(12) United States Patent
Aoyama et al.

(10) Patent No.: US 7,075,827 B2
(45) Date of Patent: Jul. 11, 2006

(54) FUNCTION RECONFIGURABLE SEMICONDUCTOR DEVICE AND INTEGRATED CIRCUIT CONFIGURING THE SEMICONDUCTOR DEVICE

(75) Inventors: Kazuo Aoyama, Otsu (JP); Hiroshi Sawada, Kyoto (JP); Akira Nagoya, Yokohama (JP); Kazuo Nakajima, Potomac, MD (US); Tadashi Shibata, Koto-ku (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 1074 days.

(21) Appl. No.: 09/754,632

(22) Filed: Jan. 4, 2001

(65) Prior Publication Data

US 2002/0105833 A1 Aug. 8, 2002

(30) Foreign Application Priority Data

Jan. 7, 2000 (JP) .................................... 2000-005942
Feb. 9, 2000 (JP) .................................... 2000-031557
Mar. 22, 2000 (JP) .................................... 2000-080022

(51) Int. Cl.
*G11C 16/04* (2006.01)

(52) U.S. Cl. ........................... 365/185.24; 365/185.18; 365/185.01

(58) Field of Classification Search ............ 365/185.24, 365/185.18, 185.01, 185.22, 185.26

See application file for complete search history.

(56) References Cited

U.S. PATENT DOCUMENTS 4,873,661 A 10/1989 Tsividis 5,256,911 A 10/1993 Holler et al.
5,305,250 A 4/1994 Salam et al.
5,343,555 A 8/1994 Yayla et al.
5,901,085 A * 5/1999 Kramer et al. ......... 365/185.18
5,990,709 A 11/1999 Thewes et al.
6,009,015 A * 12/1999 Sugiyama .............. 365/185.22

FOREIGN PATENT DOCUMENTS

| EP | 0 566 739 | 10/1993 |
|---|---|---|
| EP | 0 685 807 | 12/1995 |
| EP | 1 014 274 A1 | 6/2000 |
| JP | 6-77427 | 3/1994 |
| JP | 7-161942 | 6/1995 |
| JP | 11-194924 | 7/1999 |
| WO | WO 99/66419 | 12/1999 |

OTHER PUBLICATIONS

Czezowski, Peter J. et al. "Fuzzy Neurons: A Coarse–Grained Reconfigurable Element for Computational Intelligence"; Electrical and Computer Engineering, 1999 IEEE Canadian Conference on Edmonton, Alta., Canada May 9–12, 1999, Piscataway, NJ, USA, IEEE, US, May 9, 1999, pp. 1074–1080.

(Continued)

*Primary Examiner*—David Lam
(74) *Attorney, Agent, or Firm*—Kenyon & Kenyon

(57) ABSTRACT

A function reconfigurable semiconductor device is provided. The function reconfigurable semiconductor device includes a plurality of function cells, each of the function cells being a basic unit which realizes a function; each of the function cells including a plurality of threshold elements; each of the threshold elements including means which stores a threshold value; and wherein a function which is realized by the function cell is determined by determining the threshold value in each of the threshold elements. In addition, the semiconductor device includes a nonvolatile memory which stores data for realizing the function in the function cells.

73 Claims, 112 Drawing Sheets

OTHER PUBLICATIONS

Horio, Y. et al. "Switched–Capacitor Chaotic Neuron for Chaotic Neural Networks"; Proceedings of the International Symposium on Circuits and Systems. (ISCS). Chicago, May 3–6, 1993, New York, IEEE, US, vol. 2, May 3, 1993, pp. 1018–1021.

Shibata, Tadashi et al. "FA 15.3: Real–Time Reconfiguration Logic Circuits Using Neuron MOS Transistors"; IEEE International Solid State Circuits Conference, IEEE Inc. New York, US, vol. 36, Feb. 1993, pp. 238–239, 295.

Hiroshi Sawada, et al., "Consideration for a Reconfigurable Logic Device using Neuron MOS Transistor", Technical Report of IEICE. CPSY99–89, pp. 41–48, Nov. 27, 1999.

Kazuo Aoyama,et al., "A Design Method for a Circuit with Neuron MOS Function", Technical Report of IEICE. CPSY99–90, pp. 49–56, Nov. 27, 1999.

Kazuo Aoyama, et al., "A Method for Designing a Circuit wit Neuron MOS Transistors Realizing any Logic Function", The 13th Workshop on Circuits and Systems in Karuizawa, pp. 113–118, Apr. 24–25, 2000.

Kazuo Aoyama, et al., "A Design of a Circuit with Neuron MOS Transistors Realizing Any Symmetric Function", proceedings of the 2000 IEICE General Conference, pp. 855 Mar. 31, 2000.

Kazuo Aoyama, et al., "A Threshold Logic Based Reconfigur–able Logic Element with a New Programming Technology", 10th International Conference, FPL 2000, pp. 665–674, Aug. 2000.

Tadashi Shibata, et al., "A Functional MDS Transistor Featuring Gate–Level Weighted Sum and Threshold Operations", IEEE Transactions on Electron Devices, vol. 39, No. 6, pp. 1444–1455, Jun. 1992.

Tadashi Shibata, et al., "Real Time Reconfigurable Logic Circuits Using Neuron MOS Transistors", International Solid –State Circuits Conference, 1993.

S.D. Brown, et al., "Field–Programmable Gate Arrays", Kluwer Academic Publishers.

Kotani, K., et al. "Neuron–MOS binary–logic circuits featuring dramatic reduction in transistor count and interconnections" Electron Devices Meeting, 1992. Technical Digest., International San Francisco, CA, USA Dec. 13–16, 1992, New York, NY, USA, IEEE, US, Dec. 13, 1992, pp. 431–434.

Tadashi, Shibata, et al. "Neuron MOS Voltage–Mode Circuit Technology for Multiple–Valued Logic" IEICE Transactions on Electronics, Institute of Electronics Information and Comm. Eng. Tokyo, JP, vol. E76–C, No. 3, Mar. 1, 1993, pp. 347–356.

* cited by examiner

NEURON MOS INVERTER

NEURON MOS INVERTER

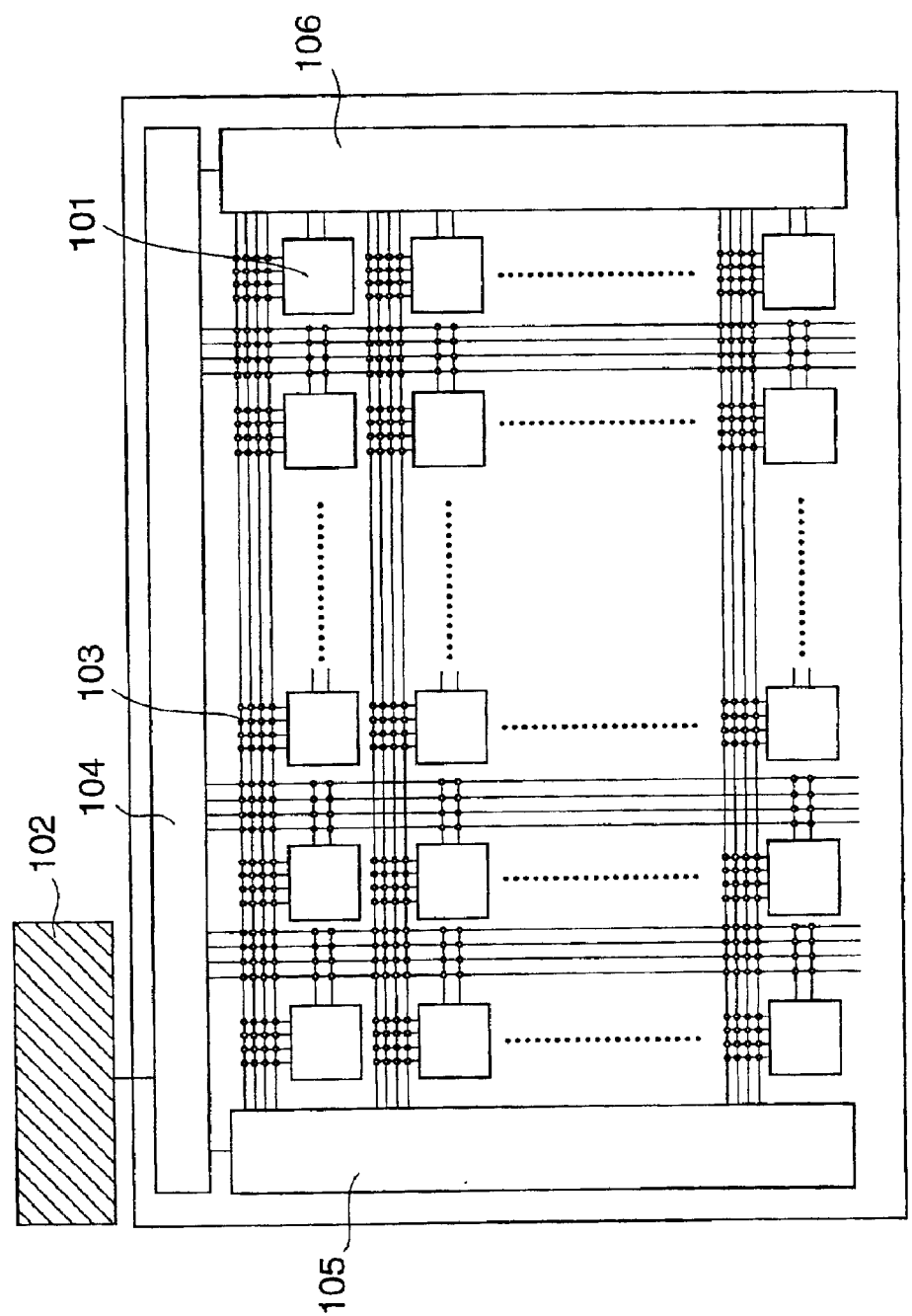

FIG.12

| THRESHOLD ELEMENT | THRESHOLD VALUE | OUTPUT VALUE OF THRESHOLD ELEMENT | | |
|---|---|---|---|---|
| | | INPUT STATUS NUMBER | | |
| | | 0 | 1 | 2 |
| TE [1] | -1 | 1 | 1 | |
| | 1 | 0 | 1 | 1 |
| TE [2] | 1 | OUTPUT VALUE OF TE [1]=1 | 0 | 1 | |
| | | OUTPUT VALUE OF TE [0]=0 | 1 | | |
| | 3 | OUTPUT VALUE OF TE [1]=1 | 0 | 0 | |
| | | OUTPUT VALUE OF TE [0]=0 | 1 | | |
| TE [3] | 3 | 0 | 0 | 1 |
| | 5 | | | 0 |

FIG.13

| INPUT STATUS NUMBER | 0 | 1 | 2 |
|---|---|---|---|
| NEGATION OF OUTPUT VALUE OF TE [2] | 1 | 0 | 0 |
| NEGATION OF OUTPUT VALUE OF TE [3] | 0 | 1 | 0 / 1 |
| OUTPUT VALUE OF TE [4] | 0 | 1 | 0 / 1 |

FIG.14

| INPUT STATUS NUMBER | 0 | 1 | | 2 | |
|---|---|---|---|---|---|
| VALUE OF input 2 [1] TERMINAL | 0 | 1 | — | — | — |
| VALUE OF input 2 [2] TERMINAL | — | — | 0 | 1 | — |
| VALUE OF input 2 [3] TERMINAL | — | — | — | — | 1 |
| output TERMINAL | 0 | 1 | 0 | 1 | 0 |

FIG.57

| INTERVAL | I | II | III | IV | V | VI | VII | VIII |
|---|---|---|---|---|---|---|---|---|
| LOGIC FORMULA | $X'_1 \cdot X_2$ | $X_1 \cdot X'_2$ | $X'_1$ | $X_1$ | $X'_2$ | $X_2$ | $X_1 + X'_2$ | $X'_1 + X'_2$ |

FIG.61

| INTERVAL | I | II | III | IV | V | VI | VII | VIII |
|---|---|---|---|---|---|---|---|---|
| LOGIC FORMULA | $X'_1 + X_2$ | $X_1 + X'_2$ | $X_2$ | $X'_2$ | $X_1$ | $X'_1$ | $X_1 \cdot X'_2$ | $X'_1 \cdot X'_2$ |

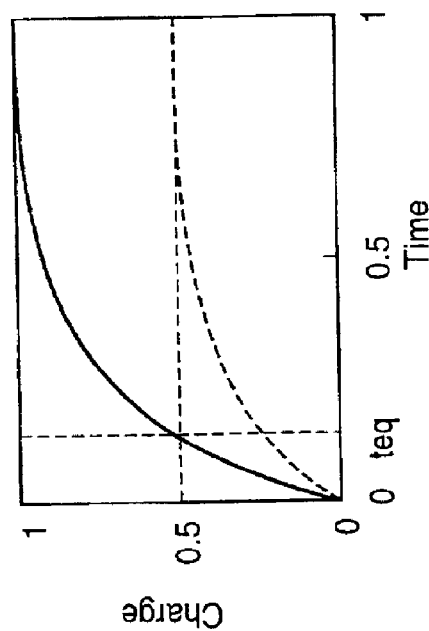
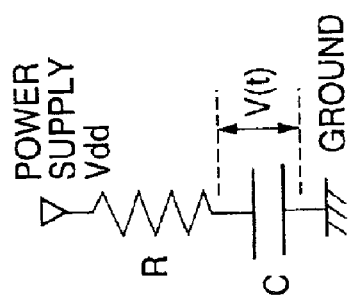
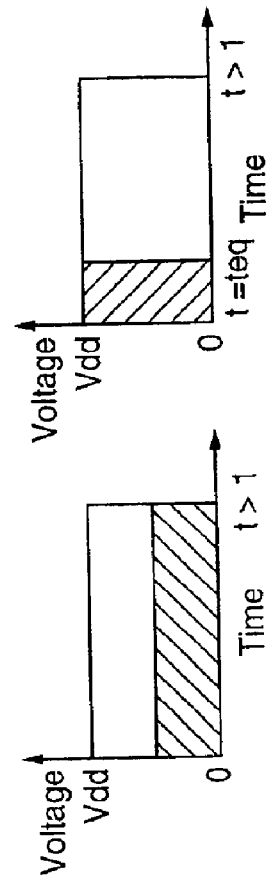

FIG.71

| INTERVAL | I | II | III | IV | V | VI | VII | VIII |
|---|---|---|---|---|---|---|---|---|
| LOGIC FORMULA | $X'_1 \cdot X_2$ | $X_1 \cdot X'_2$ | $X'_1$ | $X_1$ | $X'_2$ | $X_2$ | $X_1 + X'_2$ | $X'_1 + X_2$ |

OUTPUT SIGNAL STATE Y

INTPUT STATUS NUMBER

| m | $X_1$ | $X_2$ | $X_3$ | Y |
|---|---|---|---|---|
| 0 | 0 | 0 | 0 | 0 |
| 1 | 0 | 0 | 1 | 0 |
|   | 0 | 1 | 0 | 0 |
|   | 1 | 0 | 0 | 0 |
| 2 | 0 | 1 | 1 | 0 |
|   | 1 | 0 | 1 | 0 |
|   | 1 | 1 | 0 | 0 |
| 3 | 1 | 1 | 1 | 1 |

FIG.80

| TERMINAL NAME | TERMINAL VOLTAGE DURING INITIALIZATION TIME | | | | TERMINAL VOLTAGE DURING FUNCTION PROCESSING |
|---|---|---|---|---|---|
| | 1 | 2 | 3 | 4 | |
| ctl1 | Vdd | → | → | → | Vdd |
| ctl2 | Vdd | → | → | 0 | 0 |
| ctl3 | Vdd | → | 0 | ---→ | 0 |
| input 1 | 0 | ---→ | ---→ | ---→ | Vsig |
| input 2 | 0 | V'conf | → | → | ——— |

V'conf : VOLTAGE OF LOGICAL INVERSION OF FUNCTION CONFIGURATION DATA
Vsig : INPUT SIGNAL VOLTAGE DURING FUNCTION PROCESSING

FIG.81

| TERMINAL NAME | TERMINAL VOLTAGE DURING INITIALIZATION TIME | | | TERMINAL VOLTAGE DURING PERFORMING SELECTOR CAPABILITY |
|---|---|---|---|---|
| | 1 | 2 | 3 | |
| ctl1 | Vdd | → | 0 | 0 |
| ctl2 | Vdd | → | → | Vdd |
| ctl3 | Vdd | 0 | ---→ | 0 |
| input 1 | 0 | ---→ | ---→ | CONTROL INPUT SIGNAL VOLTAGE |
| input 2 | 0 | ---→ | ---→ | DATA INPUT SIGNAL VOLTAGE |

FIG.88

| TERMINAL NAME | TERMINAL VOLTAGE DURING INITIALIZATION TIME | | | TERMINAL VOLTAGE DURING FUNCTION PROCESSING |
|---|---|---|---|---|
| | 1 | 2 | 3 | |
| ctl1 | Vdd | ⟶ | 0 | 0 |
| ctl2 | Vdd | ⟶ | ⟶ | Vdd |
| ctl3 | Vdd | ⟶ | ⟶ | Vdd |
| ctl4 | Vdd | 0 | --⟶ | 0 |
| input 1 | 0 | --⟶ | --⟶ | Vsig |
| input 2 | 0 | --⟶ | --⟶ | Vconf |

Vconf : VOLTAGE OF FUNCTION CONFIGURATION DATA
Vsig : INPUT SIGNAL VOLTAGE DURING FUNCTION PROCESSING

FIG.89

| TERMINAL NAME | TERMINAL VOLTAGE DURING INITIALIZATION TIME | | | TERMINAL VOLTAGE DURING FUNCTION PROCESSING |
|---|---|---|---|---|
| | 1 | 2 | 3 | |
| ctl1 | Vdd | ⟶ | ⟶ | Vdd |
| ctl2 | Vdd | Vdd | 0 | 0 |
| ctl3 | Vdd | ⟶ | ⟶ | Vdd |
| ctl4 | Vdd | 0 | --⟶ | 0 |
| input 1 | 0 | --⟶ | --⟶ | Vsig |
| input 2 | V'conf | V'conf | V'conf | — |

V'conf : VOLTAGE OF LOGICAL INVERSION OF FUNCTION CONFIGURATION DATA
Vsig : INPUT SIGNAL VOLTAGE DURING FUNCTION PROCESSING

FIG.90

| TERMINAL NAME | TERMINAL VOLTAGE DURING INITIALIZATION TIME | | | TERMINAL VOLTAGE DURING PERFOMING SELECTOR CAPABILTY |
|---|---|---|---|---|
| | 1 | 2 | 3 | |
| ctl1 | Vdd | → | 0 | 0 |
| ctl2 | Vdd | → | → | Vdd |
| ctl3 | Vdd | → | → | Vdd |
| ctl4 | Vdd | 0 | ---→ | 0 |
| input 1 | 0 | ---→ | ---→ | Vsel |
| input 2 | 0 | ---→ | ---→ | Vdata |

Vsel : VOLTAGE OF ADDRESS SIGNAL OF DATA TO BE SELECTED
Vdata : INPUT SIGNAL VOLTAGE OF DATA TO BE SELECTED

FIG.91

| TERMINAL NAME | TERMINAL VOLTAGE DURING INITIALIZATION TIME | | | | | TERMINAL VOLTAGE DURING PERFOMING SELECTOR CAPABILTY |
|---|---|---|---|---|---|---|
| | 1 | 2 | 3 | 4 | 5 | |
| ctl1 | Vdd | → | → | → | 0 | 0 |
| ctl2 | Vdd | → | → | → | → | Vdd |
| ctl3 | Vdd | → | 0 | ---→ | ---→ | 0 |
| ctl4 | Vdd | 0 | ---→ | ---→ | ---→ | 0 |
| input 1 | V'sel | V'sel | V'sel | 0 | ---→ | — |
| input 2 | 0 | ---→ | ---→ | ---→ | ---→ | Vdata |

V'sel : VOLTAGE OF LOGICAL INVERSION OF ADDRESS SIGNAL OF DATA TO BE SELECTED
Vdata : INPUT SIGNAL VOLTAGE OF DATA TO BE SELECTED

FIG.110

| INPUT VARIABLE $(X_1, X_2)$ | $U_{fg}(Y_{p2}, Y_{p3})$ | | | | | | | |
|---|---|---|---|---|---|---|---|---|
| | #0 (NULL) | #1 (AND) | #2 | #3 | #4 | #5 | #6 (XOR) | #7 (OR) |
| (0,0) | 0(1,1) | 0(1,1) | 0(1,1) | 0(1,1) | 0(1,1) | 0(1,1) | 0(1,1) | 0(1,1) |
| (1,0) | 0(0,0) | 0(0,1) | 0(1,0) | 0(1,0) | 1(1,1) | 1(1,1) | 1(1,1) | 1(1,1) |
| (0,1) | 0(0,0) | 0(0,1) | 1(1,0) | 1(1,0) | 0(0,1) | 0(0,1) | 1(1,1) | 1(1,1) |
| (1,1) | 0(0,0) | 1(0,1) | 0(0,0) | 1(1,0) | 0(0,0) | 1(0,1) | 0(0,0) | 1(1,1) |

FUNCTION RECONFIGURABLE SEMICONDUCTOR DEVICE AND INTEGRATED CIRCUIT CONFIGURING THE SEMICONDUCTOR DEVICE

BACKGROUND OF THE INVENTION

1. Field of the Invention

The present invention relates to a semiconductor device and an integrated circuit. More particularly, the present invention relates to the semiconductor device and the integrated circuit which can configure a function in each of them even after they are manufactured. In addition, the present invention relates to a method of storing function configuration data.

Further, the present invention relates to an integrated circuit which can configure any symmetric function in it and has a selector capability.

Further, the present invention relates to a method of designing an integrated circuit which realizes any function and relates to the integrated circuit.

2. Description of the Related Art

A reconfigurable logic device, typified by FPGA (Field Programmable Gate Array) or PLD (Programmable Logic Device) becomes widely used for various purposes in addition that the scale of it becomes larger.

When the reconfigurable logic device begins to emerge, it is manly used for realizing a device of which the necessary amount is small but many varieties are needed, or for prototyping. However, the reconfigurable logic device, instead of ASIC (Application Specific Integrated Circuit), is often incorporated into an end product now, because FPGA can satisfy desired performance and it can be shipped several months earlier than ASIC.

Further, research and development of a reconfigurable computing system (RCS) starts to be active, wherein, in the reconfigurable computing system, the reconfigurable logic device is used and a hardware configuration can be changed adaptively according to an application. For example, the reconfigurable computing system (RCS) is shown in Toshinori Sueyoshi, "Present Status and Problems of the Reconfigurable Computing Systems—Toward the Computer Evolution—," Technical Report of IEICE, VLD96-79, CPSY96-91, 1996-12.

In an integrated circuit which configures the reconfigurable logic device like the above mentioned FGPA, parts for reconfiguring a logic include an input/output part (I/O part), a wiring connection part and a logic part. Among these, a configuring method of the logic part includes technical characteristics used for hardware design and manufacturing. Representative configurable logic blocks are an LUT (Look-Up Table) type shown in FIGS. 1A and 1B, a multiplexer-based block type shown in FIGS. 2A and 2B and a programmable logic array (PLA) type shown in FIG. 3.

The LUT type shown in FIGS. 1A and 1B includes memory elements or memory circuits typified by SRAM wherein the memory elements or memory circuits store function configuration data.

In the following, the LUT type will be described in which the SRAM is used for the logic part. Since the logic part is configured by the SRAM, it can be manufactured by a standard CMOS process. In addition, since a logic is realized by data stored in the SRAM, the logic can be rewritten unlimited times in principle. However, large area is required in the chip for realizing a logic of n (n is a positive integer) input variables since $2^n$ SRAMs are necessary. In addition, an external ROM is necessary for storing data continually since data stored in the SRAM disappears when a power supply is stopped.

An SRAM cell which is used for the changeable logic part in the FPGA is usually includes 6 transistors as shown in FIG. 4. Thus, an LUT for k input variables requires $2^k$ SRAMs so that the number of transistors for the SRAMs becomes $6 \times 2^k$.

In many cases, the number k of input variables of the LUT type FPGA which is generally used is 4 or 5. An LUT of k=4 requires 96 transistors only for the SRAM cells, and an LUT of k=5 requires 192 transistors. In addition, peripheral circuits such as an address decoder, a writing circuit, a pre-charge circuit and a sense amplifier are necessary. Thus, the scale of the circuit becomes large.

As for the multiplexer-based block type shown in FIGS. 2A and 2B, a logic is realized by a multi-stage structure of multiplexers. This multiplexer-based block type also can realize any Boolean function same as the LUT type. However, this type needs a memory element or a memory circuit, other than the multiplexers, for storing function configuration data. As the memory element or memory circuit, an anti-fuse or an 1 bit SRAM or the like is used. Generally, the anti-fuse is often used for realizing fast multi-stage logic operation. However, it is difficult to reconfigure a logic function after a logic function is configured. As for the 1 bit SRAM, in the same way as the LUT type, large area is necessary in a chip since at least $2^n$ SRAMs are required for realizing logics of n input variables.

As for the PLA shown in FIG. 3, a logic is defined by a connection state of an AND array and an OR array on the basis that any Boolean function can be configured by AND and OR. That is, PLA realized a sum-of-products type logic. In each array, memory elements or memory circuits such as anti-fuses, EPROMs, EEPROMs and SRAMs are used for the connection of wiring. Especially, EEPROMs are ofen utilized to realize wired-AND easily.

The anti-fuse has an advantage in that it operates relatively fast. However, there is a problem in that reconfiguration is difficult after a logic is configured once. As for the EPROM or EEPROM, area for this memory element is necessary for storing function configuration data other than circuits for the AND array and the OR array. In addition, generally, a data writing part and/or a data erasing part is necessary for rewriting the function configuration data. Thus, it is difficult to reconfigure a logic function easily and for a short time. Especially, as for the case of the EPROM, since irradiating ultraviolet is necessary for rewriting the logic function, it is not easy to reconfiguring the logic function. As for the EEPROM, the size of the memory cell is larger than that of the EPROM. In addition, tunnel current is used for data writing and data erasing. Thus, it is difficult to perform data writing and data erasing speedily.

Other programmable hardware, in which a logic realizing method may be different, also has the memory element or the memory circuit for storing the function configuration data.

Conventional programmable hardware is considered as a digital signal processing device which uses two-valued data representing logical 1 or 0 as an input/output signal, in which the function configuration data is also stored as two-valued data.

When an advanced programmable hardware is desired, wherein the advanced programmable hardware can process multilevel and/or analog signals as well as the two-valued signals, the conventional method lacks flexibility. In addition, by using a circuit structure which can use multilevel signals and/or analog signals internally, it may be possible to reduce area comparing with the conventional circuit.

As mentioned above, when the SRAM is used for storing the function configuration data, area in the chip becomes large. When the anti-fuse is used, reconfiguration is difficult. As for EPROM and EEPROM, a rewriting specific device becomes necessary so that there is a problem in that reconfiguration is not performed fast. In addition, it lacks flexibility when advanced programmable hardware is desired.

In the following, a description on a symmetric function will be given.

Arithmetic operation circuits are often used in an arithmetic part (data pass part) of a microprocessor (μP) or a digital signal processing processor (DSP), which are representative examples of the logic LSI. The arithmetic operation circuit includes an adding circuit, a subtracting circuit, a multiplying circuit and the like. These arithmetic operation circuits often use a full adder which handles the symmetric function.

The symmetric function is a logic function in which the function value is not changed even when input variables are permutated. For example, the output value of AND of two input variables X1 and X2 is not changed even after the values of X1 and X2 are switched. Examples of the symmetric function are AND, OR, NAND, NOR, XOR and XNOR and the like.

In addition, for the control part of the logic LSI, a circuit which includes a selector capability is often used.

Accordingly, circuits which has the symmetric function capability and circuits which has the selector capability, other than sequential circuits including such as registers and latches, are used with high frequency in the logic LSI.

The LUT type FPGA can represent any Boolean function, but does not have the selector or multiplexer capability. In addition, since the logic which is implemented in the LUT is not always a complex one, the capability for realizing any k input variable logic function is not always necessary.

As mentioned above, a circuit structure which has the symmetric function ability and the selector capability simultaneously is not proposed conventionally.

In terms of improving the function of the RCS so that it realizes not only the symmetric function but also any function, it is desirable to satisfy a condition that the time taken for reconfiguring logic function is short. Among the above-mentioned types, the LUT type which uses a memory circuit like the SRAM, a latch circuit or a circuit like DRAM may satisfy this condition.

Representative examples of the reconfigurable logic device having high rewriting speed are DPGA (Dynamically Programmable Gate Array) and DRLE (Dynamically Reconfigurable Logic Engine) in which the LUTs are configured by latch circuits.

The DPGA is described in Andre DeHon, DPGA-Coupled Microprocessors :Commodity ICs for the Early 21st Century,Proceedings of the IEEE Workshop on FPGAs for Custom Computing Machines, April, 1994. In addition, the DRLE is described in T. Fujii, et al., A Dynamically Reconfigurable Logic Engine with a Multi-Context/Multi-Mode Unified-Cell Architecture, ISSCC99, WA21.3 pp. 360–361, 1999.

However, as for the LUT type, since the truth table is directly implemented in circuits, the changeable logic part which can represent any logic function needs to be provided even when only specific logic functions are used. Thus, the logic part of k input variables needs $2^k$ memory cells for implementation as mentioned above. Therefore, there is a problem in that the area cost of the changeable logic part of the LUT type is high.

In order to solve this problem, a circuit can be considered, in which, a circuit which realizes only symmetric functions which is used frequently in arithmetic operation performed in the arithmetic part (or data pass part), a selector circuit which is often used in the control part, and a circuit which realizes all logic functions complementing the above two circuits are realized in low area cost and combined and implemented.

To combine a plurality of basic functions so as to form a basic unit of the reconfigurable logic device is equivalent to configuring a basic unit from a plurality of LUTS. Generally, the basic unit of the changeable logic part of an actual reconfigurable logic device is configured like this.

In addition, a method is proposed wherein devices having different characteristics are combined so that the basic unit of the changeable logic part is configured. For example, the method is disclosed in A. Kaviani and S. Brown, The Hybrid Field-Programmable Architecture, IEEE Design&Test of Computers, pp. 74–83, April June, 1999.

However, it is difficult for the conventional reconfigurable logic device to realize only special functions having special properties.

It is known that any logic function can be represented by a threshold logic, more specifically, it is known that any logic function can be realized by a multistage structure of threshold elements in which weights and threshold values are adjusted. One of the threshold elements which can realize the threshold logic effectively is a neuron MOS transistor. An example is disclosed in Tadashi Shibata and Tadahiro Ohmi, "A Functional MOS Transistor Featuring Gate-Level Weighted Sum and Threshold Operations," IEEE Transactions on Electron Devices, Vol.39, No.6, pp.1444–1455, 1992. FIGS. 5A–5C show a structure and a layout of the neuron MOS transistor and a circuit which is called a complementary neuron MOS inverter. The complementary neuron MOS inverter includes two neuron MOS transistors which has different conductivity types. In the following, a complementary MOS inverter which is similar to a standard complementary neuron MOS inverter (CMOS inverter) will be called a neuron MOS inverter.

FIG. 5A shows a layout, FIG. 5B shows a section view of X–X' in FIG. 5A, and FIG. 5C shows a circuit diagram of an n input complementary neuron MOS inverter.

The neuron MOS transistor has a floating gate in an region between the source region and the drain region and a plurality of input gates which are capacitively coupled to the floating gate as shown in FIGS. 5A and 5B.

FIGS. 6A and 6B show a circuit of a CMOS type inverter (neuron MOS inverter) which uses a conventional neuron MOS transistor, in which FIG. 6A shows the circuit diagram depicted by transistor symbols and FIG. 6B shows the circuit depicted by logical symbols.

In the following, the operation of the inverter, shown in FIGS. 6A and 6B for example, will be described in detail.

Let us assume that $V_i$ is a signal voltage input from ith input terminal in n input terminals, $C_i$ is an input gate capacitance value between the ith input terminal and the floating gate, $\Sigma C_{nmos} + \Sigma C_{pmos}$ is the sum total of capacitance values between the floating gate and source, drain, substrate (well) terminals. When the following formula 1 is true, $$\sum_{i=1}^{n} C_i \gg \sum C_{nmos} + \sum C_{pmos} \quad \text{(formula 1)}$$

the total sum of electrical charge amount $Q_f$ which is accumulated in each input gate capacitance is represented by the following formula 2.

$$Q_f = \sum_{i=1}^{n} C_i \cdot V_i \quad \text{(formula 3)}$$

Then, the floating gate voltage $V_{fg}$ can be represented by the following formula 3, in which $V_{fg}$ is roughly proportional to $Q_f$.

$$V_{fg} \sim \frac{\sum_{i=1}^{n}(C_i \cdot V_i)}{\sum_{i=1}^{n} C_i} \quad \text{(formula 3)}$$

When the floating gate voltage $V_{fg}$ is larger than a threshold voltage $V_{fth}$ with respect to the floating gate, the output signal voltage $V_{out}$ of the neuron MOS inverter becomes a logically inverted voltage of the floating gate voltage $V_{fg}$ with respect to the threshold voltage $V_{fth}$.

As mentioned above, the neuron MOS inverter is a kind of a threshold element which performs a threshold process. That is, the neuron MOS inverter is a kind of a threshold element which performs a threshold process on the floating gate voltage $V_{fg}$ by the threshold voltage $V_{fth}$, wherein the floating gate voltage $V_{fg}$ is roughly proportional to $Q_f$ which is a result of sum of products of $V_i$ and $C_i$ for all input signals.

In the following, a case where the input signal is a two-valued value will be described.

When assuming that the input signal voltage may take two stable voltages $\{0, V_{dd}\}$, and $C_i = C \cdot w_i$ where $w_i$ is an input gate capacitance ratio that is normalized $C_i$ by the smallest input gate capacitance value, the total sum $Q_f$ of the charge amount accumulated in each input gate capacitance is represented by the following formulas 4 and 5.

$$Q_f = C \sum_{i=1}^{N} x_i \cdot w_i \quad \text{(formula 4)}$$

$$x_i = \frac{V_i}{V_{dd}} = \begin{cases} 1 & \text{for } (V_i = V_{dd}) \\ 0 & \text{for } (V_i = 0) \end{cases} \quad \text{(formula 5)}$$

When assuming that the output signal of the neuron MOS inverter is $V_{out}$, a voltage which satisfies $V_{out} \geq V_{fth}$ is represented as $V_{high}$, a voltage which satisfies $V_{out} < V_{fth}$ is represented as $V_{low}$, the relationship between $V_{out}$ and $Q_f$ is represented by the following formulas 6 and 7.

$$V_{fg} \sim \frac{1}{\sum_{i=1}^{n} w_i} \cdot \left(\sum_{i=1}^{n} x_i \cdot w_i\right) \quad \text{(formula 6)}$$

$$V_{out} = \begin{cases} V_{high} & \text{for } (V_{fg} < V_{fth}) \\ V_{low} & \text{for } (V_{fg} \geq V_{fth}) \end{cases} \quad \text{(formula 7)}$$

Accordingly, when two-valued values $\{0, V_{dd}\}$ are used for input signals, the output signal value of the neuron MOS inverter is decided by the sum of capacitance ratio of the input gate capacitance where $x_i = 1$ is input, that is, $$\left(\sum_{i=1}^{n} x_i \cdot w_i\right) \quad \text{(formula 8)}$$

and $V_{fth}$.

Such a neuron MOS transistor and a basic structure of a circuit using it are disclosed in a Japanese laid open patent applications No. 6-77427 and 7-161942. According to a technique shown in the Japanese laid open patent application No. 6-77427, a logic function of an integrated circuit for realizing Boolean functions is formed by using a mask for forming wiring during manufacturing processes. Therefore, reconfiguration of the logic function after manufacturing is impossible. This is similar to the concept of a gate array. Therefore, in the Japanese laid open patent application No. 6-77427, after-mentioned ideas of the present invention is not disclosed.

As for a structure disclosed in Japanese laid open patent application No.7-161942, unnecessary charge accumulated in the floating gate is removed by connecting the floating gate to a terminal having a voltage for improving a reliability of the neuron MOS transistor. Thus, in the Japanese laid open patent application No. 7-161942, after-mentioned ideas of the present invention is not disclosed.

In Tadashi Shibata, Koji Kotani and Tadahiro Ohmi, "Real-Time Reconfigurable Logic Circuits Using Neuron MOS Transistors", IEEE International Solid-State Circuits Conference, FA15.3, pp. 238–239, 1993, it is disclosed that a Boolean function for a specific number of inputs can be represented by using a neuron MOS circuit configured by the neuron MOS transistors. However, signals for selecting a Boolean function is supplied directly from the outside of the integrated circuit. Therefore, this document does not discloses an idea that the neuron MOS circuit holds function or logic configuration data. That is, according to the technique disclosed in this document, the function capability can not be realized unless control signals are provided continuously from the outside.

It is conceivable that to provide a memory device for storing the control signals, which select a Boolean function, for the circuit of the above document. When a volatile memory typified by SRAM is added, as the memory device, to the circuit configured by the neuron MOS inverters regarding process speed as important, this circuit structure is equivalent to a circuit in which an address decoder part of the LUT type FPGA is configured by the neuron MOS inverters. This is not very useful.

In addition, a design method of a symmetric function by using a neuron MOS circuit is disclosed in Kazuo Aoyama, Hiroshi Sawada, Akira Nagoya, Kazuo Nakajima, "A Design Method for a Circuit with Neuron MOS Transistors Realizing," Technical Report of IEICE, CPSY99-90, PP. 49–51, 1999-11.

Further a basic structure of a neuron MOS transistor is disclosed in a Japanese laid open patent application No. 3-6679. In this document, a capacitance value between an input gate terminal and a floating gate terminal is positioned as a weight coefficient which is described in W. S. McCulloch and W. A. Pitts, "A Logical Calculus of the Ideas Immanent in Neural Nets", Bull. Match. Biophy., Vol.5, pp. 115–133, 1992, or a weight coefficient for making a D-A (Digital-Analog) converter when the neuron MOS transistor is used for a source follower type circuit.

As mentioned above, there are following problems in the conventional programmable hardware. That is, as for the LUT type, a large area is required for the changeable logic part which consists of memory circuits such as SRAMs in order to enable reconfiguring of a logic function. As for the multiplexer type and the PLA type, the anti-fuse or memory elements such as EEPROMs and EPROMs are required so that reconfiguring the logic function can not be performed easily and in a short time, wherein it is very difficult for the anti-fuse to reconfigure the logic function due to the principle and the EEPROM requires a specific device for data writing and deleting.

Therefore, an integrated circuit is desired wherein the area of memory elements or memory circuit other than main configuration elements is not necessary for realizing the changeable logic part.

A device which can reconfigure the logic function speedily among conventional reconfigurable logic device is the LUT type FPGA, in which the changeable logic part is configured by the LUT including SRAMs. The LUT having k input variables can realize any Boolean function which can be generated by k input variables. However, there is a problem in that a large area is required in the LSI. Thus, a changeable logic part which has small area and can reconfigure the logic function is desired.

In addition, a circuit structure and the designing method are desired, in which a circuit for realizing symmetric function and a small area cost circuit for realizing any function including symmetric functions are combined in the changeable logic part of a neuron MOS circuit.

SUMMARY OF THE INVENTION

It is an object of the present invention to provide a semiconductor device and an integrated circuit which decrease or does not use a memory element or a memory circuit such as SRAM for storing function configuration data in the programmable hardware so that area used for implementing the device and the circuit can be decreased. In addition, it is an object of the present invention to provide a method for reconfiguring a function capability which includes a logic capability easily and speedily so that the programmable hardware increases in performance.

Further, it is an object of the present invention to provide an integrated circuit which has a symmetric function capability and a selector capability and a memory capability, wherein area for the changeable logic part of the integrated circuit is small and the integrated circuit can reconfigure a function speedily.

Furthermore, it is an object of the present invention to provide a method for realizing not only the symmetric function but also any logic function of k input variables effectively by using a neuron MOS circuit, and a neuron MOS circuit designed by using this method.

The above-mentioned object of the present invention is achieved by a function reconfigurable semiconductor device, comprising:

a plurality of function cells, each of the function cells being a basic unit which realizes a function;

each of the function cells including a plurality of threshold elements;

each of the threshold elements including means which stores a threshold value; and wherein a function which is realized by the function cell is determined by determining the threshold value in each of the threshold elements.

The semiconductor device may further comprises a nonvolatile memory which stores data for realizing the function in the function cells.

In the semiconductor device, the function cells may be connected by wiring which can change connection status.

The semiconductor device may further includes at least two control systems, each of the threshold elements being connected to the control systems via the wiring; and at least one control system in the control systems being connected to the nonvolatile memory.

In the semiconductor device, each of the function cells may includes a plurality of stages, each of the stages including at least one threshold element.

In the semiconductor device, each of the threshold elements may includes:

a first input part which inputs an input signal to be processed;

a second input part which inputs a control signal for realizing the function;

wherein the threshold value is set by the control signal, an output value for an input signal which is input from the first input part being determined according to the threshold value.

In the semiconductor device, each of the threshold elements may includes:

a plurality of input terminals;

a first terminal which can be regarded as an electrically insulated state transiently; and a nonlinear element;

the input terminals being connected to the first terminal; and the nonlinear element receiving a voltage of the first terminal.

In the semiconductor device, each of the threshold elements may further includes:

a first switch between the first terminal and a terminal having a first predetermined voltage;

at least one second switch being connected to at least one input terminal in the input terminals;

wherein the second switch switches between a connection state of inputting an input signal from the at least one input terminal and a connection state of inputting a second predetermined voltage.

In the semiconductor device, the nonlinear element may be an inverter circuit which may be a CMOS inverter or a resistive load type inverter.

In the semiconductor device, each of the threshold elements may include:

a semiconductor region of a first conductivity type disposed on a substrate;

a source region and a drain region of a second conductivity type provided on the semiconductor region;

a floating gate electrode provided on a region which separates the source region and the drain region via an insulating film, the floating gate electrode connected to a terminal having a first voltage via an element which can take a conducting state, and, an interrupted state or an electrically high impedance state;

a plurality of input gate electrodes connected to the floating gate electrode via an insulating film, the input gate electrodes controlled by at least two input control parts provided in the semiconductor device;

at least one element for switching which can connects at least one of the input gate electrodes to an input line which inputs function configuration data or to a terminal having a second voltage.

The above-mentioned object of the present invention is also achieved by a function reconfigurable integrated circuit, comprising:

a plurality of threshold elements;

each of the threshold elements including means which stores a threshold value; and wherein a function which is realized by the integrated circuit is determined by determining the threshold value in each of the threshold elements.

The above-mentioned object of the present invention is also achieved by a function reconfigurable integrated circuit, comprising:

neuron MOS transistors each of which includes a switch;

a circuit which stores function configuration data for determining a function as a vector which is a result of subtracting a third vector from the sum of a first vector and a second vector;

the first vector including, as elements, voltages of input gate electrodes of the neuron MOS transistors at a time when floating gate electrodes of the neuron MOS transistors are in a high impedance state or are interrupted from initialization terminals used for setting an initial voltage in the floating gate electrode;

the second vector including, as elements, voltages of the floating gate electrodes at a time when the floating gate electrodes are connected to the initialization terminals;

the third vector including, as elements, voltages of the input gate electrodes at a time when the floating gate electrodes are interrupted from the initialization terminals or when the floating gate electrodes are in a high impedance state with respect to the initialization terminal.

In the function reconfigurable integrated circuit, the neuron MOS transistor may include:

a semiconductor region of a first conductivity type disposed on a substrate;

a source region and a drain region of a second conductivity type provided on the semiconductor region;

the floating gate electrode, which can be regarded as in a floating state, provided on a region which separates the source region and the drain region via an insulating film, the floating gate electrode connected to the initialization terminal having a predetermined voltage via an element which can take a conducting state, and, an interrupted state or an electrically high impedance state;

a plurality of input gate electrodes capacitively coupled to the floating gate electrode via an insulating film.

The above-mentioned object of the present invention is also achieved by a function reconfigurable integrated circuit, comprising:

neuron MOS transistors each of which includes a switch;

a circuit which stores function configuration data for determining a function, the function configuration data being a difference between the sum of charge amounts induced in input gate electrodes of the neuron MOS transistors during performing a function processing and charge amounts of floating gate electrodes of the neuron MOS transistors at a time when the floating gate electrodes are interrupted from or become in a high impedance state with respect to an initialization terminal used for setting an initial voltage to the floating gate electrode.

The function reconfigurable integrated circuit may includes i input terminals, i being a positive integer, wherein;

when the reconfigurable integrated circuit stores function configuration data including n elements, n being a positive integer, a time necessary for initialization of the floating gate electrodes is divided into j intervals on a time axis, j being a positive integer, such that $i+j \geq n$ is satisfied, the time necessary for initialization being a time from a first time to a second time, at which the first time, at least one of the floating gate electrodes being connected to the initialization terminal, at which the second time, the floating gate electrodes being interrupted from or becoming in a high impedance state with respect to the initialization terminal;

function configuration data is stored such that elements of the function configuration data are disposed on predetermined regions in a two dimensional plane which is formed by the i input terminals and the j intervals so as not to overlap one another.

The function reconfigurable integrated circuit may further includes:

a circuit which provides elements of the first vector as two-valued values of logical 1 or logical 0 or continuous values; and a circuit which provides elements of the third vector as two-valued values of logical 1 or logical 0 or continuous values.

In the function reconfigurable integrated circuit, voltages which are provided from outside of the integrated circuit or voltages which are generated in the integrated circuit are used as elements of the first vector, the second vector and the third vector.

The function reconfigurable integrated circuit may be configured by a plurality of stages, each of the stages includes at least one neuron MOS inverter having a switch which includes the neuron MOS transistor having a switch.

The function reconfigurable integrated circuit may further includes:

a plurality of circuit blocks, each of the circuit blocks including at least one the integrated circuit;

wherein processing on storing function configuration data is performed in the integrated circuits simultaneously in each of the circuit blocks.

In the function reconfigurable integrated circuit, multiple-valued voltages or continuous voltages may be used for storing the function configuration data, the multiple-valued voltages or the continuous voltages being provided from the outside of the integrated circuit or being generated in the integrated circuit from voltages provided from the outside of the integrated circuit.

The function reconfigurable integrated circuit may further includes:

an impedance network which includes switches and impedance components; wherein, the integrated circuit stores multiple-valued voltages or continuous voltages which are generated by the impedance network from voltages provided from the outside of the integrated circuit.

In the function reconfigurable integrated circuit, the impedance components may be connected in series between a first terminal and a second terminal which have different voltages; and each of the switches being for connecting one of the impedance component to the input gate electrode of the neuron MOS transistor.

In the function reconfigurable integrated circuit, the impedance network may be configured such that capacitances are connected in parallel between a first terminal and a second terminal which have different voltages, each of the capacitances having a switch, and one of two terminals of each of the capacitances can be connected to one of the input gate electrodes of the neuron MOS transistor.

In the function reconfigurable integrated circuit, the function configuration data may be stored by storing charge amounts of multiple-valued values or charge amounts of continuous values, the multiple-valued values or the continuous values are represented by time intervals during which a predetermined voltage is provided, the predetermined voltage being provided from outside of the integrated circuit or being generated in the integrated circuit.

In the function reconfigurable integrated circuit, the multiple-valued values or the continuous values may be generated and stored by controlling the time intervals by using an imprdance network and a capacitance between the input gate electrode and the floating gate electrode, the network comprising resistance elements and capacitance elements and provided on a path over which a signal is applied to the input gate electrode.

The above-mentioned object of the present invention is also achieved by a method of storing function configuration data in an integrated circuit including neuron MOS transistors having a switch, comprising the steps of:

connecting each of floating gate electrodes of the neuron MOS transistors to an initialization terminal which is in a second voltage;

applying voltages in a third voltage vector to input gates of the neuron MOS transistors while each of the floating gate electrodes of the neuron MOS transistors is connected to the initialization terminal;

when a voltage of each of the floating gate electrodes can be regarded as the same as the second voltage, interrupting each of the floating gate electrodes from the initialization terminal or setting a high impedance with respect to the initialization terminal in each of the floating gate electrodes; and applying voltages of a first voltage vector to the input gate electrodes.

The above-mentioned object of the present invention is also achieved by a method of storing function configuration data in an integrated circuit including neuron MOS inverters having a switch, the integrated circuit configured by a plurality of stages each of which stages including at least one of the neuron MOS inverters, wherein each of floating gate electrodes of the neuron MOS inverters can be connected to a ground terminal having a ground voltage via a switch, the method comprising the steps of:

when each of the floating gate electrodes is connected to the ground terminal, applying predetermined voltages to input gate electrodes of the neuron MOS inverters;

interrupting each of the floating gate electrodes from the ground terminal or providing a high impedance to each of the floating gate electrodes while applying the predetermined voltages to the input gate electrodes;

when each of the floating gate electrodes can be regarded as in a floating state, applying a power supply voltage instead of the predetermined voltages to the input gate electrodes.

The above-mentioned object of the present invention is also achieved by a method of storing function configuration data in an integrated circuit including neuron MOS inverters having a switch, the integrated circuit configured by a plurality of stages each of which stages including at least one of the neuron MOS inverters, wherein each of floating gate electrodes of the neuron MOS inverters can be connected to a power supply terminal having a power supply voltage via a switch, the method comprising the steps of:

when each of the floating gate electrodes is connected to the power supply terminal, applying predetermined voltages to input gate electrodes of the neuron MOS inverters;

interrupting each of the floating gate electrodes from the power supply terminal or providing a high impedance to each of the floating gate electrodes while applying the predetermined voltages to the input gate electrodes;

when each of the floating gate electrodes can be regarded as in a floating state, applying a ground voltage instead of the predetermined voltages to the input gate electrodes.

The above-mentioned object of the present invention is also achieved by a method of storing function configuration data in an integrated circuit including neuron MOS inverters having a switch, the integrated circuit configured by a plurality of stages each of which stages including at least one of the neuron MOS inverters, wherein each of floating gate electrodes of the neuron MOS inverters can be connected to a second voltage terminal having a second voltage via a switch, the method comprising the steps of:

when each of the floating gate electrodes is connected to the second voltage terminal, applying third voltages to input gate electrodes of the neuron MOS inverters;

interrupting each of the floating gate electrodes from the second voltage terminal or providing a high impedance to each of the floating gate electrodes while applying the third voltages to the input gate electrodes;

when each of the floating gate electrodes can be regarded as in a floating state, applying a first voltage instead of the third voltages to the input gate electrodes.

The above-mentioned object of the present invention is also achieved by an integrated circuit which realizes a function of k input variables, k being a positive integer, comprising:

k first input signal terminals which input k first input signals and k+1 second input signal terminals which input k+1 second input signals, wherein input status numbers, each of which is the number of the first input signal terminals having identical values, are in one-to-one correspondence with the second input signal terminals;

the integrated circuit outputting a value which is determined according to a state of the second input signal terminal which corresponds to the input status number;

the integrated circuit including a symmetric function capability of k input variables and a selector capability, the selector capability selecting one signal among the k+1 second input signals by using the k first input signals.

The above-mentioned integrated circuit includes:

two stages, a first stage in the two stages including k+1 threshold elements, a second stage in the two stages including a threshold element;

each of the k+1 threshold elements in the first stage including terminals for inputting the k first input signals and a terminal for inputting one of the second input signals;

the threshold element in the second stage including terminals for inputting the k first input signals and terminals for inputting signals based on output signals of the k+1 threshold elements of the first stage;

each of the threshold elements in the first stage having a threshold value which is different from a threshold value of any other threshold element in the first stage;

the threshold element in the second stage receiving products of a first weight and signal values output from the k+1 threshold elements of the first stage, the first weight having reversed sign of a second weight by which the first input signals are multiplied, or the threshold element in the second stage receiving products of a positive weight and reversed signals of signals output from the k+1 threshold elements of the first stage.

The above-mentioned object of the present invention is also achieved by a function reconfigurable integrated circuit comprising at least one neuron MOS transistor having a switch;

the neuron MOS transistor including an element between a floating gate electrode and a terminal of a predetermined voltage, wherein the element can take either of two states of a conducting state and an interrupted state or a high impedance state; wherein, the integrated circuit has a symmetric function capability and a selector capability by controlling at least one of three voltages, a first voltage of the three voltages being a voltage of the floating gate electrodes at a time when the element is in the conducting state, a second voltage of the three voltages being a voltage of an input terminal of the neuron MOS transistor at a time when the element is in the conducting state, a third voltage of the three voltages being a voltage of the input terminal of the neuron MOS transistor at a time when the element is in the interrupted state.

The function reconfigurable integrated circuit may includes:

two stages, first stage in the two stages including k+1 threshold elements using the neuron MOS transistors, second stage in the two stages including a threshold element using the neuron MOS transistor;

each of the k+1 threshold elements in the first stage including k first input signal terminals, a second input signal terminal which is different from other second input signal terminals of other threshold elements;

the threshold element in the second stage including terminals for inputting k first input signals and k+1 terminals for inputting signals based on output signals of the k+1 threshold elements of the first stage;

each of the threshold elements in the first stage having a threshold value which is different from a threshold value of any other threshold element in the first stage;

the threshold element in the second stage receiving products of a positive weight and reversed signals of signals output from the k+1 threshold elements of the first stage.

The function reconfigurable integrated circuit may further includes a switching circuit which selects between the symmetric function capability and the selector capability.

The function reconfigurable integrated circuit may further includes a control circuit which switches between four modes;

in a first mode, the symmetric function capability being realized only during applying function configuration data;

in a second mode, the function configuration data being stored;

in a third mode, the selector capability being realized only during applying an address of a signal to be selected;

in a fourth mode, the address being stored.

In the function reconfigurable integrated circuit, the threshold element using the neuron MOS transistor may have a switch being an element which forms an inverter circuit.

In the function reconfigurable integrated circuit, output terminals of the threshold elements of the first stage may be connected to input terminals of the threshold element of the second stage via circuits including wave-shaping circuits.

The function reconfigurable integrated circuit may further include a circuit including a delay circuit, which is provided on a path over which a signal is applied to the threshold element of the second stage.

The above-mentioned object of the present invention is also achieved by a function reconfigurable integrated circuit which includes a plurality of neuron MOS transistors or a plurality of neuron MOS transistors having a switch, wherein the integrated circuit is configured such that:

sums of sets of an element or elements are different with respect to each other, wherein the elements in a set do not overlap each other, the elements being included in a capacitance ratio set ($w_1, w_2, \ldots, w_i, \ldots, w_k$);

wherein each element in the capacitance ratio set ($w_1, w_2, \ldots, w_i, \ldots, w_k$) is a capacitance ratio with respect to a minimum value of capacitance values, the capacitance values being values of capacitances between input gate electrodes to which input variables are input and a floating gate electrode, wherein k is the number of the input variables.

In the function reconfigurable integrated circuit, each of the neuron MOS transistor and the neuron MOS transistor having a switch comprising:

a semiconductor region of a first conductivity type disposed on a substrate;

a source region and a drain region of a second conductivity type provided on the semiconductor region;

the floating gate electrode, which can be regarded as in a floating state, provided on a region which separates the source region and the drain region via an insulating film;

a plurality of input gate electrodes capacitively coupled to the floating gate electrode via an insulating film;

wherein the floating gate electrode of the neuron MOS transistor having a switch is connected to a terminal having a predetermined voltage via an element which can take either of two states of a conducting state and an interrupted state or a high impedance state.

In the function reconfigurable integrated circuit, each of the neuron MOS transistor and the neuron MOS transistor having a switch may be a transistor wherein the capacitance ratio $w_i$ of ith input gate satisfies $$w_i > \sum_{j=1}^{i-1} w_j, \quad (2 \leq i \leq k).$$

In the function reconfigurable integrated circuit, each of the neuron MOS transistor and the neuron MOS transistor having a switch may be a transistor wherein $w_i = z^{i-1}, 1 \leq i \leq k$, and $z \geq 2$ are satisfied.

In the function reconfigurable integrated circuit, each of the neuron MOS transistor and the neuron MOS transistor having a switch may be a transistor wherein $w_i = \alpha^{i-1}, 1 \leq i \leq k$ and $1 < \alpha < 2$ are satisfied.

In the function reconfigurable integrated circuit, each of the neuron MOS transistor and the neuron MOS transistor having a switch may be a transistor wherein $w_i = \alpha^{i-2} \cdot (1+\beta)$, $2 \leq i \leq k$, $\alpha > 1$ and $0 < \beta < 1$ are satisfied.

In the function reconfigurable integrated circuit, each of the neuron MOS transistor and the neuron MOS transistor having a switch may be a transistor wherein $w_i = 2^{i-2} \cdot (1+\beta)$, $2 \leq i \leq k$ and $0 < \beta < 1$ are satisfied.

The function reconfigurable integrated circuit may includes two stages, a first stage of the two stages including pre-inverters each of which is the neuron MOS transistor or the neuron MOS transistor having a switch, the pre-inverter having more than two threshold values with respect to an input signal.

The function reconfigurable integrated circuit may further includes terminals from which two-valued control signals which determine the threshold value are input.

The function reconfigurable integrated circuit may further includes a control signal terminal from which a multiple-valued signal or an analog signal is input, the multiple-valued signal or the analog signal determining the more than two threshold values.

The above-mentioned object of the present invention is also achieved by a designing method of a function reconfigurable integrated circuit, the integrated circuit comprising two stages which includes neuron MOS inverters using neuron MOS transistors or neuron MOS transistors having a switch, the neuron MOS inverter in a first stage of the two stage being a pre-inverter and neuron MOS inverter in a second stage of the two stage being a main inverter, the method comprising the steps of:

setting values of input gate capacitances, for each of the neuron MOS inverters, between input gate electrodes from which first input signals are input and a floating gate electrode such that input vectors can be identified, the input vector being a vector representation of the first input signals;

setting, for each input gate electrode connected to an output terminal of the pre-inverter, a value of an input gate capacitance between an input gate electrode from which an output signal from a pre-inverter is input and the floating gate of the main inverter such that, in two different voltages of the floating gate which correspond to two output values of the pre-inverter, one is larger than a threshold voltage of the floating gate and another is smaller than the threshold voltage, wherein the input gate capacitance corresponds to the pre-inverter which corresponds to one of the input vectors; and setting, for each of the pre-inverters, a value of an input gate capacitance between an input gate electrode from which a second input signal are input and the floating gate of one of the pre-inverters such that, a voltage of the floating gate becomes equal to the threshold voltage at each of two different input charge amounts, wherein an input charge amount corresponding to the one of the pre-inverters which corresponds to a first input vector is larger than one of the two different input charge amounts and is smaller than another of the two different input charge amounts, wherein each of the two different input charge amounts do not exceed an input charge amount of a second input vector which is nearest to the first input vector.

The above-mentioned object of the present invention is also achieved by a designing method of a function reconfigurable integrated circuit, the integrated circuit comprising two stages which includes neuron MOS inverters using neuron MOS transistors or neuron MOS transistors having a switch, the neuron MOS inverter in a first stage of the two stage being a pre-inverter and neuron MOS inverter in a second stage of the two stage being a main inverter, the method comprising the steps of:

setting values of input gate capacitances, for each of the neuron MOS inverters, between input gate electrodes from which first input signals are input and a floating gate electrode such that input vectors can be identified, the input vector being a vector representation of the first input signals;

for the main inverter, dividing the input vectors which are arranged in ascending order by corresponding input charge amounts into blocks each of which block includes four input vectors, the input charge amounts being accumulated in input gate capacitances between first input signal terminals and a floating gate;

setting values of input gate capacitances, for the main inverter, between input gate electrodes from which output signals from the pre-inverters are input and the floating gate such that the floating gate takes two values in which one is larger than a threshold voltage of the floating gate and another is smaller than the threshold voltage of the floating gate by using combinations of logical values of output signals of three pre-inverters for four input vectors in the block; and setting, for each of the pre-inverters, a value of an input gate capacitance between an input gate electrode from which a second input signal are input and the floating gate of one of the pre-inverters such that, a voltage of the floating gate becomes equal to the threshold voltage at each of two different input charge amounts, wherein an input charge amount corresponding to the one of the pre-inverters which corresponds to a first input vector is larger than one of the two different input charge amounts and is smaller than another of the two different input charge amounts, wherein each of the two different input charge amounts do not exceed an input charge amount of a second input vector which is nearest to the first input vector. The design method of a function reconfigurable integrated circuit may further include the step of utilizing directly a physical multiple-valued value for a multiple-valued expression unlike using plural bits.

BRIEF DESCRIPTION OF THE DRAWINGS

Other objects, features and advantages of the present invention will become more apparent from the following detailed description when read in conjunction with the accompanying drawings, in which:

FIG. 7 shows a function reconfigurable semiconductor device according to an embodiment 1-1 of the present invention;

FIG. 12 shows relationships between output values of threshold elements of first and second stages, input state values, and threshold values;

FIG. 13 shows the input values and the output values of TE[4] for each input status number;

FIG. 14 shows relationships between the values of input1[2]~input2[3] and the output terminal;

FIGS. 48A–48C show a concept in that the signal is expanded in time and space, in which FIG. 48A shows a case when a plurality of signals are input from different terminals simultaneously, FIG. 48B shows a case when a plurality of signals are input from a terminal by time division, FIG. 48C shows a case when signals for generating a logic is dispersed in time and space;

FIG. 57 shows meanings of intervals shown in FIG. 56;

FIG. 61 shows meanings of intervals shown in FIG. 60;

FIGS. 62A–62C are figures showing that multiple-valued voltage input can be regarded as equivalent to two-valued voltage input in which time interval is controlled when a neuron MOS transistor is initialized, in which FIG. 62A shows a circuit diagram equivalent to a main component of one of input signal terminals of a neuron MOS transistor, FIG. 62B shows transient characteristics of the equivalent circuit shown in FIG. 62A when a standard power supply voltage is used and when ½ of the power supply voltage is used, FIG. 62C shows a relationship between the power supply voltage and time when ½ of the power supply voltage is kept for a time, FIG. 62D shows a relationship between the power supply voltage and time when the power supply voltage is applied for a time interval;

FIGS. 63A and 63B are circuit diagrams of neuron MOS inverters each of which has two input signal terminals and a control signal terminal, in which FIG. 63A shows one of pre-inverters shown in FIG. 52 and FIG. 63B shows a circuit having the same capability as that shown in FIG. 63A in which applying time for two-valued voltage inputs is controlled;

FIG. 71 shows meanings of intervals shown in FIG. 70;

FIG. 80 shows a procedure for applying terminal voltages in the circuit shown in FIG. 77 when realizing the symmetric function capability;

FIG. 81 shows a procedure for applying terminal voltages in the circuit shown in FIG. 77 when realizing the selector capability;

FIG. 88 shows a procedure for realizing a first mode in the integrated circuit 405;

FIG. 89 shows a procedure for realizing a second mode in the integrated circuit 405 wherein function configuration data is stored;

FIG. 90 shows a procedure for realizing the third mode which realizes the selector capability, wherein an address of a selected signal is not stored so that a signal which is selected by the address is output only during applying the address;

FIG. 91 shows a procedure of a fourth mode, wherein the address of data to be selected is stored in the selector capability;

FIG. 110 shows relationships between the normalized floating gate voltage $U_{fg}$ and logical values ($Y_{p2}, Y_{p3}$) of the output signals of the pre-inverters 1102, 1103, when the integrated circuit 804 realizes 8 logic functions among 16 logic functions which can be realized by input variables $x_1$ and $x_2$ when the number k of elements is 2;

DETAILED DESCRIPTION OF THE PREFERRED EMBODIMENTS

Figure 1A:
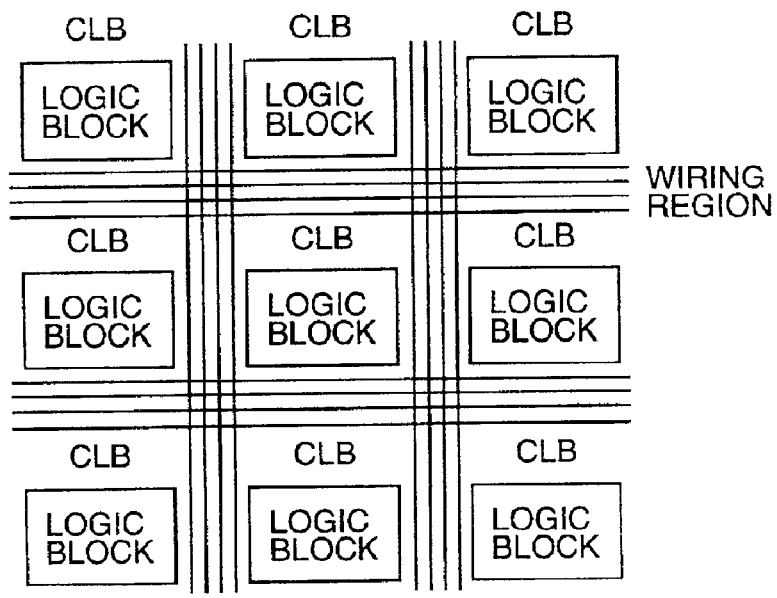
FIGS. 1A and 1B show structures of an LUT (Look-Up Table) type changeable logic part according to a conventional technique.
Figure 1B:
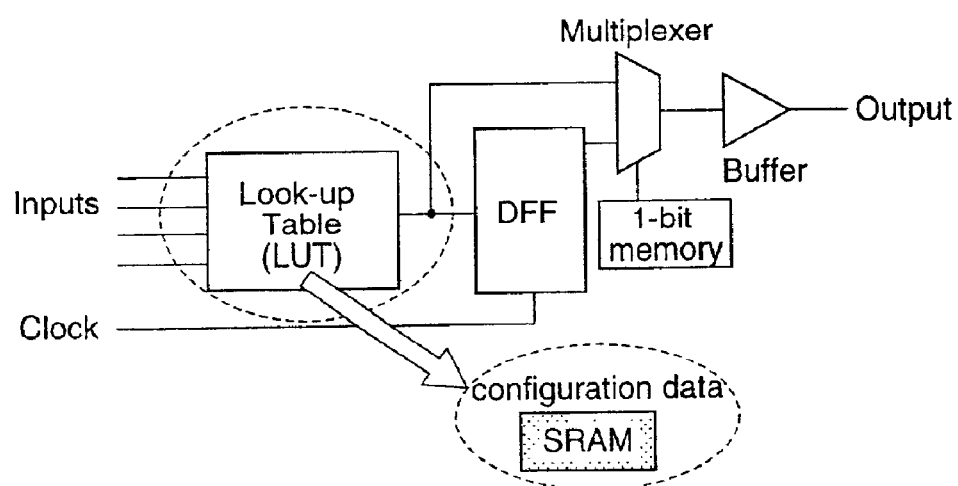

In the following, embodiments of the present invention will be described. In embodiments 1-1~1-3, integrated circuits including function reconfigurable function cells and a principle of an integrated circuit applicable to the function cells will be described. In embodiments 2-1~2-10, basic structures of circuits using neuron MOS transistors based on the principle will be described in detail. In embodiments 3-1~3-4, detailed structures of circuits using the neuron MOS transistors for realizing symmetric functions will be described. In embodiments 4-1~4-6, detailed structures for realizing any functions and for enabling use of multiple-valued expressions.

Each of integrated circuits which are described in the embodiments 2-1~4-6 can be used as an integrated circuit which configures the function cell in the semiconductor device in the embodiment 1-1~1-3.

(Embodiment 1-1)

FIG. 7 shows a function reconfigurable semiconductor device according to an embodiment of the present invention. The function reconfigurable semiconductor device includes function cells 101 arranged like an array, wherein the function cells 101 are connected by wiring which can change a connection state. In addition, the function reconfigurable semiconductor device includes a centralized nonvolatile memory circuit 102 which is connected to the function cells via a control circuit block 104. Each of the function cells is an integrated circuit which includes aftermentioned threshold elements. Further, the function reconfigurable semiconductor device has an input circuit block 105 and an output circuit block 106.

In FIG. 7, input signal lines and output signal lines of the function cell 101 are connected to wiring provided between the function cells via elements or switches 103 which switch connection states.

The centralized nonvolatile memory circuit 102 has data for realizing functions.

Next, the operation of the semiconductor device will be described.

When reconfiguring functions, the data stored in the centralized nonvolatile memory circuit 102 is sent to the function cells 101 and the switch 103 via the control circuit block 104. The structure and the method for reconfiguring functions will be described later.

After the function is set via the control circuit block 104, input variables or input signals are input from the input circuit block 105 so that they are processed and the results are output from the output circuit block 105. While the device is operating, if a connection state of wiring is changed or if function realized by the function cell is changed, the changed data is transferred to the centralized nonvolatile memory circuit 102 so that it is updated.

Figure 8:
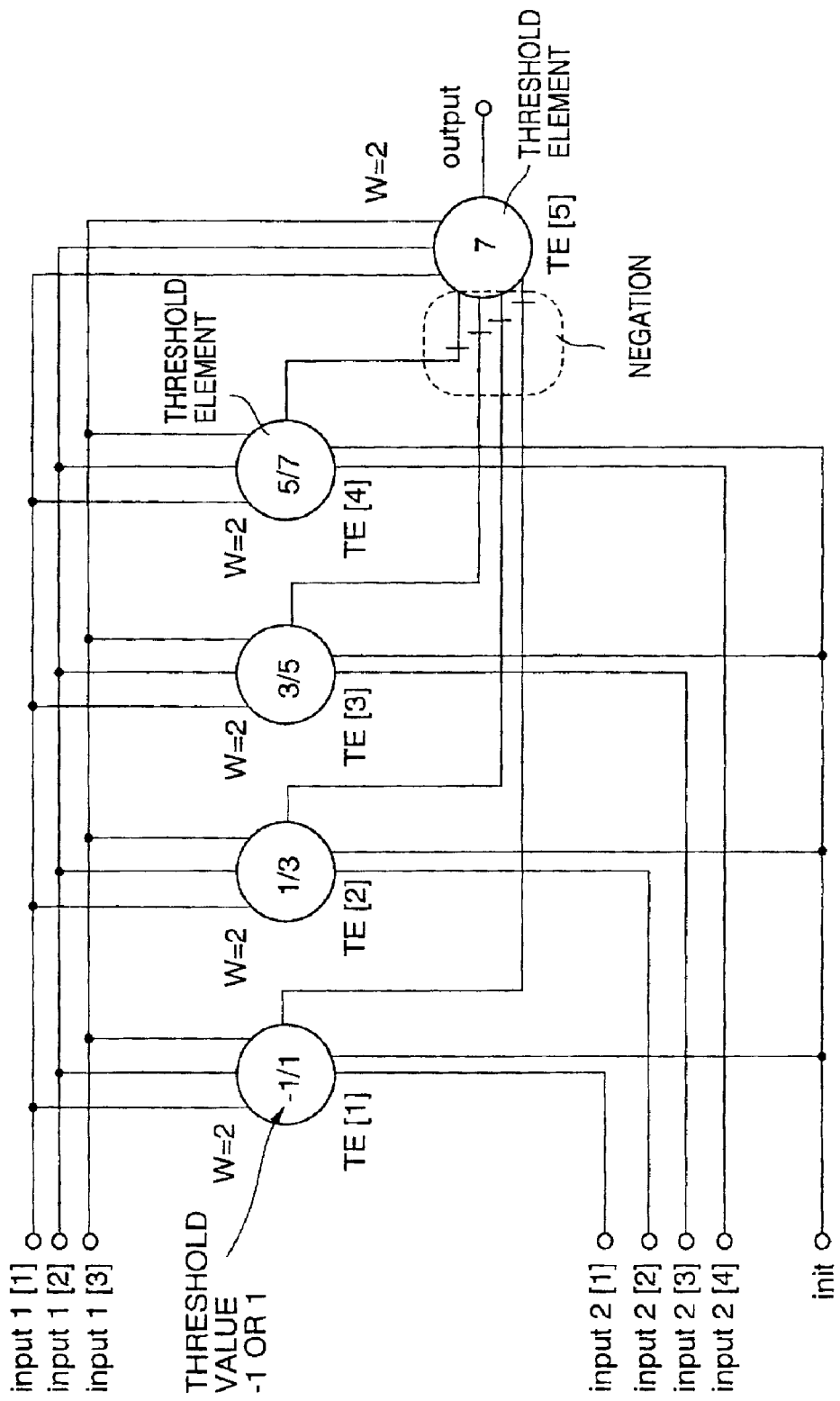
FIG. 8 shows a structure example of a basic circuit included in the function cell 101.

FIG. 8 shows a structure example of a basic circuit included in the function cell 101. This circuit includes threshold elements (TEs), input terminals input1[1]~input1[3] and control signal input terminals input1[2]~input2[4]. The threshold element can store a threshold value by an initialization signal. The function cell is comprised of two stages of the threshold elements, wherein a first stage includes TE[1]~TE[4] and a second stage includes TE[5]. An output signal is output from the threshold element of the second logic element. In addition, all input signal lines and a control signal line are connected to each of the threshold element of the first stage. An output signal from each of the threshold element of the first stage is input to the threshold element of the second stage after inverted (NOT is applied). In addition, all input signal lines are connected to the threshold element of the second stage. This circuit also has an init terminal for providing timing.

The terminals input1[1]~input1[3], input1[2]~input2[4] and init corresponds to an input part and the output terminal corresponds to an output part. Each of input1[1]~input1[3] is an input terminal for an input variable. Each of input1[2]~input2[4] is a control terminal for providing function configuration data for realizing $2^4$ symmetric functions which can be formed by 3 input variables. The init terminal provides timing for storing one of two threshold values which is selected by a variable value provided from each of input2[2]~input2[4]. "w" shown in FIG. 8 indicates a weight which is assigned to each input variable.

In this embodiment 1-1, each threshold element has two threshold values as shown in FIG. 8 and one threshold value is selected by a signal from the control terminal.

In the following, it will be described that the circuit shown in FIG. 8 can realize any symmetric function of 3 input variables. In the following description, the number of variables each of which is logical 1 will be called an input status number.

When the number of input variables is 3, the input status number takes one of 0, 1, 2 and 3. Any symmetric function of 3 input variables can be realized if the circuit can output logical 0 or 1 in each of the input status numbers.

Figure 9:
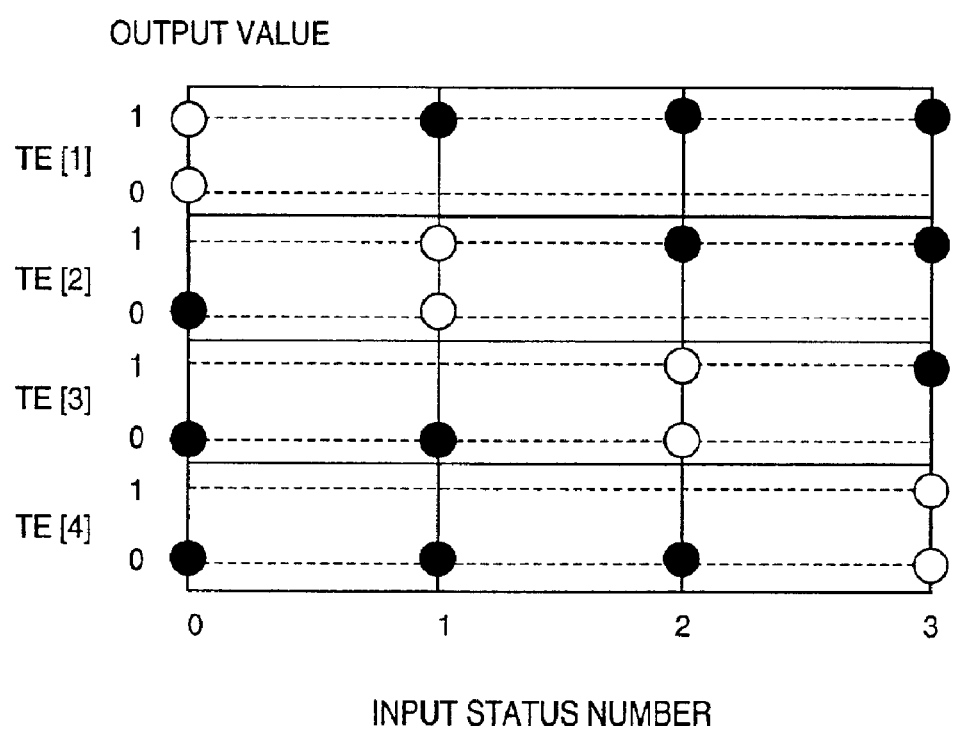
FIG. 9 is a figure for explaining relationships between input status numbers and logical output values of the first stage threshold elements TE[1]~TE[4]

FIG. 9 is a figure for explaining relationships between the input status numbers and logical output values of each of the first stage threshold elements TE[1]~TE[4]. A black circle in this figure represents an output value which is determined regardless of the threshold value of the threshold element, and a white circle represents an output value which can take logical 0 or 1 depending on the threshold value.

When the input status number is 0, that is, when every input value is logical 0, the sum of products of input values and the weight for each threshold element is 0. Therefore, in each of threshold elements TE[2]~TE[4], the sum of products is smaller than either of the two threshold value so that 0 is output. TE[1] outputs 1 when the threshold value is −1 and outputs 0 when the threshold value is 1. When the input status number is 1, the sum of products of input values and the weight for each threshold element becomes 2. In this case, TE[1] outputs 0 in either of two threshold values and each of TE[3] and TE[4] outputs 1. Only TE[2] outputs 1 or 0 depending on the threshold value. When the input status number is 2 or 3, output values are determined as shown in FIG. 9 in the same way as mentioned above.

Figure 10A:
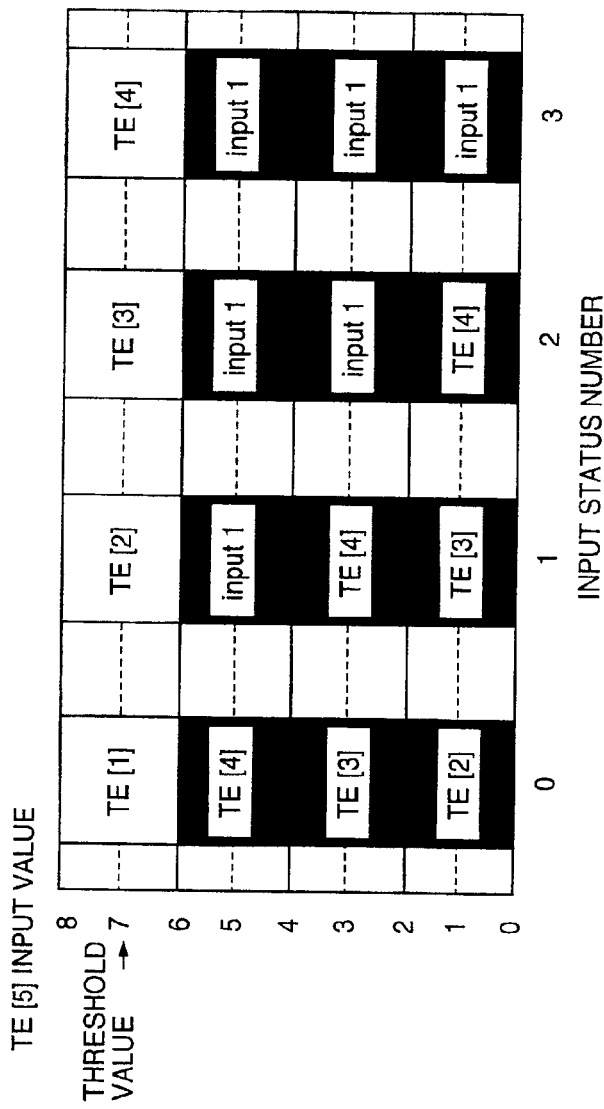
FIG. 10A shows input values (after multiplied by the weight) to the threshold element TE[5] for each input status number.
Figure 10B:
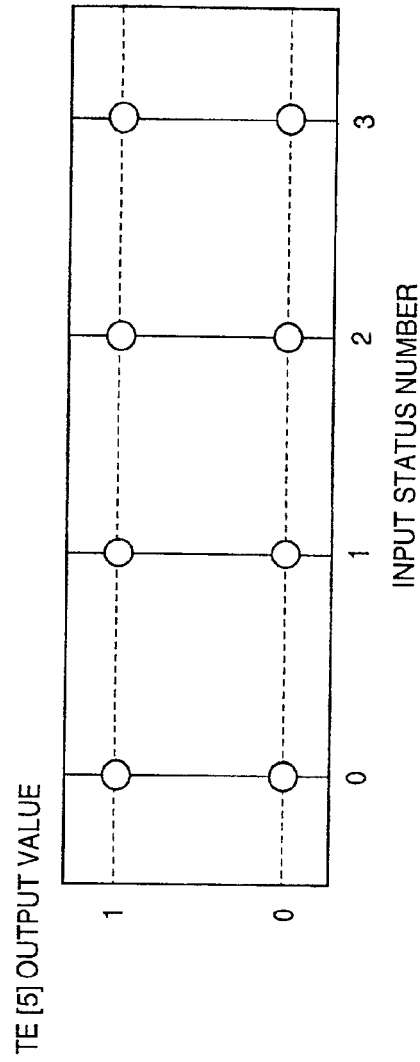
FIG. 10B shows output values for input status numbers.

FIG. 10A shows input values (after multiplied by the weight) to the threshold element TE[5] for each input status number. FIG. 10B shows output values for each input status number.

Figure 2A:
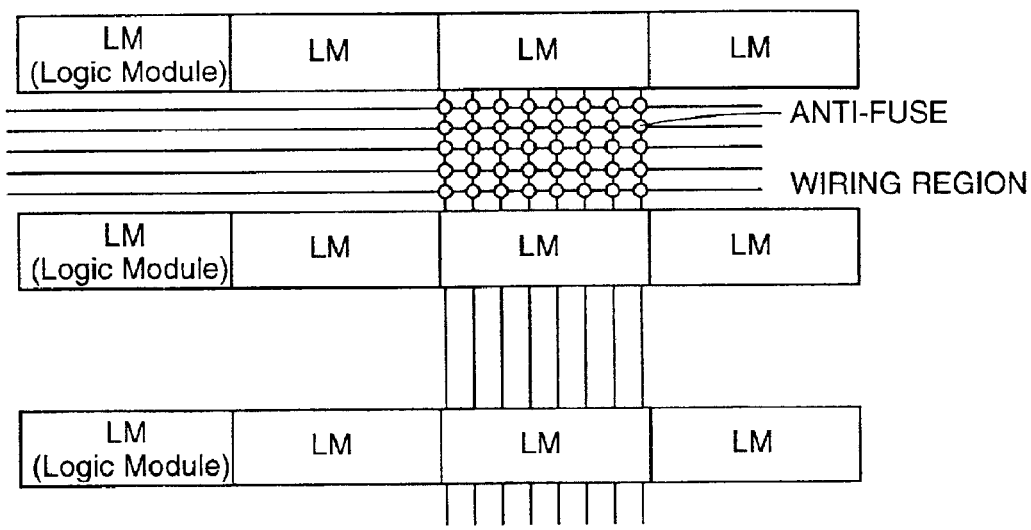
FIGS. 2A and 2B show structures of a multiplexer-based block type changeable logic part according to a conventional technique.
Figure 2B:
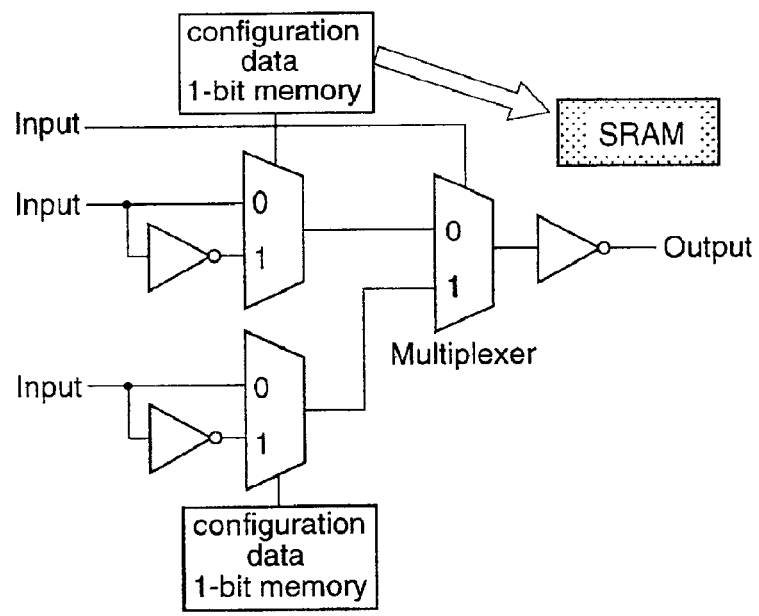
Figure 3:
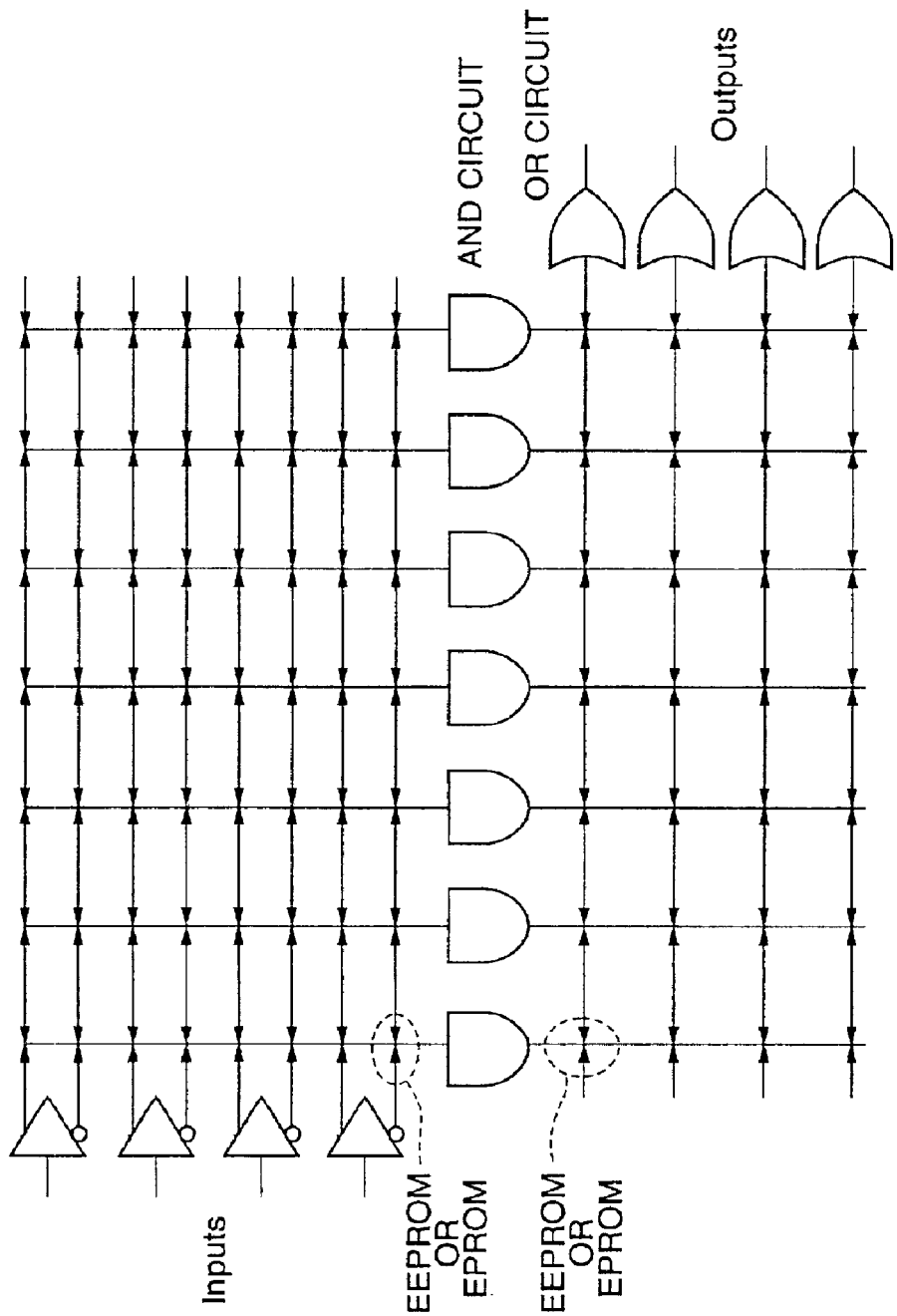
FIG. 3 shows a structure of a PLA type changeable logic part according to a conventional technique.
Figure 4:
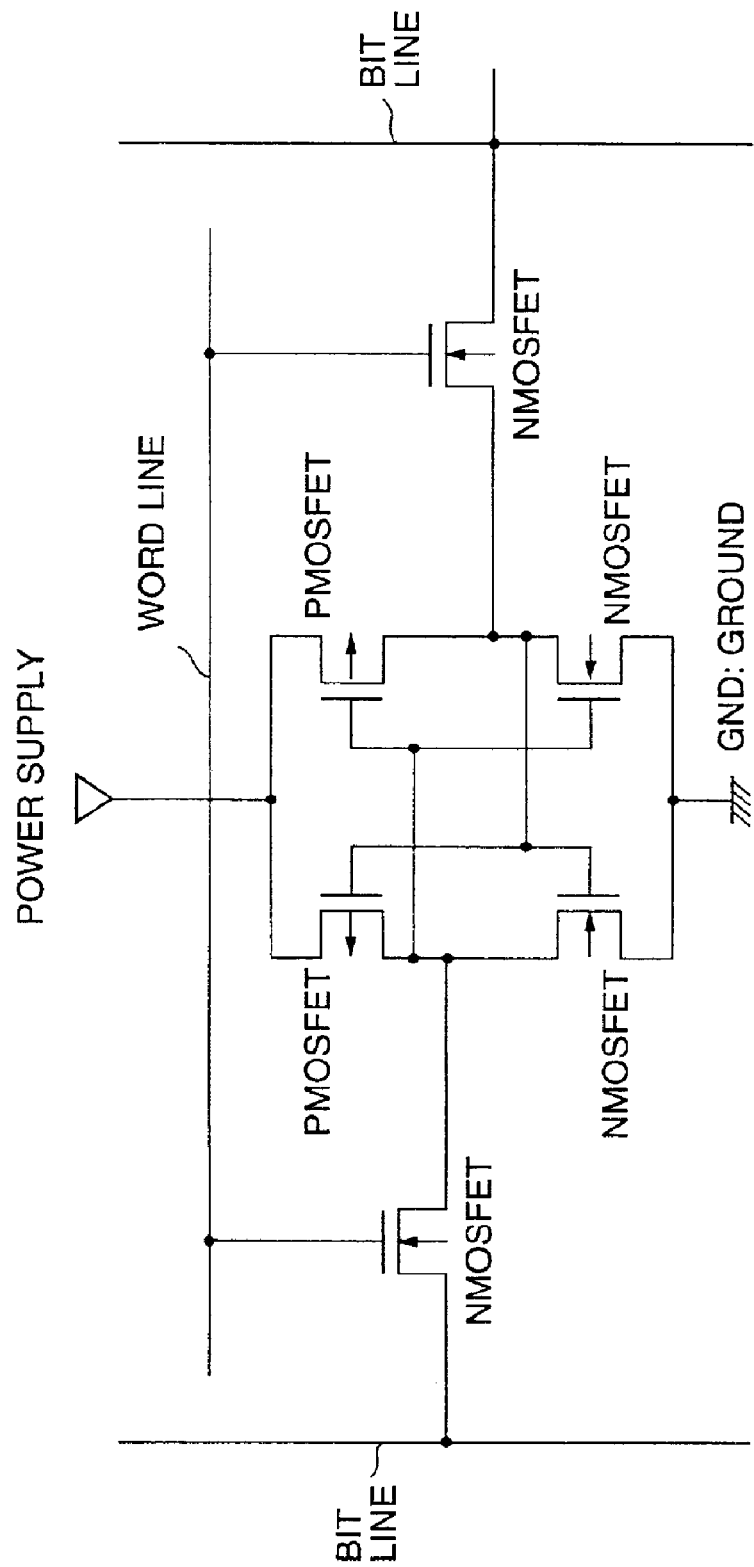
FIG. 4 is a circuit diagram of a CMOS type SRAM cell according to a conventional technique.
Figure 5A:
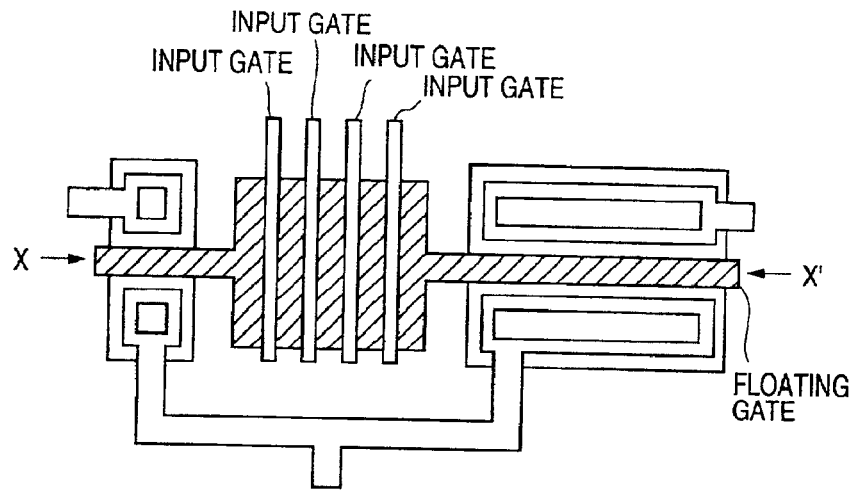
FIGS. 5A–5C show a structure of a CMOS type inverter using a conventional neuron MOS transistor.
Figure 5B:
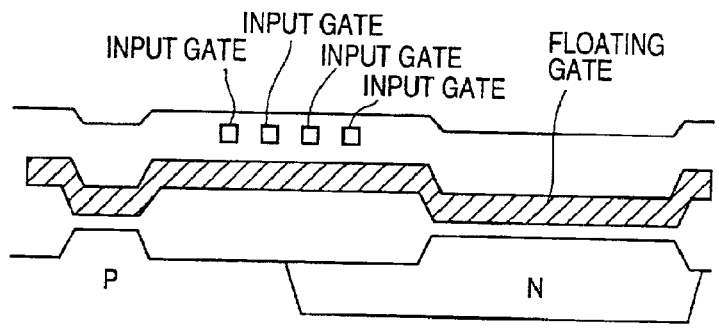
Figure 5C:
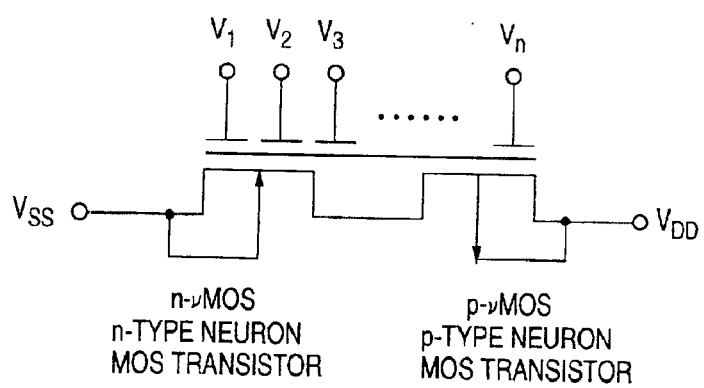

In FIG. 10A, a shaded area for each threshold state number shows fixed input numbers and an outlined area represents a part which depends on the threshold value. In addition, each source of the input value is shown in the shaded area and the outlined area. For example, when the input status number is 1, 6 is the fixed value, in which 6 is the sum of the sum (2+2=4) of inputs from TE[3] and TE[4] and an input value 2 (because the input status number is 1 and the weight is 2) from an input terminal. As shown in FIG. 9, 2 or 0 is added as an input value from TE[2] depending on the threshold value of TE[2]. Since the threshold value of TE[5] is 7, if 2 is added as the input value from TE[2], the output value from TE[5] becomes 1. On the other hand, if 0 is added as the input value from TE[2], the output value from TE[5] becomes 0. That is, as shown in FIG. 10B, depending on whether the threshold value of TE[2] is set as 1 or 3, the output value of the circuit may take 0 or 1. When the input status number is 0, the output value of TE[5] is decided depending on the threshold value of TE[1]. When the input status number is 1, the output value of TE[5] is decided depending on the threshold value of TE[2]. When the input status number is 2, the output value of TE[5] is decided depending on the threshold value of TE[3]. When the input status number is 3, the output value of TE[5] is decided depending on the threshold value of TE[4].

As mentioned above, the circuit shown in FIG. 8 can realize any symmetric function of three input variables by selecting the threshold value of each threshold element. This circuit and method can be easily extended to k input variables.

In the following, a method of selecting and storing the threshold value of each threshold element. Each threshold element can store two different threshold values each of which threshold values can be selected by one bit selection signal 1 or 0. In addition, by changing an init signal from 1 to 0 while the selection signal is being input, the threshold value can be stored.

The number of logic stages is not limited to two as shown in FIG. 8. For example, a circuit which has three logic stages can also realize any symmetric function of two input variables.

Figure 11:
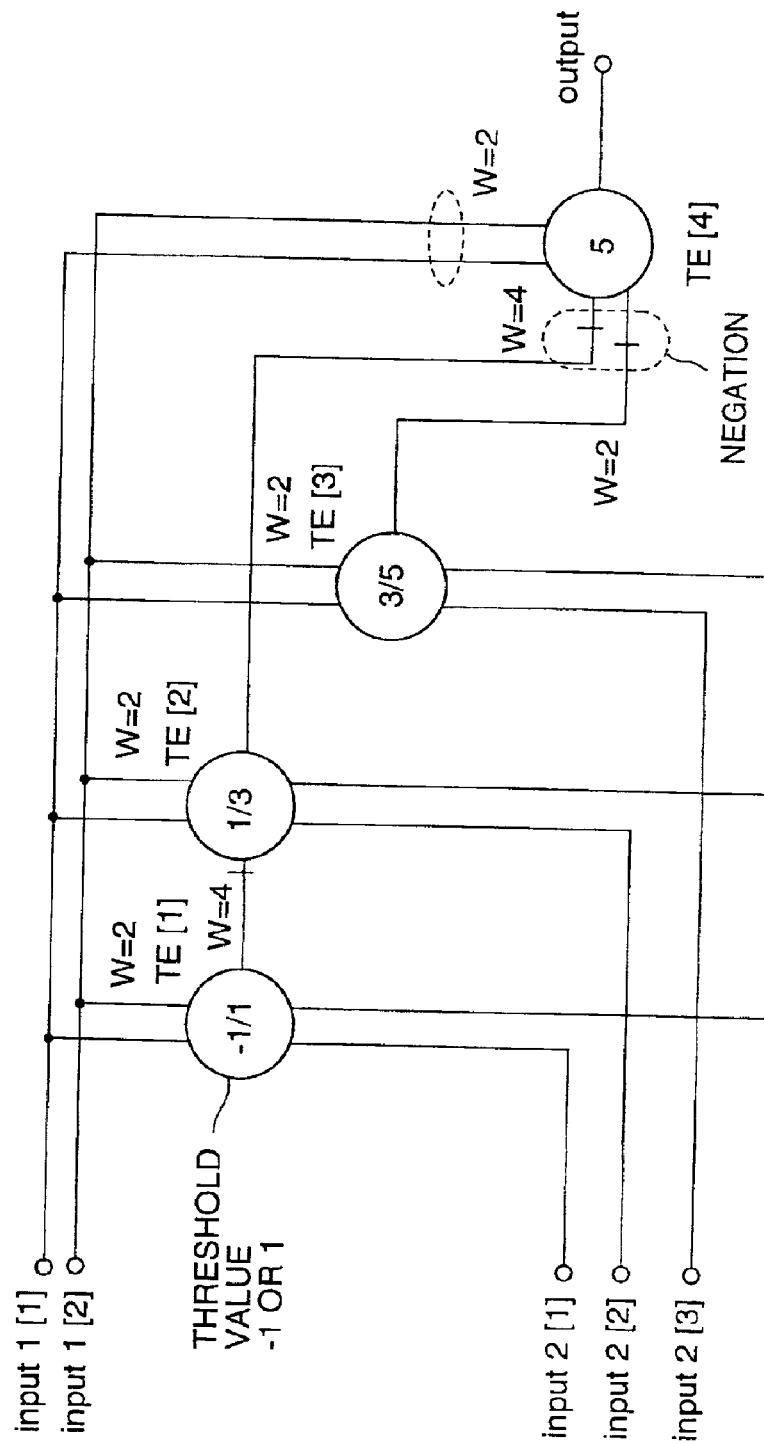
FIG. 11 shows a structure of a three stage logic circuit which includes threshold elements.

FIG. 11 shows a structure of the three stage logic circuit which includes the threshold elements. As shown in FIG. 11, the first stage includes the threshold element TE[1], the second stage includes the threshold elements TE[2] and TE[3] and the third stage includes the threshold element TE[4]. Each threshold element except one of the third stage has different two threshold values either of which values is selected by one bit selection signal. The threshold value of TE[1] is −1 or 1 which is selected by the selection signal input from the terminal input1[2]. The threshold value of TE[2] is 1 or 3 which is selected by the selection signal input from the terminal input2[2]. The threshold value of TE[3] is 3 or 5 which is selected by the selection signal input from the terminal input2[3]. The weight by which an input variable is multiplied is 2 at each of the threshold elements for each of input variables of input2[2] and input2[3]. A logically inverted value of the output value of TE[1] is input into TE[2], wherein the logically inverted value is multiplied by a weight 4. The threshold logic value of TE[4] is 5. TE[4] receives the input variables, an inverted value of the output value of TE[2] and an inverted value of the output value of TE[3] as input values, wherein the weights are 2, 4, 2 for each of the input values respectively. In addition, the threshold value of each threshold element can be stored by a signal from the init terminal in the same way as the circuit shown in FIG. 8.

FIG. 12 shows relationships between output values of threshold elements of the first and second stages, input status numbers, and threshold values. As shown in this figure, when the input status number is 1 or 2, the output value of TE[1] is always 1 regardless of the threshold value. When the input status number is 0, the output value of TE[1] is 0 or 1 depending on the threshold value. When the input status number is 0 or 1, the output value of TE[3] is always 0 regardless of the threshold value. When the input status number is 2, the output value of TE[3] is 0 or 1 depending on the threshold value. The output value of TE[2] depends on the output value of TE[1] when the input status number is 0. When the input status number is 1, TE[2] outputs 0 or 1 depending on the threshold value as shown in the figure. When the input status number is 2, TE[2] always outputs 1.

FIG. 13 shows the input values and the output values of TE[4] for each input status number, wherein the input values of TE[4] are inverted values of the output values of TE[2] and inverted values of the output values of TE[3]. As shown in FIG. 13, when the input status number is 1, the output value of TE[4] is 0 or 1 depending on the inverted value of the output value of TE[2], that is, depending on the value of the terminal input1[2]. When the input status number is 0, the output value of TE[4] is 0 or 1 depending on the inverted value of the output value of TE[2], that is, depending on the value of the terminal input1[2]. When the input status number is 1, the output value of TE[4] is 0 or 1 depending on the inverted value of the output value of TE[2], that is, depending on the value of the terminal input2[2]. When the input status number is 2, the output value of TE[4] is 0 or 1 depending on the inverted value of the output value of TE[3], that is, depending on the value of the terminal input2[3].

FIG. 14 shows relationships between the values of input1[2]~input2[3] and the output terminal, which indicates a summary of the operation of the circuit shown in FIG. 11. In the circuit shown in FIG. 11, it is assumed that the smaller threshold value is selected when the selection signal which is input into each threshold element is 1 and the larger threshold value is selected when the selection signal is 0. In FIG. 14, a short lateral line indicates that the value of the output terminal is not changed whichever the selection signal value is 0 or 1.

As mentioned above, it is understood that the three stage logic circuit can realize any symmetric function.

Next, implementations of the threshold element shown in FIG. 8 will be described.

Figure 15:
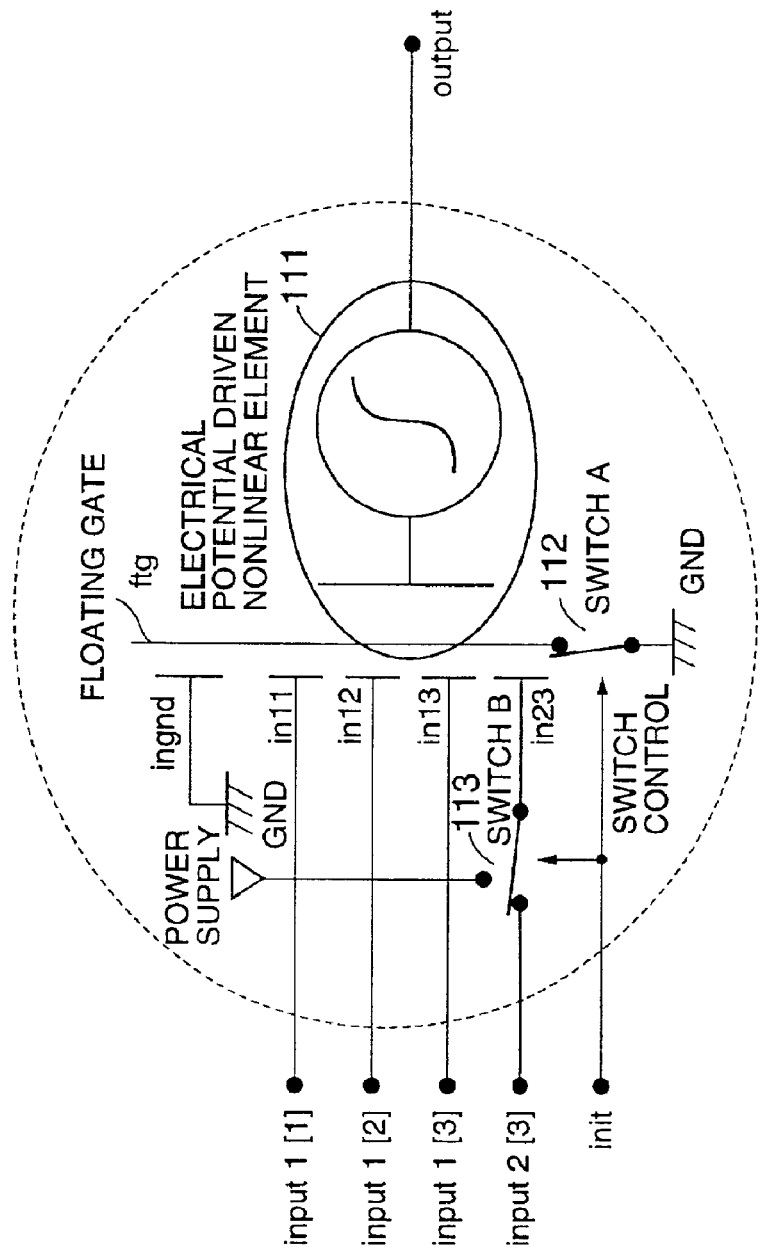
FIG. 15 shows an implementation example of the threshold element in a threshold element network shown in FIG. 8 which realizes any symmetric function.

FIG. 15 shows an implementation example of the threshold element shown in FIG. 8. The threshold element includes input terminals input1[1]~input1[3] for inputting three input variables, an input terminal input2[3] for inputting a signal which is used for selecting a threshold value, an input terminal "init" for inputting an initialization signal which is used for storing a selected threshold value, and an output terminal "output".

A plurality of input terminals (or input gates) are connected to a floating gate ftg in series via capacitances. In addition, the threshold element includes an electrical potential driven nonlinear element 111 which inputs voltage of the floating gate and outputs a processed value processed by a nonlinear function typified by a step function, a sigmoid function and the like.

The floating gate is connected to a ground via a switch A (112). The input terminal input2[3] is connected to the floating gate via a capacitance through a switch B (113). The switch A is controlled so that the switch A is connected to or disconnected from the ground. The switch A and B are synchronized so that when the switch A is connected to the ground, the switch B is connected to input2[3] and when the switch A is disconnected from the ground, the switch B is connected to a power supply.

Assuming that a capacitance value between each of input gates in11, in12, in13, in23 and the floating gate ftg is C, a capacitance value between a terminal ingnd which is connected to the ground and the floating gate is C, a capacitance value which is capacitively coupled with a floating gate in the electrical potential driven nonlinear element is much smaller than C and negligible. In addition, assuming that each voltage of the terminals input1[1]~input1[3] is $V_{11}$, $V_{12}$, $V_{13}$ respectively, a voltage of the terminal input2[3] is $V_{23}$, a voltage of the floating gate is $V_{fg}$, the power supply voltage is $V_{dd}$. Further, each of $V_{11}$~$V_{13}$ and $V_{23}$ takes only two values $V_{dd}$ or 0. Assuming that $x_{11}$, $x_{12}$, $x_{13}$, $x_{23}$ are $V_{11}$, $V_{12}$, $V_{13}$, $V_{23}$ which are normalized by $V_{dd}$ respectively, and $U_{fg}$ is $V_{fg}$ which is normalized by $V_{dd}$. In this example, the threshold value of the electrical potential driven nonlinear element is one-half of the normalized floating gate voltage $U_{fg}$. In the following, the operation of this threshold element having this condition will be described.

First, a case where the floating gate ftg is in a complete floating state, that is, when the voltage of ftg is set to 0 while 0 is input to each input gate, will be described.

In this embodiment, $V_{fg}$ and $U_{fg}$ are represented by the following formulas 9 and 10.

$$V_{fg} \sim \frac{1}{5} \cdot \left( \sum_{i=1}^{3} V_{1i} + V_{23} \right) \qquad \text{(formula 9)}$$

$$U_{fg} \sim \frac{1}{5} \cdot \left( \sum_{i=1}^{3} V_{1i} + V_{23} \right) \qquad \text{(formula 10)}$$

Therefore, when a threshold value control variable $x_{23}$ which is input from input2[3] is 0 and when $$\sum_{i=1}^{3} x_{1i}$$

which is the sum of input variables is equal to or smaller than 2, $U_{fg}$=2/5 at the maximum which is smaller than the threshold value ½. When $$\sum_{i=1}^{3} x_{1i}$$

is 3, $U_{fg}$=3/5 which is larger than the threshold value ½. Therefore, from the viewpoint of the input variable, the threshold value is between 2 and 3 of the input status number. On the other hand, when $x_{23}=1$, $U_{fg}$ becomes 3/5 even when $$\sum_{i=1}^{3} x_{1i} = 2.$$

That is, $U_{fg}$ is larger than the threshold value and the threshold value is between 1 and 2 of the input status number from the viewpoint of the input variable. As mentioned above, by keeping on retaining a voltage for the terminal input2[3], it becomes possible to select one of the two threshold values.

Next, it will be described that the selected threshold value can be stored without keeping on inputting the threshold control variable by using the switch A and switch B, wherein the threshold control variable is input from input2[3] at a time $t_0$.

First, the floating gate ftg is connected to the ground by the switch A. Then, in23 and input2[3] are connected by the switch B. This state is called that the switches are in an initial state. When the switches are in the initial state, 1 is input from input2[3] as the threshold control variable, and 0 is input from each of input1[1]~input1[3]. In this state, since the floating gate ftg is connected to the ground, Vfg=0. Next, the switch A is released so that the floating gate ftg is disconnected from the ground. After that, the switch B is connected to the power supply side so that in23 is connected to the power supply. The voltage of the in23 is not changed, which is $V_{dd}$ which is 1 as the control variable, after the switch B is switched. However, since $U_{fg}$=0, the relationship between the normalized floating gate voltage $U_{fg}$ and the input variable $x_{1i}$ can be represented by the following formula 11.

$$U_{fg} = \frac{1}{5} \cdot \left( \sum_{i=1}^{3} x_{1i} \right) \quad \text{(formula 11)}$$

Therefore, only after $$\sum_{i=1}^{3} x_{1i}$$

becomes 3, $U_{fg}$ will become larger than the threshold value.

Another case will be described next.

When the switches are in the initial state, 0 is input from input2[3] as the threshold control variable and 0 is input to each of input1[1]~input1[3]. Next, the switch A is released and the floating gate ftg is disconnected from the ground. After that, in23 is connected to the power supply by the switch B. In this case, the voltage of in23 is changed from 0 to $V_{dd}$ by switching the switch B. This corresponds to the above-mentioned case of $x_{23}=1$ where the control variable is kept continuously input. The relationship between the normalized floating gate voltage $U_{fg}$ and the input variable $x_{1i}$ is represented as the following formula 12.

$$U_{fg} = \frac{1}{5} \cdot \left( \sum_{i=1}^{3} x_{1i} + 1 \right) \quad \text{(formula 12)}$$

Therefore, $U_{fg}$ becomes larger than the threshold value only after (formula) becomes 2. As mentioned above, one of two threshold value can be selected by inputting the threshold control variable to input2[3], wherein the selected threshold value can be retained even if the input from input2[3] is stopped.

The structure shown in FIG. 15 corresponds to the threshold element TE[3] shown in FIG. 8. Each of TE[1]–TE[4] which has different threshold values can be realized, for example, by changing the ratio of the capacitance between the ingnd terminal and the floating gate to the capacitance between the input terminal and the floating gate, or by changing connection of the ingnd terminal from the ground to the power supply.

For example, for realizing TE[1], the connection of the ingnd terminal is changed to the power supply and the capacitance between the ingnd terminal and the floating gate is set to 3C. As for TE[2], the connection of the ingnd terminal is changed to the power supply and the capacitance between the ingnd terminal and the floating gate is set to C. For TE[3], it is mentioned above. For TE[4], the ingnd terminal is connected to the ground in the same way as TE[3] and the capacitance is set to 3C.

In the threshold elements TE[1]–TE[4] shown in FIG. 8, the same init signal can be used for controlling the switches in each threshold element.

Figure 16:
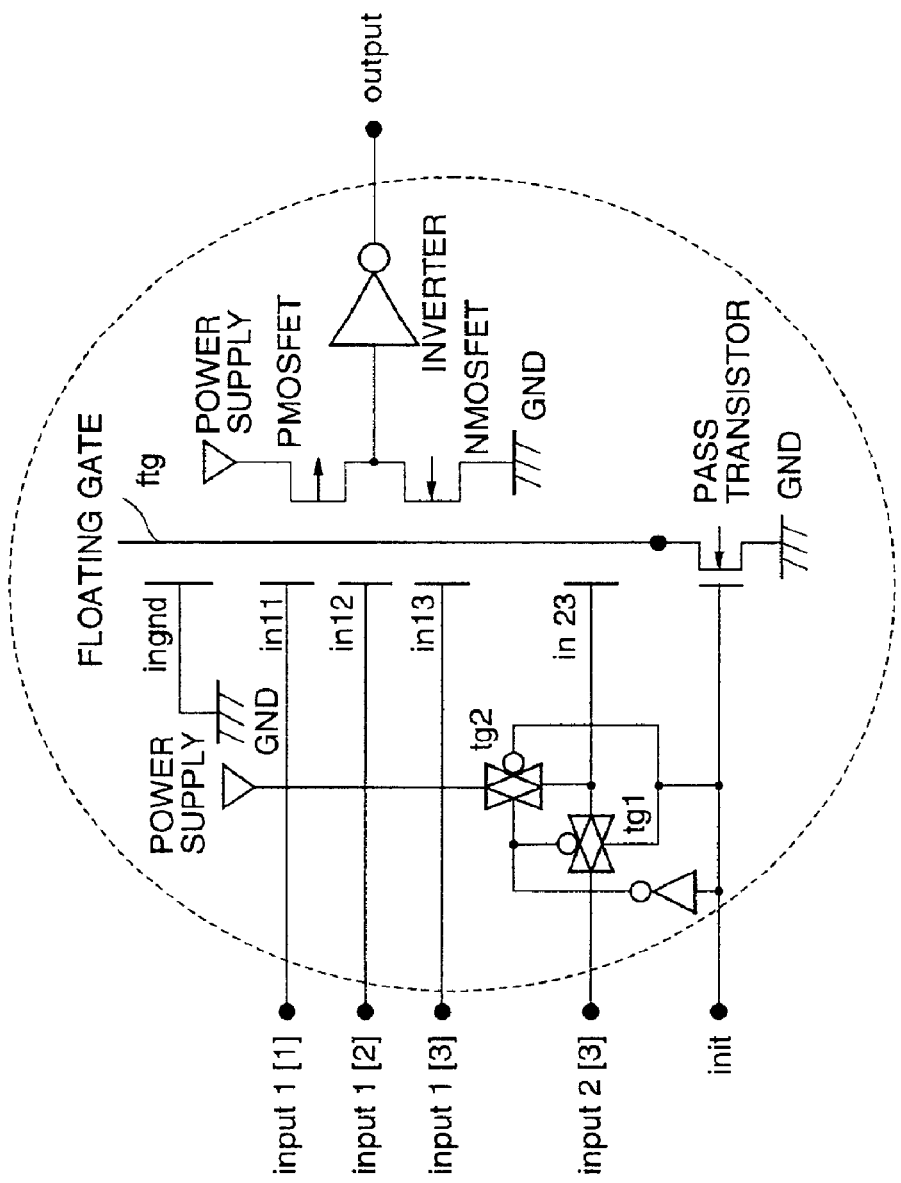
FIGS. 16 and 17 show examples of an electrical potential driven nonlinear element 111, the switch A and the switch B shown in FIG. 15.
Figure 17:
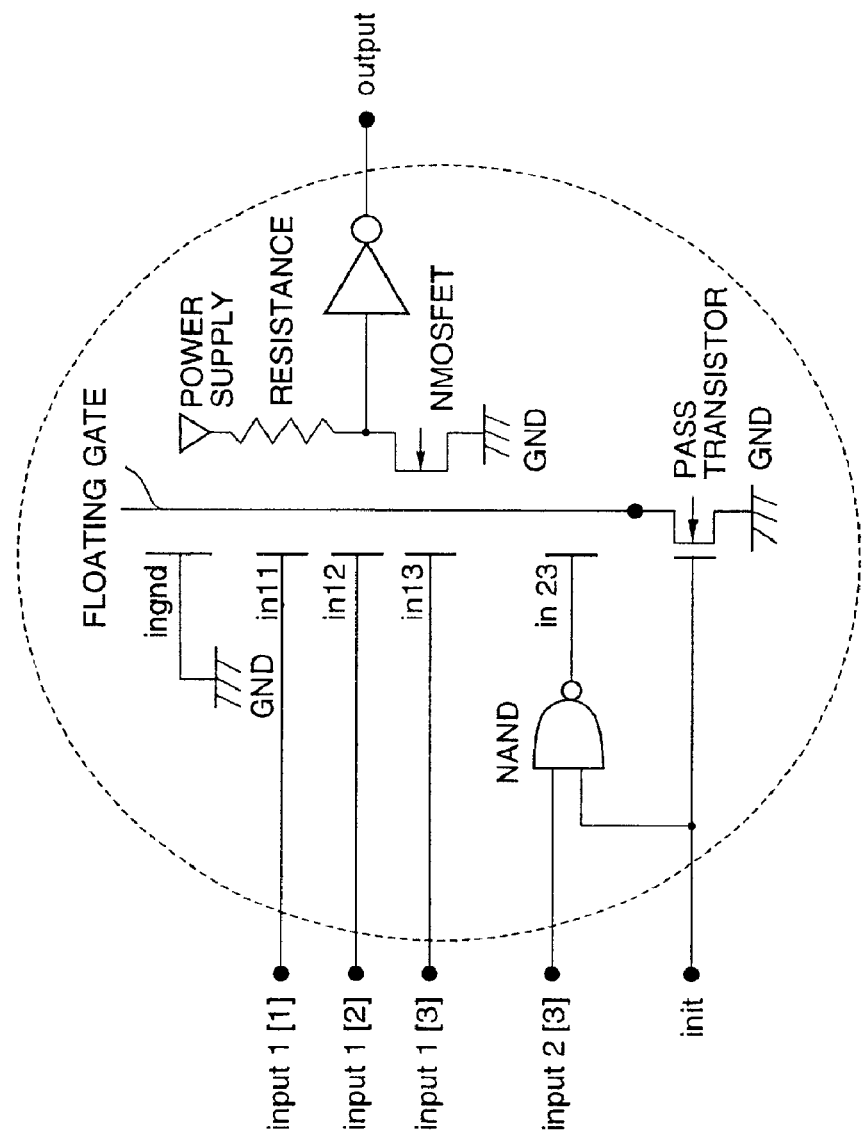

Each of FIGS. 16 and 17 shows examples of the electrical potential driven nonlinear element 111, the switch A and the switch B.

In the structure shown in FIG. 16, a CMOS inverter is used as a nonlinear element, a pass transistor is used as the switch A and transmission gates tg1, tg2 are used as the switch B. In the structure shown in FIG. 17, a resistive load type inverter is used as the nonlinear element, a pass transistor is used as the switch A and two input NAND gate is used as the switch B. When using the NAND gate, the threshold control variable value input from input2[3] is a value which is logically reversed from the vale used in the structure shown in FIG. 16 so that same effect can be obtained.

As mentioned above, a threshold element which can store one of two threshold values selectively can be realized.

(Embodiment 1-2)

Figure 18:
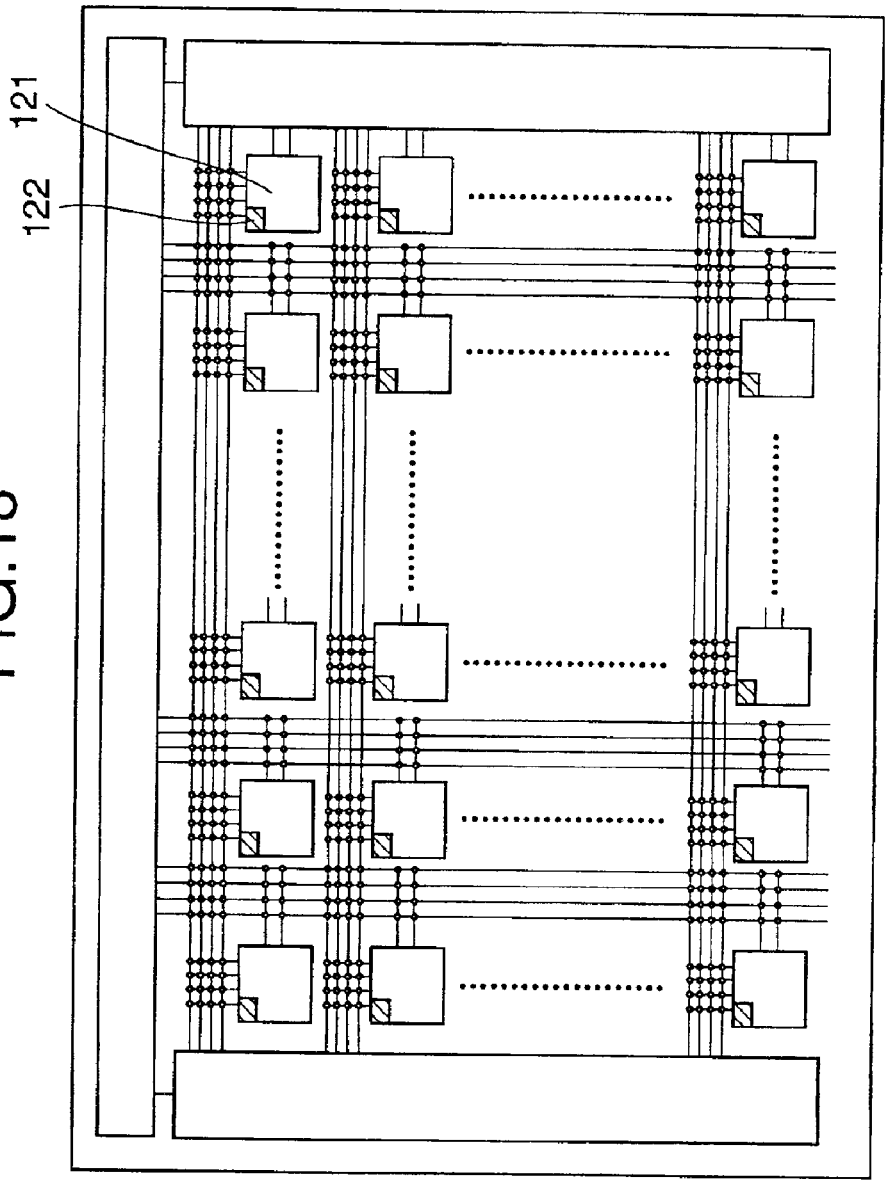
FIG. 18 shows a function reconfigurable semiconductor device wherein nonvolatile memory circuits for storing function data are distributed so that each function cell has the nonvolatile memory circuit.

FIG. 18 shows a function reconfigurable semiconductor device wherein nonvolatile memory circuits for storing function data are distributed so that each function cell has the nonvolatile memory circuit according to the embodiment 1-2 of the present invention. That is, instead of providing the nonvolatile memory circuit 102 shown in FIG. 7, the nonvolatile memory circuit 122 is provided to each function cell 121. The nonvolatile memory circuit 122 can be configured by an EEPROM circuit, a flash memory circuit, a memory circuit using a ferroelectric material or MRAM.

(Embodiment 1-3)

Figure 19:
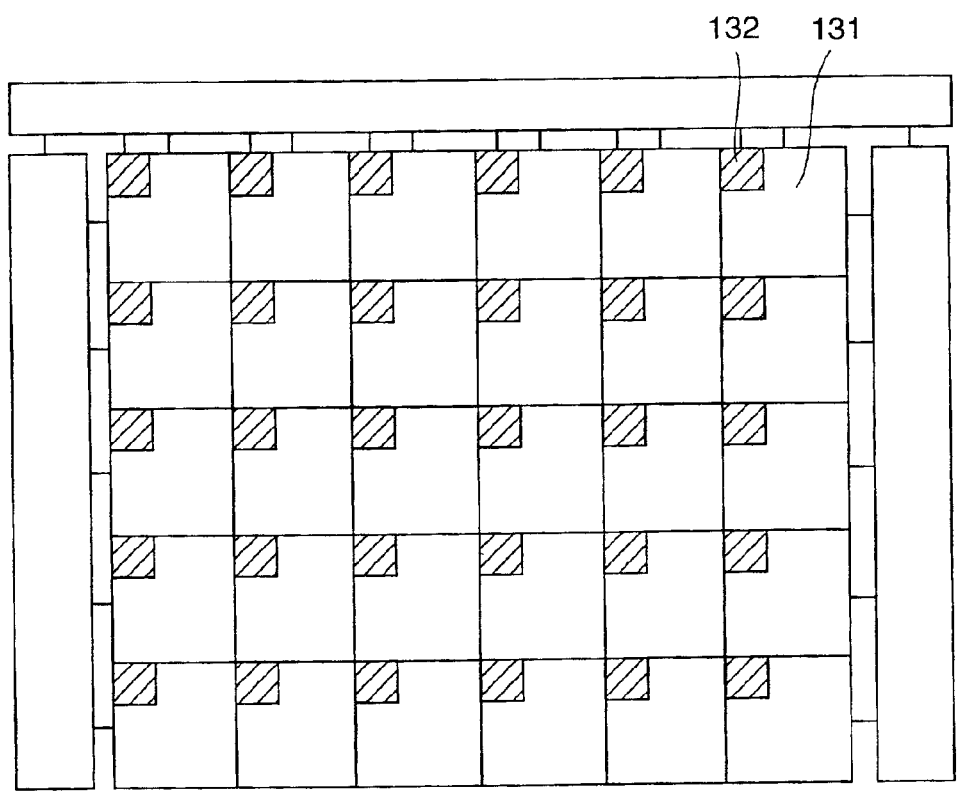
FIG. 19 shows a function reconfigurable semiconductor device wherein nonvolatile memory circuits 132 are distributed and provided in the function cells, and no wiring area exists.

FIG. 19 shows a function reconfigurable semiconductor device wherein nonvolatile memory circuits 132 are distributed and provided in the function cells, and no wiring area exists. The wiring area is not necessary since the function cells are also used as wiring for the routing of interconnections among them.

A realizing method of the wiring for the structure shown in FIG. 19 will be described with reference to FIG. 8 and FIG. 20. The structures shown in FIG. 20 and FIG. 16 are similar except that switches are added in the structure shown in FIG. 20.

Figure 20:
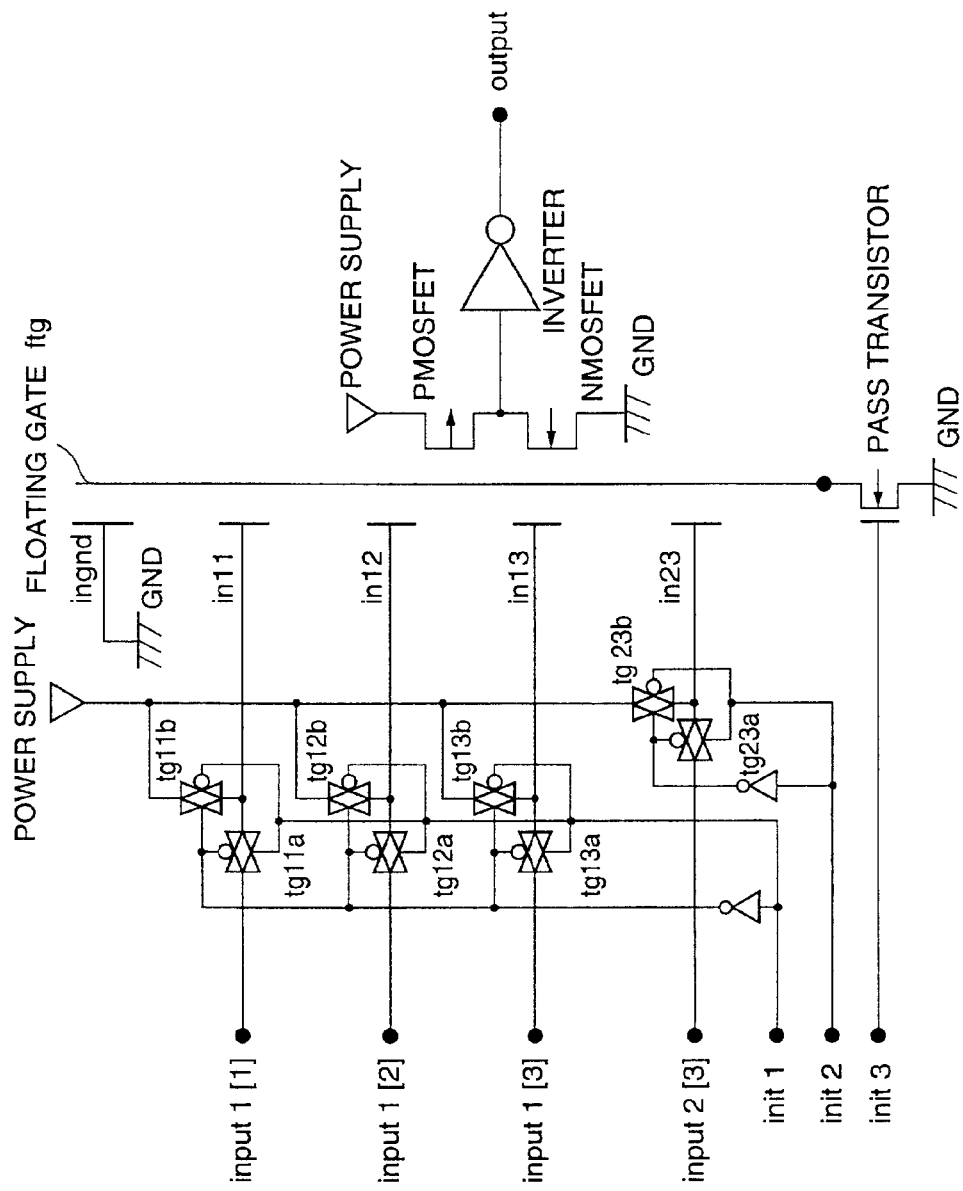
FIG. 20 shows an implementation example of the threshold element for adding wiring capability to the function cell which realizes any symmetric function and which includes the threshold element.

In the structure shown in FIG. 20, terminals input1[1]~input1[3] and input1[2]~input2[4] are configured to connect to the nonvolatile memory circuit. As mentioned before, by using the init signal shown in FIG. 8, the input variables input from the terminals input1[1]~input1[3] are stored.

That is, the input status number is fixed as a number. As described in the embodiment 1-1, the output value of the function cell is decided by the control variable input to the threshold element TE[1] from input1[2] when the input status number is 0, the output value is decided by the control variable input to the threshold element TE[2] when the input status number is 1, the output value is decided by the control variable input to the threshold element TE[3] when the input status number is 2, and the output value is decided by the control variable input to the threshold element TE[4] when the input status number is 3. That is, by fixing the input status number, a value is output from the function cell depending on one of the control variables from input1[2]~input2[4]. Therefore, by using one of the output value or a logically reversed value, wiring function can be realized wherein the control variable value becomes the value of the function cell.

FIG. 20 shows a circuit structure of the function cell realizing the above-mentioned function. "init1" is a signal terminal which controls switches. Transmission gate tg11a and tg11b constitutes one of the switches which connects in11 to input1[1] or the power supply, transmission gate tg12a and tg12b constitutes another switch which connects in12 to input1[2] or the power supply, and transmission gate tg13a and tg13b constitutes another switch which connects in13 to input1[3] or to the power supply. Each of in11~in13 is connected to the floating gate via a capacitance. "init 2" has the same function as init shown in FIG. 16. That is, "init 2" controls a signal so that in23 is connected to one of input2[3] or to the power supply. "init 3" is a terminal for a signal which synchronizes with one of init1 and init2.

When using the function cell as the wiring, input2[3] and in23 are connected by fixing to 1. "init1" is controlled and init3 is synchronized with init1. When assuming that a control variable terminal which is used as the wiring is input2[3], a value input to input2[3] is not a variable for controlling logic but a variable which is transmitted. Since input2[3] decides the output value of the function cell when the input status number is 2, a value which is logically reversed from the input variable which constitutes the input status number 2 is input at the time of initialization of the floating gate. In the initialization of the floating gate, the floating gate is connected to the ground via the pass transistor. At the time of the initialization, logical 0 is input from input2[3].

Next, 0 is input from each of init1 and init3, the pass transistor is disconnected from the ground so that the floating gate becomes an electrically insulated state. According to this operation, the function cell shown in FIG. 20 can have a function of wiring. As mentioned above, a circuit can be realized wherein the wiring area is eliminated and the function cell is used as wiring.

(Embodiment 2-1~2-10)

In the following, embodiments of the function reconfigurable integrated circuit on the basis of the principle described in the embodiment 1-1 will be described in detail, in which neuron MOS inverters are used.

(Embodiment 2-1)

Figure 21:
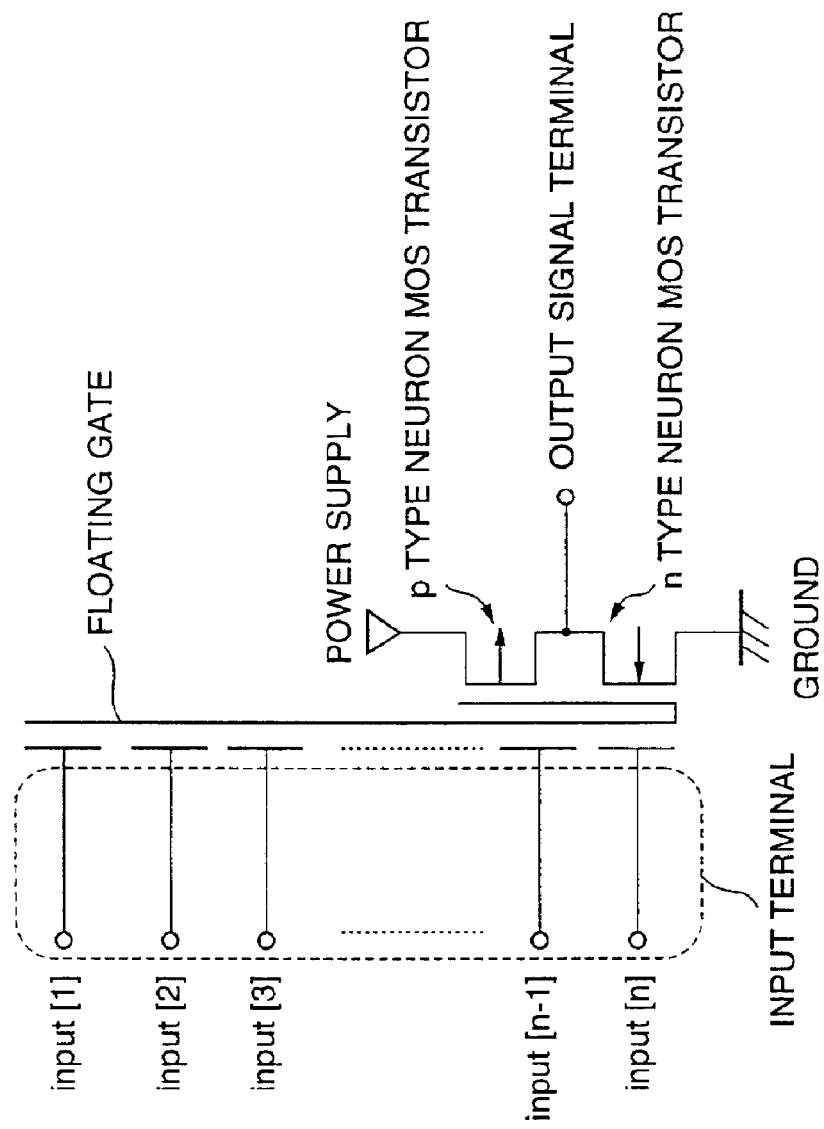
FIG. 21 is a basic circuit diagram of a neuron MOS inverter.

In this embodiment, the reconfigurable logic part in the programmable hardware like the LUTs of the configurable logic blocks in the FPGA is configured by a circuit structure which includes two stages of neuron MOS inverters. The neuron MOS inverter is shown in FIG. 21. More precisely, the reconfigurable logic part is configured by a neuron MOS circuit which includes $n (n \geq 1)$ input signal terminals input[1]~input[n] and $m (m \geq 1)$ control signal terminals ctl[1]~ctl[m]. Terminals input[1]~input[n] correspond to input1[1]~input1[3] shown in FIG. 8 and ctl[1]~ctl[m] correspond to input1[2]~input2[4] shown in FIG. 8. Each neuron MOS inverter is similar to the threshold element in FIG. 8, but, corresponds to a threshold element which does not include data storing capability.

Figure 22:
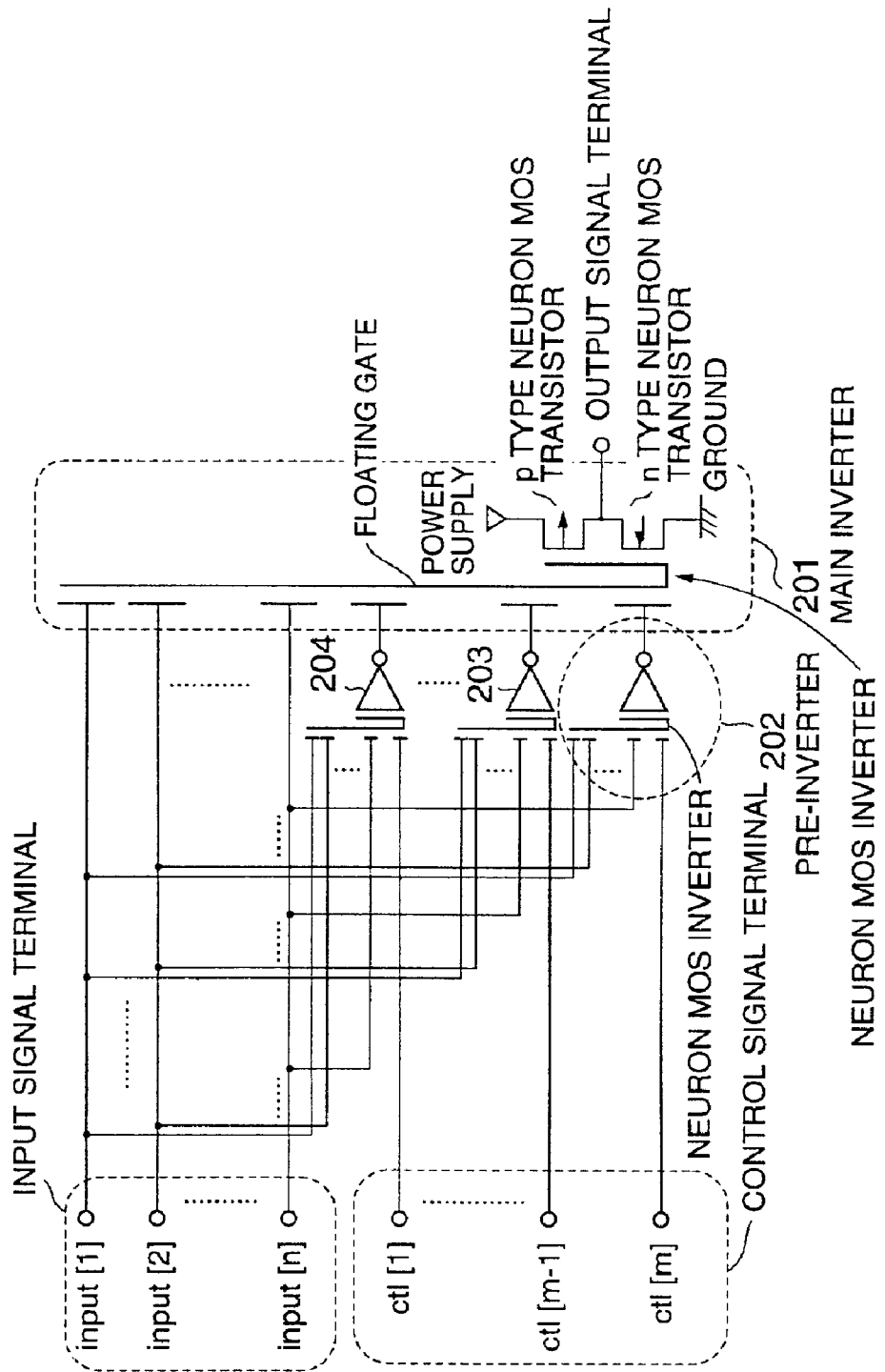
FIG. 22 shows a main structure of a neuron MOS circuit of the present invention.

As shown in FIG. 22, the neuron MOS inverter of the last (second) stage which has an output signal terminal is called a main inverter 201 and neuron MOS inverters which are in the first stage are called pre-inverters 202, , 203 , . . . , 204. In this structure, a desired logic can be decided according to a combination of control signals which are input to the pre-inverters 202, 203 , . . . , 204. If there are m control signal terminals, the number of possible combinations of two-valued control signal inputs is $2^m$. In the following, a method of storing any one of the $2^m$ combinations without providing any memory element or memory circuit to the control signal terminal will be described. In addition, circuit examples realizing the method will be described. First, a case where two input signals are used will be described.

In the beginning, "initial state" of the floating gate of the neuron MOS transistor will be defined. In this embodiment, following two cases are called "basic initial state". First, the basic initial state is a state where any electric charge does not exist in the floating gate of the neuron MOS inverter from the time right after manufacturing so that the floating gate is in the complete floating state and the sum of capacitances between the floating gate and the input terminals are much larger than capacitances between the floating gate and the electrodes of each MOS transistor. Second, the basic initial state is a state after following process is performed. That is, first, connect the floating gate to the ground while every input terminal is fixed to the ground voltage, then, release the floating gate from the ground so that the floating gate is in the floating state. The above-mentioned two cases will be called "basic initial state".

Next, the case of two input variables will be described as an example.

Figure 23:
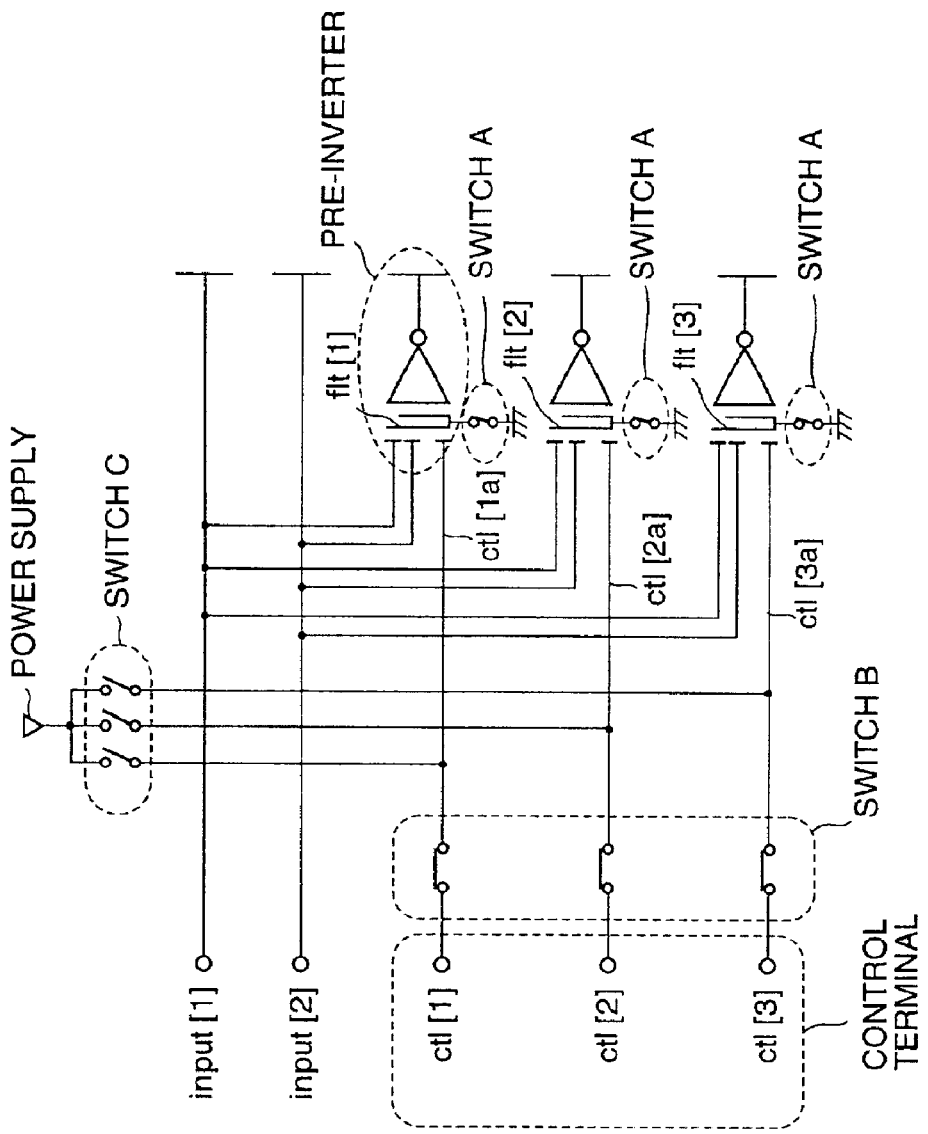
FIG. 23 is a circuit diagram of a main inverter input part wherein a logic is configured by using three control signals for two input signals.

FIG. 23 shows a structure based on the structure of FIG. 22 where the number of the input signal terminals is 2 (n=2), the number of the control signal terminals is 3 (m=3) and switches A, B and C are added, which structure corresponds to an input part of the main inverter.

When a neuron MOS circuit having the input part shown in FIG. 23 performs a logic process, assuming that a combination of necessary control signal voltages when the floating gate is in the basic initial state is represented as (Vctl[1], Vctl[2], Vctl[3])=(1,0,1) wherein a normalized voltage which is normalized by a power supply voltage is used. This vector representation will be called a function configuration data vector. Each value which is represented by the normalized voltage can corresponds to logical 1 or 0. In the structure of FIG. 23, the maximum voltage and the minimum voltage of the circuit operation are defined to be the power supply voltage and the ground voltage respectively, wherein the voltages are normalized by the power supply voltage. Instead, it is also possible to use other voltages generated in the circuit as the maximum voltage and the minimum voltage. As shown in FIG. 23, the switch A is provided between the floating gate terminal and the ground terminal of each pre-inverter, and the switch B is provided between each control signal terminal and each control signal terminal of the pre-inverter. To distinguish the control signal terminals of the pre-inverter side from the control signal terminals (ctl[1], ctl[2], ctl[3]), the control signal terminals of the pre-inverter side will be called control signal input terminals (ctl[1a], ctl[2a], ctl[3a]). The switch C is provided between the power supply and each control signal input terminal.

The operation is as follows. First, the switch C is released and the switches A and the switches B are set connected. By connecting the switch A to the ground, the normalized voltages of the floating gates of the pre-inverters become (Vflt[1], Vflt[2], Vflt[3])=(0,0,0). This vector representation will be called a second vector. Next, ground voltage is applied to the two input signal terminals input[1], input[2], then, normalized voltages (Vctl[1], Vctl[2], Vctl[3])=(0,1,0) which are inverted signals of the control signals necessary when the floating gate is in the basic initial state are applied to the control signal terminals ctl[1]~ctl[3]. This vector representation will be called a third vector. By releasing the switches A and B in this state, each pre-inverter is initialized in which normalized voltages of the control signals are (Vctl[1], Vctl[2], Vctl[3])=(0,1,0).

Next, connect the switches C to the power supply so that all of the control signal input terminals are connected to the power supply. At this time, actual normalized voltages of the control signal input terminals of the pre-inverters are (Vctl[1a], Vctl[2a], Vctl[3a])=(1,1,1). This vector representation will be called a first vector. Although the actual normalized voltages are shown above, the normalized voltages are equivalent, from the view point of the floating gates of the pre-inverters, to the normalized voltages of the control signals necessary when the floating gate is in the basic initial state. That is, the function configuration data vector is stored as a difference between the sum of the first vector and the second vector, and the third vector.

Next, a method which generalizes this method will be described. In the structure shown in FIG. 24, voltages of m control signals corresponding to m pre-inverters, that is, the voltages of the control signal input terminals ctl[1a]~ctl[ma], and the floating gates flt[1a]~flt[ma] are defined as follows. The second vector which represents normalized voltages of floating gates flt[1]~flt[m] is described as a formula 13.

$$Vflt = \begin{pmatrix} Vflt[1] \\ Vflt[2] \\ Vflt[3] \\ \vdots \\ Vflt[m] \end{pmatrix} \quad \text{(formula 13)}$$

When the switches B are connected and the switches C are released, the third vector Vctl which shows normalized voltages which are applied to the control terminals is described as a formula 14.

$$Vctl = \begin{pmatrix} Vctl[1] \\ Vctl[2] \\ Vctl[3] \\ \vdots \\ Vctl[m] \end{pmatrix} \quad \text{(formula 14)}$$

When the switches B and the switches A are set to be released and the switches C are set to be connected, that is, when the floating gates flt[1]~flt[m] are in a floating state, the first vector Vctla which shows normalized voltages, relative to the ground, of the control signal terminals is described as a formula 15.

$$Vctla = \begin{pmatrix} Vctl[1a] \\ Vctl[2a] \\ Vctl[3a] \\ \vdots \\ Vctl[(m)a] \end{pmatrix} \quad \text{(formula 15)}$$

A vector Vrel which shows relative normalized voltages of the control signal terminals from the viewpoint of the floating gates flt[1]~flt[m] is described as a formula 16.

$$Vrel = \begin{pmatrix} Vrel[1] \\ Vrel[2] \\ Vrel[3] \\ \vdots \\ Vrel[m] \end{pmatrix} \quad \text{(formula 16)}$$

At this time, the relationship between the vectors can be represented as a following formula 17.

$$Vrel = Vctla + Vflt - Vctl \quad \text{(formula 17)}$$

When a function configuration data vector which is normalized voltages for function configuration data which is desired to store is represented as Vcfg, it can be said that the function configuration data is stored if Vcfg equals to Vrel. At this time, the relationship can be represented as a following formula 18.

$$Vcfg = Vrel - Vctla + Vflt - Vctl \quad \text{(formula 18)}$$

At the time of initialization, that is, when the voltages of the control signal terminals of all pre-inverters are fixed at the power supply voltage and the switches A are connected to the ground, the first vector and the second vector can be represented as following formulas 19 and 20 respectively if the voltages of the floating gates flt[1]~flt[m] of the pre-inverters are fixed to the ground voltage.

$$Vctla = \begin{pmatrix} 1 \\ 1 \\ 1 \\ \vdots \\ 1 \end{pmatrix} = E \quad \text{(formula 19)}$$

$$Vflt = \begin{pmatrix} 0 \\ 0 \\ 0 \\ \vdots \\ 0 \end{pmatrix} = 0 \quad \text{(formula 20)}$$

Therefore, the third vector which shows normalized voltages at the time of initialization for realizing a logic is represented as a following formula 21.

$$Vctl = E + 0 - Vcfg = V'crg \quad \text{(formula 21)}$$

In this formula, V'crg is a voltage vector where each "1" in Vctl is replaced by "0" and each "0" in Vctl is replaced by "1". So far, normalized voltages are used for the elements of the vectors. When the normalized voltage is two-valued, that is, 1 or 0, the elements of a vector of the function configuration data can be considered as Boolean variables. Considering the elements as the Boolean variables, V'ctl is an inversion of Vctl. Accordingly, it is understood that the function configuration data can be stored by inputting an inverted vector of the desired function configuration data at the time of the basic initial state when the first vector is E and the second vector is 0.

According to the conventional method, since data which constitutes the logic function includes both of 1 and 0, it is necessary that memory elements or memory circuits store the function configuration data. On the other hand, according to the present method, an additional memory element or memory circuit is not necessary for each pre-inverter. This is because the above-mentioned method adopts a method of fixing the voltages of all control signal terminals to a voltage when performing function processing. Therefore, according to the present invention, a combination of the control signals for realizing a logic can be stored without providing any new memory element or memory circuit other than the neuron MOS circuit when electric power is supplied.

In the following, circuit simulation of the operation of storing the control signal voltages will be described.

In the circuit simulation, a neuron MOS circuit which has two input signals and three control signals is used.

Figure 25:
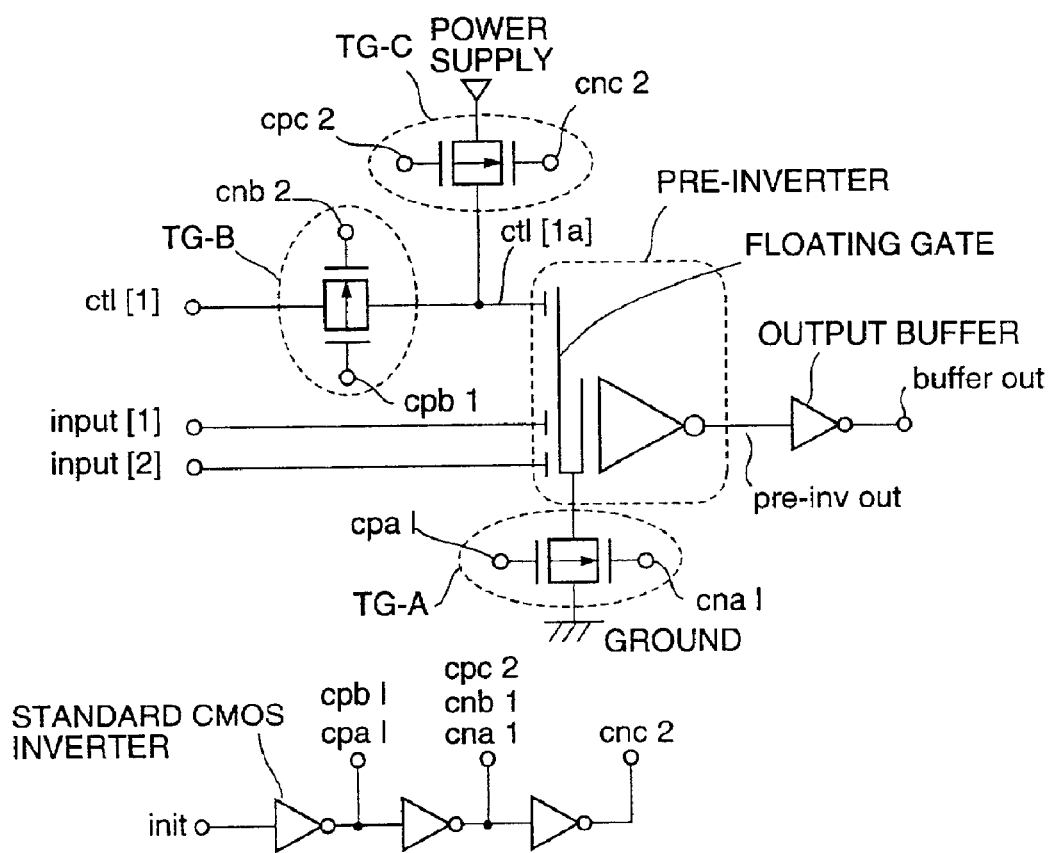
FIG. 25 is a circuit diagram of a main part of a circuit which can store control signals input to pre-inverters.

FIG. 25 shows a circuit which is used for the simulation. The circuit shown in FIG. 25 is based on one of pre-inverters shown in FIG. 23. The circuit shown in FIG. 25 is configured such that the switch A, B and C shown in FIG. 23 are replaced by transmission gates TG-A, TG-B, TG-C respectively and an output buffer is provided at the output terminal of the pre-inverter. Each of these transmission gates can be replaced by a pass transistor of a MOS transistor. Switching between continuity and interruption of the transmission gates TG-A, TG-B, TG-C is performed by control signals applied to transmission gate control signal terminals (cpal, cnal), (cpbl,cnbl) and (cpc2, cnc2) respectively. These control signals are generated by signals from an initialization signal terminal init by using standard CMOS inverters. In this simulation, the control signals are generated by the multistage standard CMOS inverters shown in FIG. 25. It is also possible to generate each control signal by a different circuit or to supply each control signal from outside. TG-A and TG-B conduct or are interrupted in synchronization. TG-C becomes a state which is opposite to the state of TG-A and TG-B after a delay time.

Figure 26:
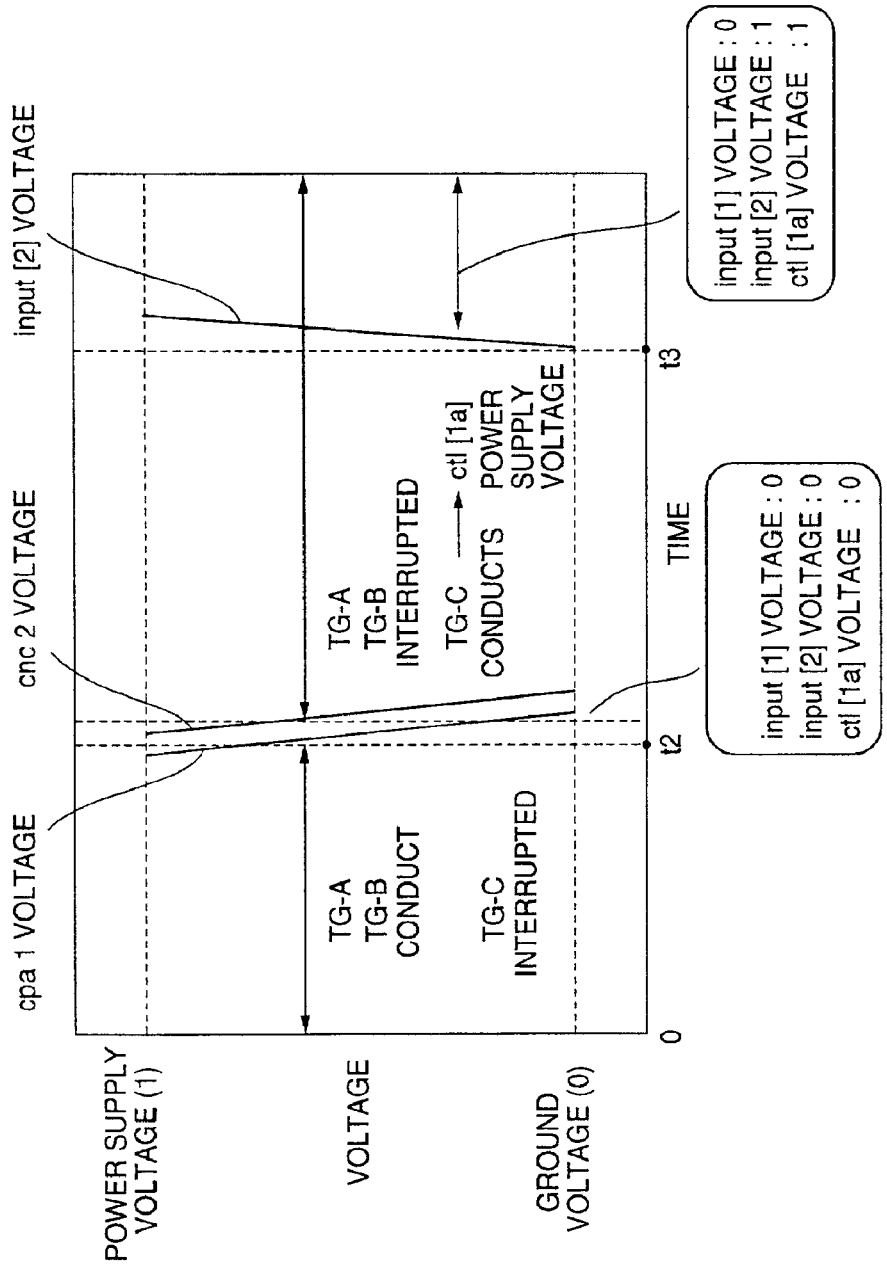
FIG. 26 is a timing chart in a case when initialization is performed while the control signals are fixed to the ground voltage.

A method for storing "1", which is the power supply voltage, in the circuit shown in FIG. 25 will be described with reference to FIG. 26. At the time 0, each voltage of the input signal terminals input[1], input[2] and the control signal terminal ctl[1] is set as the ground voltage, the transmission gates TG-A, TG-B are set to continuity state and TG-C is set to interrupted. Then at a time t2(t2>0), TG-A and TG-B are set to the interruption state. Then, TG-C is set to the continuity state. After the time t2, the control signal terminal ctl[1a] becomes the power supply voltage, and the floating gate becomes a voltage due to capacitive coupling between the floating gate and the control signal input terminal ctl[1a]. Further, at the time of t3(t3>t2), the voltage of the input signal terminal input[2] is set to the power supply voltage. At this time, two of the three input terminals of the pre-inverter become the power supply voltage. Therefore, the pre-inverter outputs a value near the ground voltage which is a inverted voltage of the power supply voltage if the threshold voltage of the pre-inverter is set to be about half of the power supply voltage. In this case, the output buffer which is added to the pre-inverter only for the circuit simulation outputs the power supply voltage which is inverse of the output of the pre-inverter.

Figure 27:
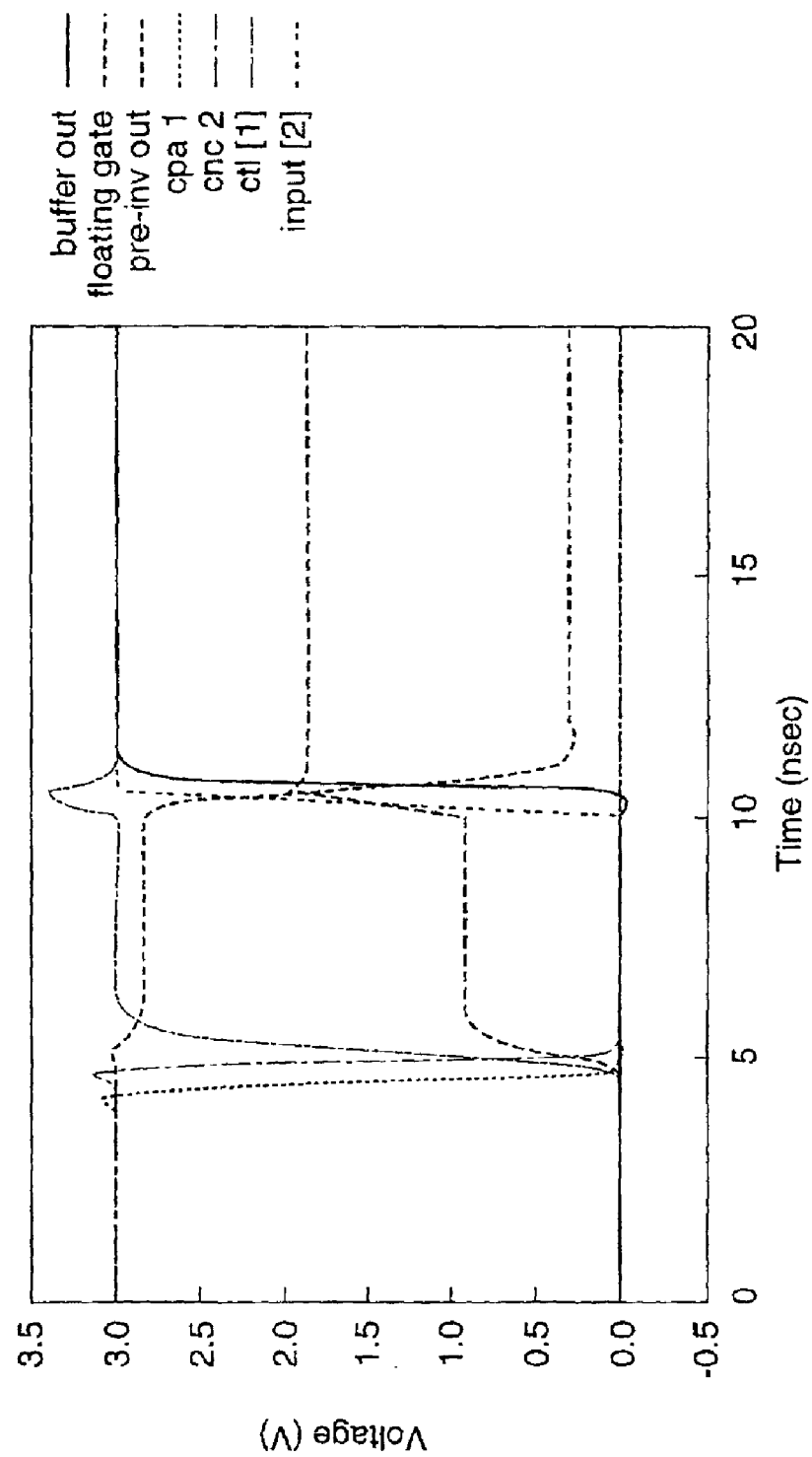
FIG. 27 is a waveform chart, by a circuit simulation, which shows voltage changes of terminals with respect to time in a case when initialization is performed while the control signals are fixed to the ground voltage.

As mentioned above, the floating gate is initialized by using 0 which is an inverted voltage of 1 which is necessary for function configuration and the control signal terminal ctl[1a] is connected to the power supply for storing the control signals properly. The result of the circuit simulation of this operation is shown in FIG. 27. As shown in FIG. 27, it can be understood that the voltage of the floating gate varies according to the states (continuity or interruption) of TG-A, TG-B, TG-C, and that the voltage of the floating gate further increases so that the output of the floating gate is inverted when the voltage of the input signal terminal input[2] becomes the power supply voltage.

Figure 28:
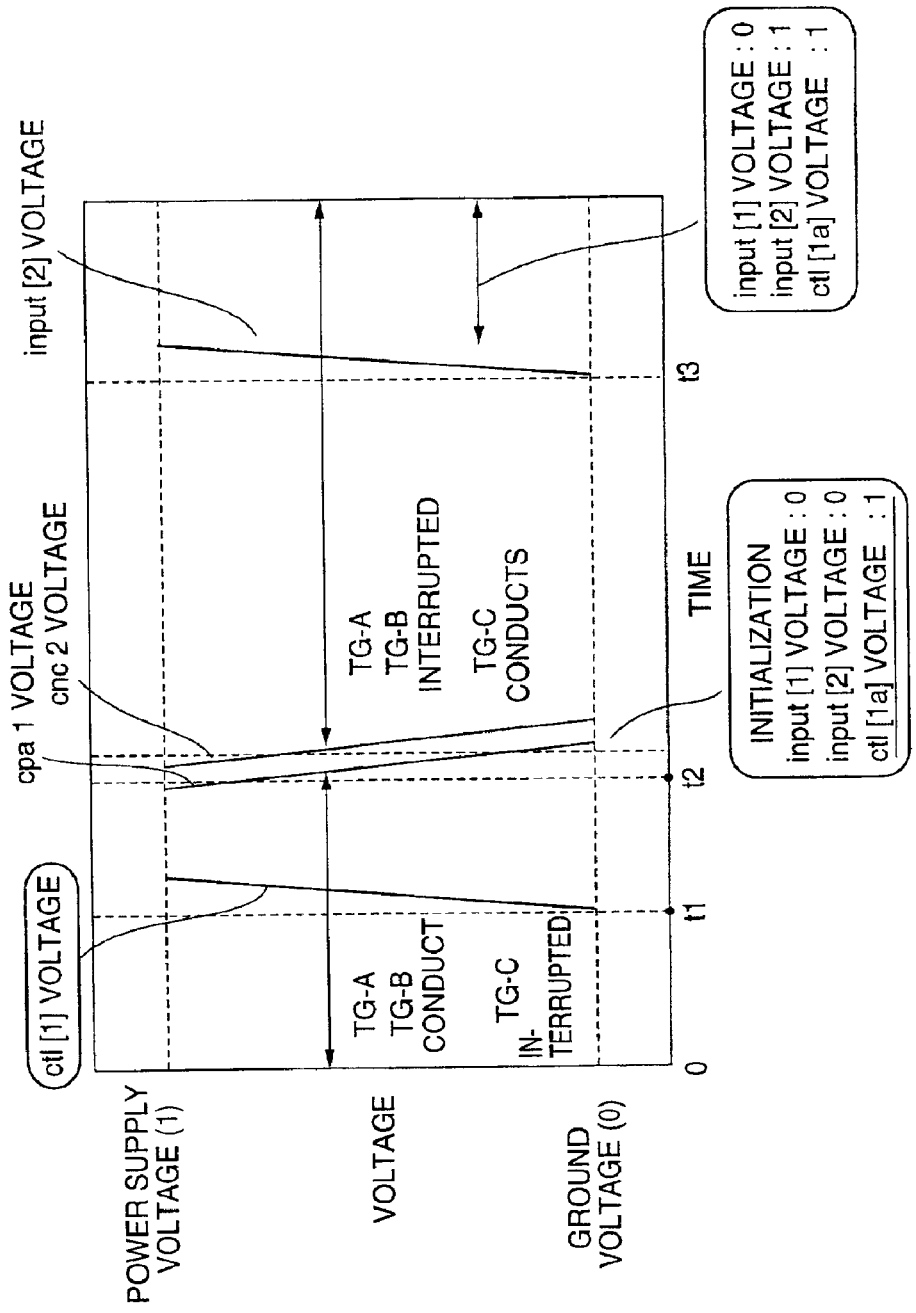
FIG. 28 is a timing chart in a case when initialization is performed while the control signals are fixed to the power supply voltage.
Figure 29:
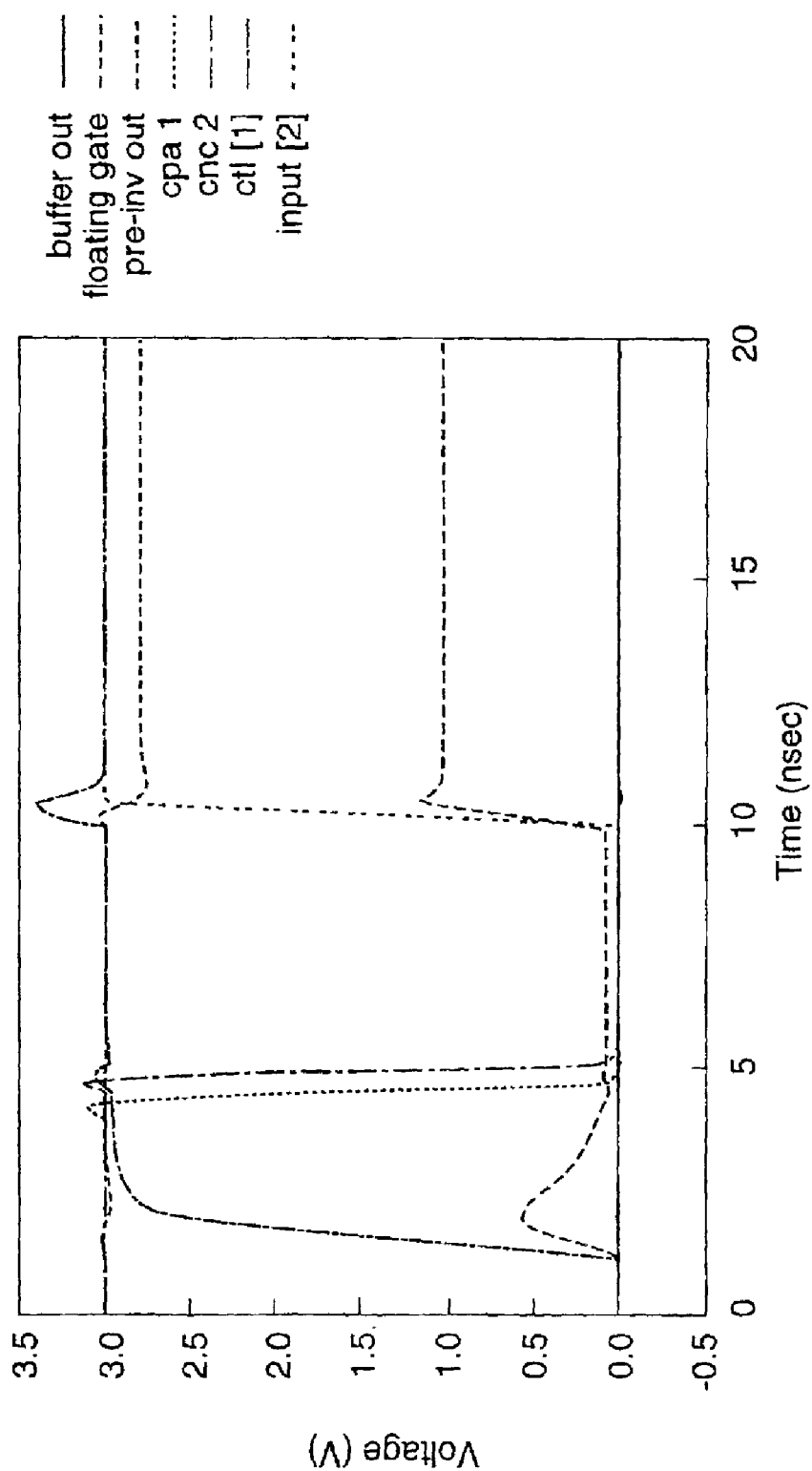
FIG. 29 is a waveform chart, by a circuit simulation, which shows voltage changes of terminals with respect to time in a case when initialization is performed while the control signals are fixed to the power supply voltage.

In the following, a method of storing a state where the voltage of the control signal is 0 will be described with reference to FIG. 28. In this case, the state at the time of 0 is the same as the case shown in FIG. 26, but the method of initialization of the floating gate is different. In FIG. 28, the voltage of the control signal terminal ctl[1] is fixed to be the power supply voltage at the time t1(0<t1<t2) when TG-A and TG-B are in the continuity state. At the time t2 after a delay time from t1, each of TG-A and TG-B is interrupted, then TG-C is set to conducting. At this time, the voltage of the control signal input terminal ctl[1a] does not vary before and after the time t2. Since the floating gate is connected to the ground from the time t1 to the time t2, the voltage of the floating gate is near the ground voltage. At the time t3, the power supply voltage is applied to the input signal terminal input[2]. At this time, although the voltage of the input signal terminal input[2] and the control signal input terminal ctl[1a] are the power supply voltage which is the same as the case shown in FIG. 26, the output of the pre-inverter dose not change before and after the time t3. The result of the circuit simulation of this operation is shown in FIG. 29. The result shown in FIG. 29 represents a case same as the case wherein, after the voltages of the input signal terminals input[1], input[2] and the control signal terminal ctl[1] are fixed at the ground voltage so that the floating gate is initialized, the floating gate is disconnected from the ground, then, the voltage of the input signal terminal input[2] is changed to the power supply voltage.

Figure 24:
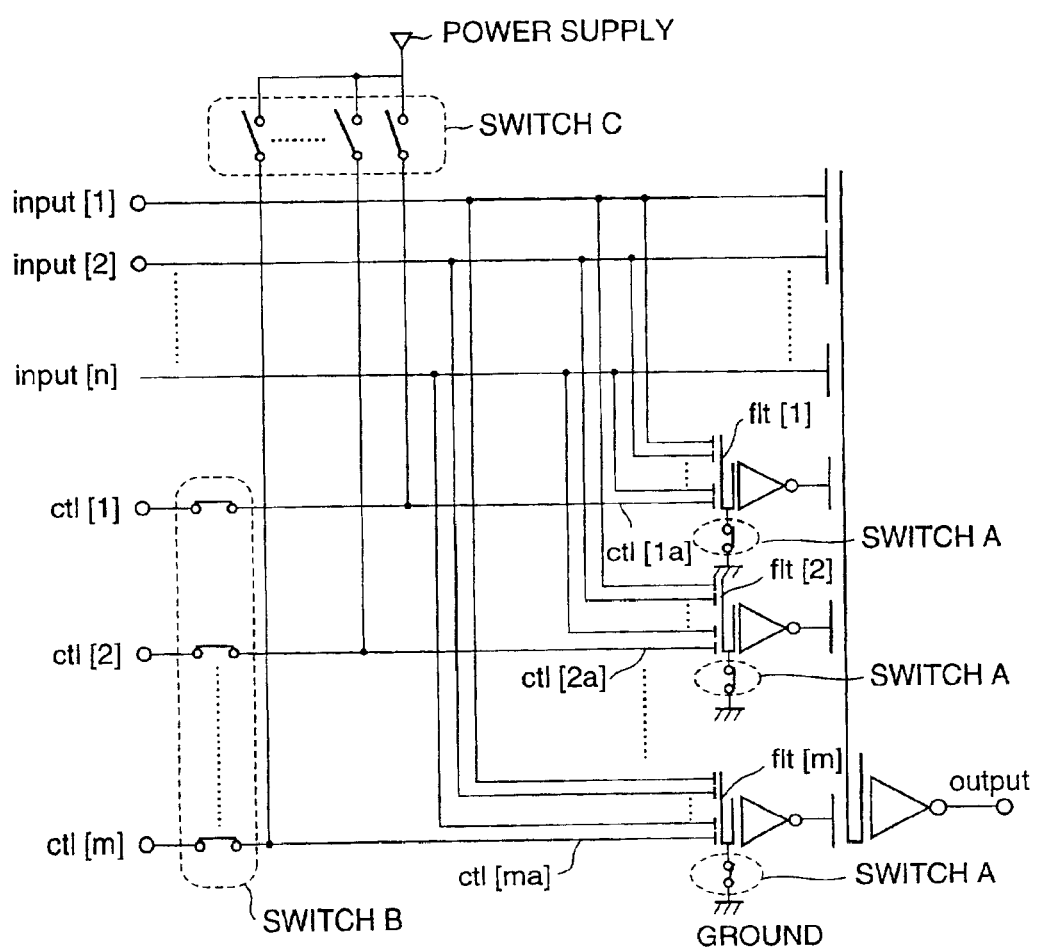
FIG. 24 is a conceptual diagram of a neuron MOS circuit having data storing capability.
Figure 30:
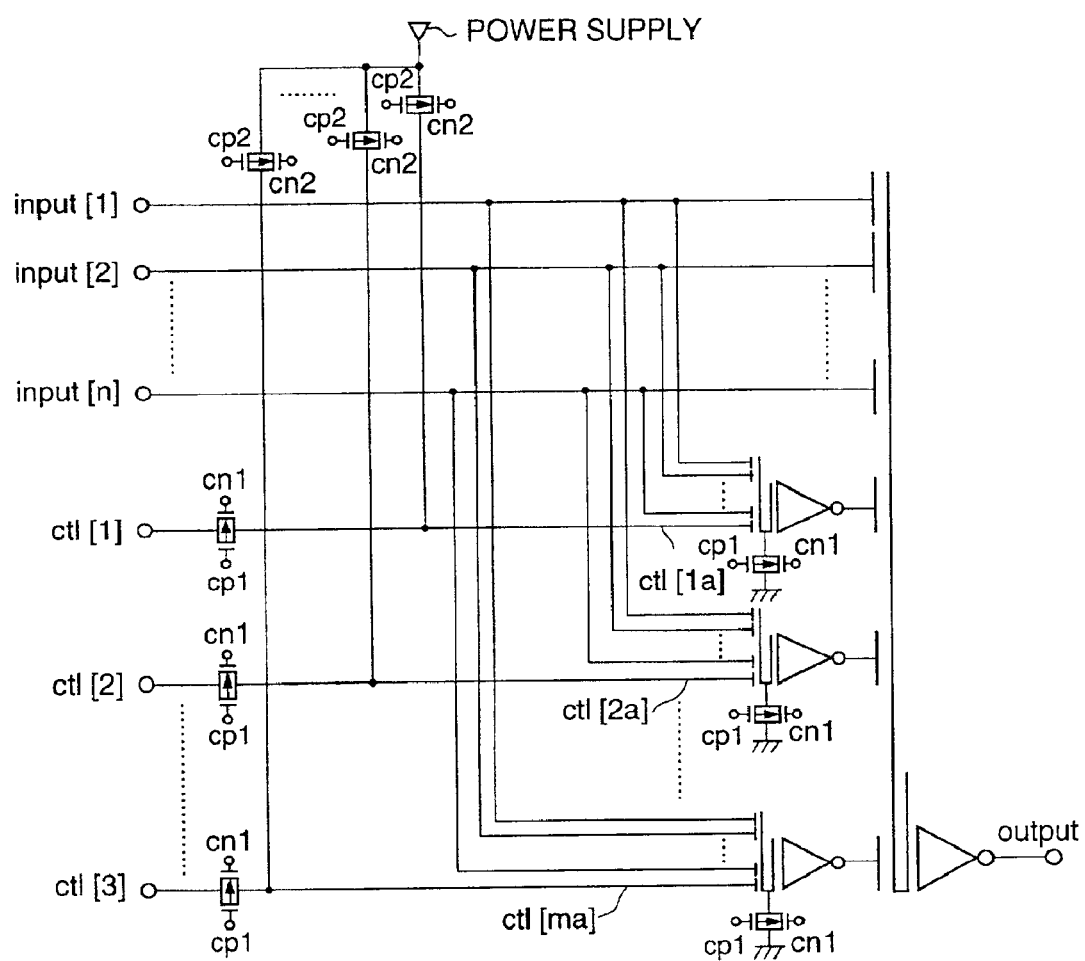
FIG. 30 shows a neuron MOS circuit which has a function of storing states of control signals.

FIG. 30 shows an example of the neuron MOS circuit which has the above-mentioned function of storing the function configuration data. This circuit is configured such that each switch in the circuit shown in FIG. 24 is replaced by a transmission gate which is one of electrical switches. These transmission gates switche between conduction and interruption according to control signals applied to transmission gate control signal terminals cp1, cp2, cn1, cn2. Each of the transmission gates can be replaced by a MOS transistor used as a pass transistor.

Figure 31:
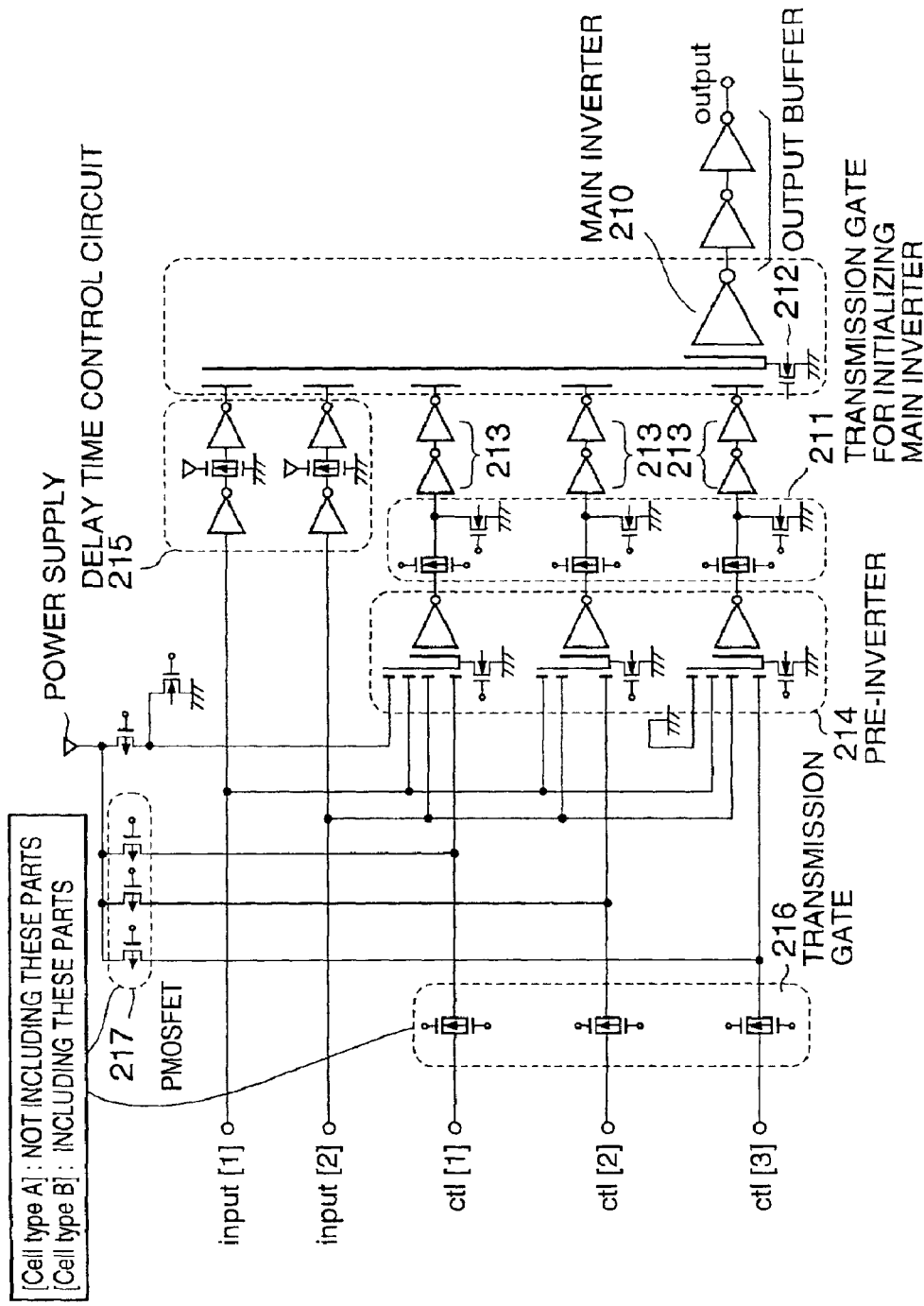
FIG. 31 shows a neuron MOS circuit for two input signals which has a function configuration data storing capability.

Next, a circuit simulation will be shown, in which a neuron MOS circuit which uses two input signal is used. In this circuit simulation, it is shown that the function configuration data storing method of the present invention is effective for a function reconfigurable circuit. The neuron MOS circuit used for this circuit simulation is shown in FIG. 31. The neuron MOS circuit shown in FIG. 31 is configured such that transmission gates (TG) 211 for initializing the floating gate of the main inverter, a pass transistor 212 which is connected to the ground and inverters 213 having two stages for wave shaping are added to the neuron MOS circuit shown in FIG. 30. In the circuit shown in FIG. 31, the inverters 212 are located after the pre-inverters 214 and a delay time control circuit 215 which includes two transmission gates and four inverters is added to the two input terminal of the main inverter 210. In addition, in order to configure a logic, a circuit for the input terminals to connect to the power supply or a circuit for the input terminals to connect to the ground is added.

Figure 32:
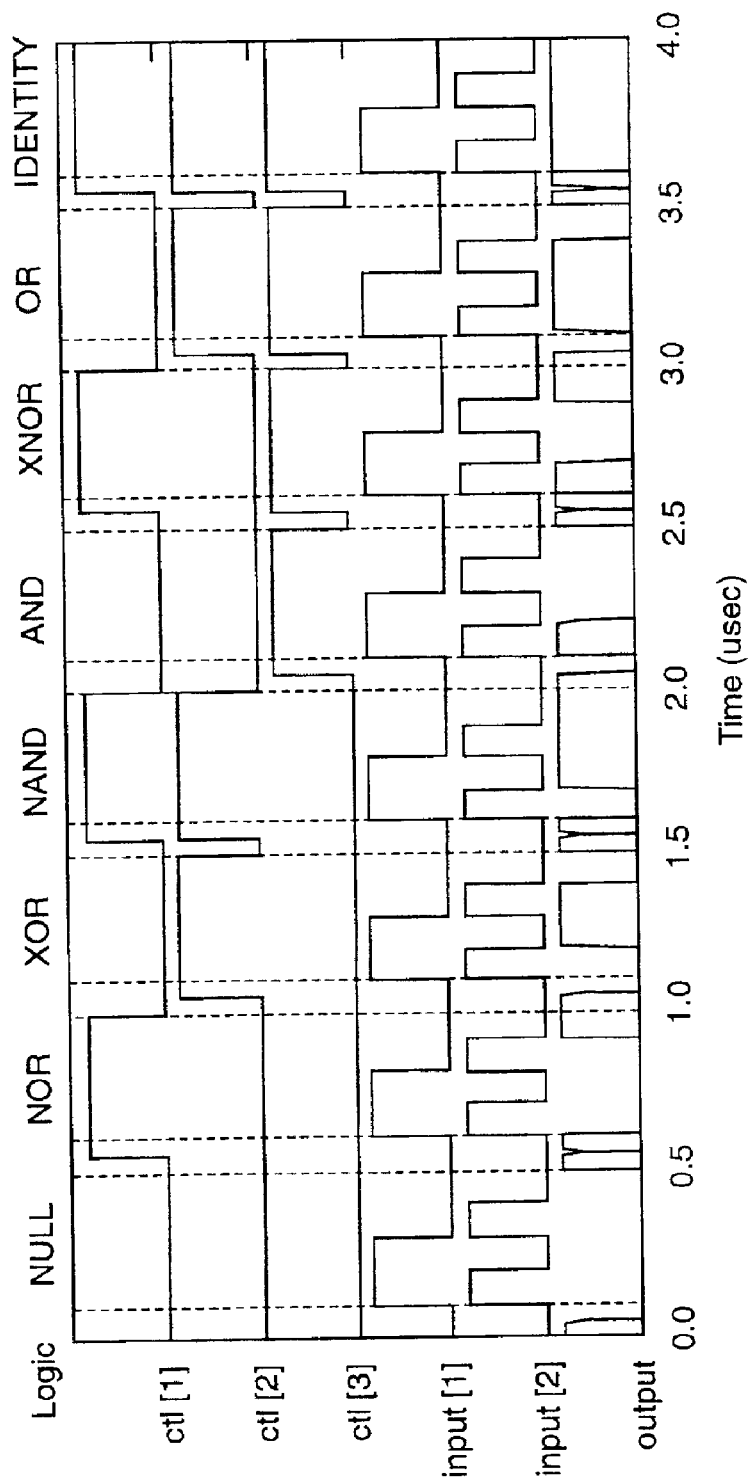
FIG. 32 is a waveform chart which shows change of terminal voltages by a circuit simulation when a cell type A is used and the floating gate is in the basic initial state.

In FIG. 31, a circuit which uses transmission gates 216 and PMOSFET transistors 217 is called a cell type B, wherein the transmission gates 216 connect the control signal terminals ctl[1], ctl[2], ctl[3] to transmission gates and the transistors 217 connect the control signal input terminals to the power supply. A circuit which does not use the transmission gates 216 and the PMOSFET transistors 217 is called a cell type A. As for cell type A, the pre-inverters 214 are initialized by setting all input terminals to the ground voltage, and, then, setting the floating gate to the ground voltage so that the floating gate becomes the floating state. As for the cell type B, the floating gates of the pre-inverters 214 are initialized according to the method of the present invention in which the function configuration data is stored. FIG. 32 shows a relationship between time and the waveform for each terminal in the case of cell type A. In the figure, the lateral axis indicates time (μsec which means $10^{-6}$ second). The same abbreviation (μsec) will be used in the following figures. The vertical axis indicates, from above, logic names, the voltage of ctl[1], the voltage of ctl[2], the voltage of ctl[3], the voltage of input[1], the voltage of input[2] and the voltage of the output terminal output. In the simulation result shown in FIG. 32, the floating gates are initialized during a time when the logic changes. As shown in this figure, it is understood that desired logic functions are realized by combining the voltages of the control signal terminals.

Figure 33:
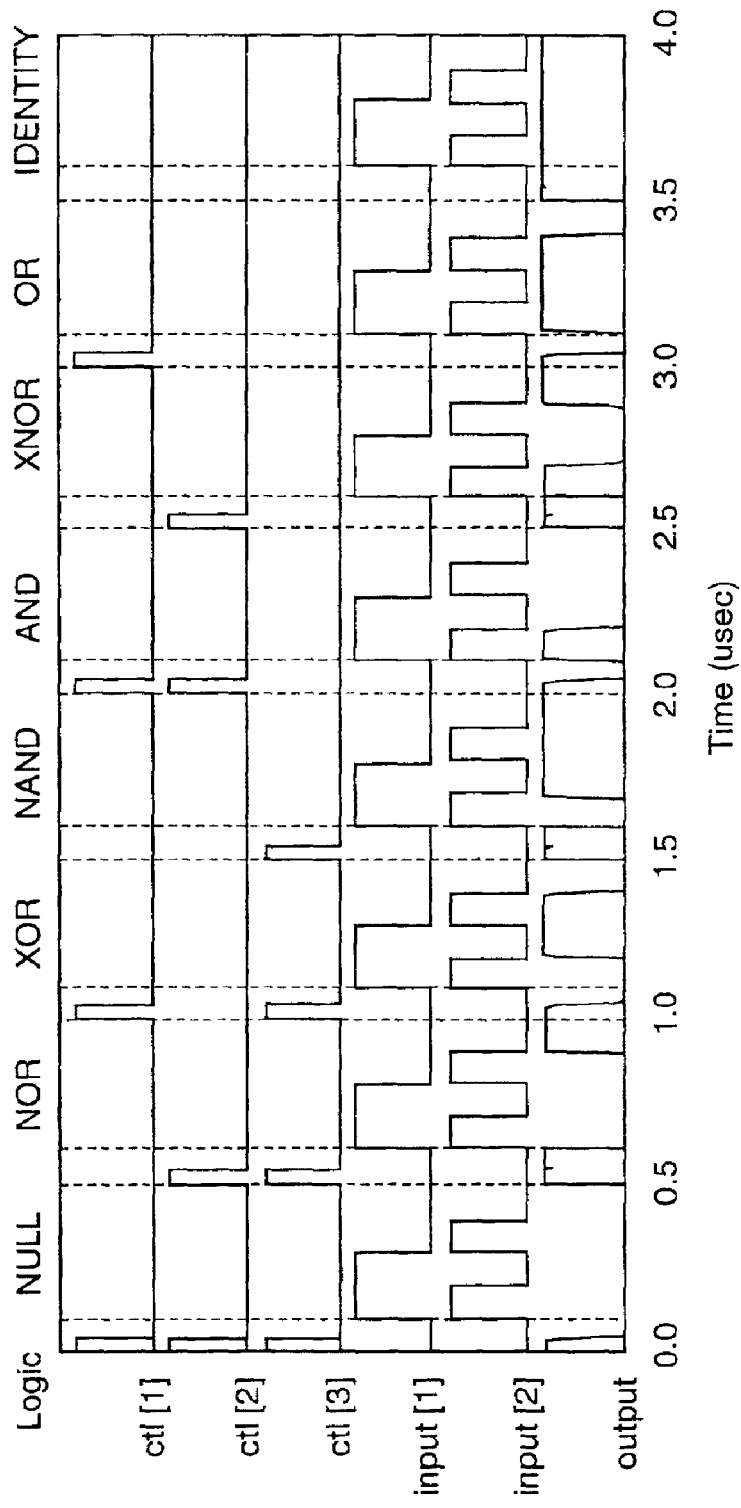
FIG. 33 is a waveform chart which shows change of terminal voltages by a circuit simulation when a cell type B is used and initialization for storing function configuration data is performed.

FIG. 33 shows a relationship between time and the waveform for each terminal in the case of cell type B which can store the function configuration data according to the present invention. The vertical axis and the lateral axis is the same as FIG. 32. In this case shown in FIG. 33, the floating gate is initialized during a period when a logic function executed in the circuit is changed. For the initialization of the floating gate, a set of voltages are applied to the control signal terminals ctl[1]~ctl[3]. The set of voltages is a set of the logically reversed voltages of the voltages applied at the time of the basic initial state of the floating gate and the voltages applied in the circuit shown in FIG. 32. In actual signal processing, each control signal terminal is disconnected from the input terminal of the floating gate side of the pre-inverter in which the input terminal of the floating gate side is connected to the power supply. The same logic functions as those of FIG. 32 are realized in the case shown in FIG. 33. Thus, it is understood that the function configuration data which is input to the control signal terminals is stored according to the present invention.

As mentioned above, according to the embodiment 2-1, a function configuration data storing method and circuit structures which use the method are described, wherein two stage structure of neuron MOS transistors is used. It can be easily estimated that not only the two stage structure but also a multistage structure of the neuron MOS transistors can store the function configuration data according to the method of the present invention.

(Embodiment 2-2)

Figure 34:
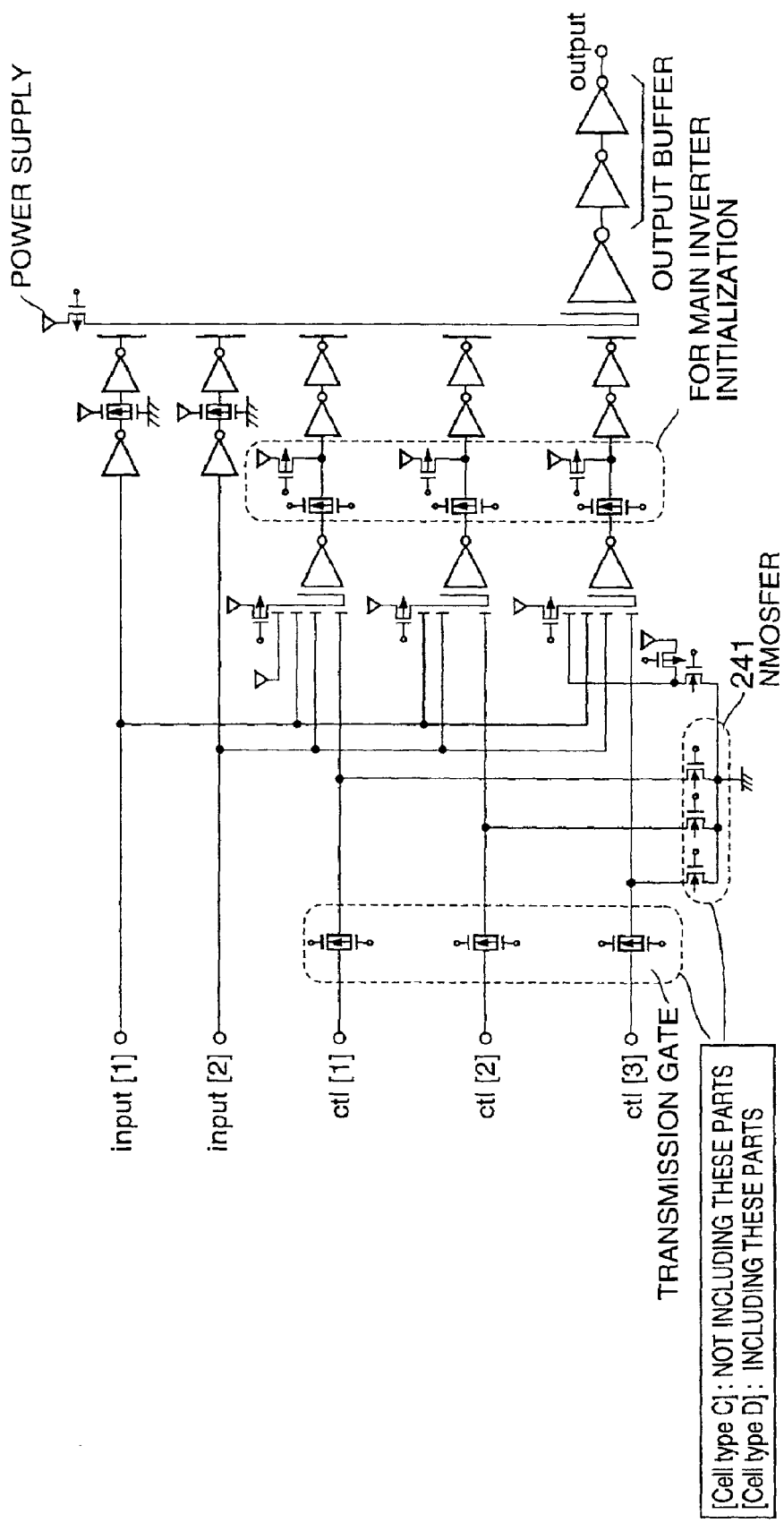
FIG. 34 is a figure of a neuron MOS circuit for two input signals which has a function configuration data storing capability.
Figure 35:
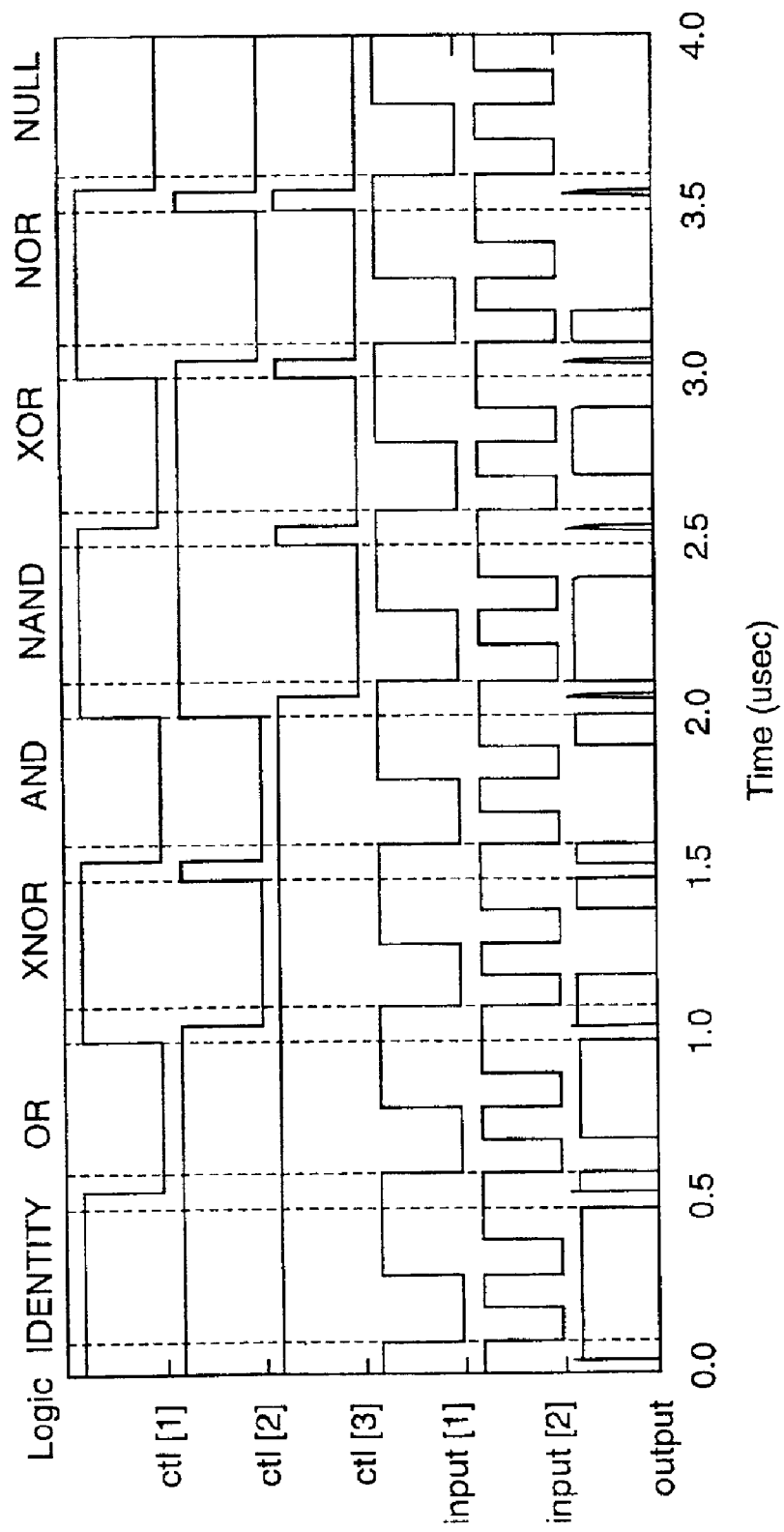
FIG. 35 is a waveform chart which shows change of terminal voltages by a circuit simulation when a cell type C is used and the floating gate is in the basic initial state.

FIG. 34 shows an example of an integrated circuit in which logical values of the floating gates of the pre-inverters and the main inverter are inverted values of the integrated circuit shown in FIG. 31. As for the integrated circuit shown in FIG. 34, the value of each element of the first vector is logical 0, that is, the ground voltage electrically. The value of each element of the second vector is logical 1, that is, the power supply voltage electrically. In FIG. 34, the integrated circuit is called a cell type C when transmission gates which are connected to the control signal terminals ctl[1], ctl[2], ctl[3] and NMOSFETs 241 which connect the transmission gates with the ground are not included. The integrated circuit is called a cell type D when the transmission gates and the NMOSFETs 241 are included. The integrated circuit of the cell type D can store the function configuration data in a steady state. As for the cell type C, the voltages of input terminals input[1] and input[2] for every neuron MOS inverter are set at the power supply voltage for initializing the floating gates. This state is the basic initial state. FIG. 35 shows a voltage waveform which is the result by circuit simulation in the case of the cell type C. The lateral axis indicates time and the vertical axis the voltage of each control signal terminal. In the simulation, desired logic functions are realized by changing the voltages of the control signal terminals.

Figure 36:
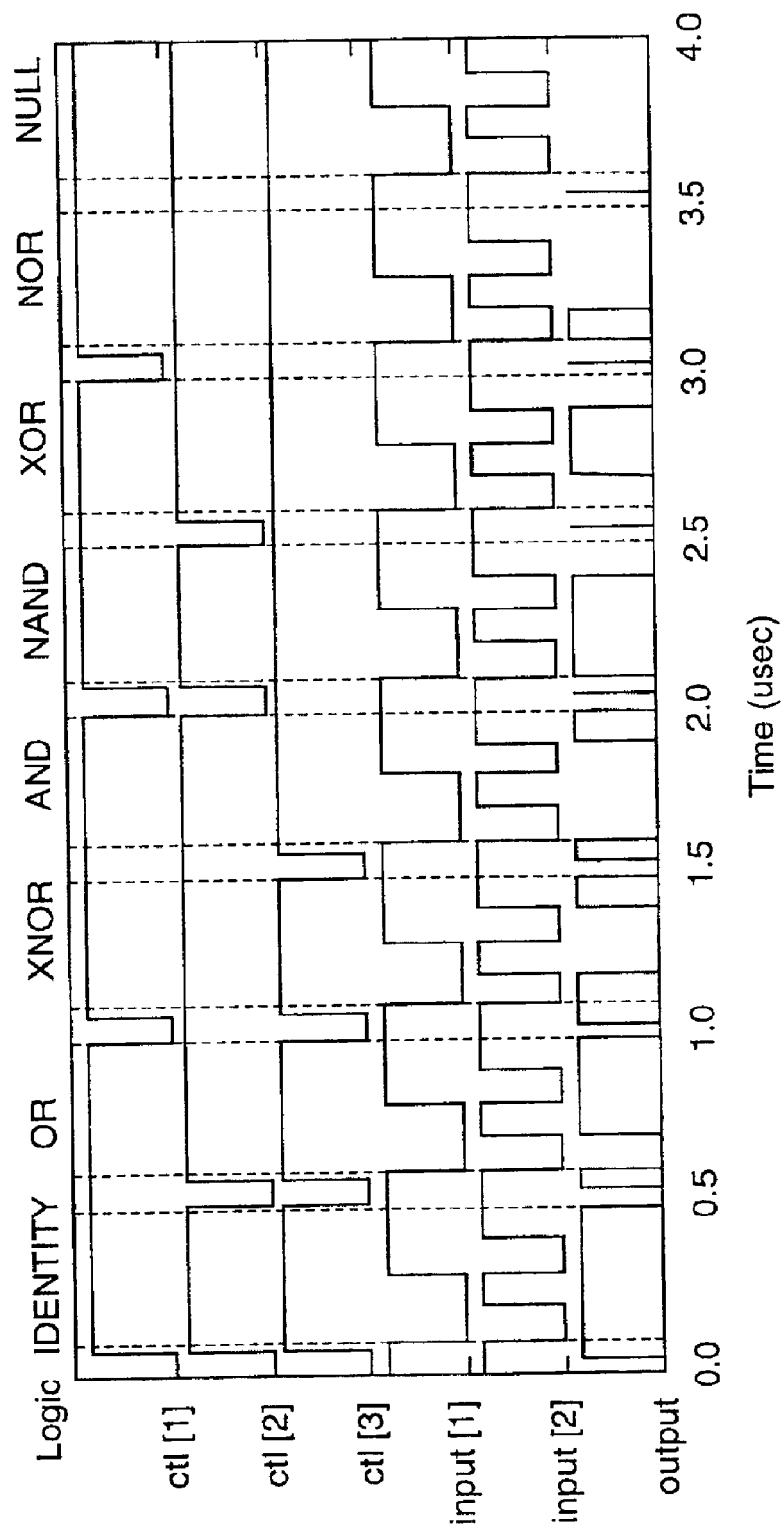
FIG. 36 is a waveform chart which shows change of terminal voltages by a circuit simulation when a cell type D is used and initialization for storing function configuration data is performed.

FIG. 36 shows a voltage waveform which is the result of the circuit simulation in the case of the cell type D, wherein voltages which are logically inverted from voltages which should be applied continuously to the control signal terminals in cell type C are applied at the time of initialization of the floating gates. That is, an inverted vector of a function configuration data vector is used as the third vector. It can be understood from FIG. 36 that the function configuration data is stored so that the same logic functions as those of cell type C are realized.

In the case of FIG. 36, the voltage of each of the control signal terminals ctl[1], ctl[2], ctl[3] is set to the power supply voltage during the time when a logical process is performed. However, as is understood from FIG. 34, since the control signal terminals are disconnected by the transmission gates, the voltage may take any value other than the power supply voltage.

Figure 37:
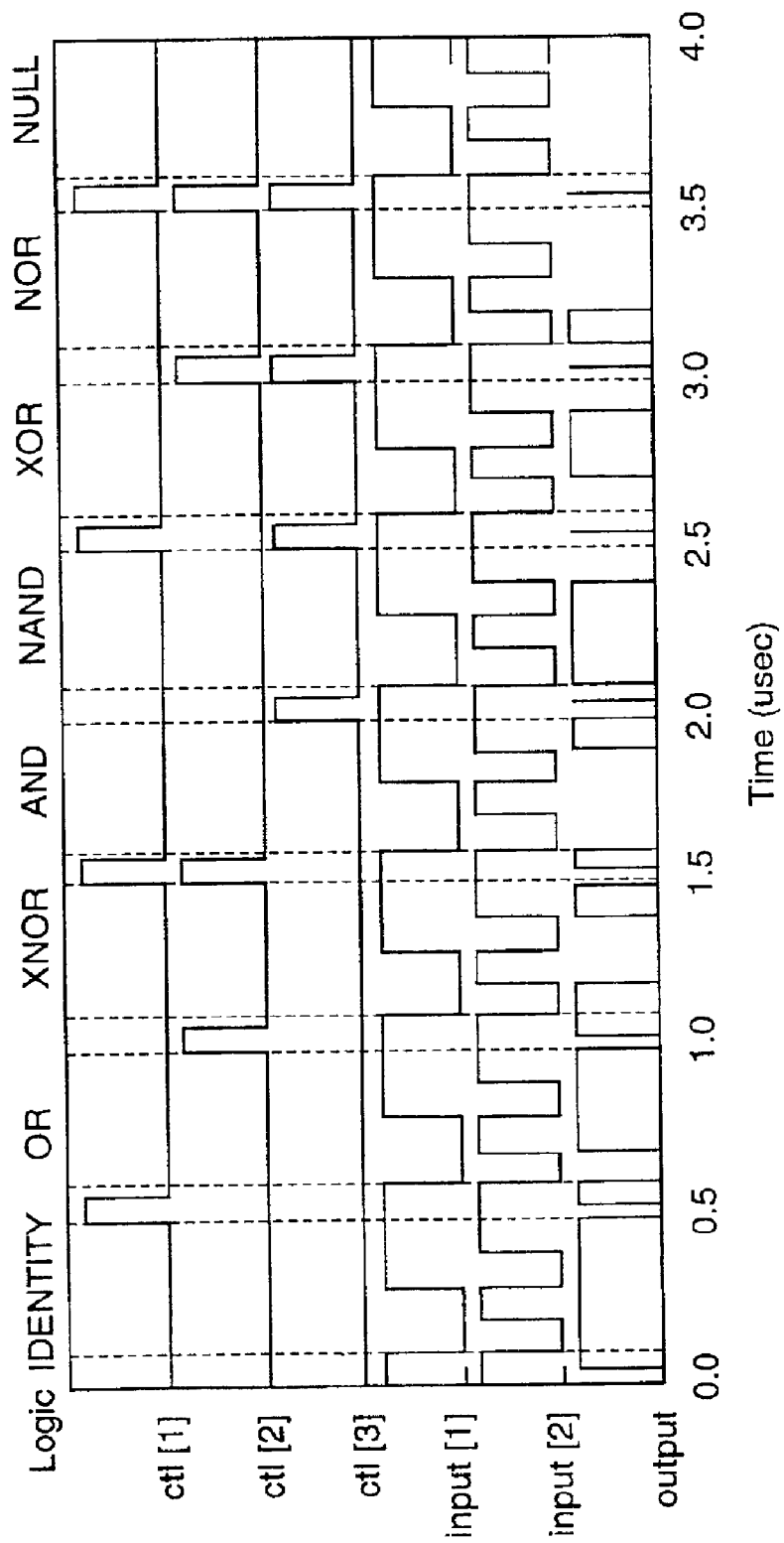
FIG. 37 is a waveform chart which shows change of terminal voltages by a circuit simulation when a cell type D is used and initialization for storing function configuration data is performed.

FIG. 37 shows the example. That is, FIG. 37 shows the result by circuit simulation using the cell type D, wherein the voltage of each of ctl[1], ctl[2], ctl[3] is set to the ground voltage during the time of performing a logical process. That is, the voltages of the control signal terminals ctl[1]~ctl[3] are set to the ground voltage except when the initialization is performed. It is shown that the waveform of the output terminal shown in FIG. 37 is the same as the waveform of the output terminal shown in FIG. 36.

Therefore, not only the method of the embodiment 2-1 but also the method of the embodiment 2-2 can be used. According to the embodiment 2-1, logical 1 is used as the element of the first voltage vector, logical 0 is used as the element of the second voltage vector and logically inverted data of the function configuration data of the basic initialization state is used as the third voltage vector. On the other hand, according to the embodiment 2-2, logical 0 is used as the element of the first voltage vector and logical 1 is used as the element of the second voltage vector.

(Embodiment 2-3)

Figure 38:
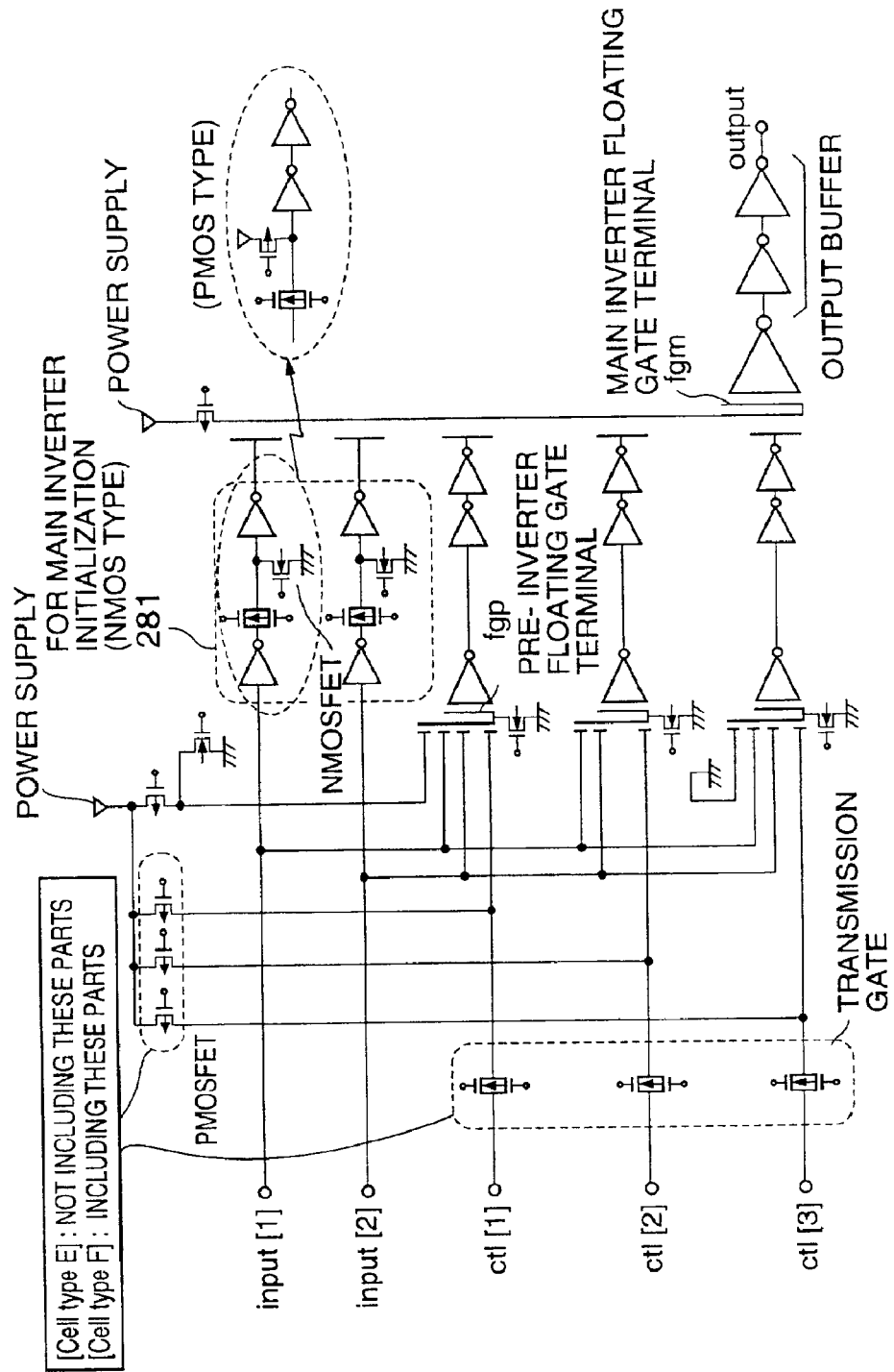
FIG. 38 is a figure of a neuron MOS circuit for two input signals which has a function configuration data storing capability.

FIG. 38 shows a circuit structure example in a case where a voltage for initializing a floating gate terminal fgm of the main inverter and each voltage for initializing the floating gate terminals fgp of the pre-inverters are different. In the case shown in FIG. 38, a main inverter initializing circuit 281 is added to an input signal terminal instead of an output of the pre-inverter which is the case of FIG. 31. The main inverter initializing circuit 281 includes a transmission gate and an NMOSFET which control the voltage of the input terminal of the main inverter when the floating gate of the main inverter is initialized. The reason is that the output of the pre-inverter can be used for initialization of the floating gate terminal of the main inverter since the initialization voltage of the floating gate terminal of the pre-inverter is an inversion of the initialization voltage of the floating gate terminal of the main inverter. Therefore, logical values of the output of the pre-inverter and the floating gate terminal voltage are the same when initialization is performed. When the same voltage as that used in the circuit of FIG. 31 is used as the voltage of the input signal terminal input[1] and input[2], the above-mentioned additional circuit becomes necessary. Because, the voltage is logical inversion of the floating gate voltage of the main inverter when initialization is performed. It can be easily estimated that the additional circuit can be not only the NMOS type as shown in FIG. 38 but also a PMOS type.

Figure 39:
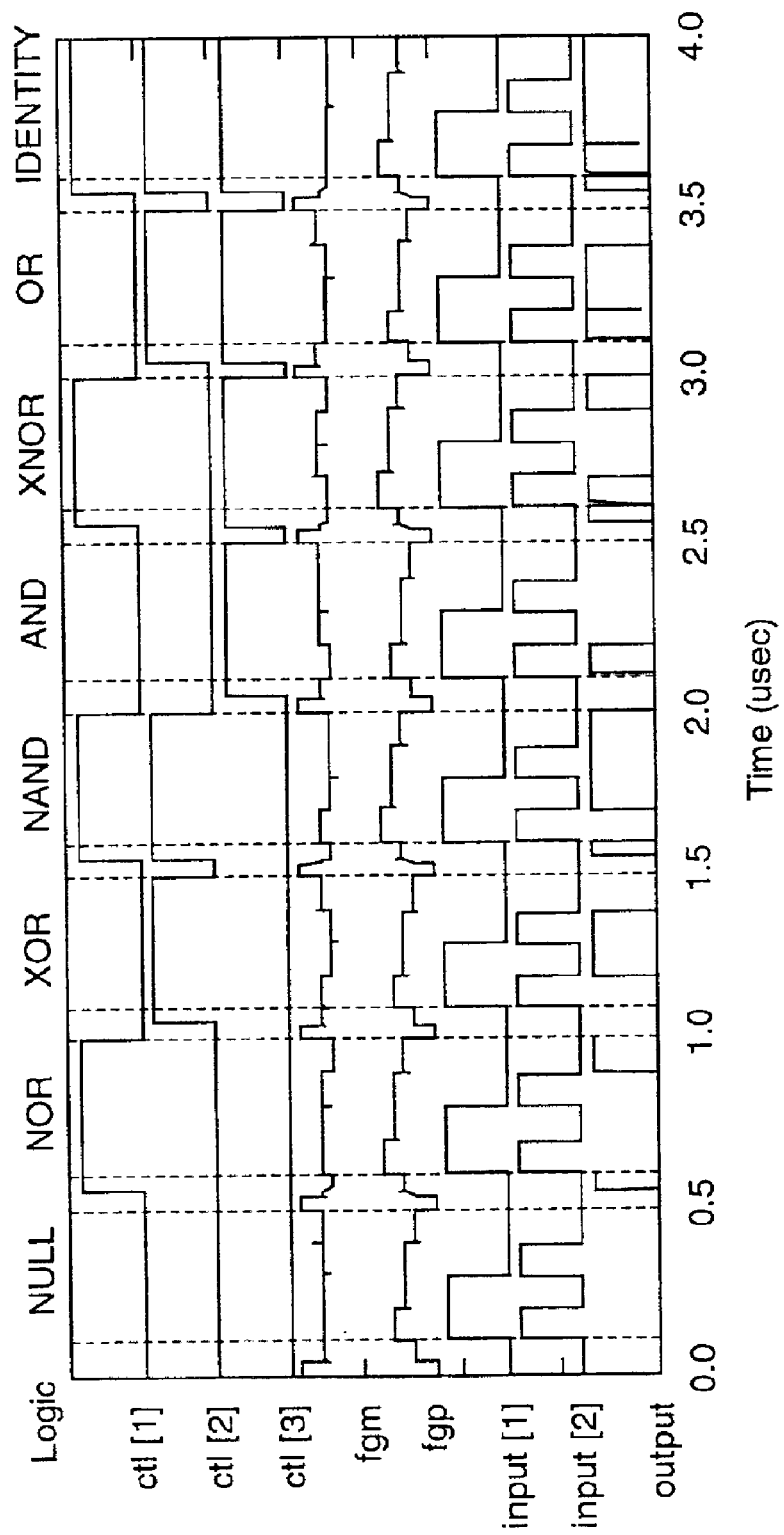
FIG. 39 is a waveform chart which shows change of terminal voltages by a circuit simulation when a cell type E is used and the floating gate is in the basic initial state.
Figure 40:
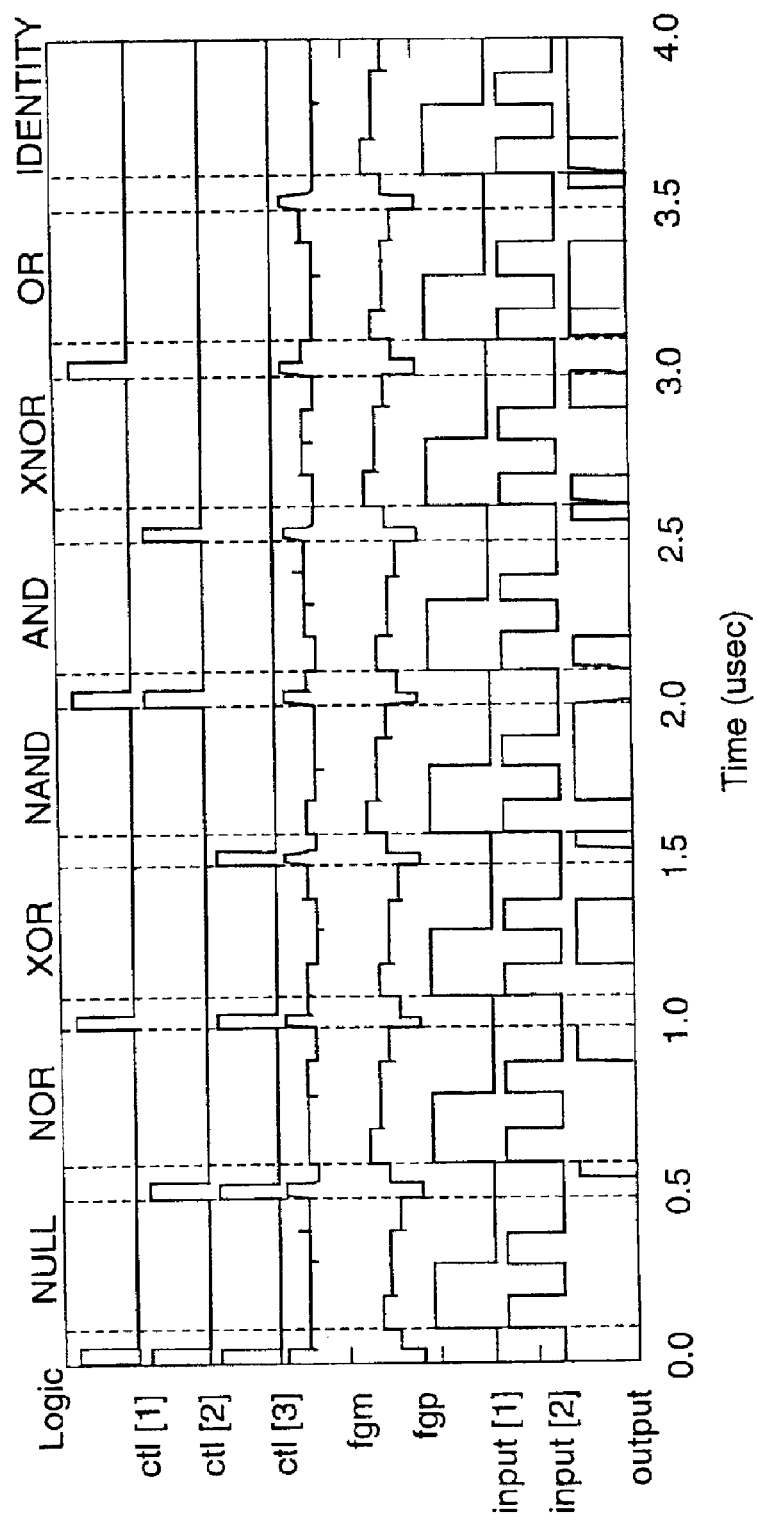
FIG. 40 is a waveform chart which shows change of terminal voltages by a circuit simulation when a cell type F is used and initialization for storing function configuration data is performed.

In the same way as shown in FIG. 31 and FIG. 34, a circuit which includes transmission gates and PMOSFETs after the control signal terminals is called a cell type F, and a circuit which does not include transmission gates and PMOSFETs is called a cell type E. FIG. 39 shows a result by circuit simulation of the cell type E. In FIG. 39, the lateral axis indicates time and the vertical axis indicates voltages of each terminal. In this case, the floating gate terminals are initialized at the time of reconfiguring the function. FIG. 39 shows that the voltage of the floating gate terminal fgm of the main inverter is in "high level" and the voltage of the floating gate terminal fgp of the pre-inverter is in "low level". In addition, it is necessary to apply the function configuration data continuously for the cell type E. On the other hand, according to a result by circuit simulation of the cell type F as is shown in FIG. 40, the same logic functions are realized by inputting inverted data of the function configuration data of the cell type E once at the time of floating gate initialization.

As mentioned above, the method of the present invention is effective not only when the same voltages are used for initializing the floating gate terminal of the main inverter and the floating gate terminals of the pre-inverters but also when different voltages are used. In addition, it can be easily understood that the circuit of the same function can be realized by using the initialization method of applying logical 0 to the floating gate terminal of the main inverter and applying logical 1 to the floating gate terminals of the pre-inverters, that is, applying voltages inverted from the voltages used in this embodiment to the floating gate terminals of the main inverter and the pre-inverters.

(Embodiment 2-4)

FIG. 17 shows a circuit structure example according to the embodiment 2-4. In the circuit structure, not only voltages of the control signal terminals ctl[1], ctl[2], ctl[3] but also the voltages of the input signal terminals input[1] and input[2] are used as the function configuration data when the floating gates of the neuron MOS inverters are initialized. In this case, the initialization voltage of the floating gate of the main inverter is different from the initialization voltages of the floating gates 312 of the pre-inverters. Different points from the circuit shown in FIG. 31 are that the floating gate terminal fgm of the main inverter 310 is connected to the power supply via a PMOSFET 313 so as to connect or disconnect to the power supply, and that the transmission gates 211 and the NMOSFET 212 are not included after the output terminal of each pre-inverter. The reason for excluding the transmission gates 211 and the NMOSFET 212 is the same as that described in the embodiment 2-3.

In the following, the principle of the operation of the circuit shown in FIG. 41 will be described. When the floating gate fgm of the main inverter is initialized by the power supply voltage, the voltage of the floating gate terminal fgp of each pre-inverter is set to the ground voltage. At this time, the output of each pre-inverter is the power supply voltage. In addition, at the time of initialization of fgm, the power supply voltage is applied to the input signal terminals input[1] and input[2]. Accordingly, fgm can be initialized while all input terminals (gate electrodes) of the main inverter are in the power supply voltage. When the voltage of the floating gate fgm becomes a voltage which can be regarded as the power supply voltage, fgm is disconnected from the power supply so that the floating gate becomes the floating state. After completing initialization of the floating gate fgm of the main inverter, initialization of the floating gate of each pre-inverter is performed in the same way as that shown in FIG. 31. At this time, the ground voltage is used for the voltage of the input signal terminals.

Next, the initialization of the fgm will be described by using a vector notation each element of which vector is an input terminal voltage of the main inverter which is normalized by the power supply voltage. In this description, the voltage of fgm is extended to a vector which includes elements of the number of the input terminals of the main inverter in which all elements have the same value as a value of the fgm. Therefore, the vector Vfgm at the time of initialization is represented as the following formula 22, in which E is a unit vector.

$$Vfgm = \begin{pmatrix} Vfgm[1] \\ Vfgm[2] \\ Vfgm[3] \\ Vfgm[4] \\ Vfgm[5] \end{pmatrix} = \begin{pmatrix} 1 \\ 1 \\ 1 \\ 1 \\ 1 \end{pmatrix} = E \qquad \text{(formula 22)}$$

This corresponds to the second vector in the embodiment 2-1.

Next, a vector notation Vinit of the input terminal voltages of the maim inverter at the time of initialization is represented as the formula 23.

$$Vinit = \begin{pmatrix} V\ minput[1] \\ V\ minput[2] \\ Vmpreinv[1] \\ Vmpreinv[2] \\ Vmpreinv[3] \end{pmatrix} = \begin{pmatrix} 1 \\ 1 \\ 1 \\ 1 \\ 1 \end{pmatrix} = E \qquad \text{(formula 23)}$$

Figure 41:
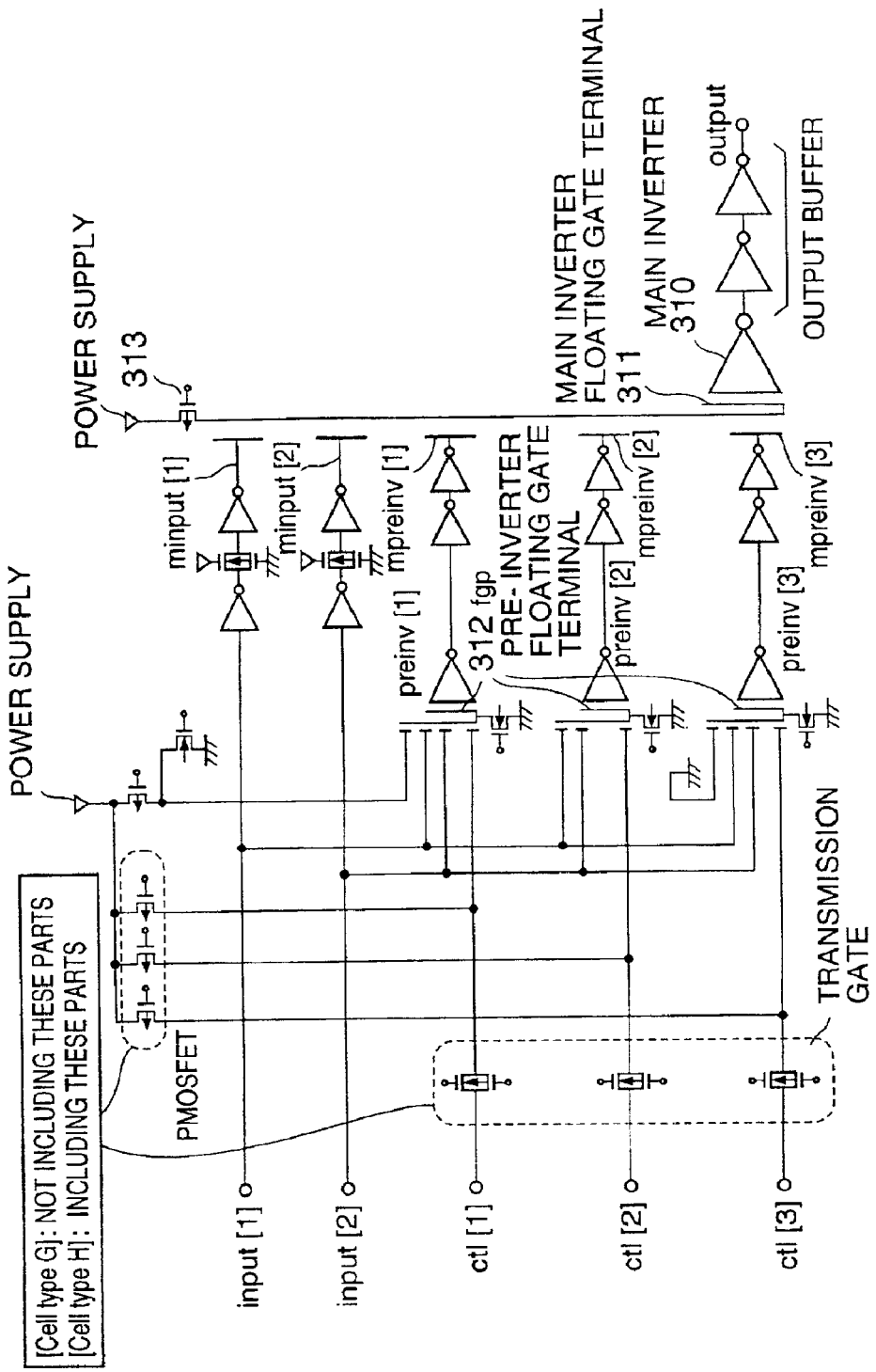
FIG. 41 is a figure of a neuron MOS circuit for two input signals which has a function configuration data storing capability.

In this embodiment as shown in FIG. 41, let us assume that terminals which apply input voltages, which reflect the voltages of input[1] and input[2], directly to the main inverter are represented as minput[1] and minput[2] respectively, and that each of the normalized voltages are represented as Vminput[1] and Vminput[2], and terminals which apply input voltages, which reflect the output voltages of preinv[1], preinv[2] and preinv[3], directly to the main inverter are represented as mpreinv[1], mpreinv[2] and mpreinv[3] respectively. This vector corresponds to the third vector of the embodiment 2-1.

When the main inverter performs a logic process, if a normalized voltage of an input terminal with respect to the floating gate of the main inverter is represented as Vrel and the actual normalized voltage is represented as Vin, the relationship can be represented as the following formula 24, in which Vin corresponds to the first vector of the embodiment 2-1.

$$\begin{aligned} Vrel &= Vin + Vfgm - Vinit \qquad \text{(formula 24)} \\ &= Vin + E - E \\ &= Vin \end{aligned}$$

According to the formula 24, it is understood that the same logical process as that of FIG. 31 can be performed by using the same input terminal voltage as that of FIG. 31. Because, the normalized voltage of the input terminal of the main inverter with respect to the floating gate terminal is the same as the normalized voltage which is actually applied to the input terminal. The same logic functions can be realized in different circuits by combining voltages for initialization appropriately.

Figure 42:
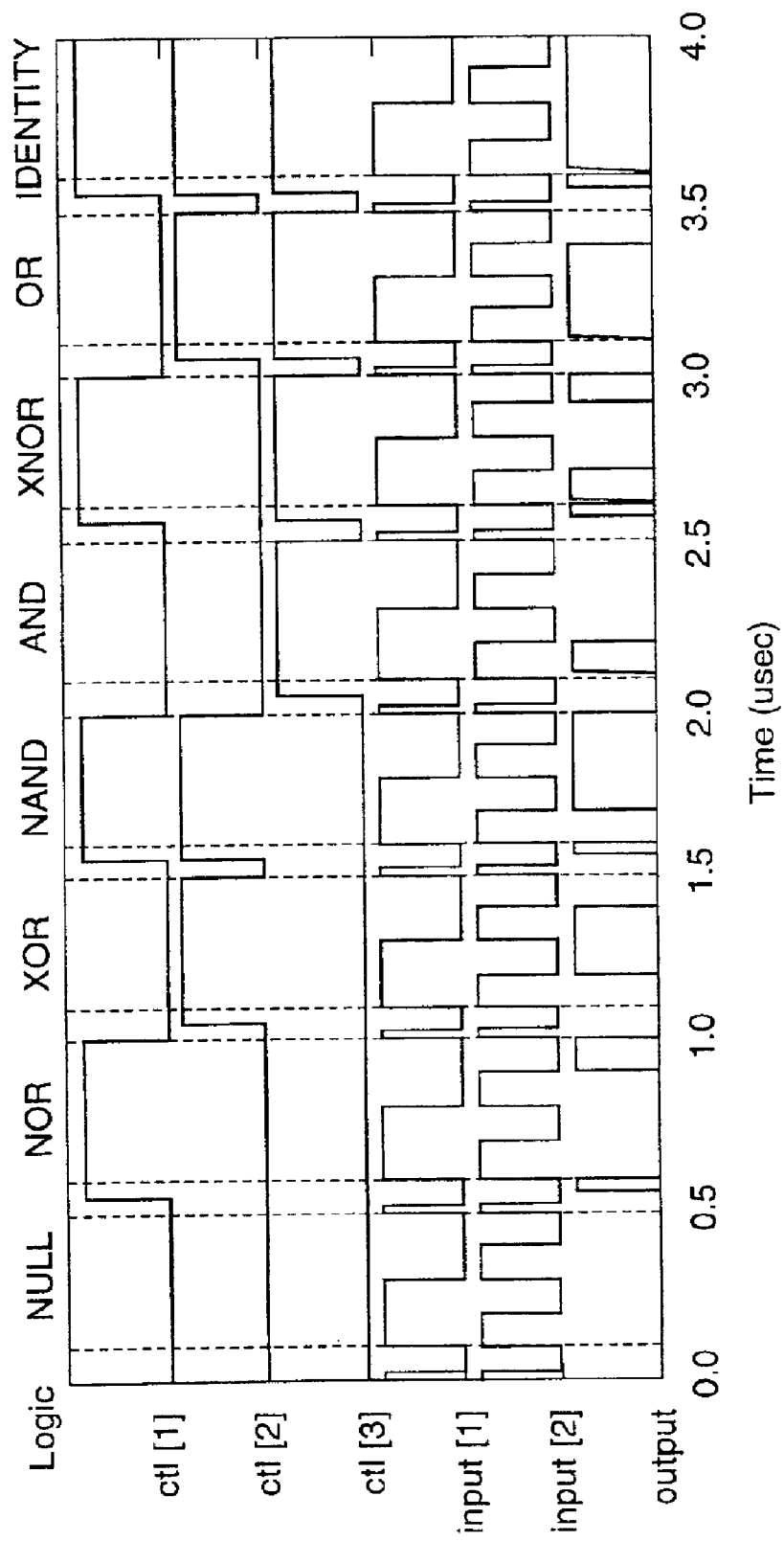
FIG. 42 is a waveform chart which shows change of terminal voltages by a circuit simulation when a cell type G is used and control signals are continuously input during processing logic processes.
Figure 43:
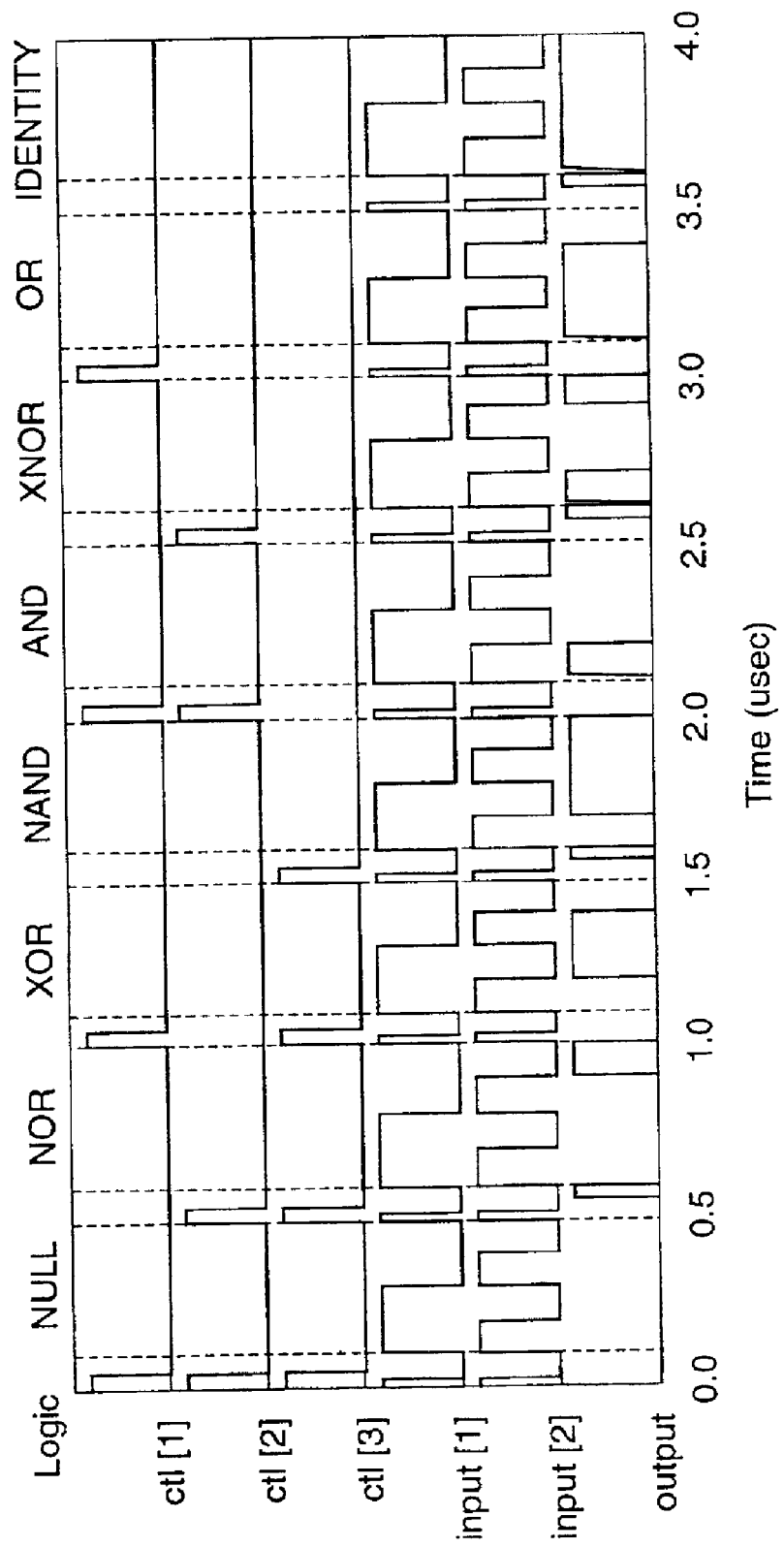
FIG. 43 is a waveform chart which shows change of terminal voltages by a circuit simulation when a cell type H is used and initialization for storing function configuration data is performed.

FIG. 42 shows a circuit simulation result by using a cell type G in which it is necessary to apply function configuration data continuously to each pre-inverter, and FIG. 43 shows a circuit simulation result by using a cell type H which can store the function configuration data by initializing the floating gate of the pre-inverters. From the voltages of the control terminal voltages and the output terminal shown in FIG. 42 and FIG. 43, it can be understood that the function configuration data is stored at the time of logic processing according to the present invention.

As mentioned above, the circuit can be simplified by including the voltage of the input terminals as the function configuration data at the time of initialization of the floating gate terminals. In addition, the same logic functions can be realized by different circuit structures.

On the other hand, it can be easily understood that different logic functions or functions besides Boolean functions can be realized by using different voltages for initialization even when the same circuit structures and the same input signals are used.

(Embodiment 2-5)

Figure 44:
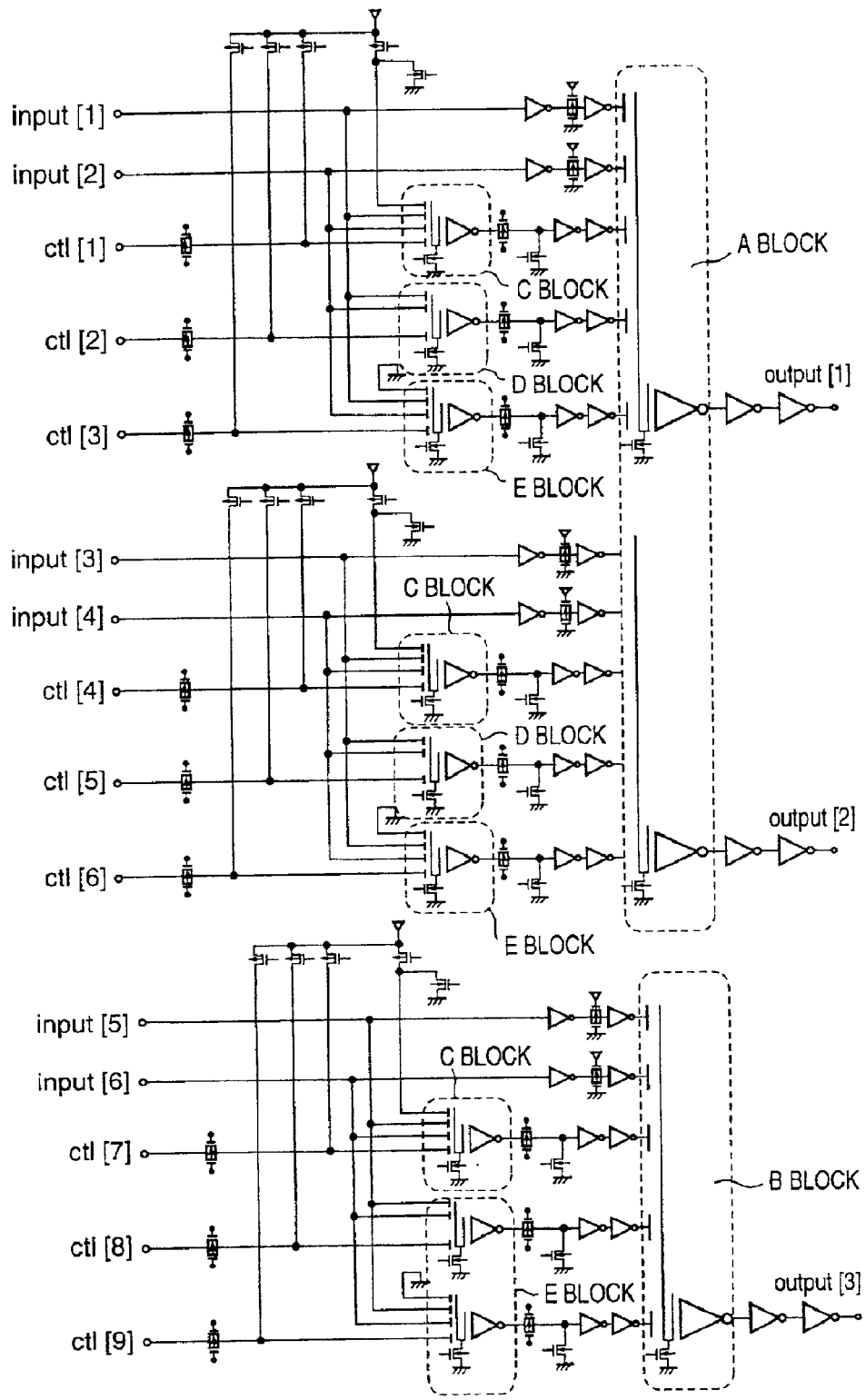
FIG. 44 shows an integrated circuit including the neuron MOS inverters which are divided into blocks in each of which controlling for storing function configuration data is performed.

FIG. 44 shows a circuit which includes at least one function unit which is a basic unit for performing a function process, wherein the function unit consists of one or more neuron MOS transistors according to this embodiment. In the following, a procedure for initializing the floating gate terminals of the neuron MOS transistors will be described. In this embodiment, the circuit shown in FIG. 31 of the embodiment 2-1 is used as the function unit. As for the circuits shown in FIGS. 31, 34, 38 and 41, the initialization of the floating gate terminals of the three pre-inverters is performed simultaneously. However, the initialization is not necessarily performed simultaneously, and it can be performed independently. In the case shown in FIG. 44, three function units are included in the circuit, in which main inverters and pre-inverters are divided into five blocks, that is, an A block, a B block, a C block, a D block and a D block. In each block, the initialization of the neuron MOS transistors is performed simultaneously. Dividing the circuit into blocks can be performed arbitrarily by request of a system which includes the function units. Since the initialization of the neuron MOS transistors in the function unit can be performed independently, various input methods can be used for the function configuration data. As for the system including the function units, a control circuit for initialization can be simplified so that control becomes easy and the circuit becomes small.

(Embodiment 2-6)

Figure 45:
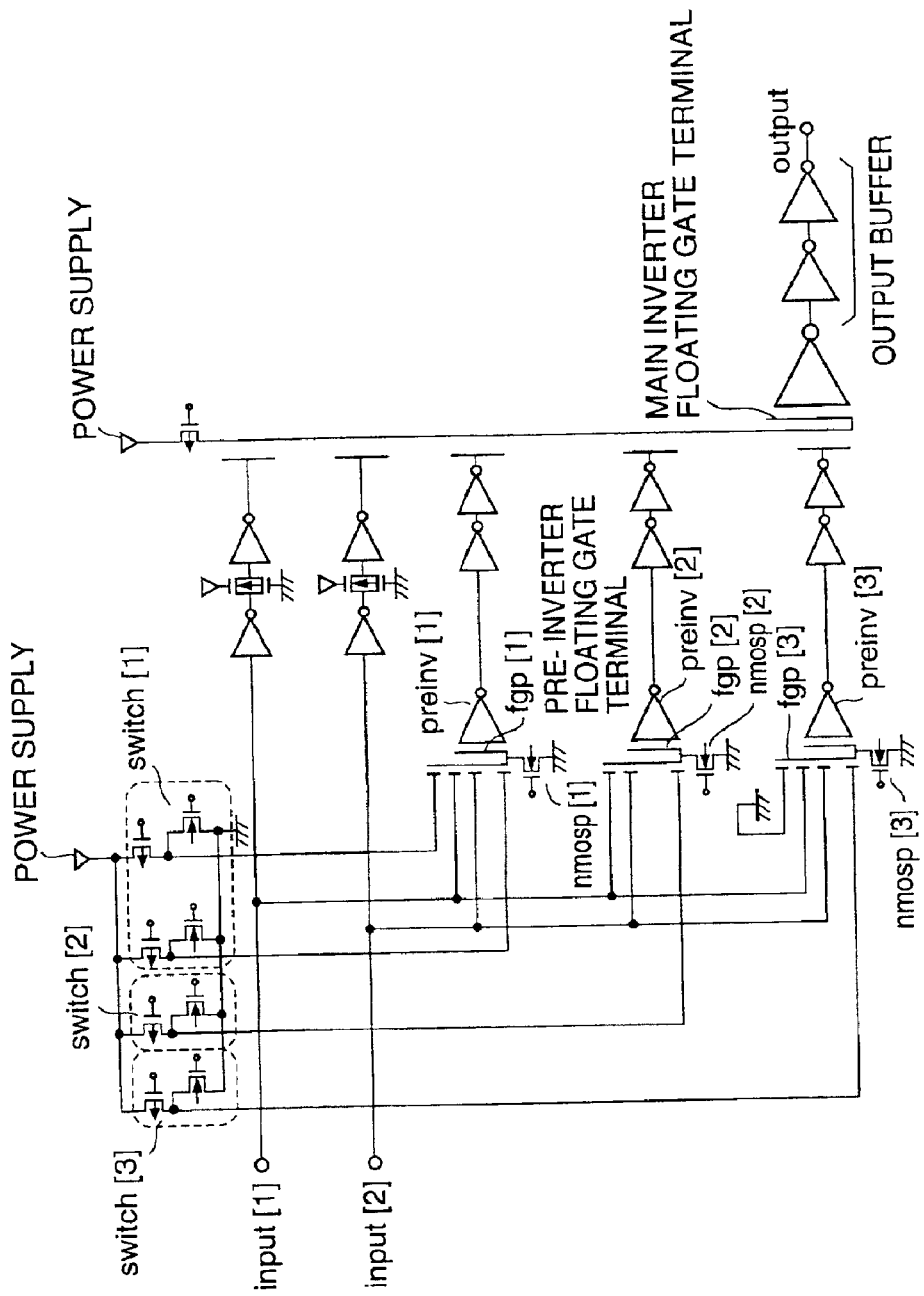
FIG. 45 is a figure of a neuron MOS circuit in which control terminals are eliminated from a circuit shown in FIG. 41 and signals which are equivalent to the control signals are input when initialization.

FIG. 45 shows a circuit including neuron MOS inverters of two stage structure for processing two input signals according to the embodiment 2-6. Comparing with the circuit-of FIG. 41, control signal terminals ctl[1]~ctl[3] are deleted, instead, a switch which connects a terminal to the power supply or the ground is provided in each terminal. In this embodiment, signals equivalent to the control signals are applied to each pre-inverter at the time of initialization. In the circuit shown in FIG. 45, three pre-inverters are indicated as preinv[1], preinv[2], preinv[3] respectively, the floating gate terminal fgp[1] of preinv[1] is connected to the ground via an NMOS transistor nmosp[1], the floating gate terminal fgp[2] of preinv[2] is connected to the ground via an NMOS transistor nmosp[2], and the floating gate terminal fgp[3] of preinv[3] is connected to the ground via an NMOS transistor nmosp[3]. In addition, terminals corresponding to the control signal terminals of preinv[1], preinv[2], preinv[3] in FIG. 41 are connected to the power supply or the ground by switch[1], switch[2], switch[3] respectively in FIG. 45. In this circuit, the floating gate terminals fgm, fgp[1], fgp[2] and fgp[3] are initialized at a zeroth time t0, a first time t1, a second time t2, a third time t3 respectively, wherein t0<t1<t2 <t3 in this embodiment. At t0, both of the input signal terminals input[1] and input[2] are in the power supply voltage, and fgp[1], fgp[2], fgp[3] are connected to the ground via nmosp[1], nmosp[2], nmosp[3] respectively.

Figure 46:
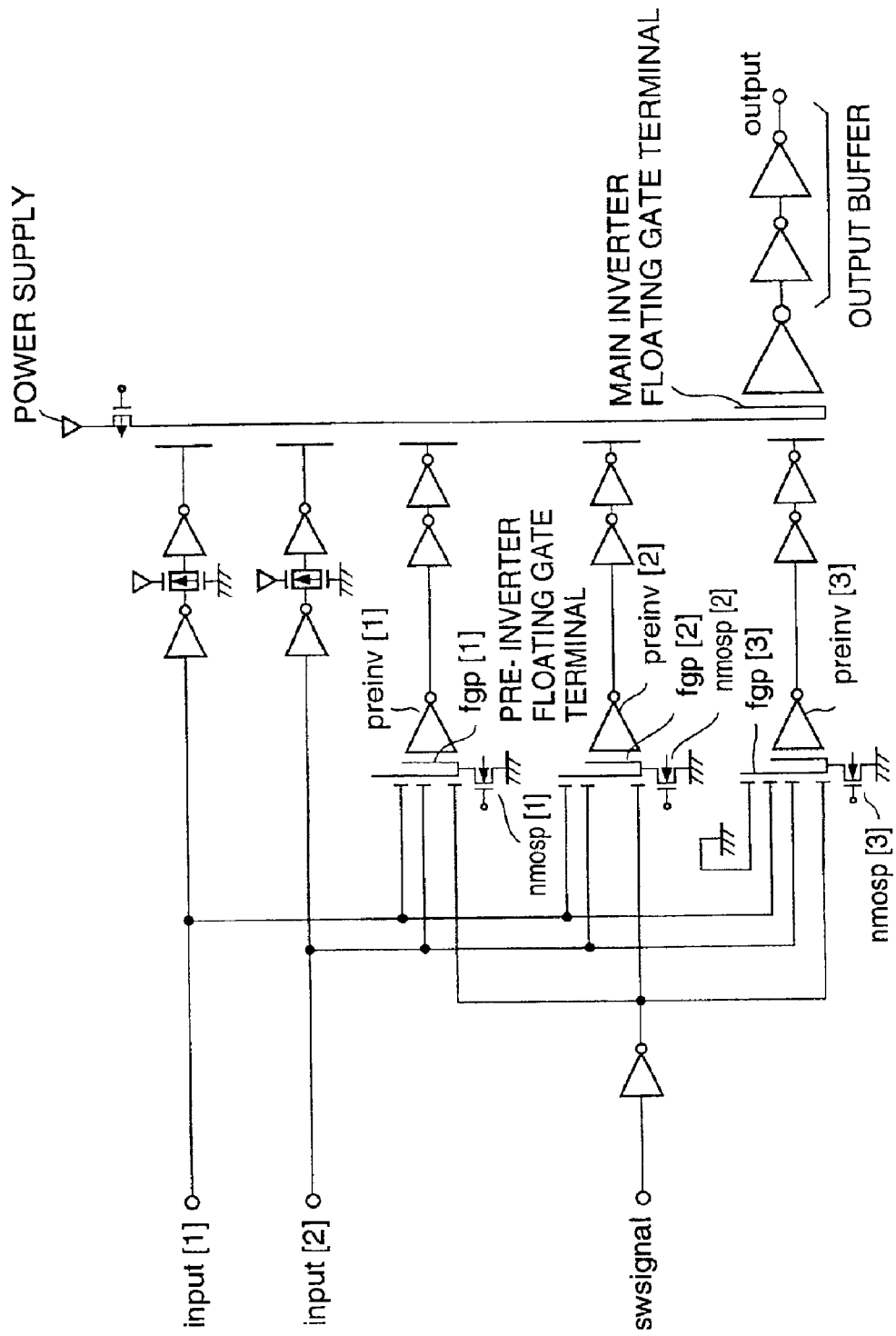
FIG. 46 is a figure of a neuron MOS circuit in which control terminals are eliminated from a circuit shown in FIG. 41 and signals which are equivalent to the control signals are input when initialization.

In this embodiment, voltages equivalent to the control signal voltages which are applied to ctl[1], ctl[2], ctl[3] in the cell type H of FIG. 41 for initialization are unfolded in time-axis by the input signal terminal input[1] for initialization in this embodiment. FIG. 46 shows another example in this embodiment in which a common control signal input terminal for all pre-inverters is provided instead of switch [1]–switch[3]. In this circuit shown in FIG. 46, the pre-inverters preinv[1]~preinv[3] are initialized by applying a following signal to the swsignal terminal. The signal becomes the power supply voltage at the time of applying a control signal to an NMOSFET which conducts at the earliest time among NMOSFETs nmosp[1]~nmosp[3], and becomes the ground voltage at the time of applying a control signal to an NMOSFET which is interrupted at the latest time among nmosp[1]~nmosp[3].

In the following, initialization of the floating gates of the pre-inverters will be described in detail with reference to FIG. 45.

By the time t1, each of nmosp[1], nmosp[2] and nmosp[3] conduct and each of switch[1], switch[2] and switch[3] is connected to the ground. At the time t1, a voltage which is equivalent to the control signal voltage which is applied to preinv[1] in the cell type H of FIG. 41 is applied from input[1]. At this state, nmosp[1] is interrupted, and switch[1] is disconnected from the ground and connected to the power supply. According to this process, initialization of fgp[1] is completed. Next, from the time t1 to the time t2, nmosp[2] and nmosp[3] conduct, and switch[2] and switch[3] are connected to the ground. At the time t2, a predetermined voltage is applied from input[2] in the same way as initialization of preinv[1]. At this state, nmosp[2] is disconnected and switch[2] is disconnected from the ground and connected to the power supply. At the time t3, the same process is performed for preinv[3].

Figure 47:
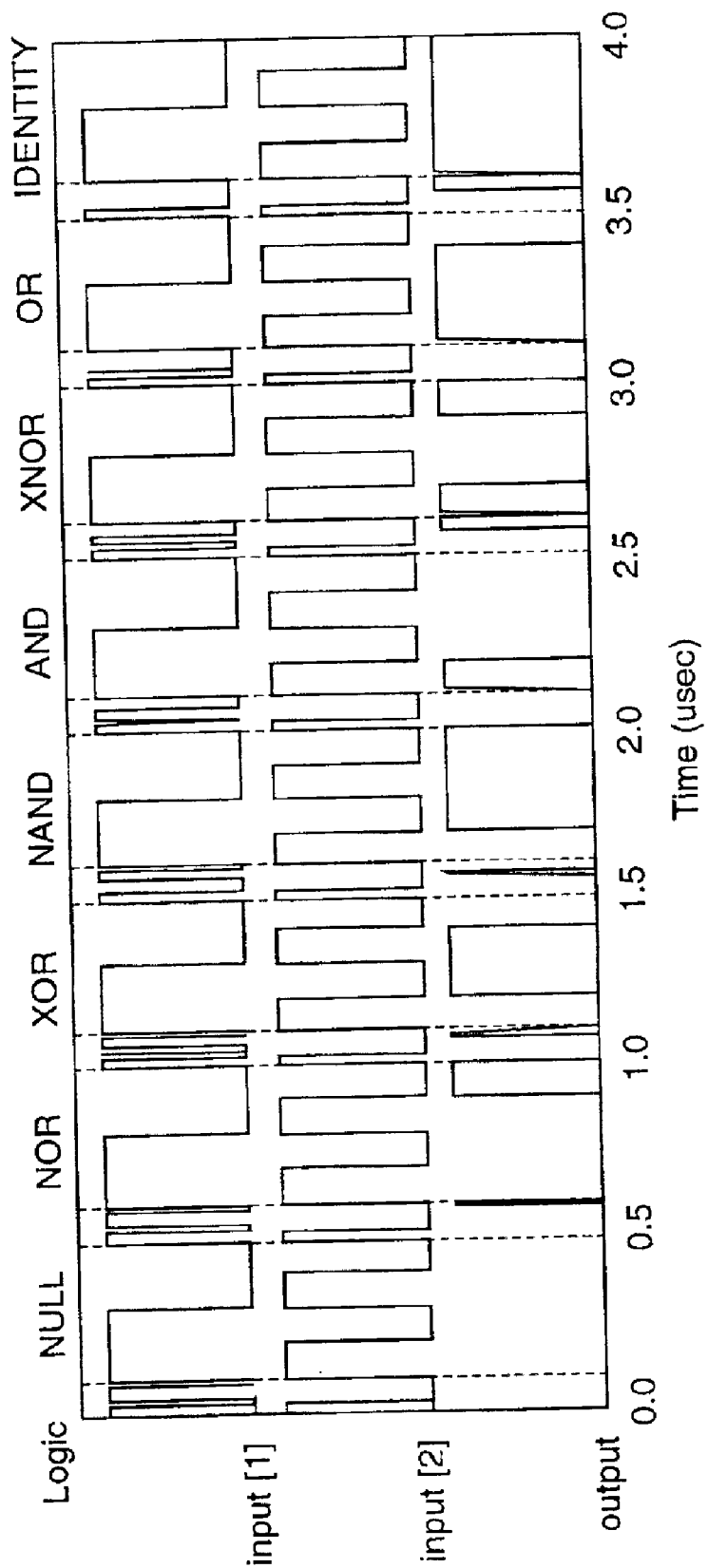
FIG. 47 is a waveform chart which shows change of terminal voltages by a circuit simulation of a circuit which can input signals, from input signals terminals, which are equivalent to control signals defining a function when initialization.

FIG. 47 shows a circuit simulation result for verification of the above-mentioned circuit operation. From FIG. 47, it is understood that the same result as that shown in FIG. 43 is obtained by applying voltage waveforms shown in FIG. 47 to input[1] during the time of initialization for reconfiguring a function, in which FIG. 43 shows the simulation result of the cell type H circuit of FIG. 41. In this circuit simulation, time-division signals are input to input[1] for generating a logic function. It is also possible that time-division signals are input to input[2] for generating a logic function. In addition, it is also possible that input signals are divided to the input signal terminals input[1] and input[2], further, each of the divided signals can be time-divided. That is, signals for function configuring can be input by dividing in time and space which correspond to floating gate initialization time and input terminals.

As mentioned above, by initializing the floating gate of each pre-inverter independently of one another, it becomes possible that function configuration data is input from the input signal terminals after the data being expanded in time-axis. By using an integrated circuit in which a plurality of the circuits shown in FIG. 45 is connected, the number of control signal terminals can be decreased and the area for realizing the integrated circuit becomes small.

Generalizing the behavior of the signal used for generating a logic function or a function besides Boolean functions at the time of initialization of the floating gate of the neuron MOS transistor in this embodiment and in the embodiment 2-4, the signal can be expanded in time and space in which the time corresponds to the initializing time of the floating gate and the space corresponds to a plurality of input terminals of the neuron MOS transistors.

Figure 48A:
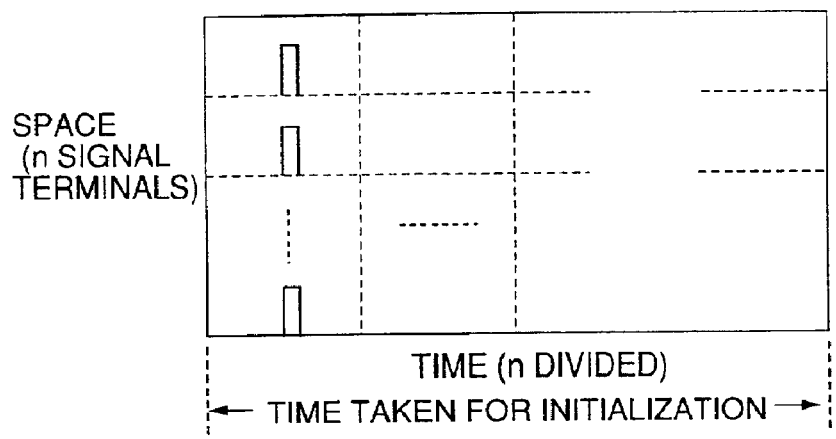
Figure 48B:
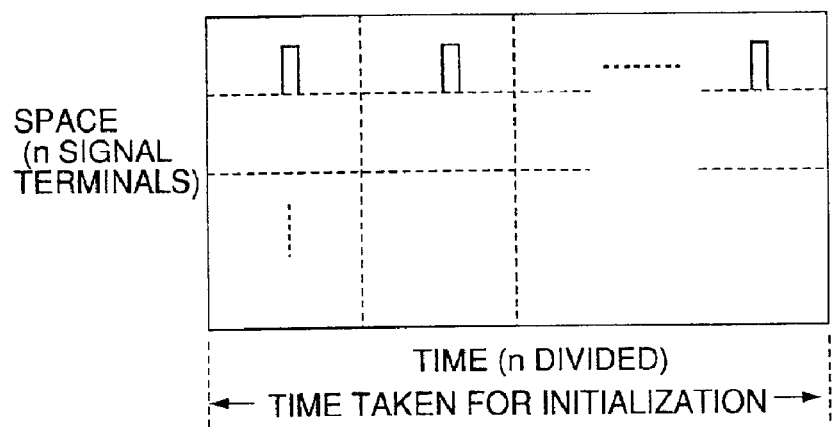
Figure 48C:
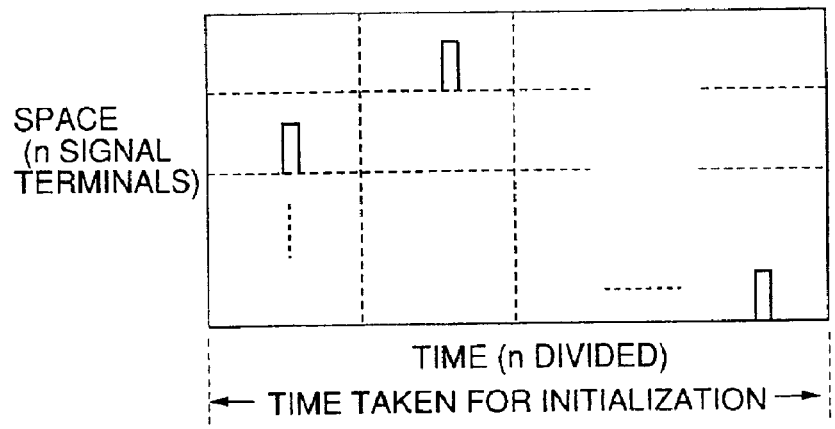

FIGS. 48A–48C show a concept in that the signal is expanded in time and space. When n (a positive integer) signals are required for generating a logic function or a function besides Boolean functions, n input terminals and n divided times, at the maximum, are prepared in the initialization time. The terminals and/or the times can be under n since n input terminals and n divided times are not necessarily required according to a method of signal expansion.

FIG. 48A corresponds to the embodiment 2-4. That is, in the embodiment 2-4, the floating gates of the three pre-inverters are initialized simultaneously. FIG. 48B corresponds to the embodiment 2-6. That is, in the embodiment 2-6, the signal for generating functions is input to input[1]. FIG. 48C corresponds to a method wherein the signal for generating a logic function or a function besides Boolean functions is dispersed in time and space. Thus, the signal for generating a logic function or a function besides Boolean functions can be input by various method so that flexibility of control can be improved.

(Embodiment 2-7)

Figure 49B:
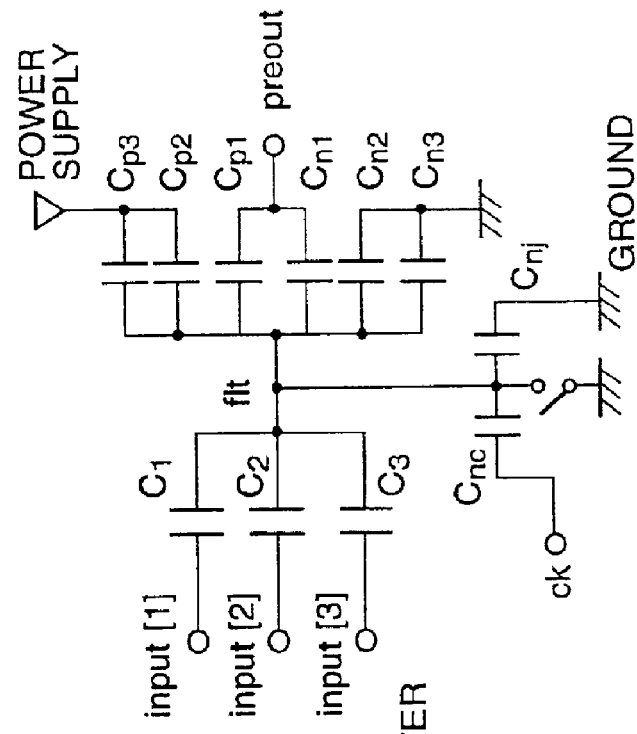
FIG. 49B is an equivalent circuit diagram of the circuit of FIG. 49A showing capacitances connected to the floating gate.
Figure 49A:
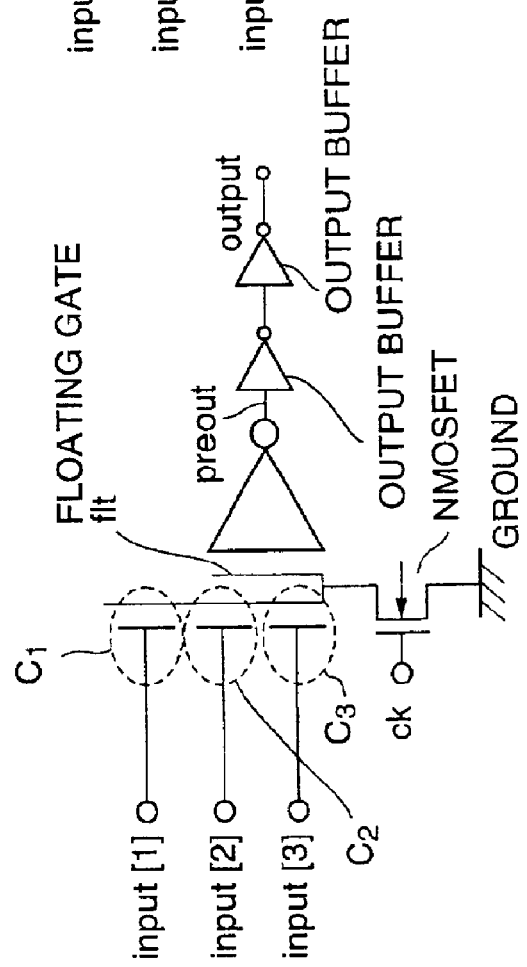
FIG. 49A shows a circuit of a neuron MOS inverter having three input terminals, in which the floating gate terminal is connected to or disconnected from the ground by NMOSFET.

FIGS. 49A and 49B shows that voltages can be stored not only as two-valued data but also as continuous values. FIG. 49A shows a circuit of a neuron MOS inverter having three input terminals, in which the floating gate terminal flt is connected to the ground by setting the NMOSFET to continuity state by applying a signal into a gate electrode ck of the NMOSFET. The three input terminals are input[1], input[2] and input[3] each of which is connected to flt via each of capacitances $C_1$, $C_2$ and $C_3$ respectively. The flt is connected to the NMOSFET, wherein ck is the gate electrode of the NMOSFET, an output terminal of the neuron MOS inverter is "preout", an output terminal of an output buffer is "output".

FIG. 49B is a circuit diagram which shows capacitance components of a p-type neuron MOS transistor and an n-type neuron MOS transistor which form the neuron MOS inverter of FIG. 49A, capacitance components of the NMOSFET which connects flt to the ground, and a switch corresponds to a current source equivalent circuit of the NMOSFET. In addition, $C_{p1}$ and $C_{p3}$ are gate overlap capacitance values of the p-type neuron MOS transistor, $C_{p2}$ is an intrinsic capacitance value between flt and an area in which channel is formed, $C_{n1}$ and $C_{n3}$ are gate overlap capacitance values of the n-type neuron MOS transistor, $C_{n2}$ is an intrinsic capacitance value between flt and an area in which channel is formed. Further, $C_{nj}$ is a capacitance value between the drain of the NMOSFET which connects flt to the ground and the substrate (or well), $C_{nc}$ is the gate overlap capacitance value. When assuming that voltages of input[1], input[2] and input[3] are $V_1$, $V_2$ and $V_3$ respectively, the voltage of flt is $V_{flt}$, the power supply voltage is $V_{dd}$, the ground voltage is $V_{ss}$, the voltage of preout is $V_{pre}$ and the voltage of the gate electrode ck is $V_{ck}$, a charge amount $Q_{flt}$ of flt can be represented by the following formula 25.

$$Q_{flt} = \sum_{i=1}^{3} C_i(V_{flt} - V_i) + \quad \text{(formula 25)}$$
$$(C_{p2} + C_{p3})(V_{flt} - V_{dd}) +$$
$$C_{n2} + C_{n3})(V_{flt} - V_{ss}) +$$
$$(C_{n1} + C_{p1})(V_{flt} - V_{pre}) +$$
$$C_{nc}(V_{flt} - V_{ck}) + C_{ni}(V_{flt} - V_{ss})$$

When assuming that the ground voltage $V_{ss}$ is 0, $V_{ck} = V_{dd}$ which means the NMOSFET conducts, $V_{flt} = V_{ss} = 0$, and that flt is initialized by using the ground voltage, the charge amount which is accumulated in flt is obtained as follows.

At the time of initialization, the p-type neuron MOS transistor conducts so that $V_{pre} = V_{dd}$. The charge amount $Q(init)_{flt}$ which is accumulated in flt is represented by the following formula 26, wherein the voltages of the input terminals input[1], input[2] and input[3] are represented as $V(init)_1$, $V(init)_2$ and $V(init)_3$ respectively at the time of initialization.

$$Q(init)_{flt} = -\left[\sum_{i=1}^{3} C_i \cdot V(init)_i + \right. \quad \text{(formula 26)}$$
$$\left. (C_{p1} + C_{p2} + C_{p3} + C_{ni} + C_{nc}) \cdot V_{dd}\right]$$

When the NMOSFET is disconnected to the ground so that flt becomes in the floating state, the voltage of flt is determined by dividing the electrical charge, which is accumulated at the time of initialization, into each of the capacitances. When each voltage of input terminals of the neuron MOS inverter is represented as $V_i$, following formulas 27, 28 and 29 are obtained, wherein $V_{ss} = 0$ and $V_{ck} = 0$.

$$Q(init)_{flt} = \sum_{i=1}^{3} C_i(V_{flt} - V_i) + \quad \text{(formula 27)}$$
$$(C_{p2} + C_{p3})(V_{flt} - V_{dd}) +$$
$$(C_{n1} + C_{p1})(V_{flt} - V_{pre}) + C_{nc} \cdot V_{flt}$$

$$V_{flt} = \frac{1}{C_{total}}\left[\sum_{i=1}^{3} C_i(V_i - V(init)_i) + \right. \quad \text{(formula 28)}$$
$$\left. (C_{p1} + C_{n1})(V_{pre} - V_{dd}) - C_{nc} \cdot V_{dd}\right]$$

$$C_{total} = \sum_{i=1}^{3} C_i + (C_{p1} + C_{p2} + C_{p3}) + \quad \text{(formula 29)}$$
$$C_{n1} + C_{nc}$$

Whether the logic value of the neuron MOS inverter is inverted or not is determined according to whether $V_{flt}$ represented by the formula 28 exceeds a threshold or not. A physical quantity for controlling $V_{flt}$ is the sum of products of the capacitance values of the input terminals and a voltage difference, in which the voltage difference is between a voltage of flt at the time of initialization and the voltage of flt at the time of floating state. That is, the basic physical quantity for controlling the neuron MOS inverter is the electrical charge amount. Therefore, changing the capacitance values of the input terminals has the same effect as that of changing the voltage difference for controlling the neuron MOS inverter. In addition, it is understood, from the formula 28, that any values as well as two-valued values can be used for voltages which are used. Further, When the sum of Ci is much larger than each of $C_{p1}$, $C_{n1}$ and $C_{nc}$, $V_{flt}$ can be represented as follows.

$$V_{flt} = \frac{1}{C_{total}} \sum_{i=1}^{3} C_i(V_i - V(init)_i) \quad \text{(formula 30)}$$
$$= \frac{1}{C_{total}} \{Q_{flt} - Q(init)_{flt}\}$$

$$\sum_{i=1}^{3} C_i \Bigg\rangle\Bigg| C_{p1}, C_{n1}, C_{nc}$$

Figure 50:
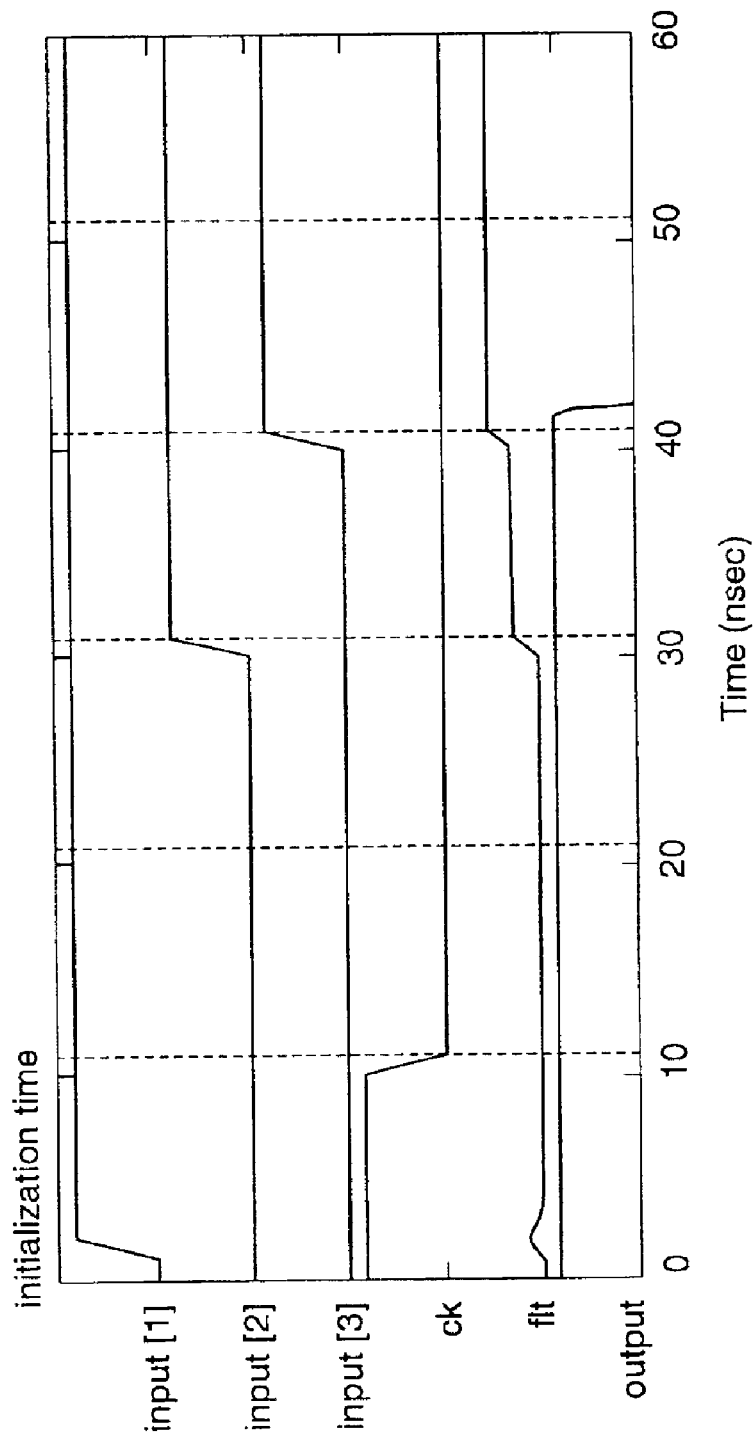
FIG. 50 is a waveform chart which shows change of terminal voltages by a circuit simulation of a neuron MOS inverter of three inputs in a case when a power supply voltages is applied to an input terminal for initialization of the floating gate.
Figure 51:
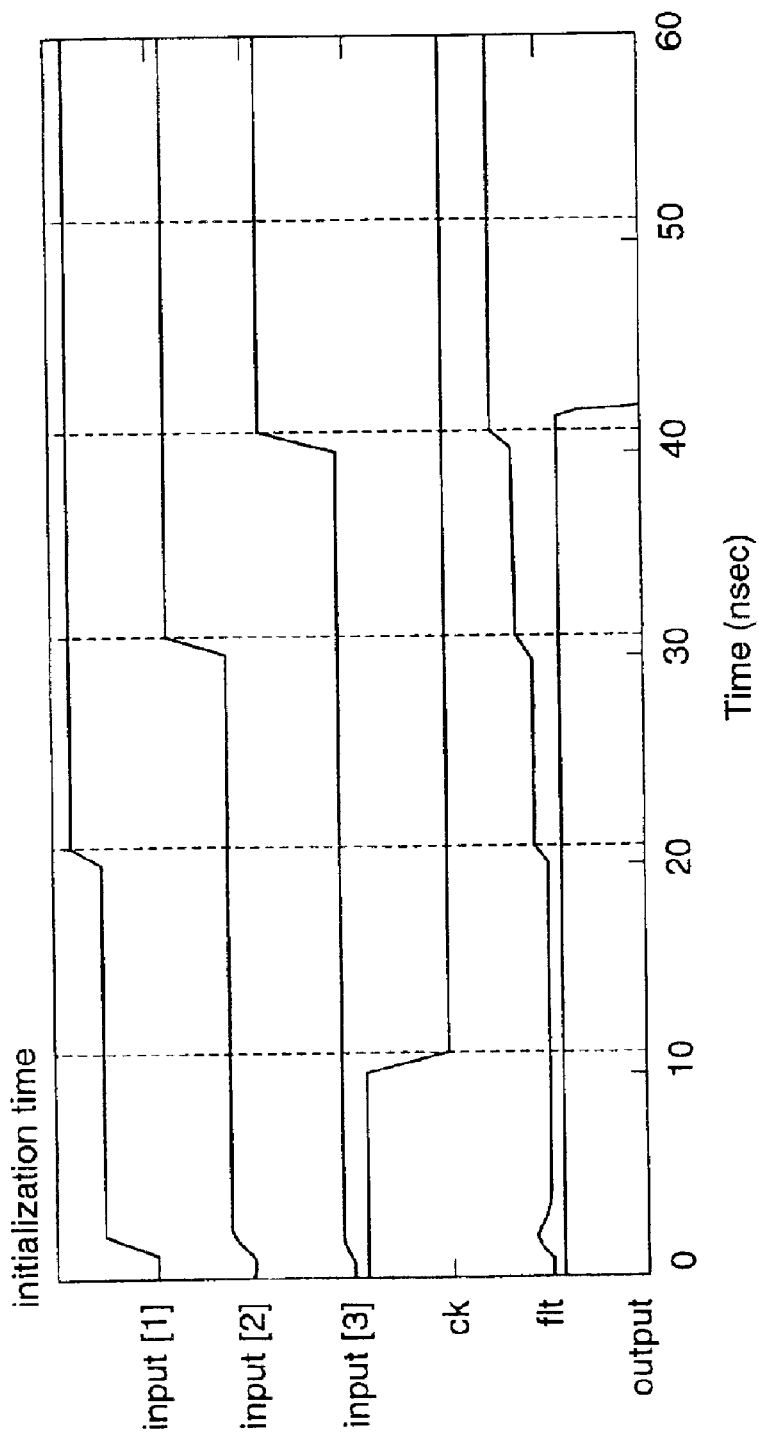
FIG. 51 is a waveform chart which shows change of terminal voltages by a circuit simulation of a neuron MOS inverter of three inputs in a case when ⅝, ¼, ⅛ voltages of a power supply voltage are applied to the three input terminals respectively for initialization of the floating gate.

FIG. 50 and FIG. 51 shows circuit simulation results which shows that continuous voltage values can be stored. In these simulation, the circuit shown in FIG. 49A is used, wherein the capacitance values $C_1$, $C_2$, $C_3$ of each input terminal are the same and the value is C ($C>>C_{p2}$, $C_{p3}$) which satisfies the relationship shown in the formula 30. In addition, the threshold value is near ½ of the power supply voltage ($V_{dd}$).

The simulation result shown in FIG. 50 is obtained as follows. At the time of initialization, the power supply voltage is applied to ck so that the NMOSFET which connects flt to the ground conducts, the voltage of input[1] is set to $V_{dd}$ and the voltages of input[2] and input[3] are set to the ground voltage. After the initialization, the voltage of input[1] is kept at the power supply voltage. Next, the voltage of input[2] is set at the power supply voltage, in addition, the voltage of input[3] is set at the power supply voltage. In this case, the charge amount Q(init)flt at the time of initialization is $C \cdot V_{dd}$. The charge amount Qflt at the time when the voltage of every terminal becomes $V_{dd}$ is $3C \cdot V_{dd}$ and $V_{flt}$ can be represented by the following formula 31.

$$V_{flt} = \frac{2}{3} \cdot V_{dd} > \frac{V_{dd}}{2} \quad \text{(formula 31)}$$

FIG. 50 shows that the voltage of the output terminal is inverted after voltages of all input terminals become the power supply voltage. In addition, FIG. 50 shows that $V_{flt}$ increases by a voltage value which is caused by the difference of charge amount between an charge amount at the time of initialization and an charge amount at each time.

As for the simulation result of FIG. 51, flt is initialized by applying (⅝)·$V_{dd}$ to input[1] applying (¼)·$V_{dd}$ to input[2] and applying (⅛)·$V_{dd}$ to input[3]. In this case, the charge amount at the time of initialization can be represented by the following formula 32.

$$Q(init)_{flt} = C \cdot \left(\frac{5}{8} + \frac{1}{4} + \frac{1}{8}\right) \cdot V_{dd} = C \cdot V_{dd} \quad \text{(formula 32)}$$

In the same way shown in FIG. 50, the output terminal is inverted after the time when the voltages of all the input terminals become the power supply voltage. At this time, the voltage of flt can be represented by the following formula 33, $$V_{flt} = \frac{2}{3} V_{dd} > \frac{V_{dd}}{2} \quad \text{(formula 33)}$$

which is the same as that of the simulation shown in FIG. 50. Accordingly, it is understood that the voltages of the input terminals can be stored as continuous values.

(Embodiment 2-8)

Figure 52:
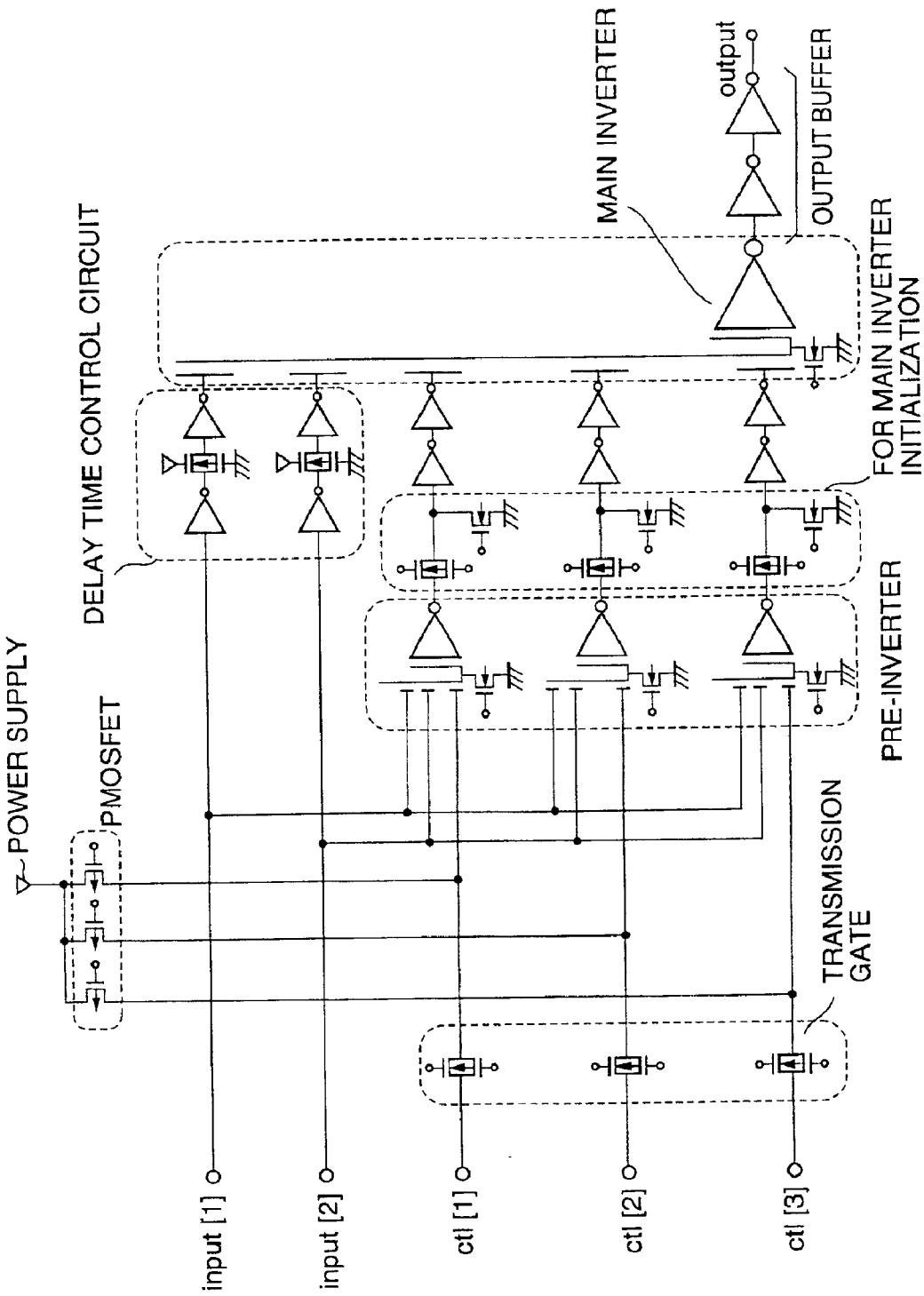
FIG. 52 is a figure of a circuit which can realize any logic function of two two-valued input signals by using multiple-valued values as control signals when the floating gate of the pre-inverters of the neuron MOS circuit which has three control signal terminals is initialized.

The circuit structure shown in FIG. 52 is similar to that shown in FIG. 31. Between the circuits shown in FIG. 52 and FIG. 31, capacitance values between each input terminal and the floating gate are different. According to the circuit shown in FIG. 52, any Boolean function of two input variables (two-valued) can be easily generated by storing multiple-valued values or continuous values in the circuit.

The principle of the operation of this circuit is the same as that of the cell type B shown in FIG. 31. That is, control signals are applied to the control signal terminals temporarily. Then, after the floating gates are operated by a predetermined process, the control signal terminals are connected to the power supply. Accordingly, the control signal values are stored by the neuron MOS transistors. The difference between the circuits shown in FIG. 52 and FIG. 31 is that multiple-valued values or continuous values are used for the control signal in the circuit shown in FIG. 52.

There are following methods for supplying the multiple-valued voltages or the continuous voltages used for the signal which configures the function capability. One method is that voltages generated by multiple power supplies in the outside of the circuit of the present invention are supplied directly as the multiple-valued voltages. Another method is that analog voltages generated by an analog circuit in the outside of the circuit of the present invention are supplied directly. Even another method is that an impedance network provided in the integrated circuit generates and supplies the multiple-valued voltages or the continuous voltages.

In the following, the impedance network will be described with reference to FIGS. 53 and 54.

Figure 53:
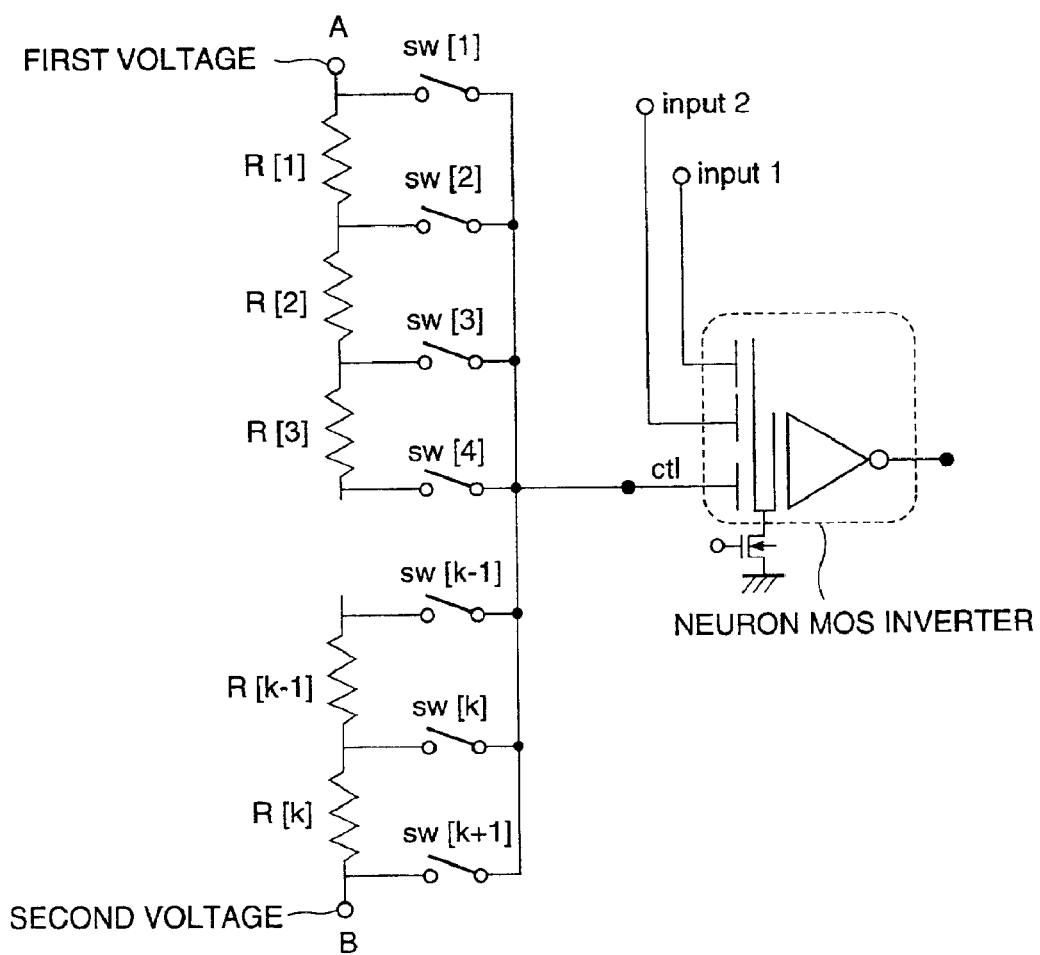
FIG. 53 is a circuit diagram showing an example of an impedance network for generating multiple-valued voltages.

FIG. 53 shows a structure of a circuit in which the multiple-valued voltages are generated by using a first voltage ($V_1$) and another set voltage ($V_2$) which are supplied from the outside or are generated in the inside, and supplied to a ctl terminal which is one of the input terminals of the neuron MOS inverter.

As shown in FIG. 53, the circuit is configured such that the terminal A and the terminal B are connected via k resistance elements R[1], R[2], R[3], . . . , R[k−1] and R[k], and, terminals of each resistance element and the ctl terminal are connected via switches sw[1], sw[2], sw[3], sw[4], sw[k−1], sw[k] and sw[k+1], wherein the first voltage is applied to the terminal A, the second voltage is applied to the terminal B and $V_1 \neq V_2$ is satisfied. In the circuit, if only sw[1] is connected, the voltage of the ctl terminal is $V_1$, and if only sw[k+1] is connected, the voltage of the ctl terminal is $V_2$.

In the following, the operation of this circuit will be described.

A switch sw[h] is selected from k−1 switches of k+1 switches excluding sw[1] and sw[k+1] and is connected, wherein $2 \leq h \leq k$ is satisfied. By performing this operation, the voltage of the ctl terminal becomes $V_{ctl}$ as shown below.

$$V_{ctl} = \frac{1}{\sum_{i=1}^{k} R[i]} \left( V_1 \sum_{i=h}^{k} R[i] + V_2 \sum_{i=1}^{h-1} R[i] \right) \quad \text{(formula 34)}$$

The formula 34 shows that the multiple-valued voltage can be generated when the voltage used for the first voltage and the voltage used for the second voltage are two different voltages used in the integrated circuit.

In the circuit shown in FIG. 53, resistance elements which have constant resistance are used. Instead, resistance elements which have variable resistance such as MOS transistors can also be used. In addition, the switches can be replaced by transmission gates, pass transistors, multiplexer circuits or the like.

Figure 54:
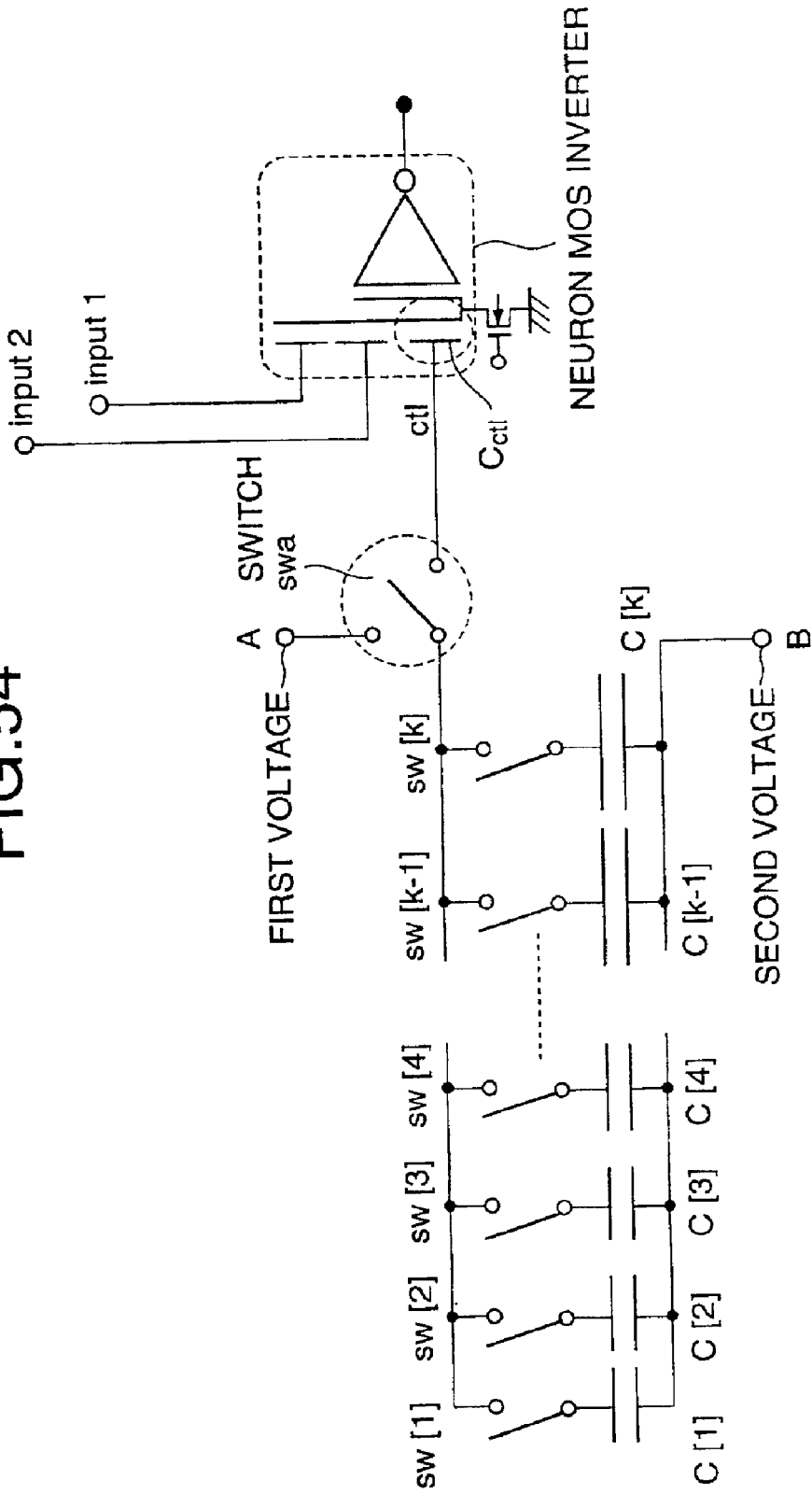
FIG. 54 is a circuit diagram showing another example of an impedance network for generating multiple-valued voltages.

FIG. 54 shows a structure of a circuit in which the multiple-valued voltages are generated by using a first voltage ($V_1$) and another set voltage ($V_2$) which are supplied from the outside or are generated in the inside, and supplied to the ctl terminal which is one of the input terminals of the neuron MOS inverter. In this circuit, $V_1 > V_2$ is assumed. As shown in FIG. 54, a first voltage is applied to the terminal A and a second voltage is applied to the terminal B. The circuit includes k capacitances C[1], C[2], ..., C[k-1] and C[k] between the terminal A and the terminal B, wherein capacitances C[1], C[2], ..., C[k-1] and C[k] have switches sw[1], sw[2], sw[3], sw[4], ..., sw[k-1] and sw[k] respectively, one terminal of the capacitance is connected to the terminal B and another terminal is connected to one terminal of a switch swa via the switch. The switch swa is connected to the terminal A or to the ctl terminal which is one of input terminals of the neuron MOS inverter.

In the following, the operation of this circuit will be described.

First, the switch swa is connected to the terminal A and the switches sw[1], sw[2], sw[3], sw[4], ..., sw[k-1] are set for continuity. After all capacitances are charged, the switch swa is disconnected from the terminal A and the switches sw[1], sw[2], sw[3], sw[4], ..., sw[k-1] and sw[k] are disconnected. At this time, only a switch sw[h] among the switches is set to conducting and the swa is connected to the ctl terminal. Assuming that a capacitance value between the ctl terminal and the floating gate of the neuron MOS inverter is Cctl and that electrical charge is not accumulated in the capacitance before the switch swa is connected to th ctl terminal, the voltage VCtl of the ctl terminal due to the above-mentioned operation is represented by the following formula 35.

$$V_{ctl} = \frac{C[h]}{C[h] + C_{ctl}} V_1 \quad \text{(formula 35)}$$

The formula 35 shows that the multiple-valued voltages can be generated by changing the capacitance values of the k capacitances when the first voltage and the second voltage are different voltages used in the integrated circuit, that is, two-valued voltages. In the circuit shown in FIG. 54, each capacitance may be configured as a capacitance network which includes series-parallel connected capacitances. In addition, the switches can be replaced by transmission gates or pass transistor or the like.

Figure 55:
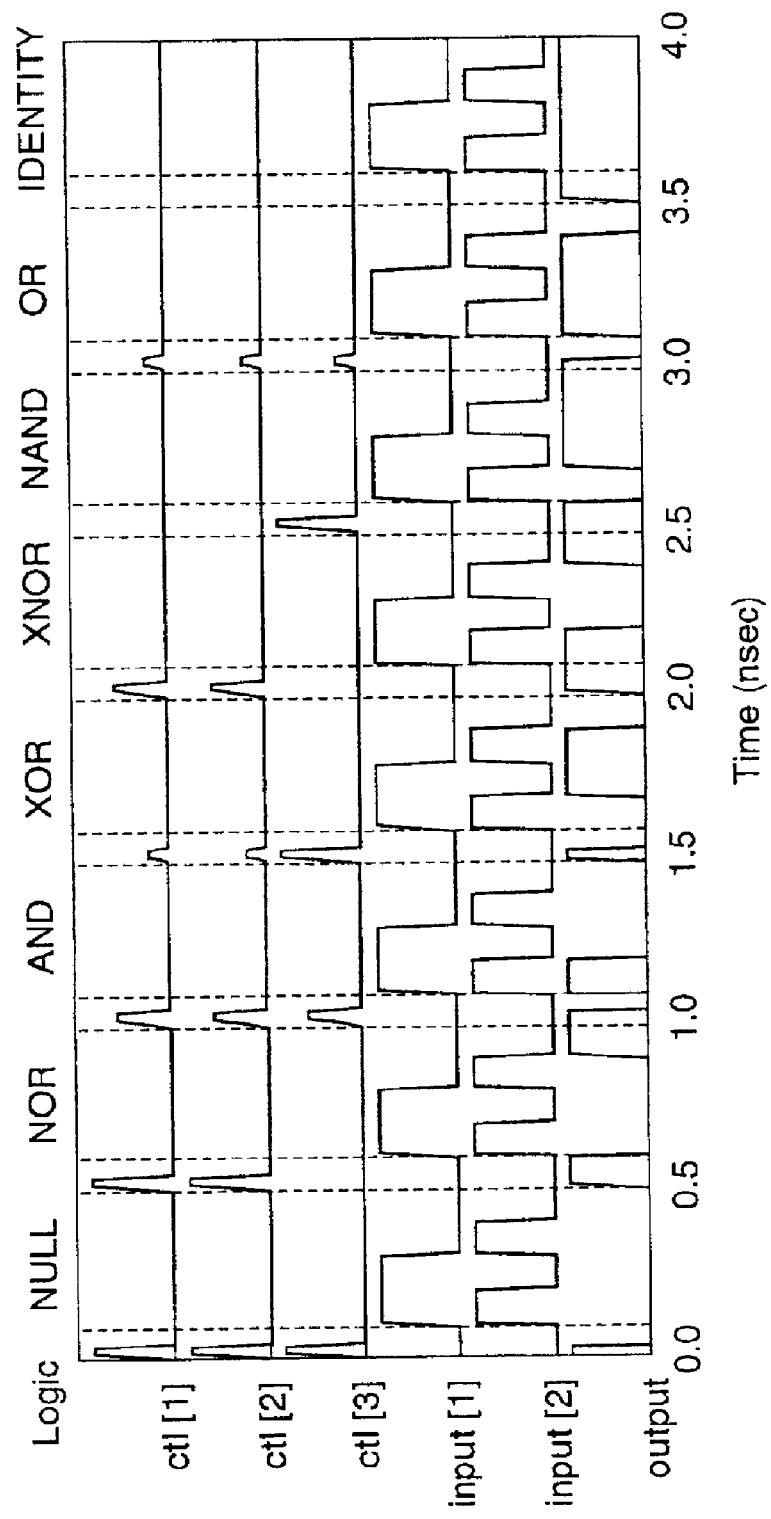
FIG. 55 is a waveform chart of voltages of terminals by a circuit simulation in a case of symmetric functions.
Figure 56:
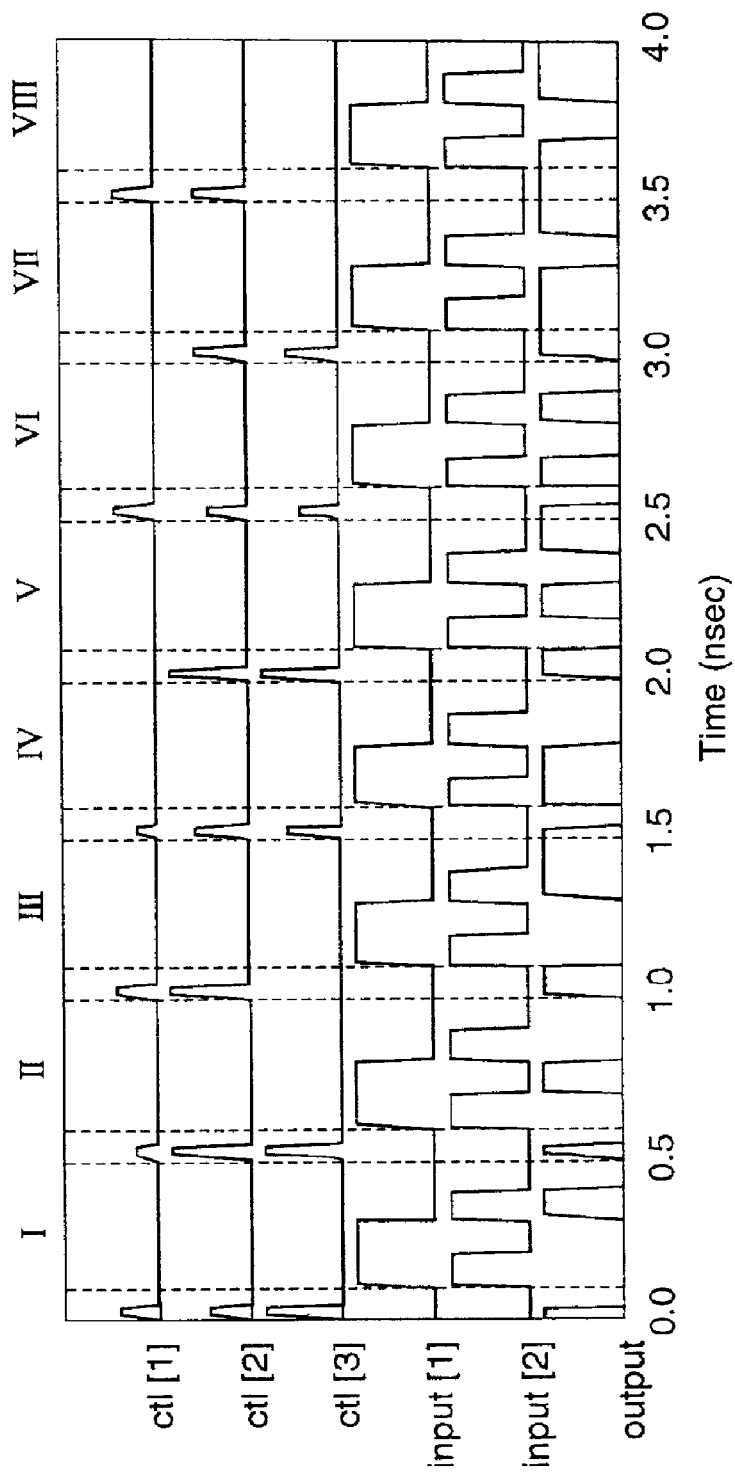
FIG. 56 is a waveform chart of voltages of terminals by a circuit simulation in a case of unsymmetric functions.

FIG. 55 and FIG. 56 show circuit simulation results in which multiple-valued voltages are stored in the circuit shown in FIG. 52 so that functions are generated. FIG. 55 shows a simulation result of generating symmetric functions. FIG. 56 shows a simulation result of generating unsymmetric functions by changing control signals. In FIGS. 55 and 56, the lateral axis indicates time (μsec) and the vertical axis indicates voltages of each terminal. In the simulation shown in FIG. 56, eight functions are generated which are shown on the graph as eight intervals. The meaning of each interval is shown in FIG. 57. Each meaning is shown as a Boolean expression in which $X_1$ is a value of input[1], $X_2$ is a value of input[2], $X'_1$ and $X'_2$ are logically inverted values of $X_1$ and $X_2$.

As shown in this embodiment, the number of functions which can be generated increases without increasing the size of the integrated circuit by storing multiple-valued values or continuous values which are provided temporarily. Therefore, the capability of the integrated circuit is improved easily.

(Embodiment 2-9)

Figure 58:
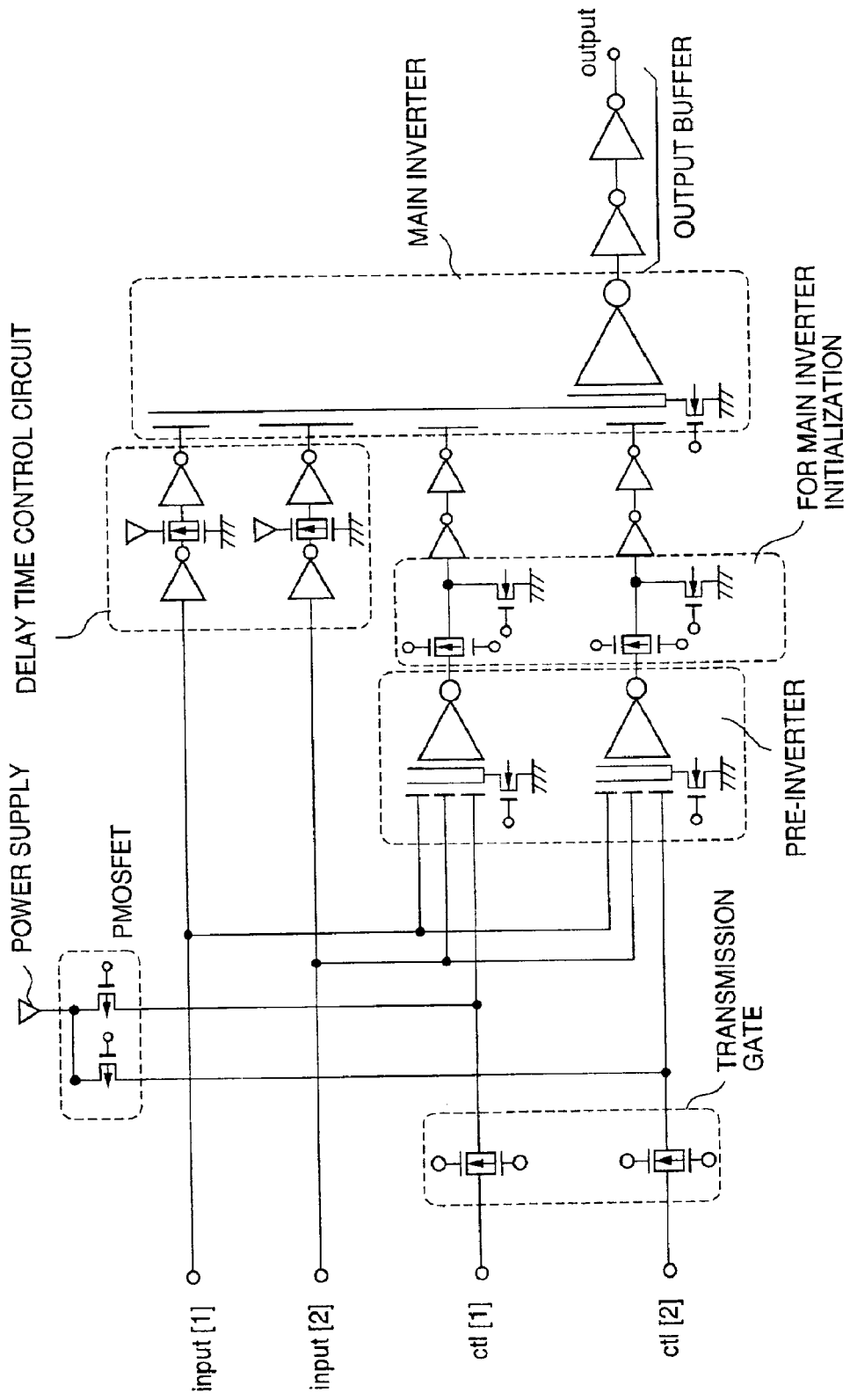
FIG. 58 is a figure of a circuit which can realize any logic function of two two-valued input signals by using multiple values as control signals and as input signals when the floating gate of the pre-inverters of the neuron MOS circuit which has three control signal terminals is initialized.

FIG. 58 shows a structure of a neuron MOS circuit according to an embodiment 2-9. According to the embodiment 2-9, any logic function of two input variables can be generated by applying multiple-valued values or continuous values to input signal terminals and control signal terminals and by storing the values when the floating gates of the main inverter and the pre-inverters.

The circuit shown in FIG. 58 is the same capability as that shown in FIG. 52, however, the circuit shown in FIG. 58 requires smaller number of pre-inverters than that of FIG. 52. Therefore, it becomes possible to decrease circuits of the pre-inverters and circuits which accompany the pre-inverters. The operation for the circuit shown in FIG. 58 is the same as that for the cell type B shown in FIG. 31 except for following points.

In the operation procedure for the circuit shown in FIG. 58, predetermined multiple-valued voltages are applied to the input signal terminals input[1] and input[2] when the floating gate of the main inverter is initialized, and, the multiple-valued voltages are applied to the control signal terminals ctl[1] and ctl[2] when the floating gates of the pre-inverters are initialized.

Figure 59:
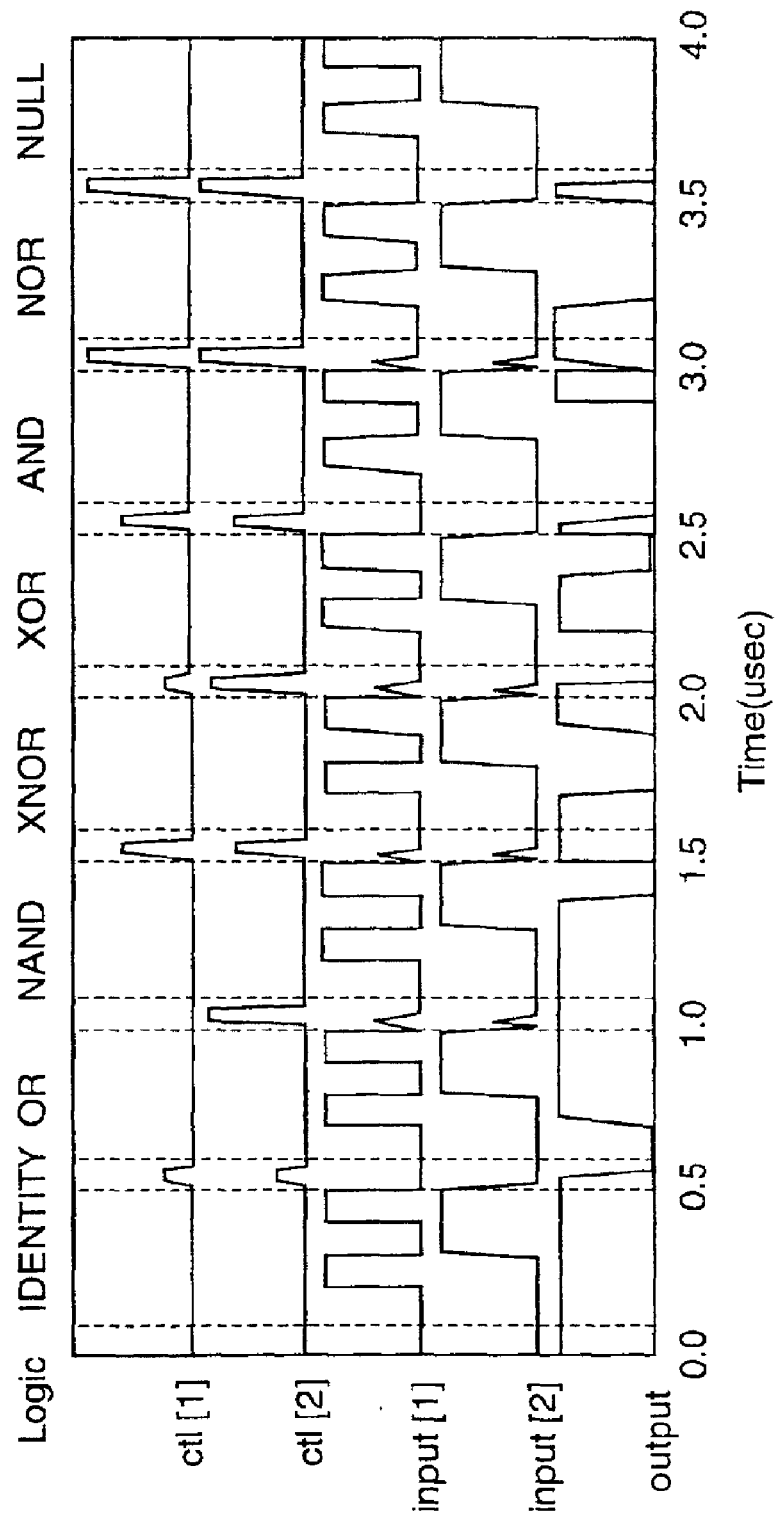
FIG. 59 is a waveform chart of voltages of terminals by a circuit simulation in a case of symmetric functions.
Figure 60:
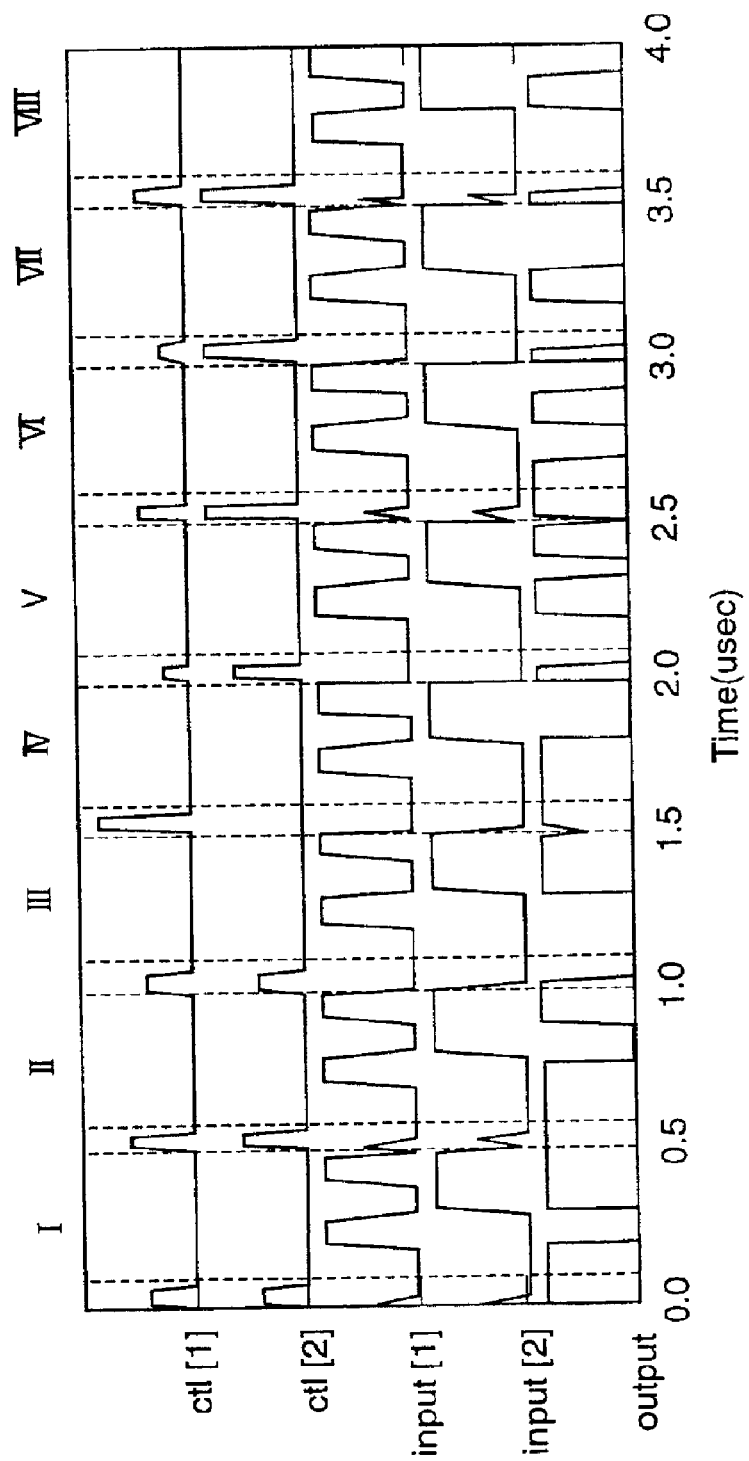
FIG. 60 is a waveform chart of voltages of terminals by a circuit simulation in a case of unsymmetric functions.

FIG. 59 and FIG. 60 show circuit simulation results according to this embodiment, in which it is verified that the circuit shown in FIG. 58 can generate any logic function of two-valued two input variables. In FIG. 59 and FIG. 60, the lateral axis indicates time (μsec) and the vertical axis indicates voltages of each terminals. FIG. 59 shows a simulation result for verification of realizing symmetric functions, in which the names of logic are shown. In the simulation shown in FIG. 60, eight functions are generated which are shown on the graph as eight intervals. The meaning of each interval is shown in FIG. 61. Each meaning is shown as a Boolean expression in which $X_1$ is a value of input[1], $X_2$ is a value of input[2], $X'_1$ and $X'_2$ are logically inverted values of $X_1$ and $X_2$.

According to this embodiment, input two-valued values are changed to multiple-valued values or continuous values by using multiple-valued values or continuous values which are stored at the time of initialization. Thus, the number of transistors is further decreased comparing with the embodiment 2-8.

(Embodiment 2-10)

In an embodiment 2-10 shown in FIGS. 62A–62D, multiple-valued values or continuous values are represented by using time during which the voltage is applied instead of using voltage values as in the embodiment 2-8. That is, two-valued voltage values are applied, wherein time widths (voltage pulse widths) during which time widths voltages are applied are controlled for representing the multiple-valued values or continuous values.

FIG. 62A shows a circuit diagram equivalent to a main component of one of input signal terminals of a neuron MOS transistor. As shown in FIG. 62A, the main component is a series connection of a resistance and a capacitance. In the case of applying the power supply voltage $V_{dd}$ to this circuit, transient characteristics of the capacitance voltage V(t) and the charge amount Q(t) which is accumulated in the capacitance are represented by the following formulas 36 and 37, wherein R is the value of resistance, C is the value of the capacitance and an initial voltage $V_0$=0.

$$V(t) = V_{dd} \cdot \left[1 - \exp\left(-\frac{t}{RC}\right)\right] \quad \text{(formula 36)}$$

$$Q(t) = C \cdot V_{dd} \cdot \left[1 - \exp\left(\frac{t}{RC}\right)\right] \quad \text{formula 37}$$

FIG. 62B shows the transient characteristics of the charge amount represented by the formula 37 when the power supply voltage is $V_{dd}$ and $0.5V_{dd}$. In FIG. 62B, the lateral axis indicates time and the vertical axis indicates voltages which are normalized by $V_{dd}$. In FIG. 62B, the upper curve shows the case of $V_{dd}$, and the lower curve shows the case of $0.5V_{dd}$. In the circuit shown in FIG. 52, when multiple-valued voltages are applied to the control signal terminals, the time taken for reaching the saturation point in the case of $0.5V_{dd}$ in FIG. 62B is used.

Assuming that teq is a time taken for accumulating a charge amount, by using the power supply voltage $V_{dd}$, which is the same as the charge amount at the saturation point in the case of $0.5V_d$, a state equivalent to the state in which the charge is accumulated to the saturation point by using $0.5V_{dd}$ can be realized by disconnecting from the power supply at the time of teq. This equivalency is shown in FIGS. 62C and 62D. The accumulated charge amount shown in FIG. 62C can be the same as the accumulated charge amount shown in FIG. 62D, wherein the accumulated charge amount shown in FIG. 62C is accumulated in the capacitance by applying $0.5V_{dd}$ for over a period (t>1) and the accumulated charge amount shown in FIG. 62D is accumulated in the capacitance by applying $V_{dd}$ for a predetermined period (t=teq).

Figure 63B:
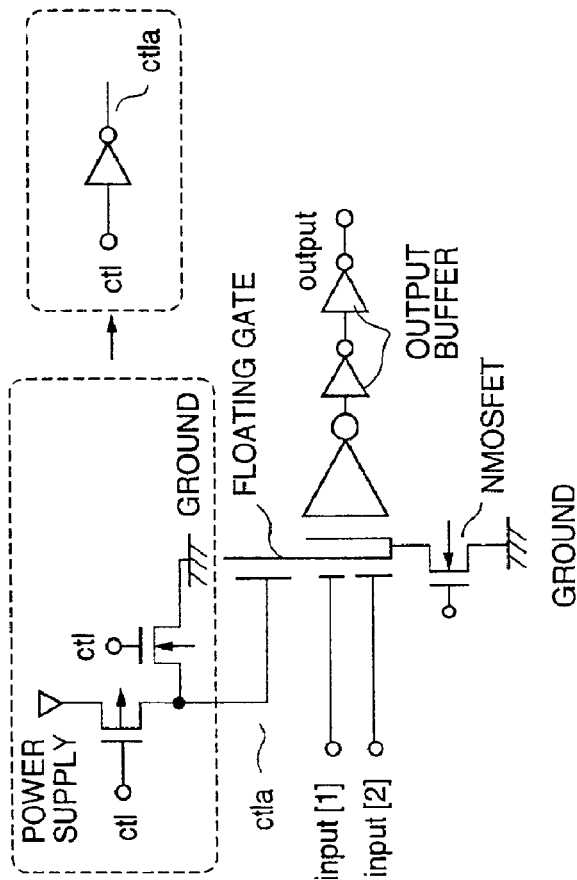
Figure 63A:
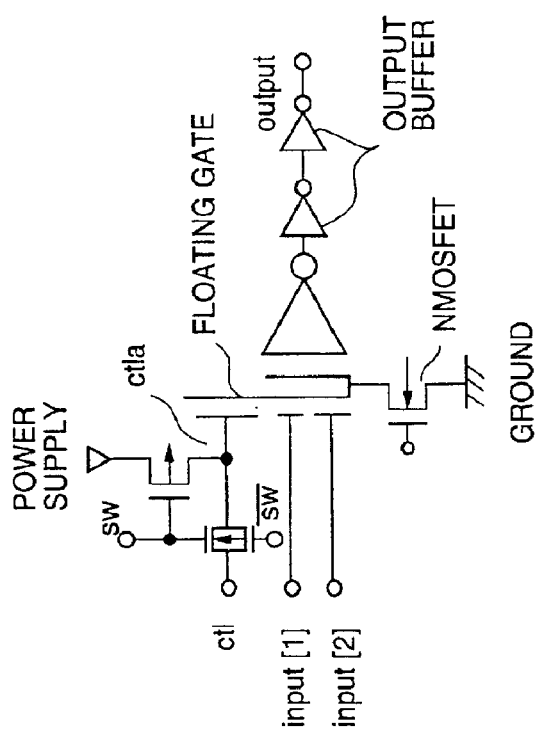

FIGS. 63A and 63B show neuron MOS inverters based on the above-mentioned idea. FIG. 63A shows one of the pre-inverters of FIG. 52. In this pre-inverter, the multiple-valued voltage is applied to the ctl terminal when the floating gate is initialized. After the initialization, the connection is switched to the power supply and the multiple-valued voltage is stored in the floating gate. As for the neuron MOS inverter shown in FIG. 63B, a charge amount can be accumulated by using the method in which the time for applying the voltage is controlled as shown in FIG. 62D. By using the voltage which is applied to the control signal terminal ctl, the input terminal ctla is connected to or disconnected from the power supply or the ground. This switching part can be regarded as a standard CMOS inverter.

Figure 64:
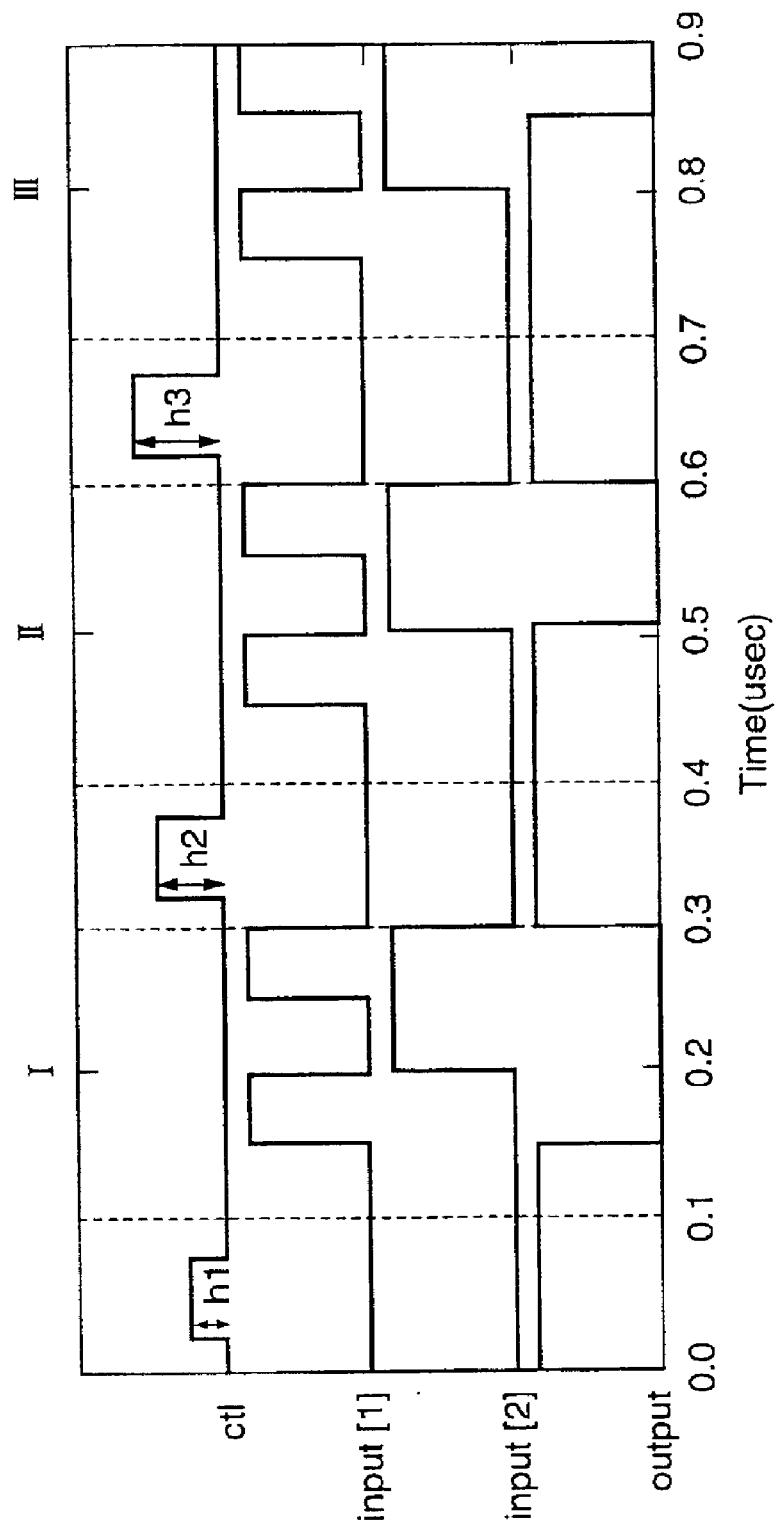
FIG. 64 shows a result by circuit simulation in which different functions are generated by applying three multiple-valued voltages to the control signal terminal ctl shown in FIG. 63A for initialization.

FIG. 64 shows a result by circuit simulation in which different functions are generated by applying three multiple-valued voltages to the control signal terminal ctl shown in FIG. 63A for initialization. In FIG. 64, the lateral axis indicates time (μsec) and the vertical axis indicates voltages of each terminal. 0~0.1 μsec is a period for initialization for an interval I, in the same way, a period for initialization is provided also for each interval of II and III. As shown in FIG. 64, different functions are realized in the intervals I, II and III.

Figure 65:
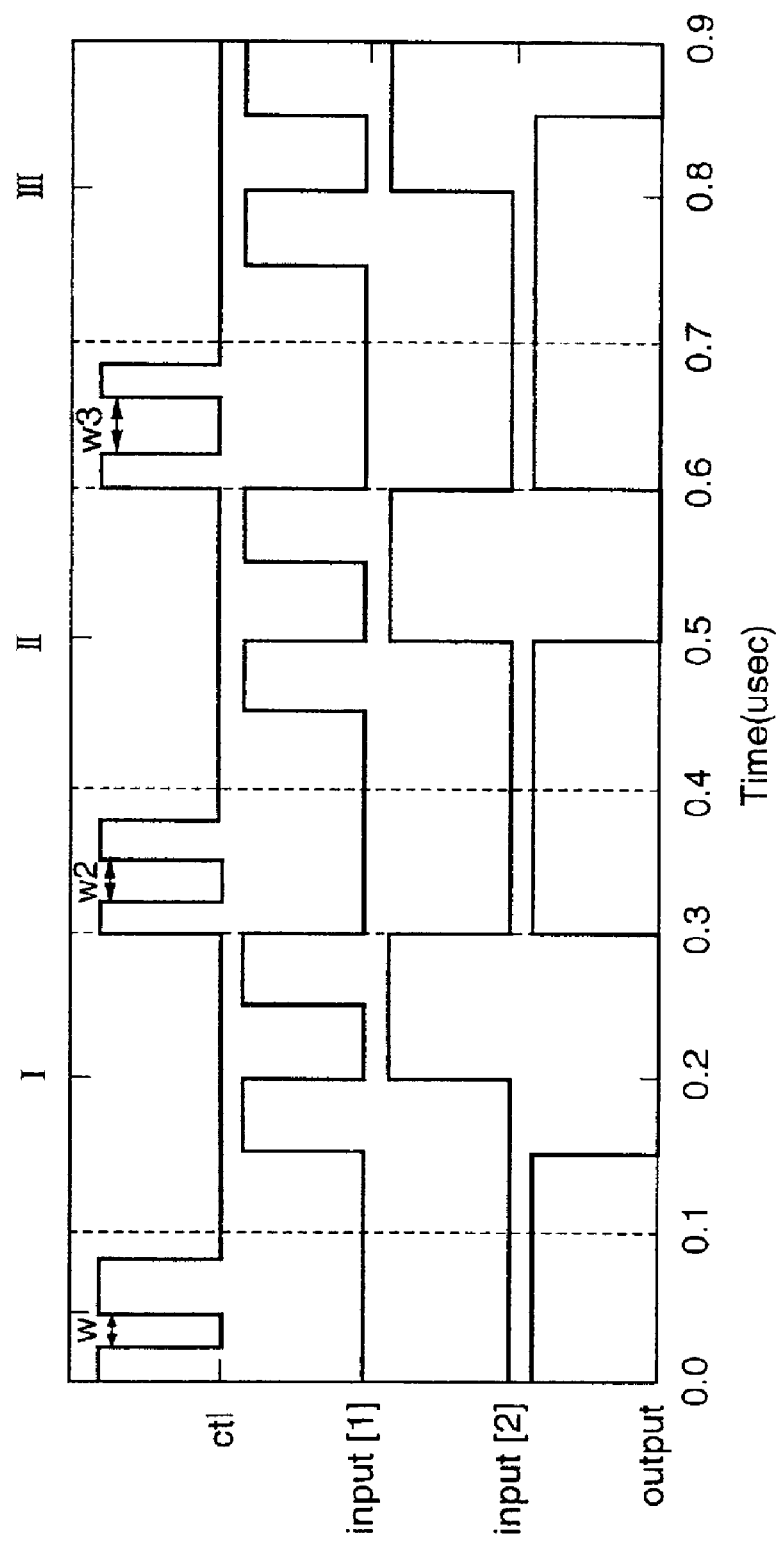
FIG. 65 shows a result by circuit simulation for the neuron MOS inverter shown in FIG. 63B in which different functions are realized by applying two-valued voltages where applying time is controlled when initializing the floating gate.

FIG. 65 shows a result by circuit simulation for the neuron MOS inverter shown in FIG. 63B. The lateral axis and the vertical axis are the same as those shown in FIG. 64. In addition, the periods for initialization and the voltages of input[1] and input[2] during intervals I, II and III are the same as those shown in FIG. 64. In this simulation, the power supply voltage or the ground voltage is applied to the ctl terminal in which the periods for applying the ground voltage to the ctl terminal are changed during initialization periods in the intervals I, II and III as $w_1$, $w_2$ and $w_3$ respectively. That is, describing by using FIG. 63B, the periods for applying the power supply voltage to the ctla terminal are changed like $w_1$, $w_2$ and $W_3$. As a result, a output voltage characteristic same as the case of FIG. 64 can be obtained. Thus, as shown in FIG. 65, it is understood that initialization which is equivalent to the initialization in which the multiple-valued value is used can be realized by control the period for applying the voltage when two-valued voltages are used. In FIG. 63B, the pass transistor is regarded as a resistance element and the capacitance between the ctla terminal and the floating gate is regarded as a capacitance element, wherein RC time constant of the resistance and the capacitance is adjusted.

Figure 66:
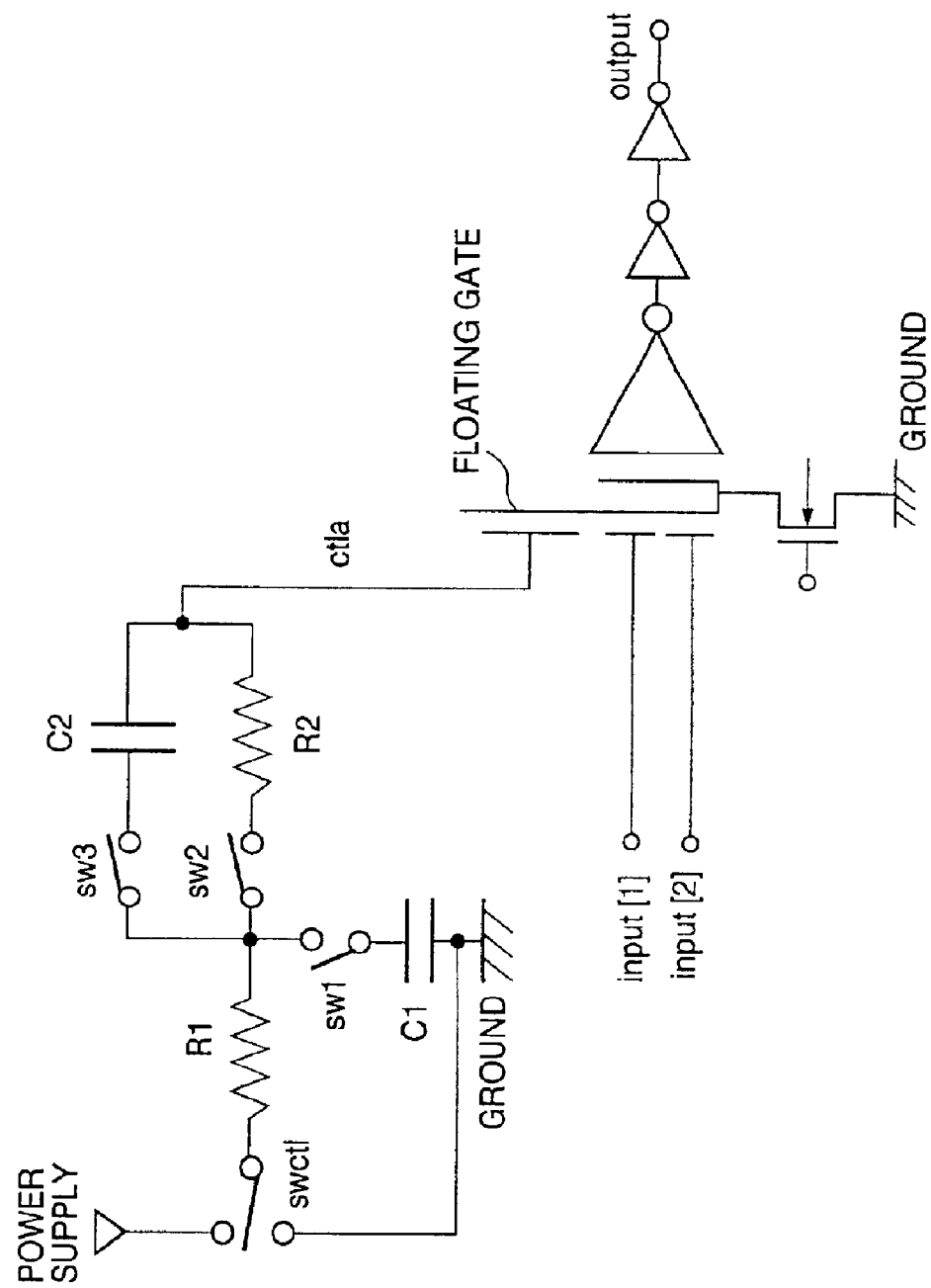
FIG. 66 shows an example of a circuit for generating multiple-valued values easily.

FIG. 66 shows a circuit diagram in which the circuit shown in FIG. 63B is generalized wherein multiple-valued values are generated easily by controlling the period for applying voltages.

The circuit shown in FIG. 66 includes a series-parallel network with switches of resistance elements and capacitance elements which is provided before the ctla terminal of the neuron MOS inverter. A switch swctl can be connected to the power supply or the ground. The switch swctl and the resistance element R1 correspond to the PMOSFET and NMOSFET which are connected to the ctla terminal in FIG. 63B. C1 is a capacitance connected in parallel to the capacitance between the ctla terminal and the floating gate. C2 is a capacitance connected in series to the capacitance between the ctla terminal and the floating gate. The two capacitances can be connected or disconnected by using sw1 and sw3. R2 is a resistance element which is connected in series to R1 and is connected in parallel to C2. R2 is connected to R1 via the switch sw2. According to providing this network including these resistance elements and capacitance elements, operation of time for accumulating electrical charge into the capacitance between the ctla terminal and the floating gate becomes easy by appropriately selecting the resistance values, the capacitance values and switching the switches.

Figure 67:
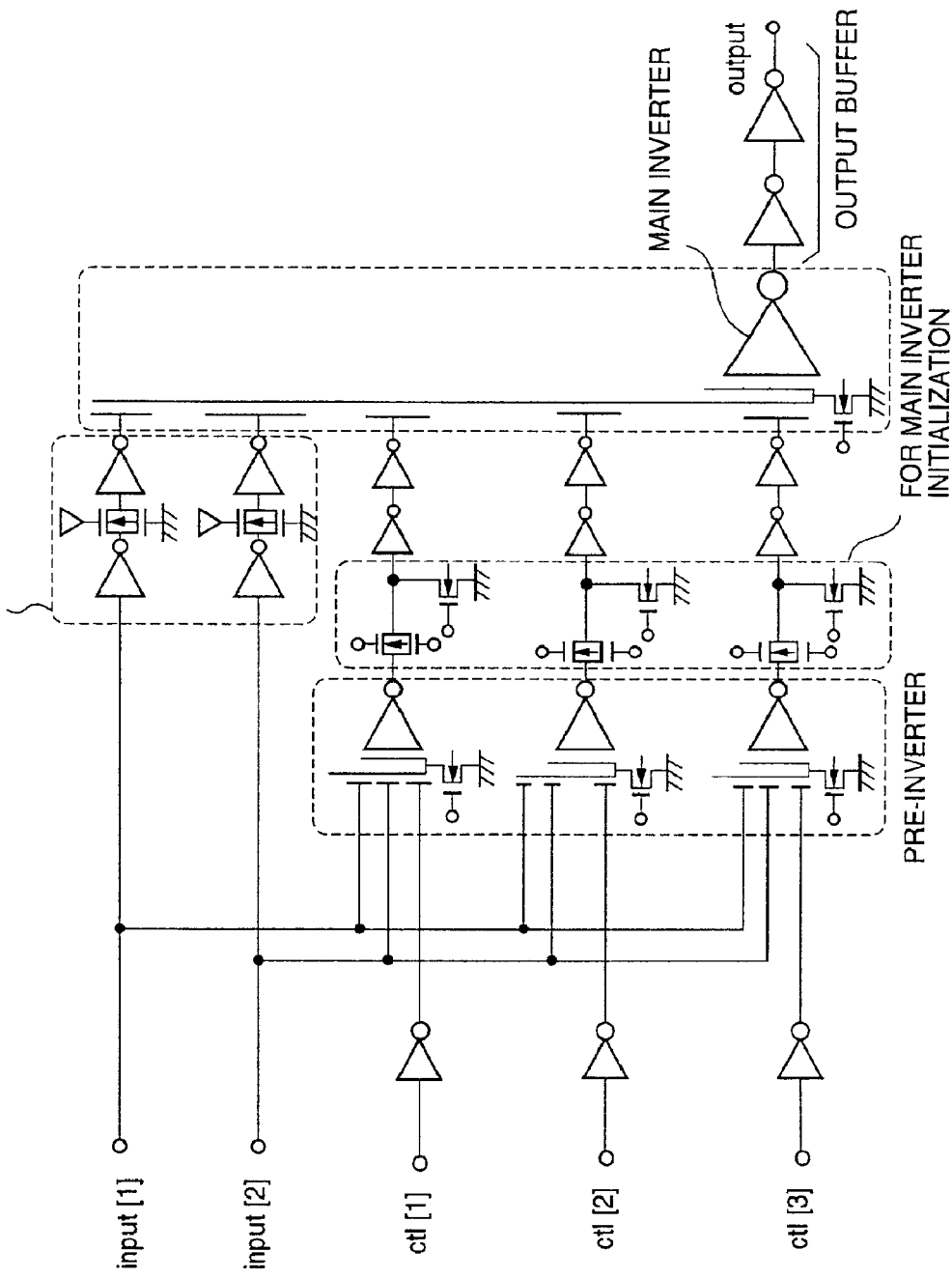
FIG. 67 shows a circuit in which any logic function of two-valued two input variables can be realized by controlling time for applying two-valued voltages.

FIG. 67 shows a circuit which has the same capability of the circuit shown in FIG. 52 in which any logic function of two-valued two input variables can be realized by controlling period for applying two-valued voltages into the control signal terminal.

Figure 68:
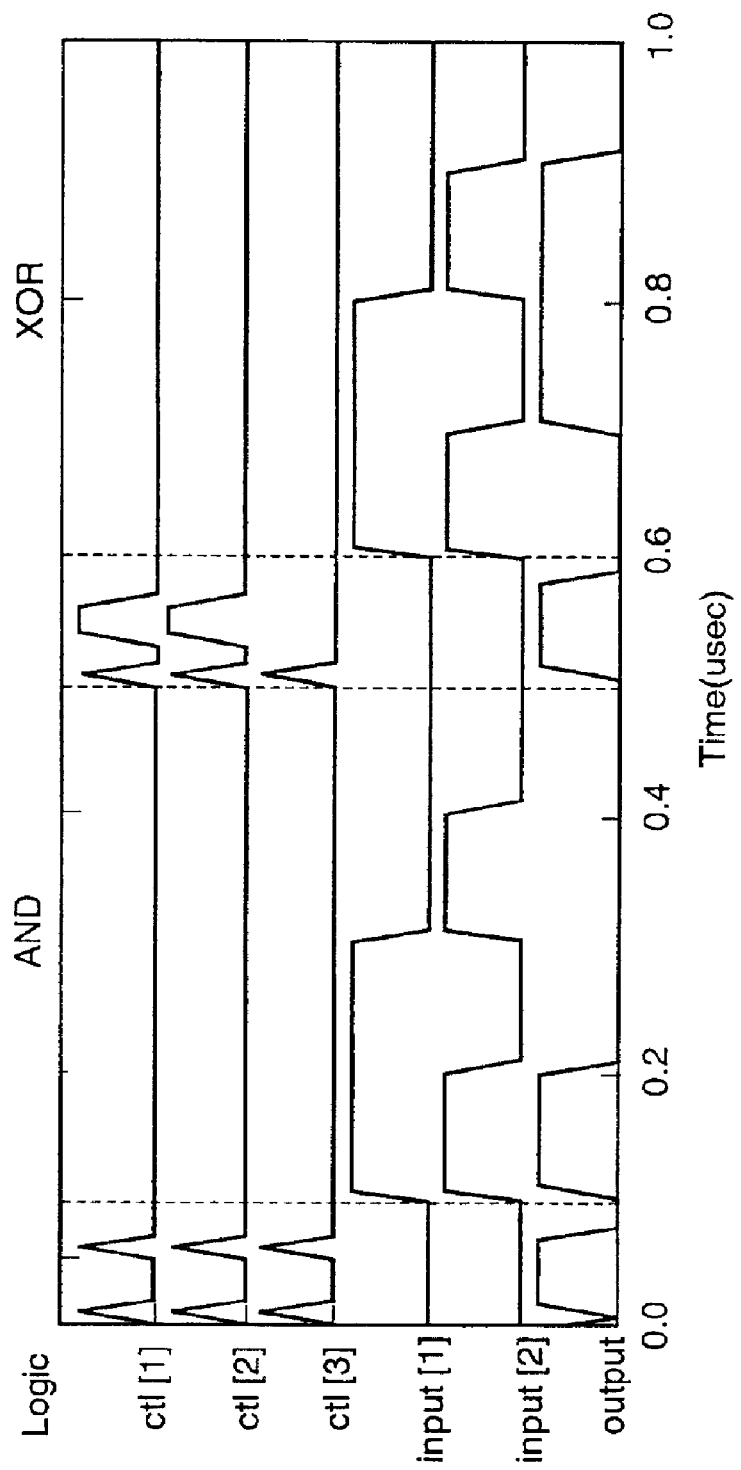
FIG. 68 shows a result by circuit simulation of the circuit shown in FIG. 67, in which AND and XOR are realized.

FIG. 68 shows a result by circuit simulation of the circuit shown in FIG. 67, in which AND and XOR are realized. In FIG. 68, the lateral axis indicates time and the vertical axis indicates voltages of terminals. As shown in FIG. 68, AND and XOR are realized by controlling periods for applying voltages to the control signal terminals ctl[1], ctl[2] and ctl[3] during initialization.

Figure 69:
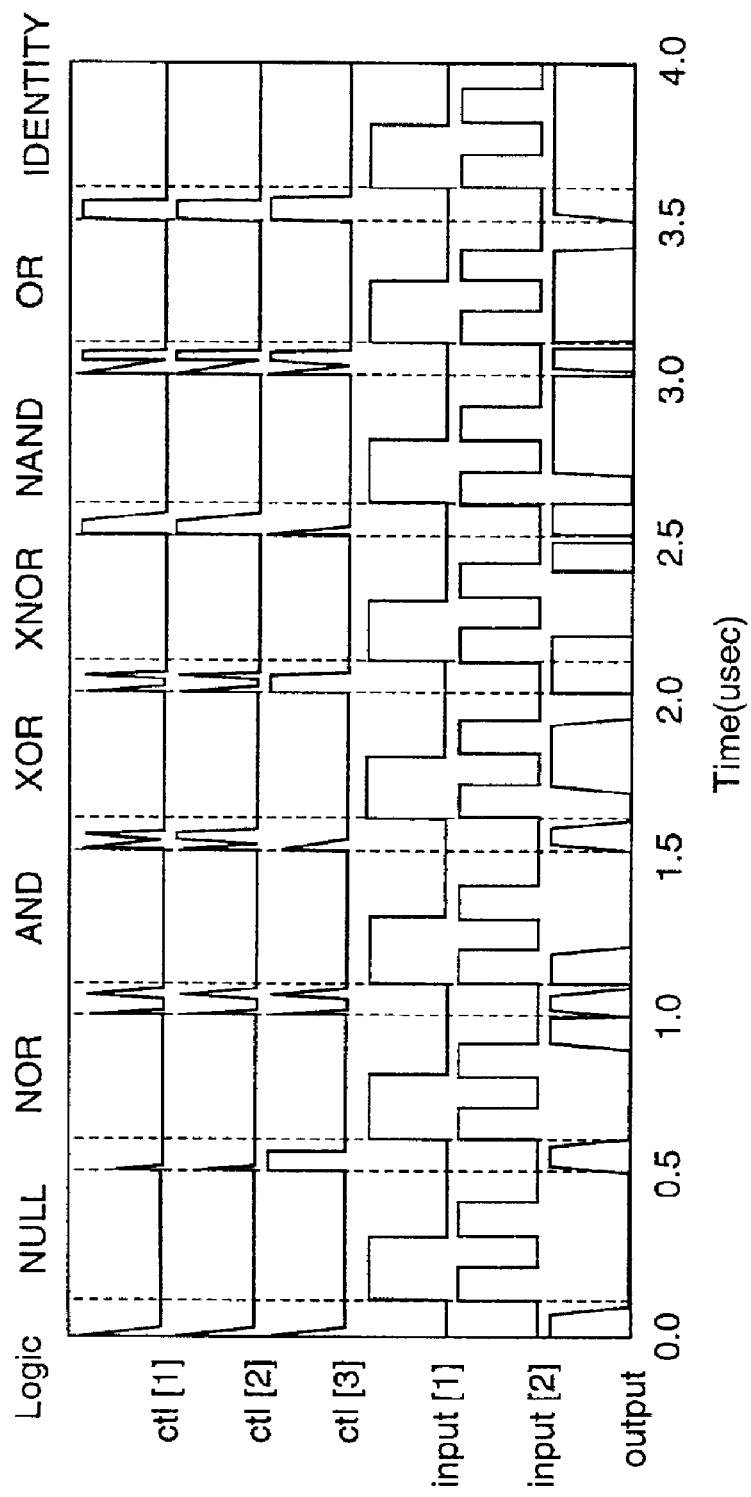
FIG. 69 is a waveform chart of voltages of terminals by a circuit simulation of a neuron MOS circuit which receives two-valued voltage input signals which realizes symmetric functions by controlling time intervals for applying voltages.
Figure 70:
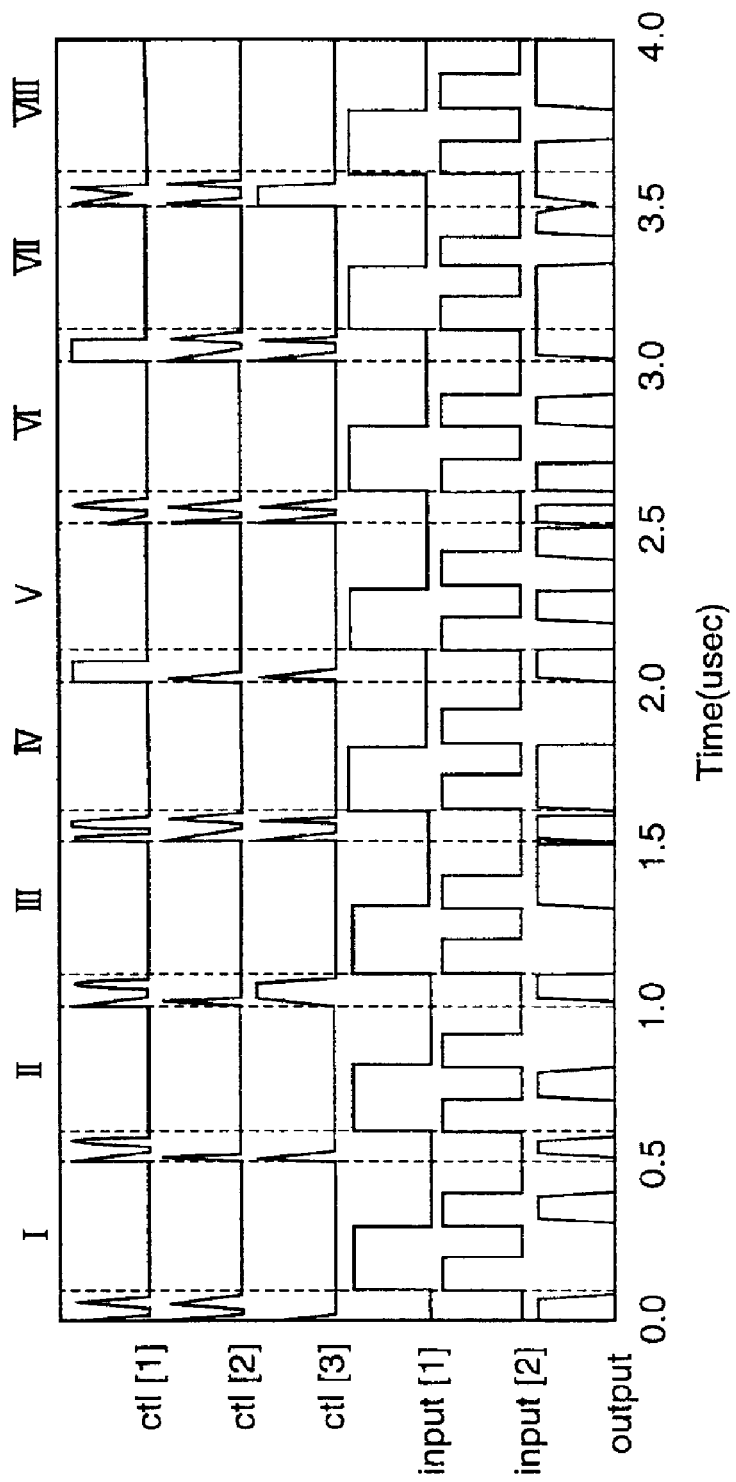
FIG. 70 is a waveform chart of voltages of terminals by a circuit simulation of a neuron MOS circuit which receives two-valued voltage input signals which realizes unsymmetric functions by controlling time intervals for applying voltages.

FIGS. 69 and 70 are also results of circuit simulations of the circuit shown in FIG. 67. The lateral axis indicates time and the vertical axis indicates voltages of each terminal. FIG. 69 shows symmetric functions and FIG. 70 shows unsymmetric functions. FIG. 71 indicates the meaning of the unsymmetric function, by using Boolean expression, corresponding to each interval of I~VIII shown in FIG. 70, wherein $X_1$ is a value of input[1], $X_2$ is a value of input[2], $X'_1$ and $X'_2$ are logically inverted values of $X_1$ and $X_2$.

As mentioned above, according to this embodiment, the capability of multiple-valued voltages or continuous voltages can be obtained by controlling the period for applying voltages even when two-valued voltages are used, and any logic function of two-valued two input variables can be realized.

As mentioned above, according the embodiments 2-1-2-10, by using the function configuration data storing method, it becomes possible to configure a function capability even after manufacturing of an integrated circuit. In addition, since the integrated circuit for performing function processing has a storing capability, any memory element or memory circuit only for storing data is not necessary so that the area for configuring a circuit of changeable logic part or function processing part can be decreased. Further, since the function configuration data is written or deleted speedily by controlling the electrical switches, dynamic reconfiguration of function capabilities is realized. Furthermore, since not only two-valued values but also multiple-valued values or continuous values can be stored as the function configuration data, advanced programmable hardware can be realized.

(Embodiments 3~1~3~4)

In the following, the embodiments 3-1~3-4 will be described in terms of realizing symmetric functions and selector capabilities on the basis of the principle described in the embodiment 1-1 and the like.

(Embodiment 3-1)

Figure 72:
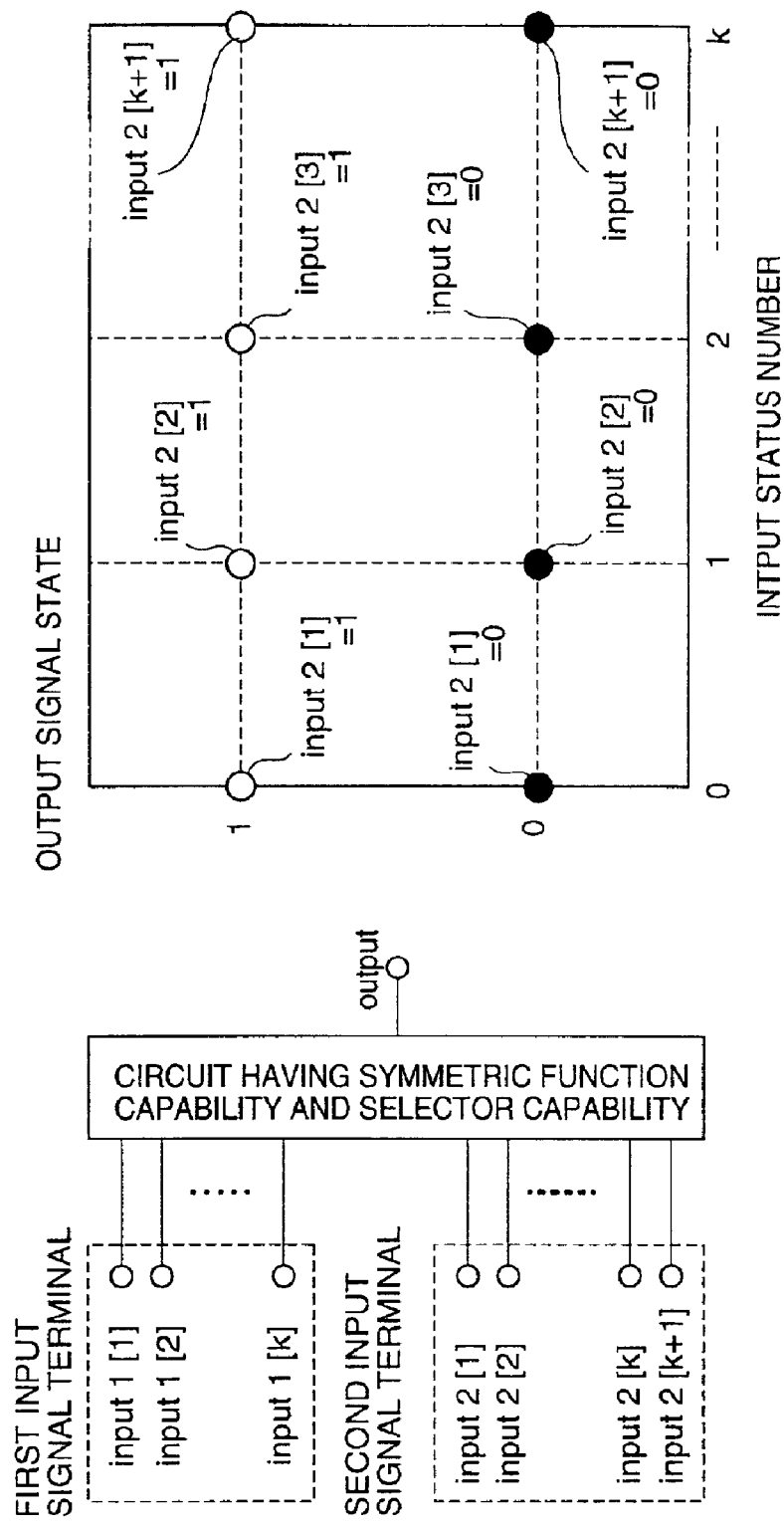
FIG. 72A shows a structure of a function reconfigurable integrated circuit 401 according to an embodiment of the present invention.
FIG. 72B is a figure for explaining a principle of the integrated circuit 401.

FIG. 72A shows a structure of a function reconfigurable integrated circuit 401. FIG. 72B is a figure for explaining a principle of the integrated circuit 401.

The function reconfigurable integrated circuit 401 has a symmetric function capability of k input variables and a selector capability which selects a value from k+1 input values.

The function reconfigurable integrated circuit 401 includes k first input terminals input1[1], input1[2], . . . , input1[k], k+1 second input terminals input1[2], input2[2], . . . , input2 [k], input2 [k+1], and an output signal terminal output.

When the circuit is used for realizing the symmetric function capability, the k first input signal terminals input1 [1]~input1[k] are used as k input variable terminals and the k+1 second input signal terminals are used as symmetric function configuration data input terminals. The symmetric function is a logic function in which the function value remains unchanged for any permutation of certain input variables. The symmetric function configuration data is data for deciding the symmetric function such as AND, OR or the like.

As described in the embodiment 1-1, when the number of input variable terminals each of which has logical "1" is m, the input status number is m. The input status number may take k+1 integers from 0 to k. FIG. 72B shows relationships between input status numbers and output signal states in which the lateral axis indicates the input status number and the vertical axis indicates the output signal states.

In the integrated circuit shown in FIG. 72A, the output signal states of each input status number are in an one-to-one correspondence with values of k+1 input signal terminals. That is, the output signal state corresponds to the state of the input terminal input1[2] when the input status number is 0, the output signal state corresponds to the state of the input terminal input2[2] when the input status number is 1, the output signal state corresponds to the state of the input terminal input2 [k+1] when the input status number is k.

Accordingly, by associating the input status number with the second input signal terminal, that is, with two values of the configuration data input terminal, any symmetric function can be realized. This is the same as described in the embodiment 1-1.

In addition, once the function configuration data is input, the function configuration data can be stored.

When the integrated circuit 401 is used for realizing the selector capability, the k first input signal terminals are regarded as k control input terminals and the k+1 second input signal terminals are regarded as k+1 data input terminal.

As mentioned above, since an input status number is an one-to-one correspondence with a second input signal terminal, selecting an input status number from the k+1 different input status number corresponds to selecting a state of an input signal terminal from the k+1 second input signal terminals. Accordingly, the selector capability can be realized.

The capability of selecting one input from a plurality of data inputs is known as a multiplexer capability. However, the multiplexer needs k control inputs and $2^k$ data inputs, which is different from the above-mentioned selector capability in which the input status number is used for selection. The above-mentioned selector capability is more flexible in that the same data can be selected by a plurality of control inputs.

As mentioned above, the function reconfigurable integrated circuit 401 can have both of the symmetric function capability and the selector capability.

(Embodiment 3-2)

Figure 73:
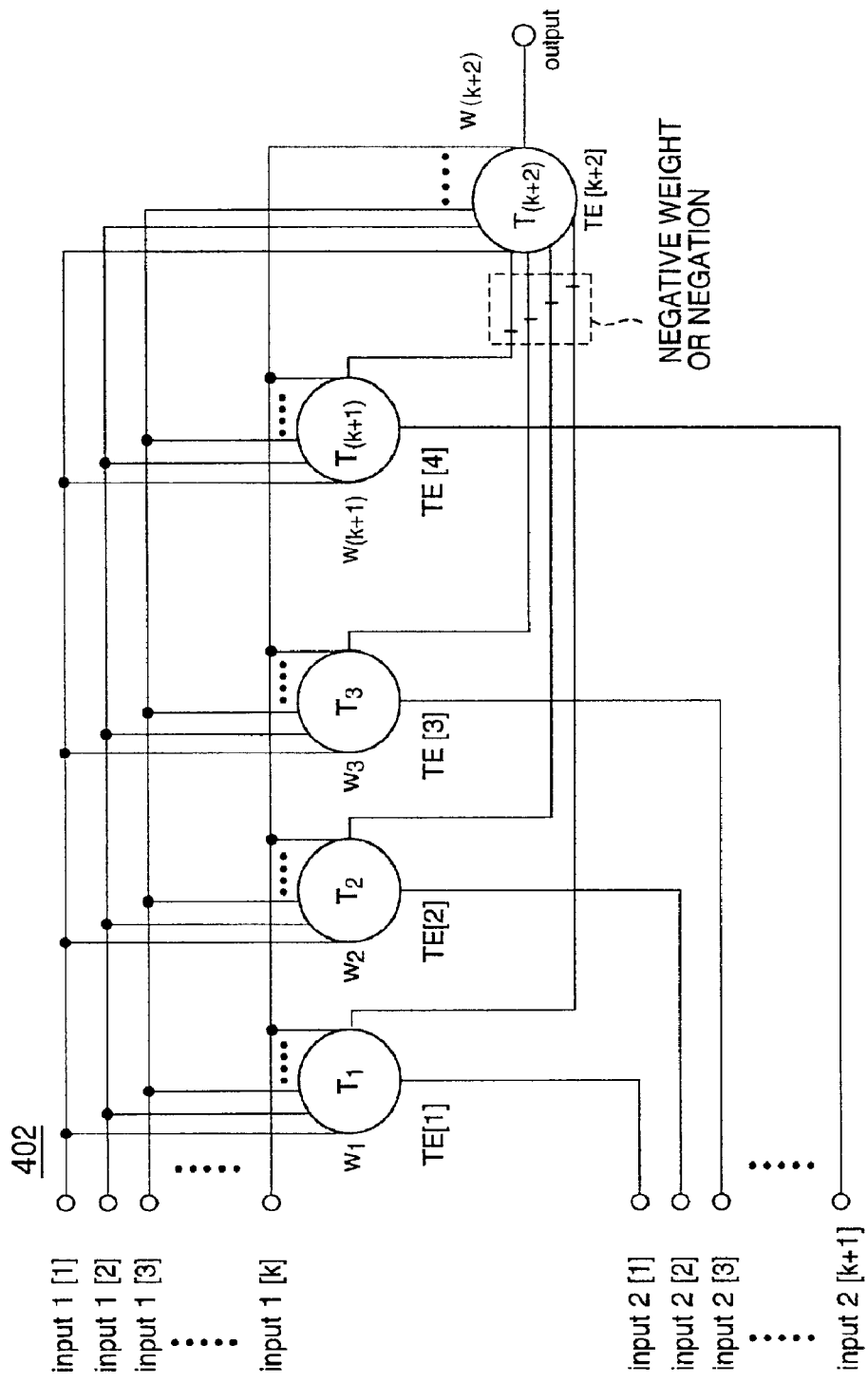
FIG. 73 is a circuit diagram which shows a function reconfigurable integrated circuit 402 according to an embodiment 3-2 of the present invention.

FIG. 73 is a circuit diagram which shows a function reconfigurable integrated circuit 402 according to the embodiment 3-2 of the present invention. The function reconfigurable integrated circuit 402 realizes the circuit having the symmetric function capability and the selector capability shown in the embodiment 3-1 by using threshold elements. The function reconfigurable integrated circuit 402 is similar to the circuit shown in FIG. 8 in the embodiment 1-1 and has the same capability. However, the definition of the threshold value in this embodiment 3-2 is different from that in the embodiment 1-1. That is, in the embodiment 1-1, each threshold element has two threshold values as shown in FIG. 8 and one threshold value is selected by a signal from the control terminal. On the other hand, in the embodiment 3-2, each threshold element has one threshold value. The reason is that, the threshold value in the embodiment 3-2 is defined by th which satisfies $$\sum_{i=1}^{k} w_i \cdot X_i + \xi_j \cdot Y_j > \text{or} < th,$$

on the other hand, the threshold value in the embodiment 1-1 is defined by $(th - \xi_j \cdot Y_j)$ which satisfies $$\sum_{i=1}^{k} w_i \cdot X_i > \text{or} < (th - \xi_j \cdot Y_j),$$

wherein $X_i$ is an input variable, $Y_j$ is a control variable, $w_i$, $\xi_j$ are weights. Therefore, the threshold value in the embodiment 1-1 takes two values depending on the value (1 or 0) of the control variable $Y_j$.

In this embodiment, description will be given according to this definition of the embodiment 3-2 and the selector capability will be described in detail.

The function reconfigurable integrated circuit 402 is a feed-forward circuit of a two stage logic structure. The first stage includes k+1 threshold elements TE[1]~TE[k+1], and the second stage includes a threshold element TE[k+2].

Each threshold logic circuit TE of the first stage has k input terminals which are connected to the first input signal terminals input1[1]~input1[k], an input terminal which is connected to one of the k+1 second input signal terminals input1[2]~input2 [k+1] and an output terminal.

The threshold element TE[k+2] of the second stage includes k input terminals connected to the first input signal terminals, input terminals connected to the output terminals of k+1 threshold elements of the first stage and an output terminal.

A signal which is input from the first input signal terminal is called a first signal and a signal which is input from the second input signal terminal is called a second signal.

In this embodiment, the threshold element TE is defined such that, the threshold element TE compares the sum of products of input signal values (each of which is logical 1 or 0) and a weight with a threshold value, then, if the sum of products is equal to or larger than a threshold value, the threshold element TE outputs logical "1", on the other hand, if the sum of products is smaller than a threshold value, the threshold element TE outputs logical "0". The weights of the input terminals of the threshold elements $TE[i](1 \leq i \leq k+1)$ are the same integer ($w_i$) and the threshold value Ti of the threshold element TE[i] is indicated by the following formula 38.

$$w_i \cdot (i-1) < T_i < w_i \cdot i \quad \text{(formula 38)}$$

Accordingly, when the input status number is m ($0 \leq m \leq k$), the sum of products of input signal values and the weight for the threshold element TE[i] is $w_i \cdot m$ if the state of the second input signal terminal is j=0, and the sum of products is $w_i \cdot (m+1)$ if the state of the second input signal terminal is j=1.

When the input status number is m, the threshold elements TE=[i] ($1 \leq i \leq k+1$) of the first stage can be classified by first, second and third groups. The threshold elements in the first group satisfy i<m+1, the threshold element in the second group satisfies i=m+1 and the threshold elements in the third group satisfy i>m+1.

Since i<m+1 is satisfied in the first group, $T_i < w_i \cdot (m+1)$ is satisfied. The first group includes m threshold elements TE[1]~TE[m] in each of which threshold elements the sum of products of input signal values and the weight exceeds the threshold value whatever the second input value is. Therefore, the output signal is always logical 1.

In the third group, since i>m+1 is satisfied, $T_i < w_i \cdot m$ is satisfied. The third group includes k−m threshold elements TE[m+2]~TE[k+1] in each of which threshold elements the sum of products of input signal values and the weight does not exceed the threshold value whatever the second input value is. Therefore, the output signal is always logical 0.

On the other hand, in the second group, since i=m+1 is satisfied, the output signal of the threshold element TE[i] depends on the second input signal value. That is, when the second input signal value is 0, the relationship between the threshold value and the sum of products of input signal values and the weight is represented as the following formula 39.

$$T_i > w_i \cdot m (j=0) \quad \text{(formula 39)}$$

Therefore, the output signal is always logical 0.

When the second input signal value is 1, the relationship between the threshold value and the sum of products of input signal values and the weight is represented as the following formula 40. In the formula 40, "+1" in "(m+1)" in the second term of the right side shows an effect of the second input signal.

$$T_i < w_i \cdot (m+1) \ (j=1) \quad \text{(formula 40)}$$

Therefore, the output signal is logical 1.

As mentioned above, the output signal of the threshold element TE[m+1] of the second group varies depending on the two different states (the values j=0,1 of the second input signal) of the second input signal terminal.

In summary, when the input status number is m, m threshold elements of the first stage output logical 1, k−m threshold elements of the first stage output logical 0 and only one threshold element of the first stage outputs logical 1 or 0 according to the value of the second input signal.

Input terminals of the threshold element TE[k+2] of the second stage is connected to the k first input signal terminals and the k+1 output signal terminals of the first stage.

Each signal from the first input signal terminal is multiplied by a positive weight W(k+2) and each signal from the output signal terminal of the first stage is multiplied by a negative weight $-W_{(k+2)}$ so that the sum of the signal values are obtained in the threshold element TE[k+2].

In the following, assume that the logic state number is m. The operation of this circuit 402 will be described with respect to the threshold element TE[k+2] of the second stage.

The input value to the threshold element TE[k+2] can be divided into contribution by the first input signals and contribution by the output signals of the threshold elements TE[1]·TE[k+1] of the first stage.

The sum of products of the first input signal values and the weight ($w_{(k+2)}$) is $w_{(k+2)} \cdot m$. The sum of products of the output signal values from the first stage and the weight ($-w_{(k+2)}$) can be represented as $-w_{(k+2)} \cdot m + \Delta$ since m threshold elements output logical 1, k−m threshold elements output logical 0 and only one threshold element outputs logical 1 or 0, wherein Δ indicates the product of the output signal value of the threshold element TE[m+1] and the weight. Accordingly, the sum of products of the input signals and the weight of the threshold element TE[k+2] becomes Δ.

The sum of products Δ equals to the product of the output signal value of the threshold element TE[m+1] of the first stage and the weight $-w_{(k+2)}$ of the threshold element TE[k+2] of the second stage. Therefore, when the second input signal value which is input to the threshold element TE[m+1] is logical 1, the threshold element TE[m+1] outputs logical 1 so that Δ becomes $-w_{(k+2)}$. When the second input signal value which is input to the threshold element TE[m+1] is logical 0, the threshold element TE[m+1] outputs logical 0 so that Δ becomes 0.

At this time, if the threshold value $T_{(k+2)}$ of the threshold element TE[k+2] satisfies $-w_{(k+2)} < T_{(k+2)} < 0$, the threshold element TE[k+2] outputs different values depending on the second input signal value which is input to the threshold element TE[m+1].

In the following description, the definition of the threshold element TE is changed such that the threshold element TE outputs logical 0 when the threshold value is equal to or larger than the sum of the products of the input signal values and the weight, on the other hand, the threshold element TE outputs logical 1 when the threshold value is smaller than the sum of the products.

In addition, the weight of the threshold element TE[k+2] for the output signals from the first stage is not negative but the absolute value is the same, wherein each of the output signals is input to the threshold element TE[k+2] after logically inverted.

In this case, when the input status number is m, m threshold elements in the first stage output logical 0, k−m threshold elements output logical 1 and the threshold element TE[m+1] outputs logical 1 or 0 depending on the state of the second input signal terminal. With respect to the threshold element TE[k+2] of the second stage, the sum of products for the first input signals is $w_{(k+2)} \cdot m$ and the sum of products for the output signals from the first stage is $w_{(k+2)} \cdot (k-m) + \Delta'$ so that the sum of these becomes $w_{(k+2)} \cdot k + \Delta'$. Δ' is the value for the output signal of the threshold element TE[m+1]. Δ takes 0 or $W_{(k+2)}$.

Therefore, by setting $T_{(k+2)}$ such that $w_{(k+2)} \cdot k < T_{(k+2)} < w_{(k+2)} \cdot (k+1)$ is satisfied, the output state of TE[k+2] can be controlled by the second input signal which is input to the threshold element TE[m+1].

As mentioned above, by bringing the input status number into one-to-one correspondence with a second input signal terminal which varies the output value according to the second input signal, any symmetric function of k input variables can be generated.

In the following, the selector capability will be described.

When the input status number of the signals of the first input signal terminals is regarded as a control input value, it is possible to output a signal state of the second input signal terminal. This shows that a circuit which selects among k+1 data inputs by k control inputs.

Figure 74:
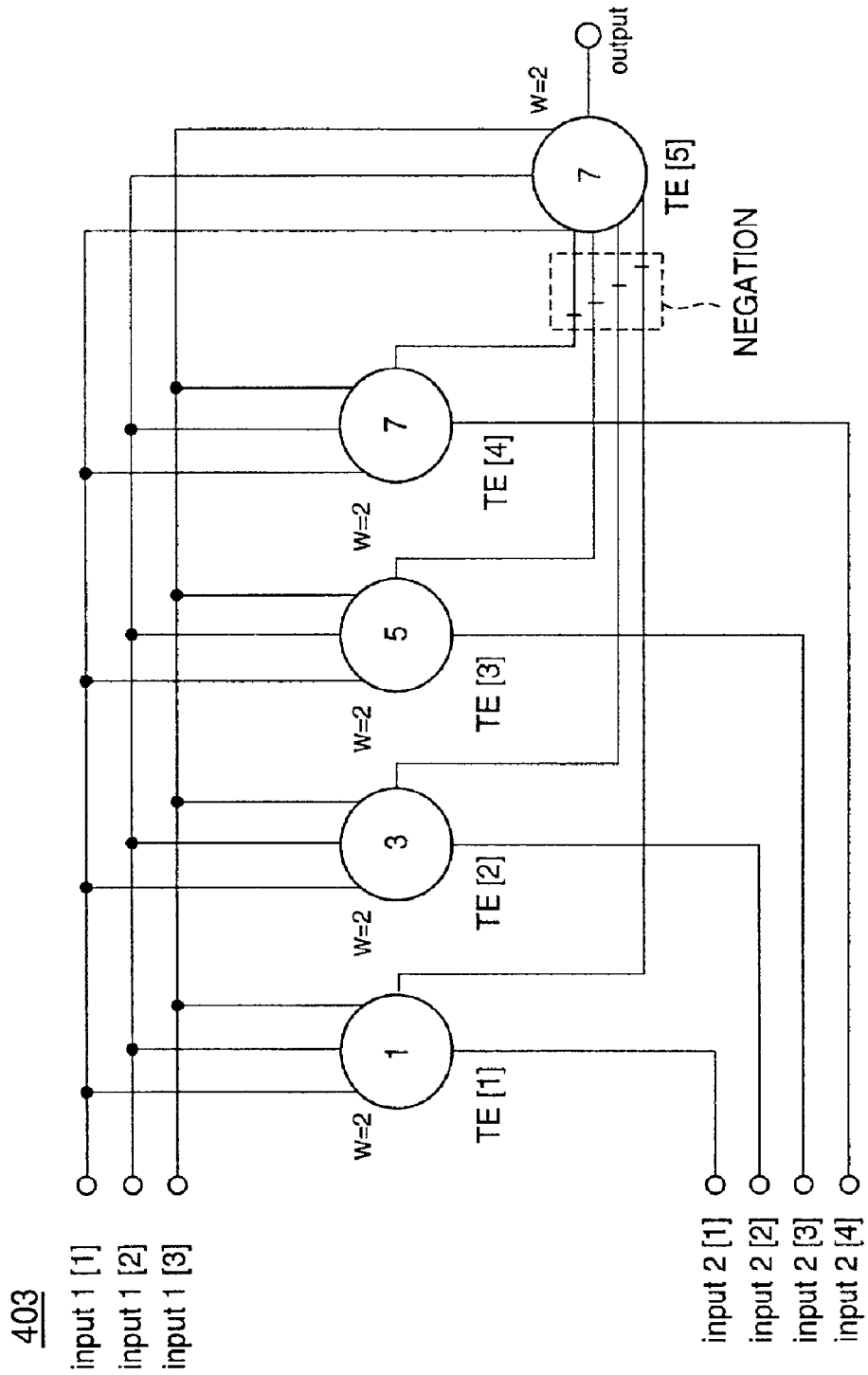
FIG. 74 shows a function reconfigurable integrated circuit 403 which includes three first input signal terminals, four second input signal terminals and threshold elements.

FIG. 74 shows a function reconfigurable integrated circuit 403 which includes three first input signal terminals, four second input signal terminals and threshold elements.

The first stage includes four threshold elements TE[1], TE[2], TE[3] and TE[4]. Each threshold element includes input terminals which receive signals from the first input signal terminals input1[1], input1[2] and input1[3], and includes input terminals which receive signals from the second input signal terminals input1[2], input2[2], input2[3] and input2[4].

The second input signals from the respective terminals input1[2], input2[2], input2[3] and input2[4] are input to the respective threshold element TE[1], TE[2], TE[3] and TE[4]. The weight of each threshold element is set as the same value "2".

The threshold values ($T_1$, $T_2$, $T_3$, $T_4$) of the threshold element TE[1]~TE[4] are (1, 3, 5, 7). The threshold element TE[5] of the second stage includes input terminal which receives signals from the first input signal terminals and input terminals which receives inverted signals from the output signal terminals of the first stage. From another point of view, it can be considered that the threshold elements of the first stage output inverted output signals. However, in this embodiment, the output signals are inverted before the signals are input into the threshold element of the second stage. The weight is 2 and the threshold value is 7.

Figure 75:
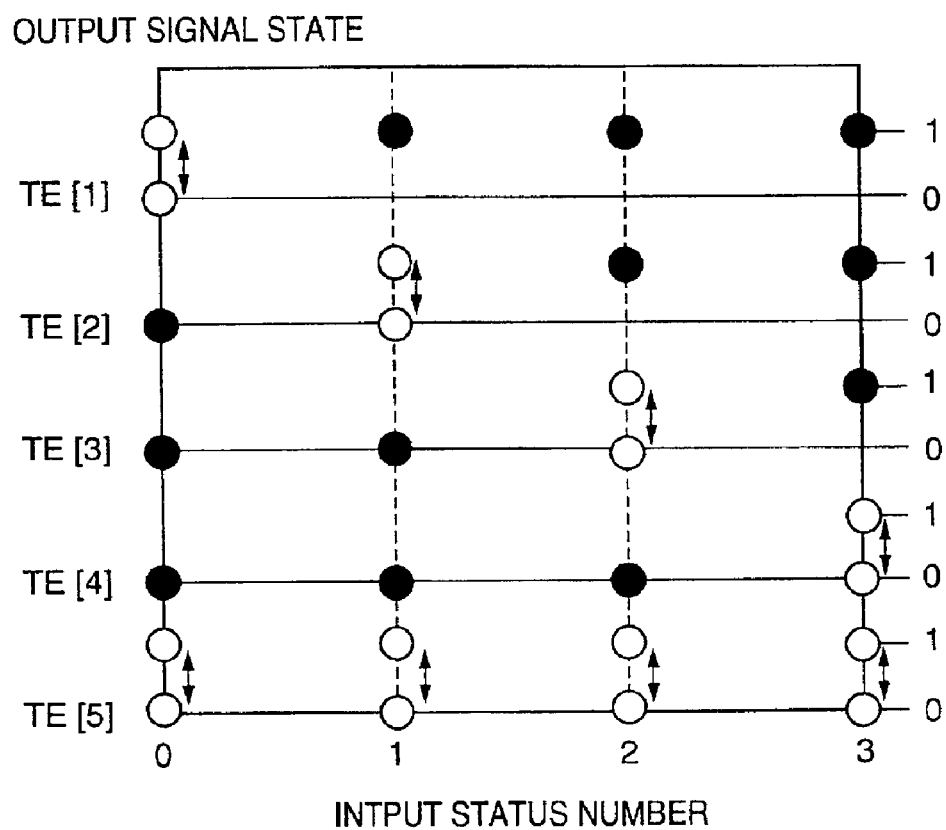
FIG. 75 is a figure for explaining the operation of the function reconfigurable integrated circuit 403.

FIG. 75 is a figure for explaining the operation of the function reconfigurable integrated circuit 403.

In FIG. 75, the lateral axis indicates the input status number of the first input signal terminal and the vertical axis indicates the state of the output signals of each threshold element. Each threshold element of the first stage further receives the input signal from the second input signal terminal. For example, TE[1] has an input terminal which receives a signal from the terminal input1[2]. In the TE[1], when the input status number m is 0, if the state of the terminal input1[2] is 1, input values exceed the threshold value of the TE[1] so that the output signal state becomes 1. If the state of the terminal input1[2] is 0, the output signal state becomes 0.

When m>0, the output signal state is always 1 whatever the value of the terminal input1[2] is. As for the output signal state of each of the threshold elements TE[1], TE[2], TE[3] and TE[4] shown in FIG. 75, the black circle indicates that the output signal state is determined whatever the second input signal state is. The white circle indicates that the output signal state depends on the second input signal state.

In the following, the operation of the threshold element TE[5] of the second stage will be described taking a case when the input status number is 2 as an example.

Since the input status number is 2, two signals of the three first input signals input to the threshold element TE[5] are logical 1 and the remainder is logical 0. As shown in FIG. 75, the output states of TE[1] and TE[2] are logical 1 regardless of the second input signal, and the output states of TE[4] are logical 0 regardless of the second input signal. The output state of the threshold element TE[3] depends on the value of the second input signal such that when the value of the second input signal is logical 1, the output state becomes logical 1, on the other hand, when the value of the second input signal is logical 0, the output state becomes logical 0.

Each of the output states of the threshold elements of the first stage is inverted and multiplied by a weight before being input into the threshold element TE[5]. Therefore, when the input status number is 2, 2 is input from the first input signal terminal and inversion of the output states of the threshold elements except for TE[3] of the first stage, which is 1, is input, so that 3 is input to the TE[5] regardless of the values of the second input signals.

When the value of the second input signal of the threshold element TE[3] of the first stage is logical 1 or 0, the number of logical 1s which are input to the threshold element TE[5] is 3 or 4 respectively. Therefore, the sum of products of all values of the input signals and the weight is 6 or 8 according to the value of the second input signal which is input to the threshold element TE[3] of the first stage.

This value is compared with a threshold value 7 of the threshold element TE[5] so that the output value is determined. The white circles at the input status number 2 of the TE[5] in FIG. 75 can be explained as mentioned above.

In cases when the input status number is other than 2, the output state of the TE[5] can be explained in the same way.

Therefore, as shown in FIG. 75 the white circles at each input status number which shows output states of a threshold element of the first stage correspond to the output states of the TE[5] at the same input status number.

This shows that any symmetric function can be realized according to the states of the second input signal terminals.

Figures 76A, 76B:
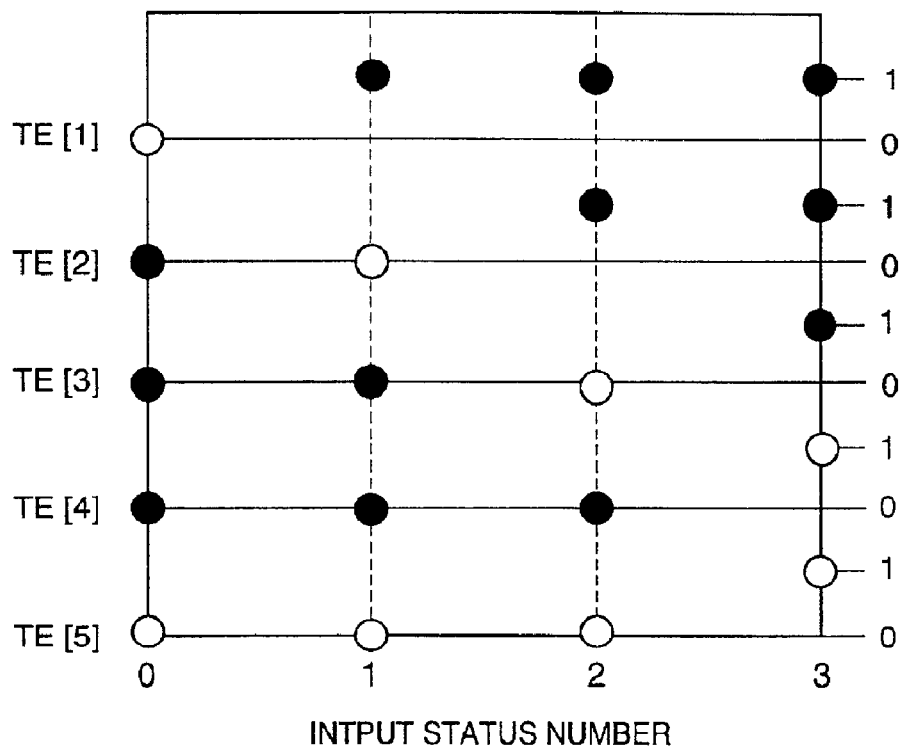
FIG. 76A shows relationships between input status numbers and the output signal states of each threshold element.
FIG. 76B shows a truth table.

FIGS. 76A and 76B are figures for explaining an AND circuit which is one of the symmetric function circuits. FIG. 76A shows relationships between the input status numbers and the output signal states of each threshold element. FIG. 76B shows a truth table.

In order to realize the AND capability, the states of the second input signal terminals input1[2], input2[2], input2[3] and input2[4] are set by 0, 0, 0 and 1 respectively. At this time, the truth table shown in FIG. 76B is obtained, wherein $X_1$, $X_2$ and X 3 indicate the states of the first input signal terminals and Y indicates the output signal state of the TE[5].

As mentioned above, according to the function reconfigurable integrated circuit 403, the AND capability can be realized. Similarly, other symmetric functions can be realized.

As shown in FIG. 76A, the output state of the threshold element TE[5] in each of the input status numbers m=0,1,2,3 corresponds to the each state of the second input terminals input1[2], input2[2], input2[3], input2[4] respectively. When the input status numbers are regarded as control inputs and the states of the second input signal terminals are regarded as data inputs, it is understood that the circuit 403 realizes four data input selector circuit having three control inputs.

As described above, the integrated circuit of this embodiment can be both of the symmetric function capability and the selector capability.

In the above embodiment, two different states are used. In addition, a circuit structure in which 1 and 0 are totally inverted can be easily contrived. Further, in some above-mentioned examples, the weights for each input signal are the same. However, since the weight is implemented as a physical quantity actually, it is difficult to strictly equalize the weights. In addition, it is not necessary to equalize the weights. They can be values which are regarded as the same in the operation principle.

In the above embodiment, the k input signals are input into each threshold element one by one. However, since the weights are the same for each first input signal, it is not necessary to input one by one. That is, the sum of the first input signal values may be calculated first, and, then, multiplied by the weight. The same effect can be obtained by this produce compared with the case where the signals are input one by one.

(Embodiment 3-3)

Figure 77:
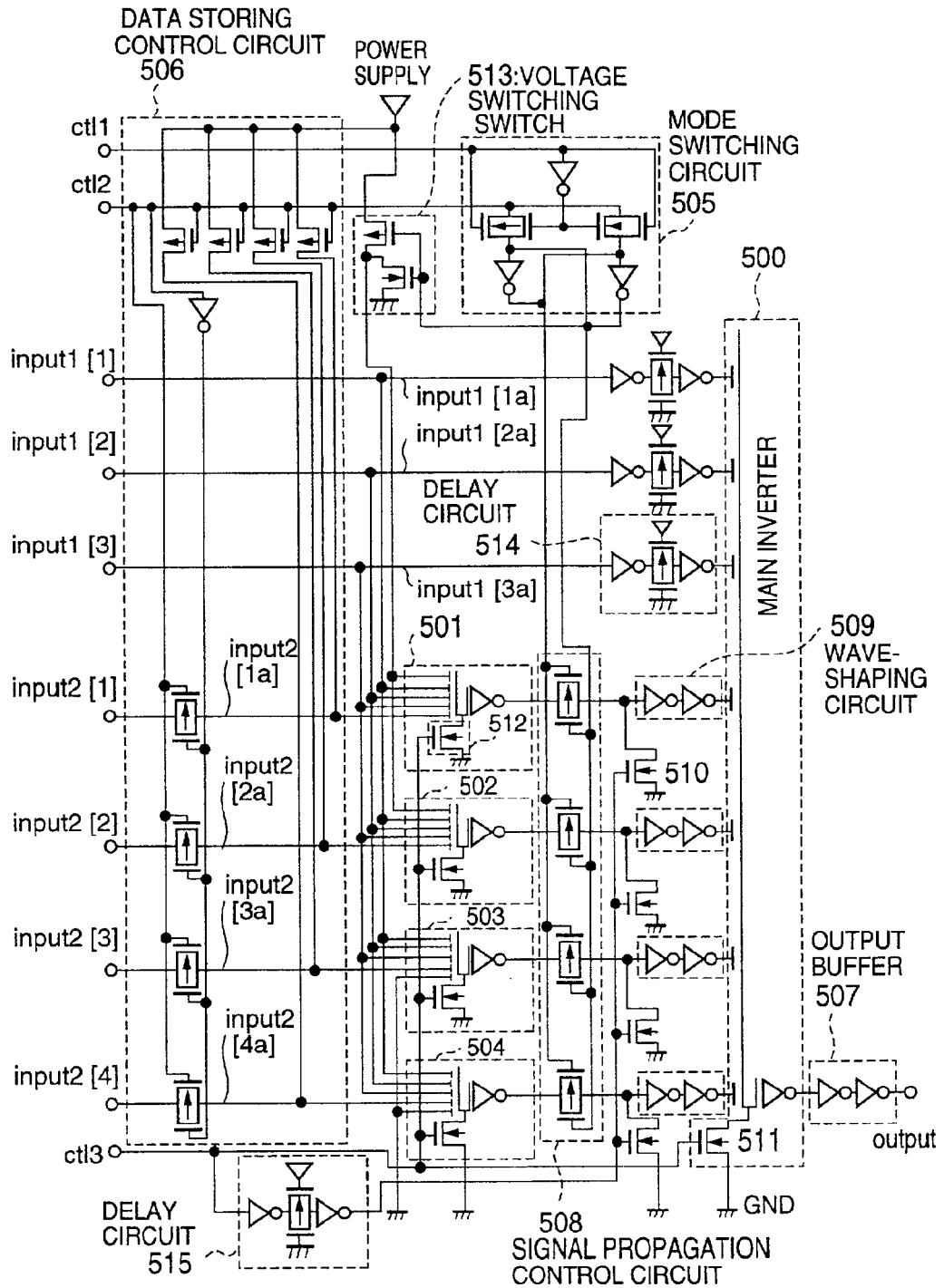
FIG. 77 shows an integrated circuit 404 according to an embodiment 3-3 which includes a symmetric function capability of k input variables and a selector capability which selects among k+1 data inputs by k control inputs.

FIG. 77 shows an integrated circuit 404 according to the embodiment 3-3. The integrated circuit 404 includes the symmetric function capability of k input variables and the selector capability which selects among k+1 data inputs by k control inputs. The integrated circuit 404 includes the neuron MOS transistors as described in the embodiment 2-1 in which FIG. 77 shows more detailed structure. In this case, k=3.

In the following, the structure and the operation of the integrated circuit 404 will be described with reference to FIG. 77. Same as the embodiment 2-1, the main components are neuron MOS inverters which are configured by the neuron MOS transistors. The integrated circuit 404 is configured by two stages in which the first stage includes four pre-inverters 501, 502, 503 and 504 and the second stage includes a main inverter 500. In addition, the integrated circuit includes a data storing control circuit 506 as a control circuit, and a mode switching circuit 505, wave-shaping circuits 509 and delay circuits 514 and 515 as peripheral circuits.

Figure 78:
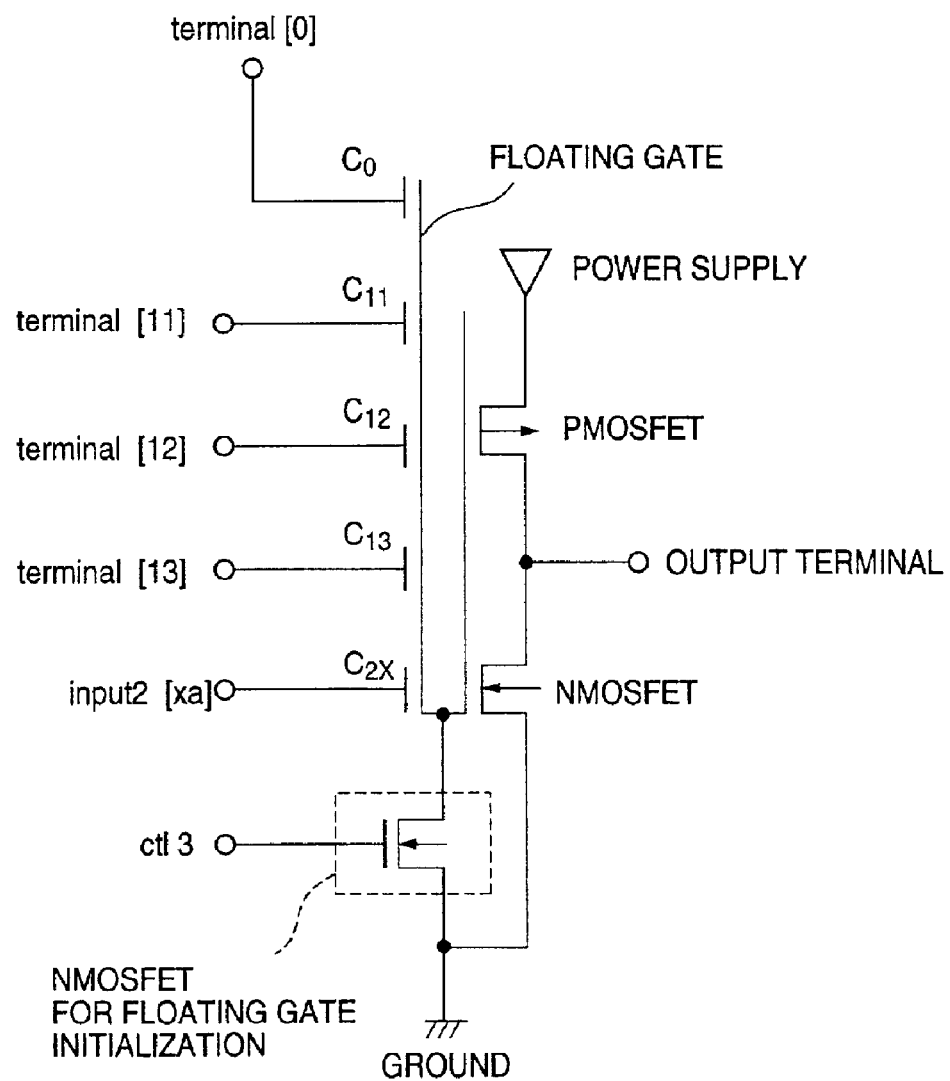
FIG. 78 is a circuit diagram showing a pre-inverter 501 in detail.

First, the circuit structure and the operation of the four pre-inverters will be described. FIG. 78 is a circuit diagram showing the pre-inverter 501. The structure and the operation of the pre-inverter 501 is the same as those of each of the pre-inverters 502, 503 and 504.

The pre-inverter 501 includes five input gates. Input terminals terminal[11], terminal[12], terminal[13] of the pre-inverter 501 are connected to the first input signal terminals input1[1], input1[2], input1[3] respectively as shown in FIG. 77, wherein capacitance values between the input terminals and the floating gate are $C_{11}$, $C_{12}$, $C_{13}$ respectively.

The terminal input2 [xa] shown in FIG. 78 is connected to one of terminals input2[1a], input2[2a], input2[3a] and input2[4a], wherein terminals input1[2a], input2[2a], input2[3a] and input2[4a] are connected to the second input signal terminals input2[1], input2[2], input2[3] and input2[4] via transmission gates. A second input signal is input to the terminal input2 [xa] and the capacitance value between the terminal and the floating gate is $C_{2x}$.

The terminal[0] shown in FIG. 78 indicates a terminal which is connected to the power supply or the ground voltage as shown in FIG. 77. The capacitance value between the terminal[0] and the floating gate is $C_0$.

The terminal ctl3 shown in FIG. 78 is the same as ctl3 shown in FIG. 73 which input signals for controlling continuity and interruption of the NMOSFET for floating gate initialization.

As an example, assume that this circuit 501 is designed such that the voltage of the output terminal becomes inverted when the voltage of the floating gate exceeds a half of the power supply voltage $V_{dd}$ and that values of $C_{11}$, $C_{12}$, $C_{13}$, $C_2x$ and $C_0$ are the same. The terminal[0] is connected to the power supply voltage.

The voltage of the terminal ctl3 is set to $V_{dd}$, the state of the NMOSFET for floating gate initialization is set to continuity, the voltage of the floating gate is set to the ground voltage. In the meantime, the voltages of all input signals and the voltage of a terminal (terminal[0] for example) which should be fixed to a predetermined voltage are set to a ground voltage.

In this state, the voltage of the terminal ctl3 is set to the ground voltage and the state of the NMOSFET is set to interruption. Accordingly, the floating gate is set to a voltage, and, then, the state of the floating gate is set to floating state. This operation is called initialization of the floating gate. The terminal which should be fixed to a predetermined voltage is fixed to the predetermined voltage after the floating gate is set to a complete floating state.

After performing the above-mentioned operation, the states of the output terminal of the pre-inverter 501 can be classified as the following three cases according to the first input signal states. In the following description, logical 1 is defined as a case when the voltage of the output terminal is larger than $V_{dd}/2$ and logical 0 is defined as a case when the voltage of the output terminal is equal to or larger than $V_{dd}/2$.

A first case of the three cases is a case when all of the first input signal voltages are the ground voltage, which case will be called a case when the input status number is 0. In this case, the state of the output terminal of the pre-inverter 501 is always logical 1 whatever the voltage of the terminal input2 [xa] is.

In a second case, only one of the first input signal voltages is the power supply voltage $V_{dd}$, which case will be called a case when the input status number is 1. In this case, the voltage of the floating gate depends on the voltage of the terminal input2 [xa]. Since the terminal[0] is already connected to the power supply, when the voltage of the terminal input2 [xa] is the ground voltage, the voltage of the floating gate can be approximated around $(2/5) \cdot V_{dd}$. Therefore, since the voltage of the floating gate is smaller than $V_{dd}/2$, the state of the output terminal becomes logical 1 which is inverted value of the logical state of the floating gate. On the other hand, when the voltage of the terminal input2 [xa] is $V_{dd}$, the voltage of the floating gate can be approximated around $(3/5) V_{dd}$. Therefore, since the voltage of the floating gate is larger than $V_{dd}/2$, the state of the output terminal is logical 0. Thus, in the second case, logically inverted value of the terminal input2 [xa] is output from the pre-inverter 501.

In a third case, more than two of the first input signal voltages are the power supply voltage $V_{dd}$, which case will be called a case when the input status number is equal to or larger than 2. In this case, the voltage of the floating gate is larger than $V_{dd}/2$ regardless of the voltage of the terminal input2 [xa] so that the state of the output terminal is logical 0.

By adjusting capacitance ratio between capacitances between input terminals of the neuron MOS inverter and the floating gate, the above-mentioned second case can be provided in any input status number, wherein the input terminals include the first input signal terminals, second input signal terminals and the terminal which should be set to a predetermined voltage.

Next, it will be described that a voltage which is logically inverted voltage of the terminal input2 [xa] can be stored by the terminal ctl3 controlling the floating gate voltage of the pre-inverter.

The voltage of the terminal ctl3 is set to the power supply voltage $V_{dd}$. Then, while the floating gate voltage of the pre-inverter 501 is fixed to the ground voltage, the voltage of the terminal input2 [xa] is set to $V_{dd}$ and voltages of all other input terminals including input2 [xa] are set to the ground voltage. While preserving this state, the voltage of the terminal ctl3 is set to the ground voltage so that the state of the floating gate is set to the floating state. After that, the voltage of the terminal which should be fixed to the predetermined voltage is fixed and the voltage of the terminal input2 [xa] is fixed to $V_{dd}$.

At this state, since the electrical charge in the floating gate was accumulated when only the voltage of input2 [xa] was $V_{dd}$, the floating gate voltage is not increased in this floating state in which the voltage of the terminal input2 [xa] is $V_{dd}$.

That is, the above state is the same as a state in which the voltage of input2 [xa] is set to the ground voltage when the floating gate is connected to the ground voltage. On the other hand, when the floating gate is initialized while the voltage of the terminal input2 [xa] is the ground voltage, the voltage of the floating gate increases after the terminal input2 [xa] is fixed to $V_{dd}$ in the floating-state. That is, the state of $V_{dd}$ is preserved as the voltage of the terminal input2 [xa].

Accordingly, in order to store a desired voltage, the voltage of the terminal input2 [xa] is set to a logically inverted value of the desired voltage when initializing the floating gate. That is, when the desired voltage is $V_{dd}$, the voltage of the terminal input2 [xa] is set to the ground voltage when initializing the floating gate. On the other hand, when the desired voltage is the ground voltage, the voltage of the terminal input2 [xa] is set to $V_{dd}$ when initializing the floating gate, after that, the voltage of the terminal input2 [xa] is fixed to $V_{dd}$.

As mentioned above, the voltage of the terminal input2 [xa] can be stored by the above-mentioned operation of the voltage of the floating gate and the input signals.

As mentioned above, in an input status number, the pre-inverter can output a value which is a logical inversion of an input signal at the terminal input2 [xa] which is the second input signal terminal. In addition, by fixing the voltage of the terminal input2 [xa] to the power supply voltage $V_{dd}$ after initialization of the floating gate, it is possible to store logical inversion of the signal at the terminal input2 [xa].

In the following, the operation for the basic symmetric function capability and the selector capability of the function reconfigurable integrated circuit 404 shown in FIG. 77 will be described with reference to FIG. 79.

Figure 79:
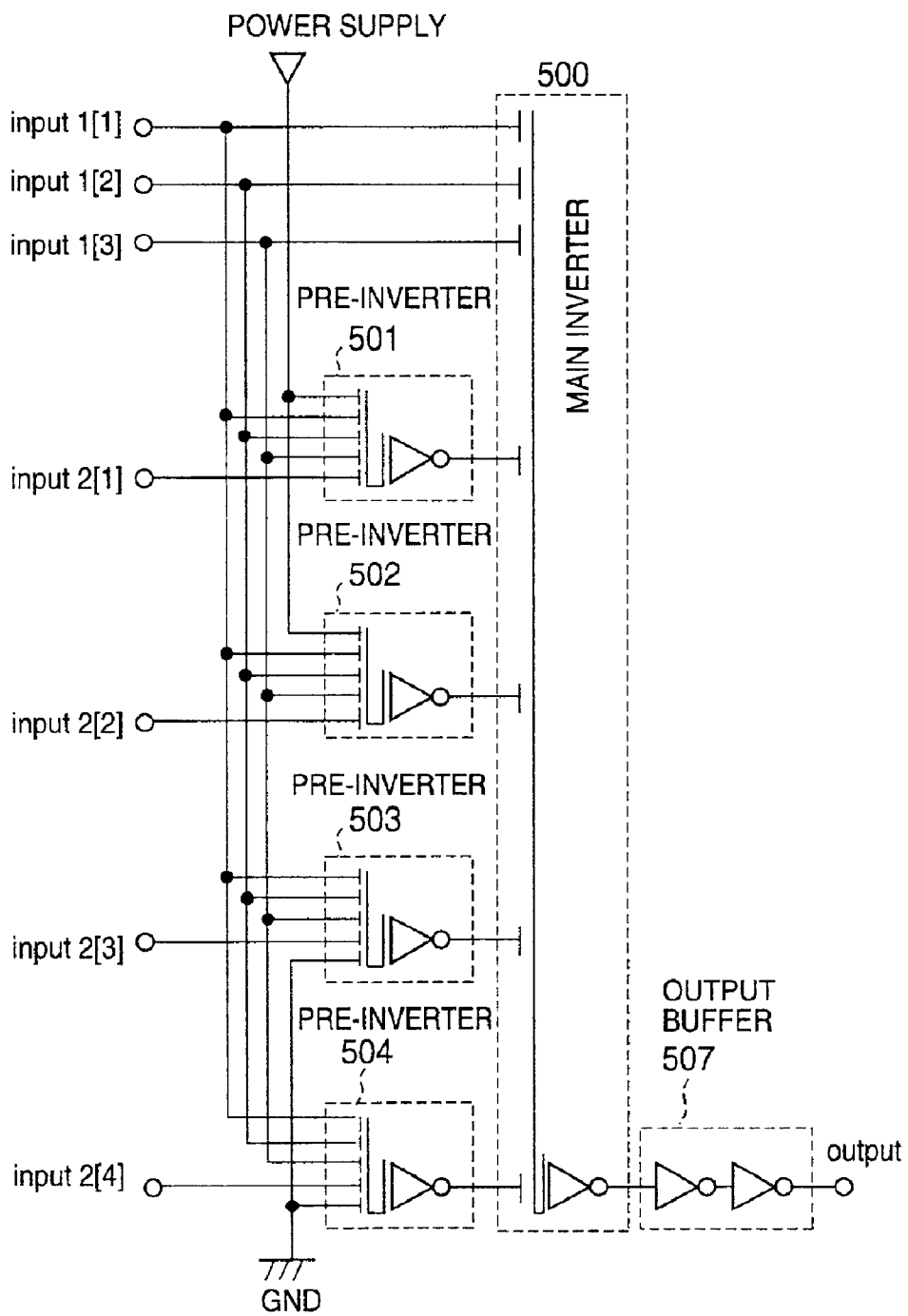
FIG. 79 is a circuit diagram which shows main components of the function reconfigurable integrated circuit 404 shown in FIG. 77.

FIG. 79 is a circuit diagram which shows main components of the function reconfigurable integrated circuit 404 shown in FIG. 77.

As shown in FIG. 79, the circuit 404 is configured by two stages in which the first stage includes four pre-inverters 501, 502, 503 and 504 and the second stage includes the main inverter 500. In addition, an output buffer 507 is connected to the output terminal of the main inverter 500.

In this case, assume that the floating gates of the pre-inverters 501~504 and the main inverter 500 are initialized while voltages of all input terminals are the ground voltage.

In addition, in the same way as the pre-inverter 501 described before with reference to FIG. 78, each of four pre-inverters 501, 502, 503 and 504 is designed so as to output a logical inversion of a value of one of terminals input2[1], input2[2], input2[3] and input2[4] which correspond to the input status numbers 0, 1, 2, 3 respectively.

A threshold voltage of the main inverter 500 is designed as $V_{dd}/2$. In addition, the capacitance values between seven input terminals and the floating gate of the main inverter 500 are designed to be the same so that the ratio of one capacitance is 1/7, wherein the seven input terminals include three first input signal terminals and input terminals which are connected to the output terminals of the pre-inverters 501–504.

When the input status number is 0, the value of the output terminal of the pre-inverter 501 is a logical inversion of the value of the terminal input1[2], wherein each of the values of the output terminals of the other pre-inverters 502~504 is logical 1 regardless of the second input terminal voltage. That is, all of the first input terminals are logical 0, three of the output terminals of the pre-inverters are logical 1 and one remainder of the output terminal is the logical inversion of the terminal input2[1]. Therefore, the voltage of the floating gate can be represented as $(3/7) \cdot V_{dd} + (1/7) \cdot V'_{input2[1]}$ wherein $V'_{input2[1]}$ indicates the logically inverted voltage of the terminal input2[1]. Thus, when the voltage of the terminal input2[1] is $V_{dd}$, the voltage of the floating gate becomes $(3/7) \cdot V_{dd}$. Since this voltage is smaller than the threshold voltage, the output of the main inverter 500 becomes logical 1. When the voltage of the terminal input2[1] is 0, the voltage of the floating gate is $(4/7) \cdot V_{dd}$. Since this voltage is larger than the threshold voltage, the output of the main inverter 500 becomes logical 0. That is, when the input status number is 0, the logical value of the terminal input2[1] is output from the main inverter 500.

In the same way, when the input status number is 1, the logical value of the terminal input2[2] is output from the main inverter 500. When the input status number is 2, the logical value of the terminal input2[3] is output from the main inverter 500. When the input status number is 3, the logical value of the terminal input2[4] is output from the main inverter 500.

This relationship between the input status numbers and the output values is the same as that shown in FIG. 75.

The circuit shown in FIG. 79 has the selector capability in which the terminals input1[1], input1[2] and input1[3] are regarded as three control input terminals and the terminals input2[1]~input2[4] are regarded as four data inputs. In addition, the circuit shown in FIG. 79 has the symmetric function capability of three inputs in which each value of the terminals input2[1]~input2[4] are fixed to a logical value.

The circuit shown in FIG. 77 is configured by the circuit shown in FIG. 79 and additional circuits. The additional circuits are circuits for initialization of floating gates, a data storing control circuit 506, a mode switching circuit 505 which switches between a mode of continuously applying the second input signals to the pre-inverters and another mode of storing the signals, wave-shaping circuits 509 which equalize the electrical signal with the logical state, and delay circuits 514.

First, a capability in which the pre-inverters store the logical values of the terminals input2[1]~input2[4] which are the second input signal terminals will be described with reference to FIG. 77.

Three first input signals, four second input signals and three control signals are input to this circuit, and one output signal is output. The first input signals are input from the first input signal terminals and the second input signals are input from the second input signal terminals.

The terminal ctl3 controls the state, continuity or interruption, of the NMOSFET 511 for floating gate initialization which is connected to the floating gate of the main inverter 500. When the voltage of the terminal ctl3 is the power supply voltage $V_{dd}$, NMOSFET 511 conducts so that the floating gate is connected to the ground. When the voltage of the terminal ctl3 is the ground voltage, the NMOSFET 511 is interrupted so that the floating gate becomes in the floating-state.

The floating gates of the pre-inverters 501~504 are controlled by signals input from the terminal ctl3 which are delayed by the delay circuit 515 in which a delay time is added with respect to a signal for controlling the NMOSFET 511.

The terminal ctl2 controls connection or disconnection between the second input signal terminals input2[1]~input2[4] and the terminals input2[1a]~input2[4a] which are input signal terminals for the pre-inverters 501~504. In addition, the terminal ctl2 controls connection or disconnection between the terminals input2[1a]~input2[4a] and the power supply.

When the voltage of the terminal ctl2 is the power supply voltage $V_{dd}$, terminals input2[1]~input2[4] are connected to the terminals input2[1a]~input2[4a] respectively so that the terminals input1[2a]input2[4a] are disconnected from the power supply.

On the other hand, when the terminal ctl2 is the ground voltage, the terminals input2[1]~input2[4] are disconnected from the terminals input2[1a]~input2[4a] so that the terminals input2[1a]~input2[4a] are connected to the power supply.

The terminal ctl1 switches between two modes, in which the second input signals are stored in the pre-inverters 501~504 in a mode and the second input signals pass through just as they are. When the voltage of the terminal ctl1 is the power supply voltage $V_{dd}$, data is stored and is output by the mode switching circuit 505. When the voltage of the terminal ctl1 is the ground voltage, the second input signals are successively passed through the pre-inverters 501~504.

In the above circuit, by fixing the voltage of ctl1 to the power supply voltage $V_{dd}$, then, setting the voltage of terminal ctl2 to the power supply voltage $V_{dd}$, the second input signals can be input to the pre-inverters 501~504. At this time, the signal propagation control circuit 508 after the pre-inverters 501~504 is interrupted by the mode switching circuit 505 so that the output terminals of the pre-inverters 501~504 are disconnected from the input side of the main inverter 500. At this time, all of the voltages of the first input signals are the ground voltage. In addition, the NMOSFETs 510 for initialization of the input gates of the main inverter conduct so that four input signals other than the first input signals are fixed to the ground voltage.

In addition, the voltage of one terminal of input terminals of the pre-inverters 501, 502 becomes the ground voltage by a voltage switching switch 513. By setting the second input signals to the ground terminal, all inputs of the pre-inverters 501~504 becomes the ground voltage. At this input state, signals which are logically inverted with respect to signals necessary for generating function capabilities are input as the second input signals, which was described with reference to FIG. 78.

After that, the voltage of the terminal ctl3 is switched to the ground voltage so that the floating gates of the main inverter 500 and the pre-inverters. 501~504 are disconnected from the ground. After the states of the floating gates become the floating state, the voltage of the terminal ctl2 is switched to the ground voltage.

Accordingly, the input terminals input2[1a]~input2[4a] of the pre-inverters are disconnected from the terminals input2[1]~input2[4] and are connected to the power supply.

In addition, one terminal of input terminals of the pre-inverters 501 and 502 is connected to the power supply by the voltage switching switch 513. Further, the pre-inverters 501~504 are connected to the input terminals of the main inverter.

According to the above-mentioned operation, a symmetric function capability can be realized.

FIG. 80 shows the above mentioned procedure. "initialization time" in FIG. 80 is a time used for storing function configuration data, in which times when voltages are changed are indicated as numbers 1, 2, 3 and 4 according to the procedure. In the figure, "input1" is a generic name for the terminals input1[1]~input1[4] and "input2" is a generic name for the terminals input2[1]~input2[4].

The output buffer 507 outputs logical values, which are stored in the pre-inverters 501~504, corresponding to the input status number of the first input signals so that the function capability is realized. From a different view point, this capability is regarded as a memory capability which outputs logical values stored in the pre-inverters 501~504 wherein the input status number of the first input signals is regarded as an address. In addition, the capability is regarded as a selector capability which outputs logical values stored in the pre-inverters 501~504.

Next, a case where logical values of the terminals input1[1]~input2[4] are successively passed through the pre-inverters 501~504 that will be described with reference to FIG. 77.

The voltage of the terminal ctl3 is set to the power supply voltage $V_{dd}$ so that the floating gates of the main inverter 500 and the pre-inverters 501~504 are connected to the ground and that the NMOSFET 510 for initialization of the main inverter input gate conducts. At the same time, the voltages of the terminals ctl2 and ctl1 are set to the power supply voltage $V_{dd}$ so that the terminals input2[1]~input2[4] are connected to the terminals input2[1a] ~input2[4a] and that the output terminals of the pre-inverters 501~504 are disconnected from the input terminals of the main inverter 500.

At this time, when the voltages of all the first input signals are set to the ground voltage, all of input signals of the main inverter 500 become the ground voltage. In addition, one terminal of input terminals of each of the pre-inverters 501 and 502 is connected to the ground by the voltage switching switch 513. By setting the voltages of the second input signal terminals input2[1]~input2[4] to the ground voltage, all of the input signals of the pre-inverters 501~504 becomes the ground voltage.

While preserving this state, the voltage of the terminal ctl3 is set to the ground voltage so that the NMOSFET 511 for initialization of the floating gate of the main inverter 500 and NMOSFETs 512 for initialization of the pre-inverters 501~504 are interrupted, so that the floating gates of the main inverter 500 and the pre-inverters 501~504 are changed to the floating state.

Next, the voltage of the terminal ctl1 is set to the ground voltage so that the output terminals of the pre-inverters 501~504 are connected to terminals which are connected to the main inverter 500 by the signal propagation control circuit 508 via the mode switching circuit 505.

According to the above-mentioned procedure, the selector capability can be realized wherein the three first input signals are regarded as control inputs, four second input signals are regarded as data inputs and one of the four second input signals are output according to the input status number.

FIG. 81 shows the operation procedure. "initialization time" in FIG. 81 indicates a time for initializing the floating gates of the main inverter 500 and the pre-inverters 501~504 and connecting the output terminals of the pre-inverters 501~504 to terminals which are connected to the input terminals of the main inverter 500, in which times for changing the voltage are shown as numbers 1, 2 and 3 according to the operation procedure.

In the figure, "input1" is a generic name for the terminals input1[1]~input1[4] and "input2" is a generic name for the terminals input2[1]~input2[4].

"control input signal voltage" in "terminal voltage while performing selector capability means a voltage combination of signals of the three first input signal terminals which are selection signals. "data input signal terminal" means a voltage combination of signals of the second input signal terminals which are data signals to be selected.

In the following, the delay circuit 514 will be described.

Since the main inverter 500 is a multiple input circuit (seven inputs in this embodiment), there is a possibility that a time may occur during which time a signal at an input terminal is in a state before state transition when another signal at another input terminal is in a state after state transition if delays of each input signals are not uniform. Output signals during this time are erroneous signals which should be removed.

The delay circuit 514 provided between the first input signal terminals input1[1]~input1[3] and input terminals of the main inverter 500 is for decreasing differences of delay times between input signals to a minimum.

Next, the wave-shaping circuit 509 will be described.

the voltages of the floating gates of the main inverter 500 and the pre-inverters 501~504 depends on a charge amount which is a product of capacitance values between input terminals and the floating gates and input signal voltages. Since the input signal voltage is not necessarily the power supply voltage or the ground voltage. Therefore, the voltage of the floating gate may become a mid-voltage between the power supply voltage and the ground voltage and the voltage of the output terminal of each of the main inverter 500 and the pre-inverters 501~504 may become the mid-voltage.

Since it is desirable that the input signal voltage of the main inverter 500 is the power supply voltage or the ground voltage, the wave-shaping circuit 509 is provided after the pre-inverters 501~504 so that the circuit 509 converts the mid-voltage into the power supply voltage or the ground voltage. In addition, the output buffer is connected to the output terminal of the main inverter for performing the above-mentioned capability.

Figure 82:
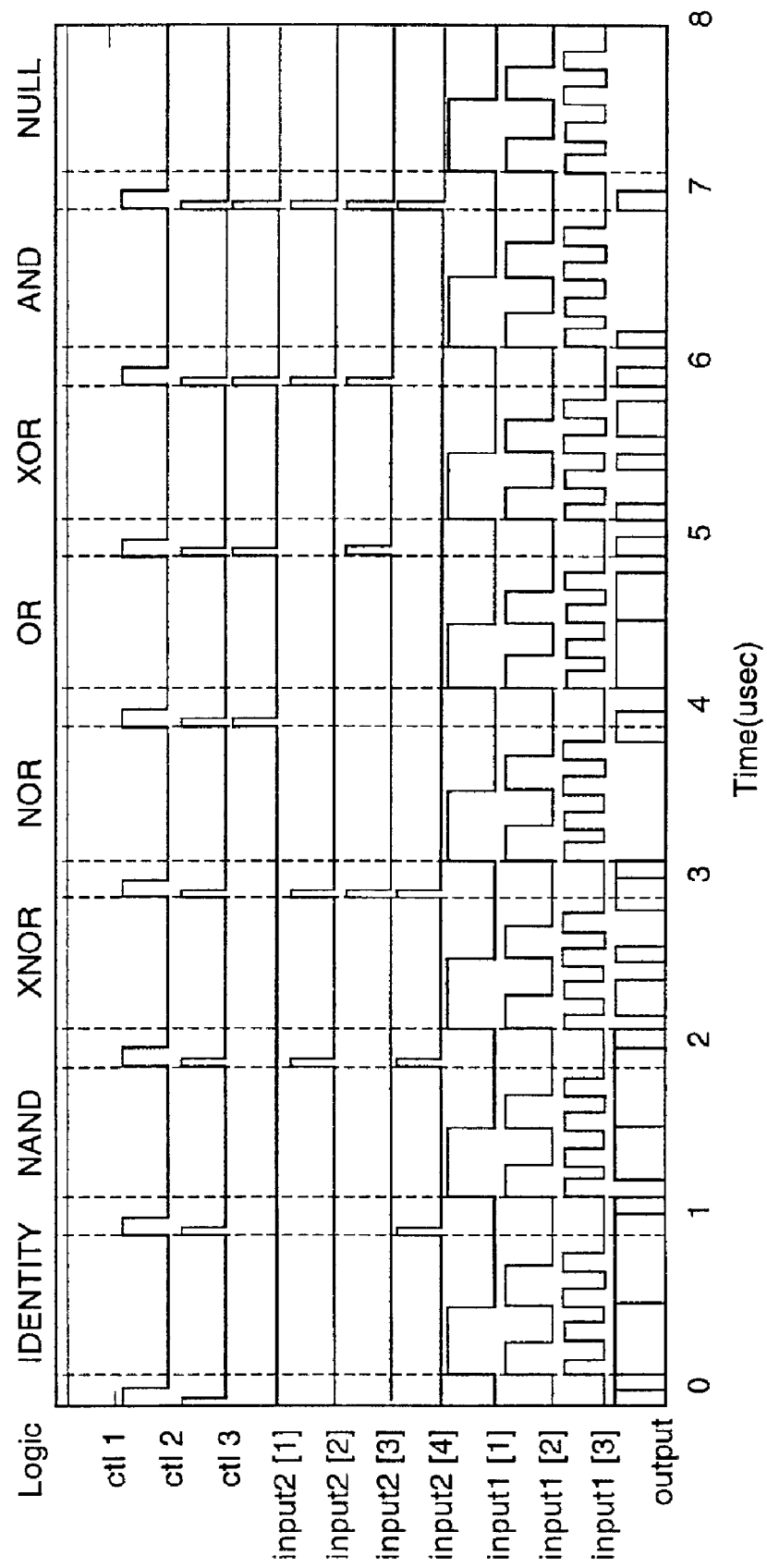
FIG. 82 shows a result by circuit simulation for verifying the operation of the circuit shown in FIG. 77, in which the symmetric function of three inputs is realized.

FIG. 82 shows a result by circuit simulation for verifying the operation of the circuit shown in FIG. 77. In this simulation, the symmetric function capability of three inputs is realized. In FIG. 82, the vertical axis shows the voltages of terminals ctl1~ctl3, the second input signal terminals input1[2]~input2[4], the first input signals terminals input1[1]input1[3] and the terminal output. The lateral axis indicates time by μsec.

In the upper lateral axis, logic names are represented in which each logic is realized in corresponding interval shown in FIG. 82. In a start time of each interval, which is shown by the vertical dotted lines, the floating gates are initialized and logic capability to be realized is stored.

In the interval 0~1 μsec, logical 1 is output whatever the combination of the first input signals is, so that IDENTITY is realized. In the intervals 1~2 μsec, NAND is realized. In the interval 2~3 μsec, XNOR is realized. In the interval 3~4 μsec, NOR is realized. In the interval 4~5 μsec, OR is realized. In the interval 5~6 μsec, XOR is realized. In the interval 6~7 μsec, AND is realized. In the interval 7~8 μsec, NULL is realized in which logical 0 is output whatever the combination of the first input signals is.

Figure 83:
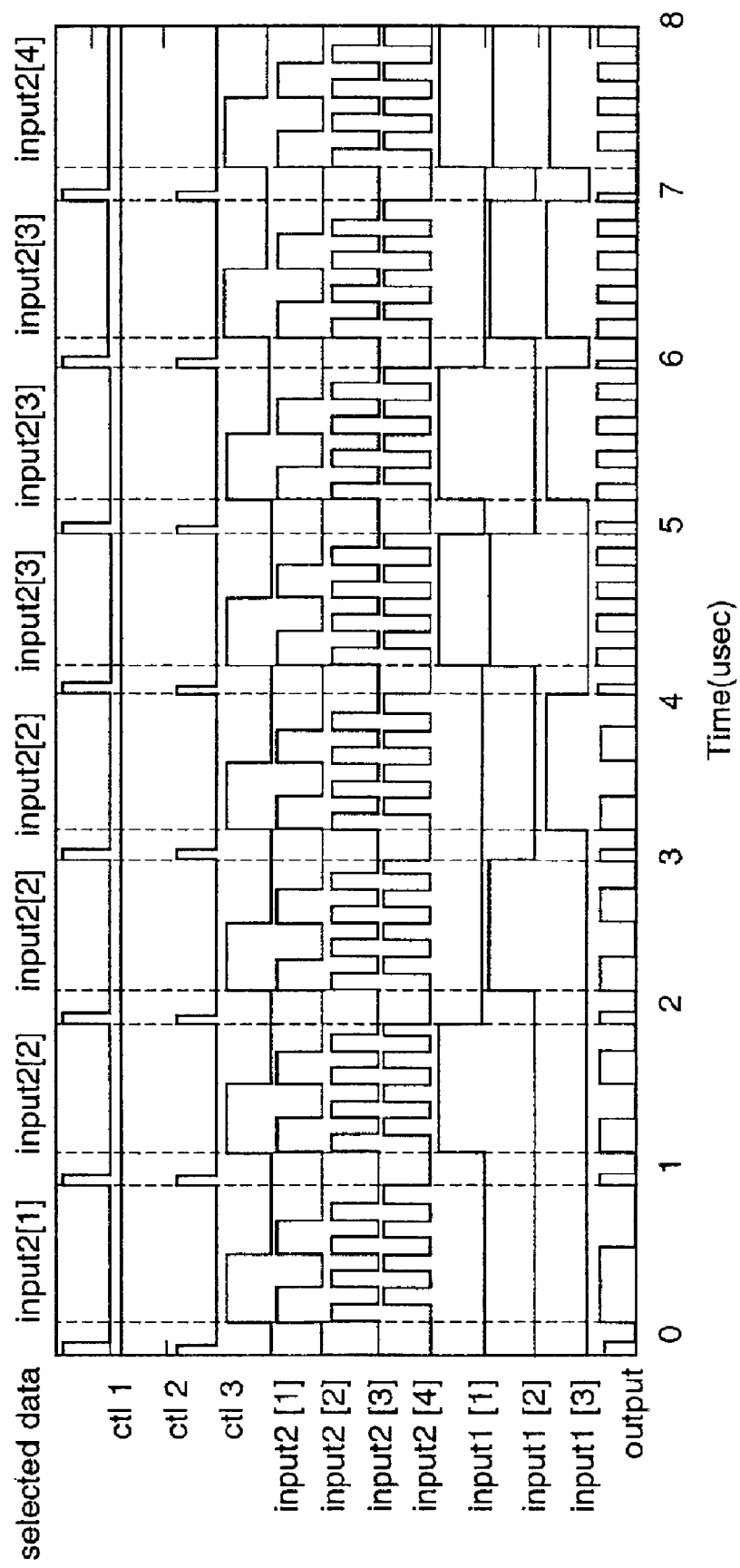
FIG. 83 shows another result by circuit simulation for verifying the operation of the circuit shown in FIG. 77, in which, a selector capability is realized in which one signal is selected among four second input signals according to the input status number wherein the three first input signals are regarded as control inputs.

FIG. 83 shows another result by circuit simulation for verifying the operation of the circuit shown in FIG. 77. In this simulation, the selector capability is realized in which one signal is selected among four second input signals according to the input status number wherein the three first input signals are regarded as control inputs.

In FIG. 83, the vertical axis shows the voltages of terminals ctl1~ctl3, the second input signal terminals input1[2]~input2[4], the first input signal terminals input1[1] input1[3] and the terminal output. The lateral axis indicates time by μsec.

In the upper lateral axis, terminal names are represented in which each signal of the terminal is selected in corresponding interval shown in FIG. 83. In a start time of each interval, which is shown by the vertical dotted lines, the floating gates are initialized.

In the interval 0~1 μsec, the voltage of input2[1] is selected. In the intervals 1~2 μsec, 2~3 μsec, 3~4 μsec, input2[2] is selected by setting one terminal in the first input signal terminals to the power supply voltage so as to set the input status number to 1. In the intervals 4~5 μsec, 5~6 μsec, 6~7 μsec, input2[3] is selected by setting two terminals in the first input signal terminals to the power supply voltage so as to set the input status number to 2. In the interval 7~8 μsec, input2[4] is selected by setting all of the first input signal terminals to the power supply voltage so as to set the input status number to 3. Accordingly, it is understood that the integrated circuit 404 shown in FIG. 77 realizes the selector capability.

As described in detail, the integrated circuit 404 shown in FIG. 77 can reconfigure the symmetric function. In addition, this integrated circuit has the selector capability. When the symmetric function capability is realized, this circuit 404 can be regarded as a memory circuit which realizes writing data and reading data.

(Embodiment 3-4)

Figure 84:
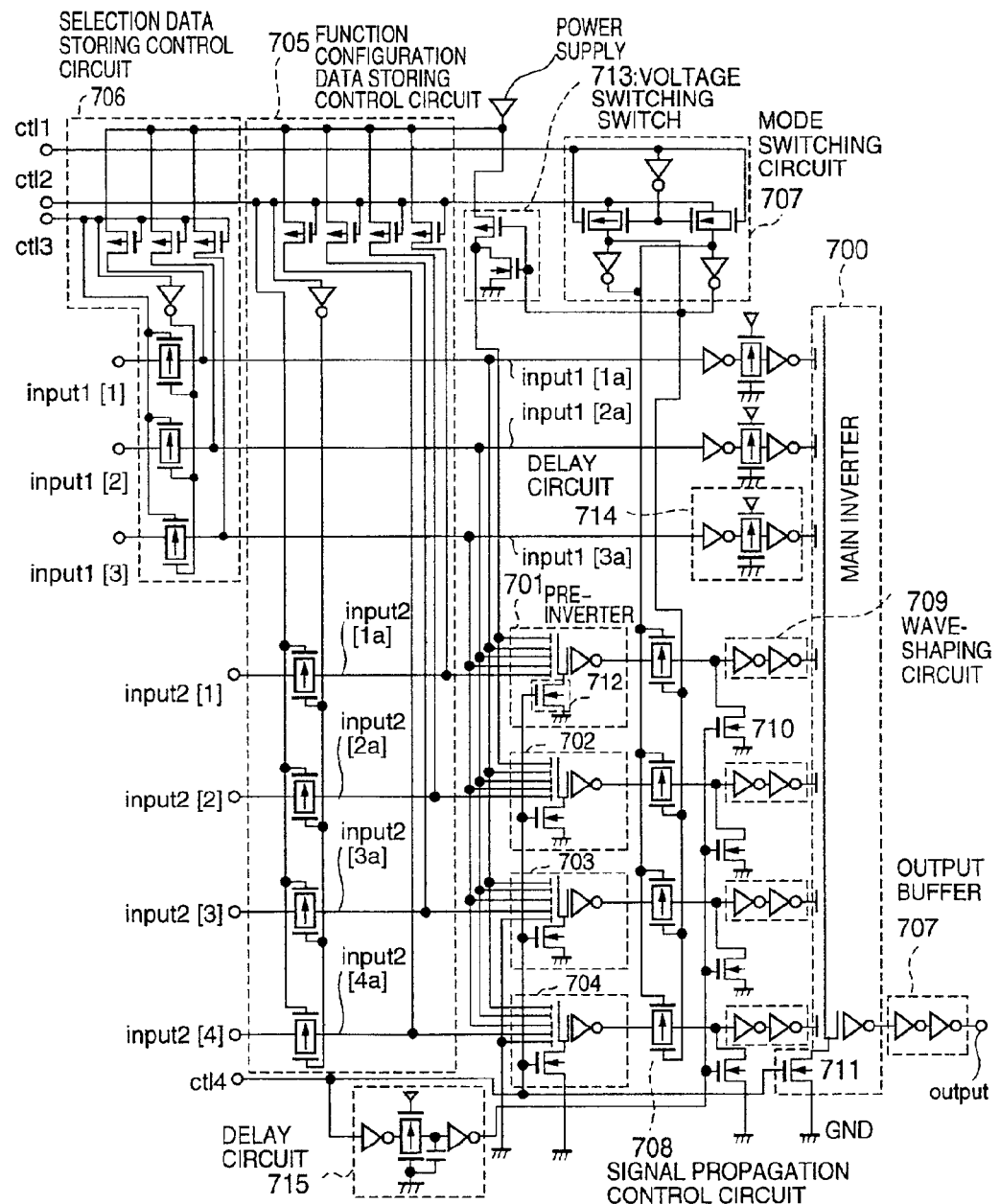
FIG. 84 shows a function reconfigurable integrated circuit 405 according to an embodiment 3-4 which has both of the symmetric function capability of three input variables and the selector capability for selecting one among four data inputs by three control inputs.

FIG. 84 shows a function reconfigurable integrated circuit 405 according to the embodiment 3-4. The function reconfigurable integrated circuit 405 has both of the symmetric function capability of three input variables and the selector capability for selecting one among four data inputs by three control inputs. In addition, the function reconfigurable integrated circuit 405 can store data for configuring the capabilities. That is, the function reconfigurable integrated circuit 405 holds data for configuring the symmetric function for the symmetric function capability and holds data for specifying a signal line to be selected for the selector capability.

In the following, the structure and the operation of the function reconfigurable integrated circuit 405 will be described.

Figure 85:
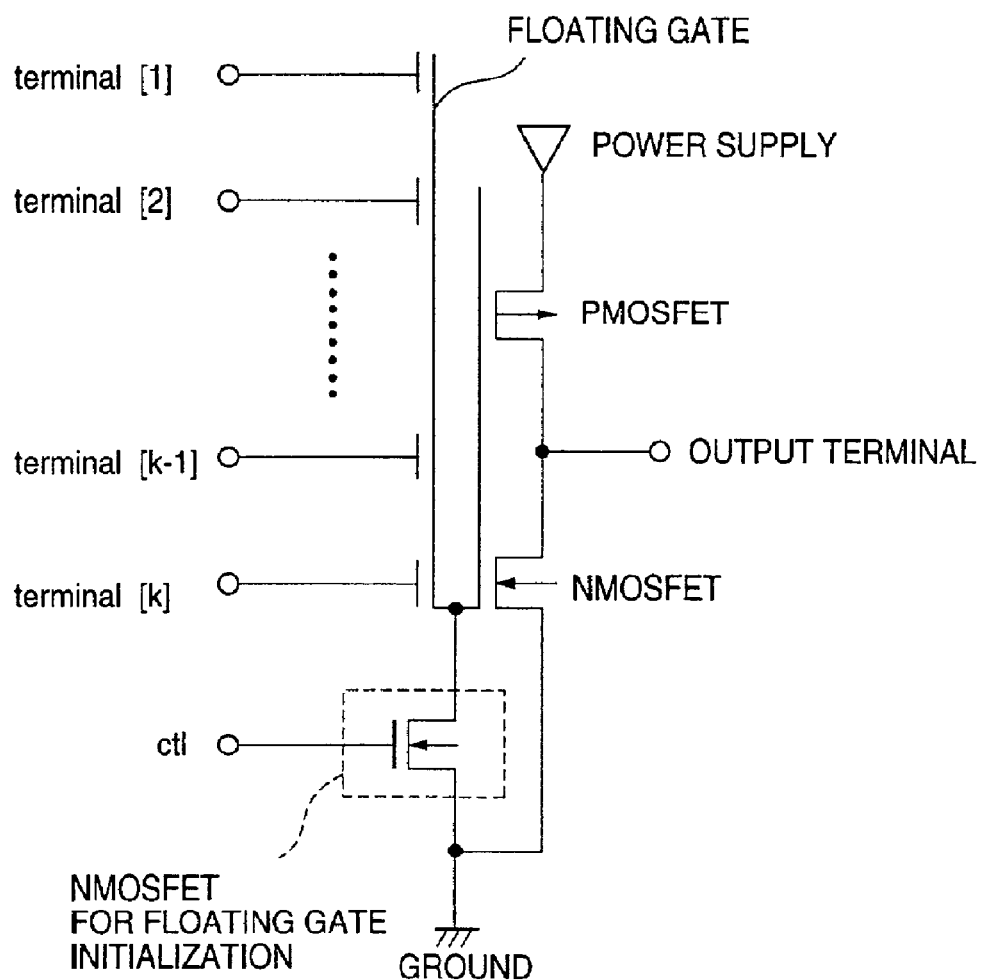
FIG. 85 shows a neuron MOS inverter 601 with a switch.
Figure 86:
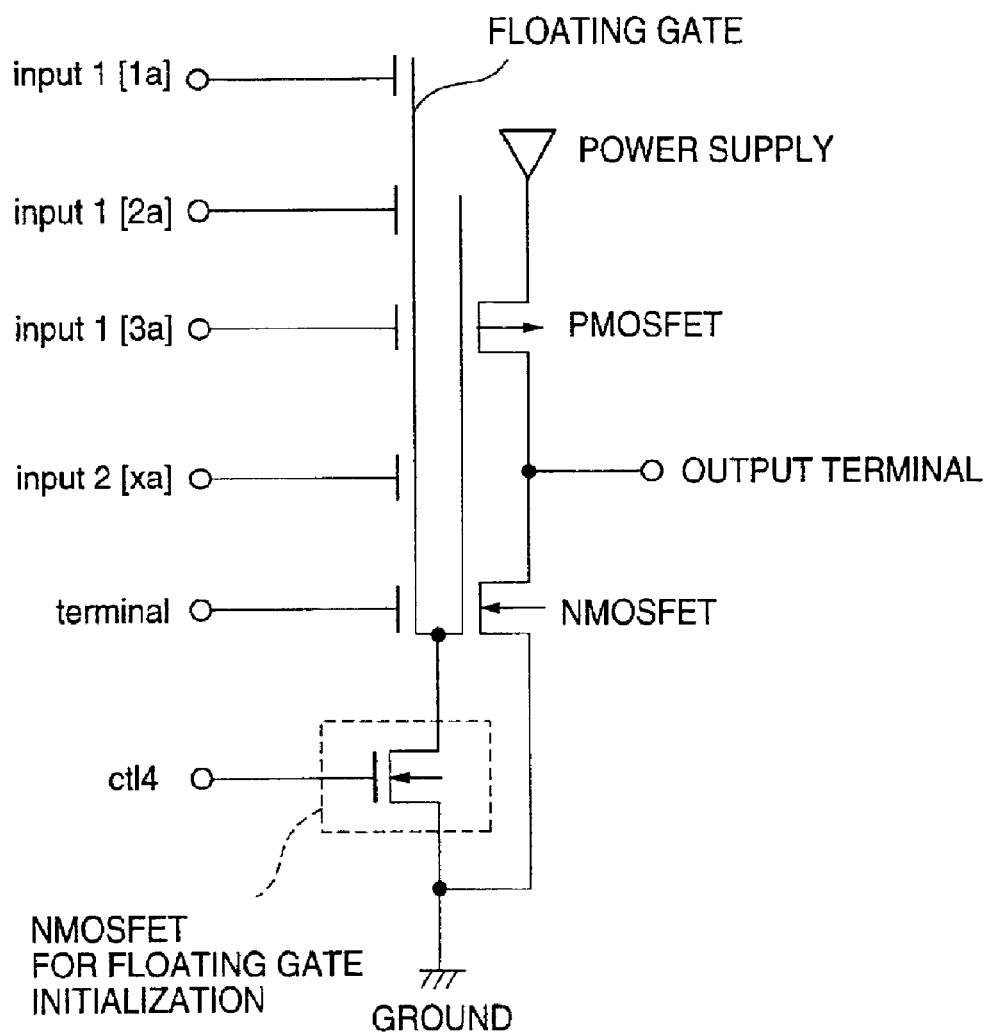
FIG. 86 shows a pre-inverter 701.
Figure 87:
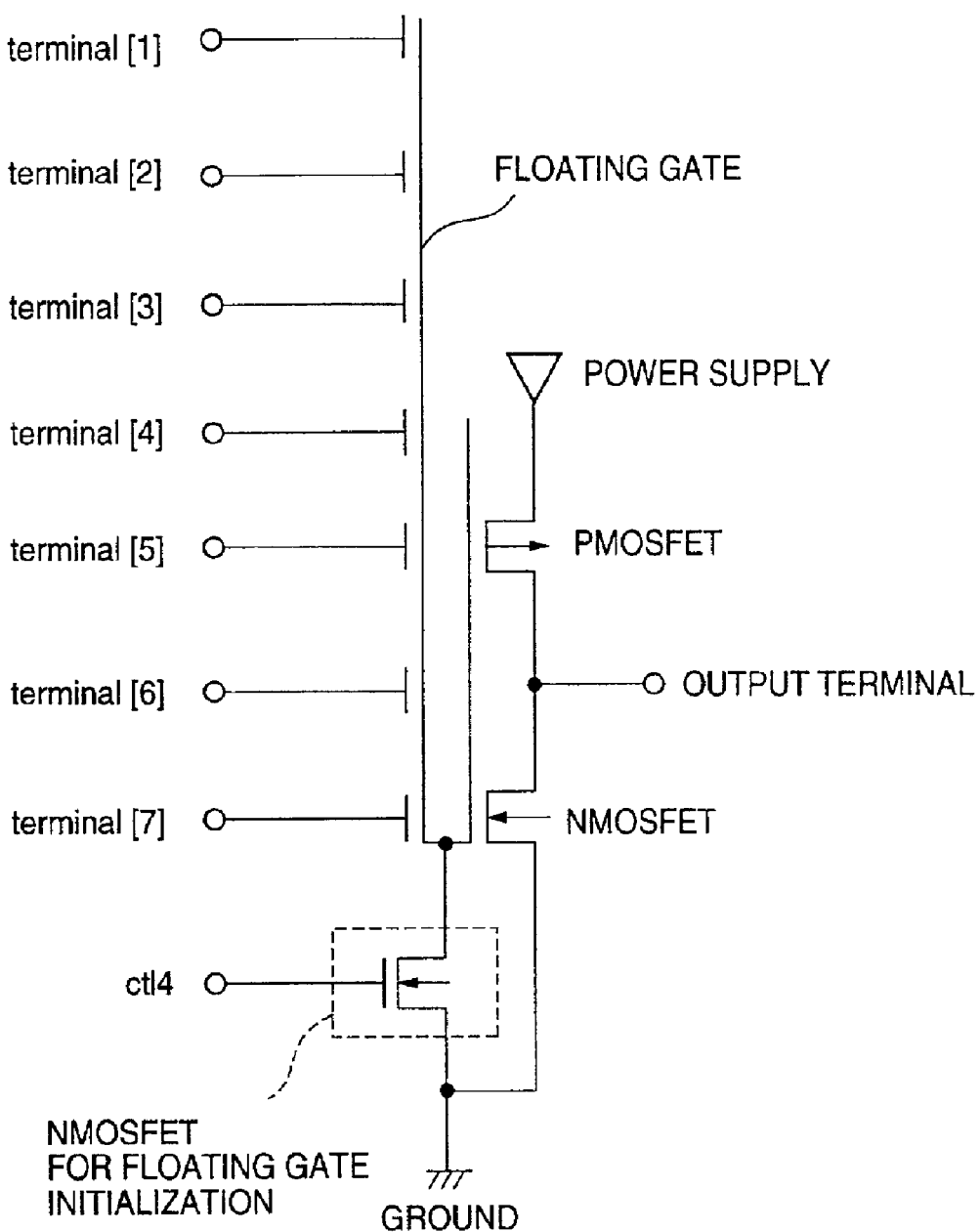
FIG. 87 shows a main inverter 700.

FIG. 85 shows a neuron MOS inverter 601 with a switch. FIG. 86 shows a pre-inverter 701. The structure and the operation of each of pre-inverters 702~704 are the same as those of the pre-inverter 701. FIG. 87 shows a main inverter 700.

The function reconfigurable integrated circuit 405 shown in FIG. 84 is a two stage logic feed-forward type circuit. The neuron MOS inverter with a switch shown in FIG. 85 is used in each stage. In addition, the circuit shown in FIG. 86 is used as a pre-inverter 701 and the circuit shown in FIG. 87 is used for a main inverter 700.

The function reconfigurable integrated circuit 405 is configured by two stages wherein a first stage includes four pre-inverters 701, 702, 703, 704 and a second stage includes the main inverter 700. The pre-inverters and the main inverter are main components of the function reconfigurable integrated circuit 405. In addition, the function reconfigurable integrated circuit 405 includes a function configuration data storing control circuit 705, a selection data storing control circuit 706, a mode switching circuit 707, a wave-shaping circuit 709, delay circuits 714, 715 and the like as control circuits and peripheral circuits.

The principle of the operation and the structure of the pre-inverters 701~704 and the main inverter 700 is the same as that in the integrated circuit 404. As for the integrated circuit 404, the first input signals are directly input to each of the pre-inverters 501~504 and the main inverter 500. On the other hand, as for the integrated circuit 405, they are input via the selection data storing control circuit 706. Thus, for pre-inverter 701 shown in FIG. 86, which has the same structure as that of the circuit shown in FIG. 78, terminal names different from those in FIG. 78 are given for the sake of clarity.

The terminals input1[1a] input1[3a] in the pre-inverter 701 shown in FIG. 86 are connected to the first input signal terminals input1[1]~input1[3] respectively via the selection data storing control circuit 706. The signal values of the input1[1a]~input1[3a] becomes the signal values of input1[1]~input1[3] or the power supply voltage.

The terminal input2 [xa] is a generic name of the terminals input2[1a]~input2[4a]. "terminal" shown in FIG. 86 is a terminal from which terminal a signal for controlling a threshold value of the pre-inverter with respect to an input signal value is input. The terminal is connected to the power supply or the ground.

Next, four modes of the integrated circuit 405 and the control methods will be described, which distinguish the circuit 405 from the circuit 404.

In a first mode in the four modes of the integrated circuit 405, data for configuring a symmetric function capability is not stored so that the data should be input continuously. In a second mode, the data is stored. In a third mode, an address of a signal which should be selected is continuously input in the selector capability. In a fourth mode, the address is stored.

FIG. 88 shows a procedure for realizing the first mode in the integrated circuit 405. In FIG. 88, "initialization time" means a time for pretreatment for performing function processing. "1, 2, 3" indicates a time series of the procedure. "input1" is a generic name of the terminals input1[1]~input1[3] and "input2 " is a generic name of the terminals input2[1]~input2[4].

In a first interval in the pretreatment time, the terminals ctl1~ctl4 are set to the power supply voltage $V_{dd}$ and the voltages of the terminals input1 and input2 are set to the ground voltage. Accordingly, in this interval, the terminals input2[1]~input2[4] are connected to the terminals input2[1a]~input2[4a] respectively by the function configuration data storing control circuit 705, the terminals input1[1]~input1[3] are connected to the terminals input1[1a]input3[1a] respectively by the selection data storing control circuit 706, the output terminals of the pre-inverters 701~704 are disconnected from the input terminals of the main inverter 700 by the signal propagation control circuit 708. The floating gates of the pre-inverters 701~704 and the main inverter 700 are connected to the ground. The voltages of terminals input1[1]input1[3] and input2[1]~input2[4] are the ground voltage and the NMOSFETs 710 for initialization of the input gates conduct. Therefore, the input signals of the pre-inverters 701~704 and the main inverters 700 are in the ground voltage.

In a second interval in the initialization time, by changing the voltage of the terminal ctl4 to the ground voltage, the NMOSFET 711 for initializing the floating gate of the main inverter 700 and the NMOSFETs 712 for initializing the floating gates of the pre-inverters 701~704 are interrupted. According to this operation, the pre-inverters 701~704 and the main inverter 700 are initialized while the voltage of every input terminal is the ground voltage.

In a third interval, when the voltage of the terminal ctl1 is changed to the ground voltage, the output terminals of the pre-inverters 701~704 are connected to the input terminals of the main inverter 700 by the signal propagation control circuit 708. In addition, PMOSFET in the voltage switching switch 713 conducts so that the terminal "terminal" in the pre-inverters 701 and 702 becomes in the power supply voltage.

In this state, the symmetric function capability can be realized by setting the voltages of the terminals input2[1] input2[4] to $V_{conf}$ which is a voltage combination representing function configuration data and inputting signals $V_{sig}$ which are processed to the terminals input1[1]input1[3].

In FIG. 88, a solid line with a right arrow indicates that $V_{dd}$ continues and a dotted line with a right arrow indicates that 0 voltage continues.

Next, a procedure for realizing the second mode will be described, in which the symmetric function configuration data is stored. FIG. 89 shows the procedure. The meanings of symbols in FIG. 89 are the same as those in FIG. 88.

In the first interval, the voltages of the terminal ctl1~ctl4 are $V_{dd}$, the voltage of the terminal input1 is the ground voltage and the voltage of input2 is a logically inverted voltage of th function configuration data. The difference between the second mode and the first mode is only the voltages of the terminal input2.

In the second interval, when the voltage of the terminal ctl4 is set to the ground voltage, the NMOSFET 711 for initialization of the floating gate of the main inverter 700 and the NMOSFETs 712 for initialization of the floating gates of the pre-inverters 701~704 are interrupted.

According to this operation, the main inverter 700 is initialized when the voltages of all input signals are the ground voltage, and, the pre-inverters 701~704 are initialized when the voltage of the input signals except for the terminal input2 is the ground voltage and the voltages of input2 are logically inverted voltages of the function configuration data.

In the third interval, when the terminal ctl2 is set to the ground voltage, the terminals input2[1]~input2[4] are disconnected from the terminals input2[1a]~input2[4a] and the terminals input2[1a]~input2[4a] are connected to the power supply voltage by the function configuration data storing control circuit 705.

In addition, the output terminals of the pre-inverters and the input terminals of the main inverter 700 are connected by the signal propagation control circuit 708. In this operation, since the terminal input2 is not connected to the pre-inverters 701~704, the output of the integrated circuit 405 is not affected by the terminal input2. In FIG. 89, a lateral short line in "terminal voltage during function processing" indicates that input2can take any value.

In this state, by applying signals Vsig to be processed to the terminals input1[1]input1[3] (input1), the symmetric function capability can be realized. It is the same as the case of the integrated circuit 404 (embodiment 3-3) that any desired symmetric function capability can be realized by connecting the terminal input2 to the power supply voltage after applying the logically inverted voltage of the function configuration data to the terminal input2 and initializing the floating gates.

FIG. 90 shows a procedure for realizing the third mode which realizes the selector capability, wherein the address of a selected signal is not stored so that the signal which is selected by the address is output only during applying the address. The meanings of symbols in FIG. 90 are the same as those in FIG. 88.

In the third mode, the operation performed in the initialization time is almost the same as that of the first mode. The difference is that, in the third mode, a voltage combination $V_{sel}$ of address signals of data to be selected is input to the terminals input1[1]input1[3] and a voltage combination of data to be selected is input to the terminals input2[1]~input2[4] when performing the selector capability.

The above-mentioned first, second and third modes can be also performed by the integrated circuit 404.

FIG. 91 shows a procedure of the fourth mode, which can not be realized by the integrated circuit 404. In the fourth mode, the address of data to be selected is stored in the selector capability.

In the first interval, the voltages of the terminals ctl1~ctl4 are set to the power supply voltage, logically inverted voltages of address signals of data to be selected are input to the terminal input1, and the voltage of the terminal input2 is set to the ground voltage. As an example, the logically inverted voltages of address signals of data to be selected is a voltage combination (0,0, $V_{dd}$) in a case that the voltages of the terminals input1[1]input1[3] are ($V_{dd}$, $V_{dd}$,0) so that the terminal input2[3] is selected in the integrated circuit 405 which is initialized by the procedure shown in FIG. 90.

In the second interval, by setting the voltage of the terminal ctl4 to the ground voltage, the NMOSFET 711 and the NMOSFETs 712 are interrupted.

In the third interval, when the voltage of the terminal ctl3 is set to the ground voltage, the terminals input1[1]~input1[3] are disconnected from the terminals input1[1a]input1[3a], and the terminals input1[1a]~input1[3a] are connected to the power supply.

In the fourth interval, since the terminals input1[1]input1[3] are disconnected from the input terminals of the pre-inverters 701~704 and the main inverter 700, they are connected to the ground. This operation is not necessarily required and the circuit is not affected whatever voltages are applied.

In the fifth interval, when th voltage of the terminal ctl1 is set to the ground voltage, the output terminals of the pre-inverters 701~704 are connected to the input terminals of the main inverter 700 by the signal propagation control circuit 708, the PMOSFET of the voltage switching switch 713 conducts so that one of input terminals is connected to the power supply in each of the pre-inverters 701 and 702. In this state, the selector capability can be performed. Data to be selected corresponds to logically inverted voltages of addresses which are stored in advance.

In FIG. 91, the lateral short line in "voltage during performing selector capability" for input1 indicates that the voltages of terminals input1[1]~input1[3] can take any value.

The four modes can be performed by the above-mentioned procedures.

FIGS. 88–91 show results of circuit simulations of the integrated circuit 405.

Figure 92:
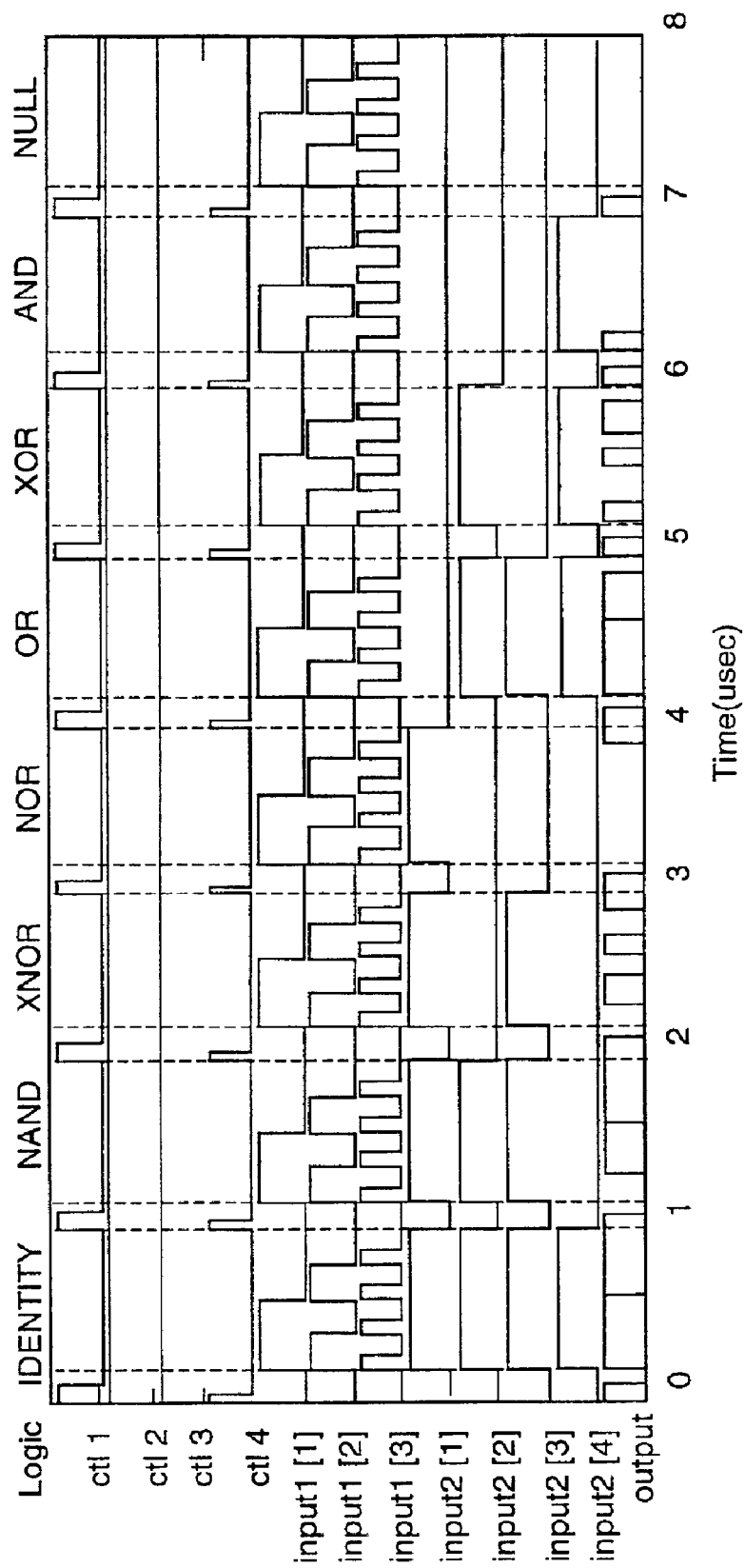
FIGS. 92–95 show results of circuit simulations of the integrated circuit 405.

FIG. 92 shows the first mode in which the symmetric function capability of three inputs is realized in the integrated circuit 405. The vertical axis indicates the voltages of the terminals ctl1~ctl4, the first input signal terminals input1[1]~input1[3], the second input signal terminals input1[2]~input2[4], and the terminal output. The lateral axis indicates time by μsec. In the upper lateral axis, logic names corresponding to time intervals are indicated. In FIG. 92, in a start time of each interval, which is shown by the vertical dotted lines, pretreatment such as initialization of the floating gates for a process to be performed in the time interval is performed.

In FIG. 92, it can be verified that the voltages of the terminals ctl1~ctl4are the same as those shown in FIG. 88.

In each of the time intervals, the voltages of the second input signal terminals input2[1]~input2[4] corresponds to symmetric function configuration data and the terminals input2[1]~input2[4] keep the same voltage during performing function processing.

In the time interval 0~1 μsec, the integrated circuit 405 outputs logical 1 whatever the voltage combination of the first input signal terminals input1[1]input1[3] is, which means that IDENTITY is realized.

NAND is realized in the time interval 1~2 μsec, XNOR is realized in the time interval 2~3 μsec, NOR is realized in the time interval 3~4 μsec, OR is realized in the time interval 4~5 μsec, XOR is realized in the time interval 5~6 μsec, AND is realized in the time interval 6~7 μsec. In the time interval 7~8μsec, NULL is realized in which logical 0 is output whatever the voltage combination of the first input signals is.

Figure 93:
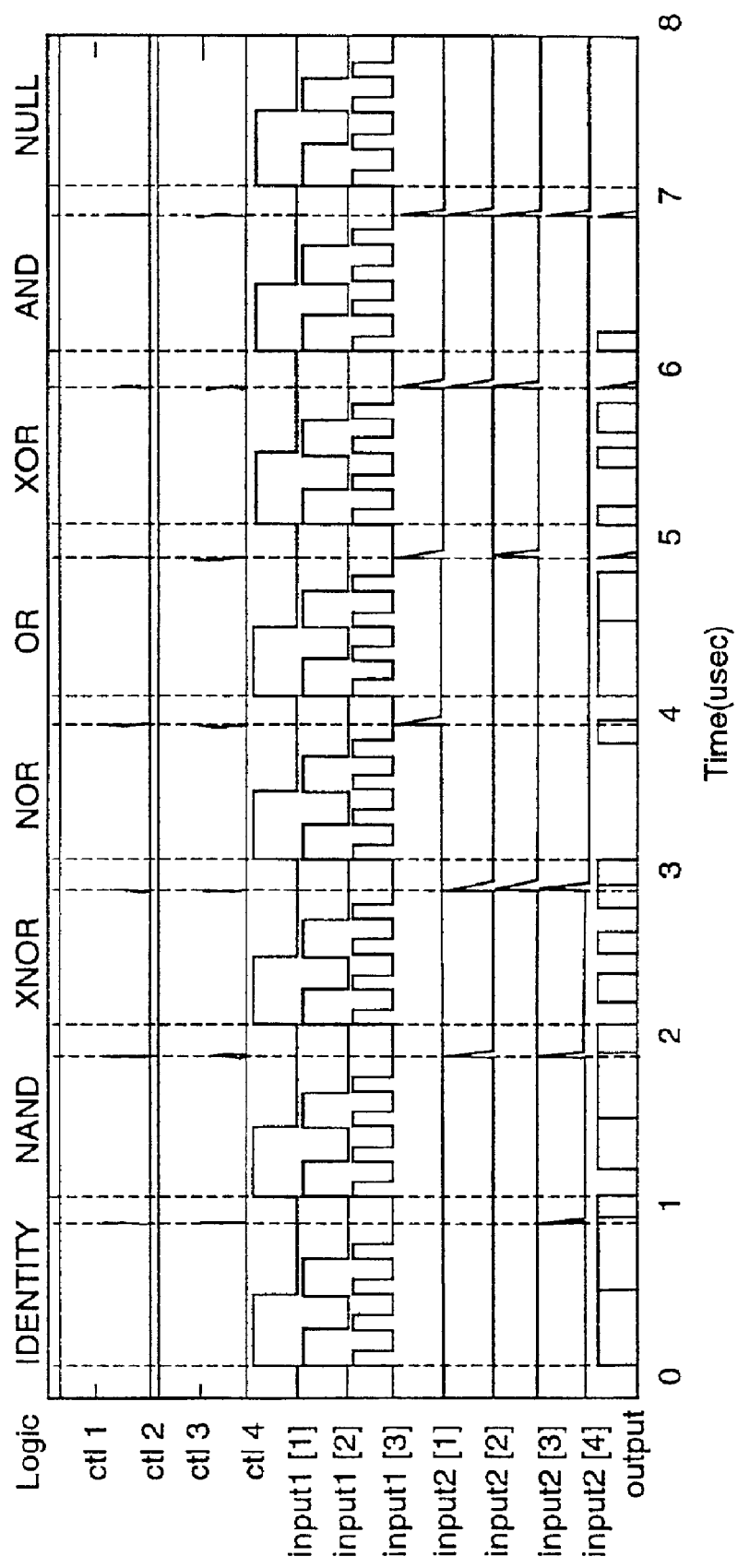

FIG. 93 shows the second mode. In the second mode, the symmetric function capability of three inputs is realized by inputting logically inverted data of the symmetric function configuration data into the second input signal terminals input2 [1]~input2[4]. The meanings of the vertical and lateral axes are the same as those in FIG. 92.

In FIG. 93, in a start time of each interval, which is shown by the vertical dotted lines, pretreatment such as initialization of the floating gates for a process to be performed in the time interval is performed. In FIG. 93, it can be verified that the voltages of the terminals ctl1~ctl4are the same as those shown in FIG. 89.

In FIG. 93, comparing with the case shown in FIG. 92, logically inverted voltages of the voltages which are applied while perfuming the symmetric function capability in FIG. 92 are input during each initialization time.

That is, for example, when XNOR is realized in the time interval 2 μsec~3 μsec, if the symmetric function configuration data is not stored as shown in FIG. 92, the voltage of the terminal input2[1] becomes $V_{dd}$, the voltage of the terminal input2[2] becomes 0, the voltage of the terminal input2[3] becomes $V_{dd}$ and the voltage of the terminal input2[4] becomes 0. On the other hand, when the symmetric function configuration data is stored as shown in FIG. 93, the voltage of the terminal input2[1] is set to 0, the voltage of the terminal input2[2] is set to $V_{dd}$, the voltage of the terminal input2[3] is set to 0 and the voltage of the terminal input2[4] is set to $V_{dd}$ during the initialization time.

IDENTITY is realized in the time interval 0~1μsec NAND is realized in the time interval 1~2 μsec, XNOR is realized in the time interval 2~3 μsec, NOR is realized in the time interval 3~4 μsec, OR is realized in the time interval 4~5 μsec, XOR is realized in the time interval 5~6 μsec, AND is realized in the time interval 6~7 μsec. In the time interval 7~8 μsec, NULL is realized in which logical 0 is output whatever the voltage combination of the first input signals is. Accordingly, the symmetric functions of three inputs are realized.

Figure 94:
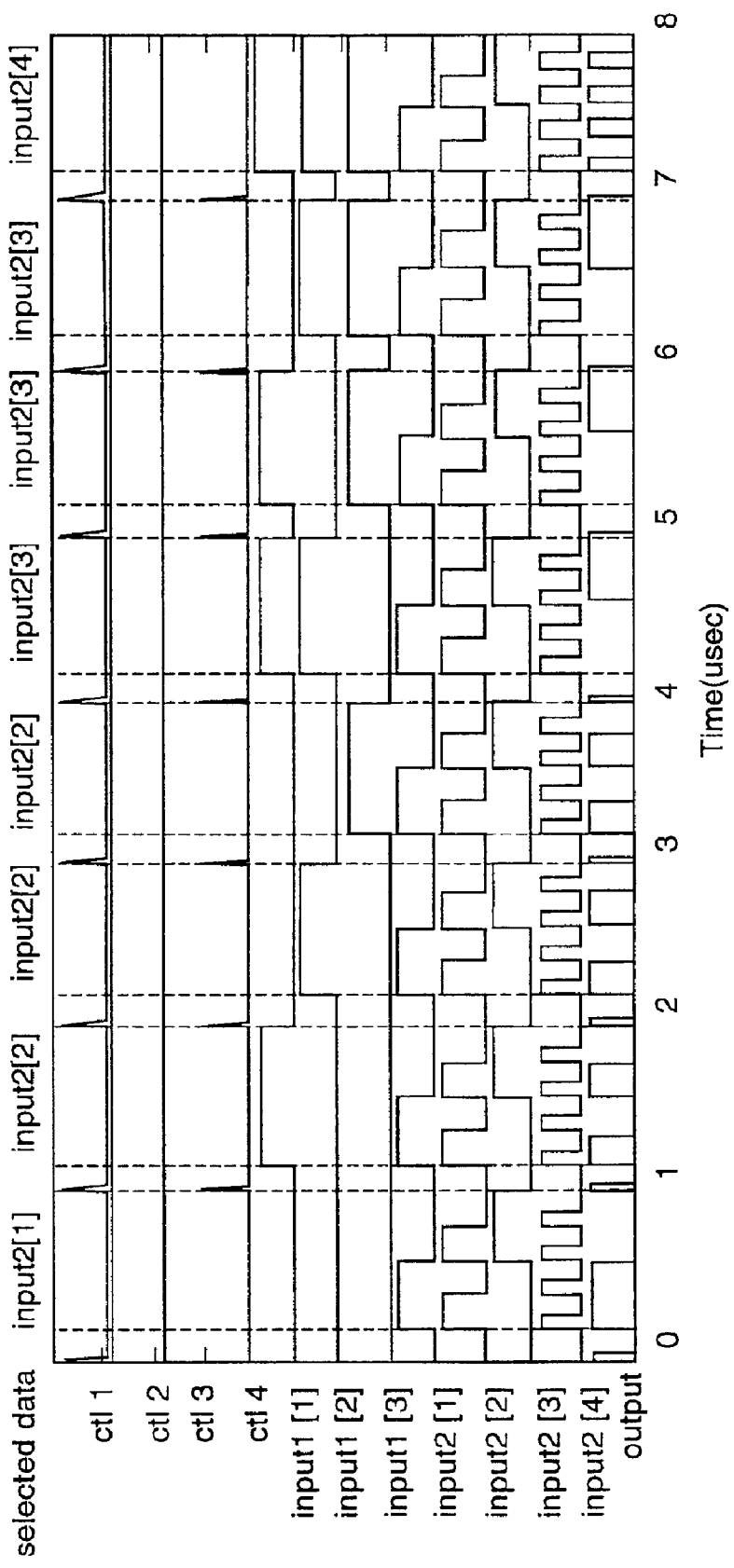

FIG. 94 shows the third mode. In the third mode, the selector capability of three inputs is realized in the integrated circuit 405, wherein one signal is selected among four second input signals by using three first input signals as control input signals. The vertical axis indicates the voltages of the terminals ctl1~ctl4, the first input signal terminals input1[1]~input1[3], the second input signal terminals input2[1]~input2[4], and the terminal output. The lateral axis indicates time by μsec. In the upper lateral axis, terminals names corresponding to selected signals are indicated. In FIG. 94, in a start time of each interval, which is shown by the vertical dotted lines, pretreatment including initialization of the floating gates is performed. In FIG. 94, it can be verified that voltages shown in FIG. 90 are given in each of the initialization time and the time for performing the selector capability.

In the time interval 0~1 μsec, the voltage of the terminal input2[1] is selected by setting all voltages of the terminals input[1]1~input1[3] to the ground voltage during performing the selector capability. In each of the time intervals 1~2 μsec, 2~3 μsec, 3~4 μsec, the voltage of the terminal input2[2] is selected by setting a voltage of different one terminal in the terminals input1[1]~input1[3] to the power supply voltage so that the input status number becomes 1. In each of the time intervals 4~5 μsec, 5~6 μsec, 6~7 μsec, the terminal input2[3] is selected by setting the voltages of two terminals in the terminals input1[1] ~input1[3] to the power supply voltage so that the input status number becomes two. In the time intervals 7~8 μtsec, the terminal input2[4] is selected by setting the voltages of all the terminals input1[1]input1[3] to the power supply voltage so that the input status number becomes three.

As shown in FIG. 94, the voltage of the selected terminal is the same as the output voltage.

Figure 95:
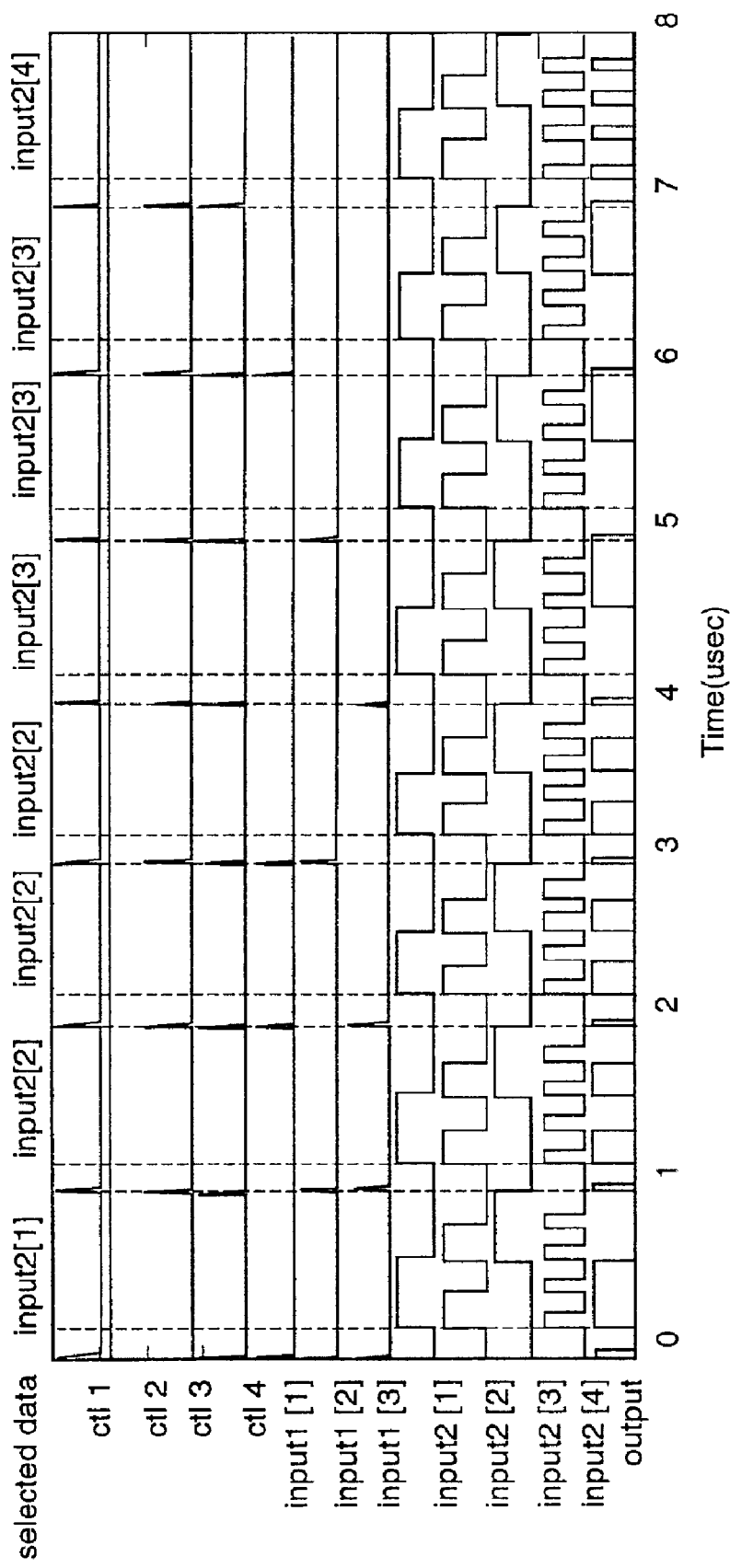

FIG. 95 shows the fourth mode. In the fourth mode, the selector capability is realized in the integrated circuit 405, wherein one signal is selected among four second input signals by applying logically inverted data of address data into three first input signal terminals input1[1]~input1[3] temporarily. The vertical axis and the lateral axis in FIG. 95 indicate the same meaning as that in FIG. 94. In FIG. 95, in a start time of each interval, which is shown by the vertical dotted lines, pretreatment including initialization of the floating gates is performed. In FIG. 95, it can be verified that voltages shown in FIG. 91 are given in each of the initialization time and the time for performing the selector capability.

When comparing with FIG. 94, logically inverted voltages of voltages which are applied during performing the selector capability in FIG. 94 are applied during each of the initialization time in FIG. 95.

That is, for example, when a signal of the terminal input2[2] is selected in the time interval 1 μsec~2 μsec, if the address data is not stored, as shown in FIG. 94, the voltage of the terminal input1[1] becomes $V_{dd}$, the voltage of the terminal input1[2] becomes 0, the voltage of the terminal input1[3] becomes 0. On the other hand, when the address data is stored as shown in FIG. 95, the voltage of the terminal input1[1] is set to 0, the voltage of the terminal input1[2] is set to $V_{dd}$, the voltage of the terminal input1[3] is set to $V_{dd}$ during the initialization time.

In the time interval 0~1 μsec, the voltage of the terminal input2[1] is selected by setting all voltages of the terminals input[1]1~input1[3] to $V_{dd}$ during performing the initialization time. In each of the time intervals 1~2 tsec, 2~3 μsec, 3~4 μsec, the voltage of the terminal input2[2] is selected by setting a voltage of different one terminal in the terminals input1[1]~input1[3] to the ground voltage in each initialization time. In each of the time intervals 4~5 μsec, 5~6 μsec, 6~7 μsec, the terminal input2[3] is selected by setting the voltages of two terminals in the terminals input1[1]input1[3] to the ground voltage in each initialization time. In the time intervals 7~8 μsec, the terminal input2[4] is selected by setting the voltages of all the terminals input1[1]~input1[3] to the ground voltage.

As shown in FIG. 95, since the voltage of the selected terminal is the same as the output voltage, it is verified that the selector capability is realized.

As mentioned above, the function reconfigurable integrated circuit 405 can reconfigure the symmetric function even after being manufactured. In addition, the integrated circuit 405 has the selector capability. When realizing the symmetric function capability, the integrated circuit 405 can select between the first mode and the second mode, wherein the function configuration data is not stored in the first mode and it is stored in the second mode. When realizing the selector capability, the integrated circuit 405 can select between the third mode and the fourth mode, wherein the address data is not stored in the third mode and it is stored in the fourth mode. Thus, the integrated circuit 405 can select among the four modes.

That is, the integrated circuit 405 can extract only symmetric functions which are used for a logic circuit from Boolean functions. In addition, the integrated circuit 405 has selector capability as well as the symmetric function capability and can switch between the two capability as necessary.

Further, the function configuration data can be stored without using a specific memory element or a memory circuit so that the integrated circuits 401~405 of the present invention can be used as a memory circuit. That is, the integrated circuits of the present invention have a capability in which three capabilities of symmetric function capability, the selector capability and the memory capability are integrated.

According to the integrated circuit of the present invention, by adopting the structure which can extract only symmetric functions which are often used in a logic LSI from Boolean functions, the area can be decreased comparing with a conventional function reconfigurable device which realizes all Boolean functions. In addition, the integrated circuit of the present invention has the selector capability.

Further, the integrated circuit of the present invention realizes the symmetric function capability and the selector capability by adopting threshold elements which realize threshold logic for the feed-forward type two stage logic.

The integrated circuit is configured by two stages, a first stage in the two stages includes k+1 threshold elements, a second stage in the two stages includes a threshold element. Each of the k+1 threshold elements in the first stage includes terminals for inputting the k first input signals and a terminal for inputting second input signals. Each threshold value of the threshold elements is different. Threshold value is set as a value between the sum of products of weight and input signal values in an input status number and the sum of products of weight and input signal values in the next input status number.

The threshold element of the second stage receives the first input signals and reversed signals of signals output from the threshold elements of the first stage. By adjusting the weight and the threshold value of the threshold element in the second stage, it becomes possible that an output value, or reversed output value, of the threshold element corresponding to a current input status number in the first stage is output. The above-mentioned capability can be realized by applying desired second input signals so that desired threshold values of the threshold elements in th first stage can be set.

The threshold element is configured by an inverter circuit including neuron MOS transistors or those having switches.

The neuron MOS transistor having a switch includes a semiconductor region of a first conductivity type disposed on a substrate, a source region and a drain region of a second conductivity type provided on the semiconductor region, a floating gate electrode, which can be regarded as in an electrically floating state, provided on a region which separates the source region and the drain region via an insulating film, the floating gate electrode connected to a terminal having a predetermined voltage via the switch, a plurality of input gate electrodes capacitively coupled to the floating gate electrode via an insulating film.

The inverter circuit is called a neuron MOS inverter. k+1 neuron MOS inverters are used in the first stage as the threshold elements. In this structure, weights for the first input signals are set to be the same in each other and the threshold value of the neuron MOS inverters are set to be different in each other. In addition, the threshold value in a neuron MOS inverter is set such that it becomes between a first input status number and a second input status number in which 1 is added to the first input status number so that, only when a logical value of a second input signal corresponding to the neuron MOS inverter is 1, input values exceed the threshold value.

The neuron MOS inverter in the second stage receives k first input signals and k+1 output signals of the neuron MOS inverters of the first stage. The weights for these input signals are set to be the same each other. And, a threshold value of the neuron MOS inverter in the second stage is set to be k. Accordingly, the above-mentioned capability can be realized. Further, by operating the voltage of the floating gate by the switch of the neuron MOS inverter, a memory capability which stores a symmetric function can be realized.

As mentioned above, the function reconfigurable integrated circuit according to the embodiments of the present invention is different from the conventional reconfigurable device. The function reconfigurable integrated circuit has the symmetric function capability and the selector capability. In addition, by using the neuron MOS inverter, high capability including memory capability can be realized with a low area cost.

In the embodiment, the above-mentioned electrically floating state" is defined not only as an interrupted state but also as a high impedance state.

According to the present invention described in the embodiments 3-1~3-4, a logic capability can be reconfigures after manufacturing. In addition, an integrated circuit which has the symmetric function and selector capabilities without a specific memory element or a memory circuit for storing function configuration data. Thus, high-performance can be obtained by using a small area in the integrated circuit.

(Embodiments 4-1~4-6)

In the following, examples of circuits including neuron MOS circuits which can configure any logic function based on the principle described in the embodiment 1-1 will be described in the embodiments 4-1~4-6 in detail.

(Outline)

In order to configure any k input variable logic function using two-valued data as input variables in an integrated circuit, following two conditions should be satisfied.

Condition (1): having different $2^k$ states corresponding to combinations of input variables;

Condition (2): having a mechanism of setting one of two-valued values for each of the $2^k$ states.

Figure 6A:
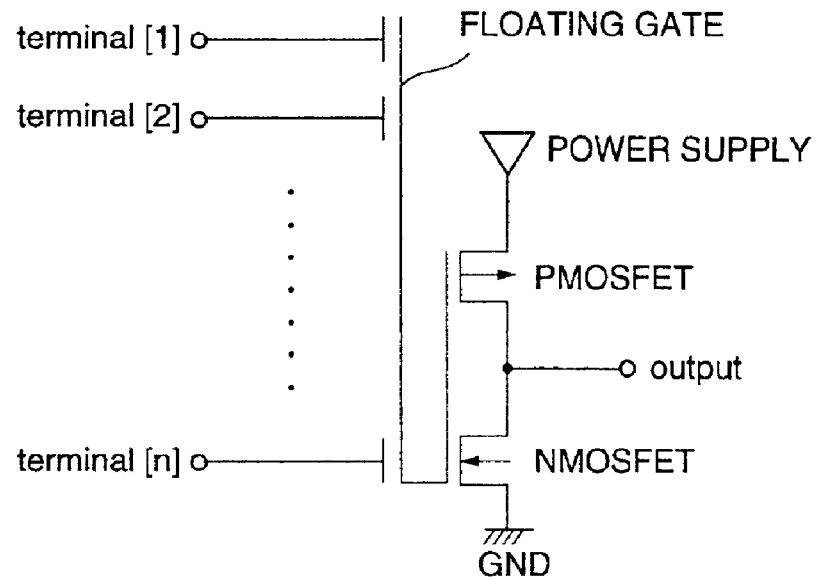
FIGS. 6A and 6B are circuit diagrams of a CMOS type inverter using a conventional neuron MOS transistor.
Figure 6B:
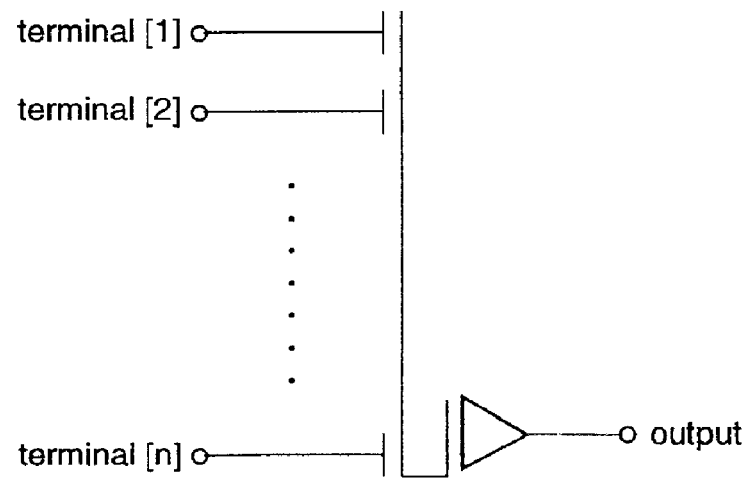

When the above-mentioned integrated circuit is configured by the conventional neuron MOS inverters shown in FIG. 6, the condition (1) is that "the voltage $V_{fg}$ of the floating gate takes $2^k$ values" as is described in the related art, that is $$"\sum_{i=1}^{k} x_i \cdot w_i \text{ takes different } 2^k \text{ values"}.$$

The embodiments 4-1~4-6 of the present invention are as follows such that the above-mentioned two conditions are satisfied.

In the embodiment 4-1 of the present invention, a method for deciding elements $w_i$ of a weight vector w which satisfies the condition (1) wherein $$"\sum_{i=1}^{k} x_i \cdot w_i \text{ takes different } 2^k \text{ values"},$$

and neuron MOS inverters for realizing the method will be described. In addition, in the embodiment 4-1, a guide for obtaining the 2 states on the neuron MOS inverters will be disclosed.

In the embodiment 4-2, a concrete and formulated example of the method for deciding elements $w_i$ of a weight vector w in the embodiment 4-1 will be disclosed. In addition, in the embodiment 4-2, a guide for obtaining the $2^k$ states on the neuron MOS inverters will be disclosed.

In the embodiment 4-3, a method will be described for deciding elements $w_i$ such that the value of a following formula 41 becomes smaller when there is a limit in the minimum number of elements $w_i$ of the weight vector w in the embodiment 4-1.

$$\sum_{i=1}^{k} w_i \qquad \text{(formula 41)}$$

When implementing the neuron MOS inverters, the value of the formula 41 corresponds to the area of the input gate electrode. Therefore, the method of the embodiment 4-3 is equivalent to a method for realizing the neuron MOS inverters with a low area cost.

In the embodiment 4-4, a method is described for satisfying the condition (1) and realizing the mechanism of the condition (2) in one of the embodiments 4-1~4-3, wherein the method for designing a symmetric function disclosed in Kazuo Aoyama, Hiroshi Sawada, Akira Nagoya, Kazuo Nakajima, "A Design Method for a Circuit with Neuron MOS Transistors Realizing Any Symmetric Function," Technical Report of IEICE, CPSY 99–90, PP. 49–51, 1999–11 is extended for a method for designing a circuit which can realize any logic function. In addition, in the embodiment 4-4, a structure of an integrated circuit designed by using the method is described. That is, in the embodiment 4-4, a designing method and a circuit structure of an integrated circuit which can reconfigure any logic function will be described.

In the embodiment 4-5, a designing method and a circuit structure of an integrated circuit will be described, wherein the integrated circuit controls the mechanism in the condition (2) by signals represented by multiple-valued values. According to the embodiment 4-5, the same capability as the embodiment 4-4 can be obtained with lower area cost.

In the embodiment 4-5, the multiple-valued values are represented by a plurality of two-valued signals in physical level. On the other hand, in the embodiment 4-6, a circuit structure will be shown in which multiple signals are used in physical level. According to the embodiment 4-6, the same capability as the embodiment 4-5 can be obtained with lower area cost.

In the following each of the embodiments will be described in detail.

(Embodiment 4-1)

In the embodiment 4-1, methods for deciding elements $w_i$ which can identify combinations of $2^k$ input variables $x_i$ and for implementing the weight vector which can identify the input vector to the neuron MOS inverters will be described.

[Methods for Deciding Elements $w_i$ Which Can Identify Combinations of $2^k$ Input Variables $x_i$]

The condition (1)

$$"\sum_{i=1}^{k} x_i \cdot w_i \text{ takes different } 2^k \text{ values}"$$

is equivalent to "identifying combinations of $2^k$ input variables".

First definitions of "combinations of input variables" and "identifying" will be described in detail taking a case where the input variables are $\{x_1, x_2, x_3\}$ as an example.

When each of the three input variables takes logical two-valued value 1 or 0, the number of combinations of the input variables are $2^3$ which are $\{0,0,0\}$, $\{0,0,1\}$, $\{0,1,0\}$, ..., $\{1,1,1\}$. The $2^3$ combinations are defined as "combinations of input variables".

Next, "identifying combinations of $2^k$ input variables" will be described.

The above mentioned combinations correspond to vector representations of vertex coordinates of a three-dimensional cube when setting coordinate axes orthogonal to each other for the three input variables. Thus, this vector will be called an input vector X hereinafter. In addition, $(w_1,w_2,w_3)$ having positive numbers as the elements will be called a weight vector W.

As for $$\sum_{i=1}^{3} x_i \cdot w_i = X \cdot W \quad \text{(formula 43)}$$

the vectors can be converted into a scalar by using inner product as shown in the formula 43.

$$\sum_{i=1}^{3} x_i \cdot w_i = X \cdot W \quad \text{(formula 43)}$$

According to this formula, "identifying combinations of $2^k$ input variables" can be rephrased by "scalars each of which scalar is a result of inner product of the input vector and the weight vector are different in each other".

Since the input vector X takes two-valued values $\{0,1\}$, it is necessary for satisfying above condition that sums of elements which are different are different, that is, relationships $w_1 \neq w_2 \neq w_3$ and $w_1+w_2 \neq w_2+w_3 \neq w_3+w_1$ should be satisfied. As an example, when the weight vector $W=(2^0, 2^1, 2^2)$, the input vector X is regarded as two-valued representation and the two-valued representation is converted to a decimal representation, eight input vectors are converted into different integers from 0 to 7.

Next, it will be described that the weight vector W in which "the scalars are different in each other" can take not only a form of the vector comprising elements of power of 2 but many other forms.

When taking a weight vector W (k=4) in which elements are numbered in ascending order as an example, $w_4>w_3>w_2>w_1$, $w_3 \neq w_1+w_2$, $\neq w_4 \neq w_1+w_3$, $w_4 \neq w_2+w_3$, $w_4 \neq w_1+w_2+w_3$ and $w_4+w_1 \neq w_3+w_2$ are needs to be satisfied in order for the scalars to be different to each other. An example satisfying this is $(w_1,w_2,w_3,w_4)=(1,1.1,1.2,1.4)$, $(w_1,w_2,w_3,w_4)=(1,1.2,1.4, 1.7)$, $(w_1,w_2,w_3,w_4)=(1, 4, 6, 8)$, $(w_1,w_2,w_3,w_4) =(1, 3, 9, 27)$ and the like.

As for an input vector having k elements, it is necessary that sums of different elements in $\{w_1, w_2, \ldots, w_i, \ldots, w_k\}$ are different to each other in order to identify the input vector having k elements.

[A Method for Implementing the Weight Vector Which Can Identify the Input Vector to the Neuron MOS Inverters]

As mentioned in the related art, the elements $w_i$ of the weight vector corresponds to ratios of input gate capacitances between the input gate electrodes corresponding to each input variable and the floating gate. Thus, by differentiating sums of the input gate capacitance ratios to each other each of which comprises elements without overlapping each other, the input vector can be identified.

(Embodiment 4-2)

In the embodiment 4-2, a condition for insuring that input vectors of any number of elements can be identified and a weight vector for satisfying the condition will be shown. Next, a weight vector by which it is insured that the input vector can be identified will be shown, in which a limit of number of input variables will be added. Finally, a method for implementing the weight vector to the neuron MOS inverter will be described.

That is, in the embodiment 4-2, following descriptions will be given: "condition in which a limit is added to the method of deciding the weight vector according to the embodiment 4-1", "a set of the weight vectors which satisfy the condition to which the limit is added", "a set of weight vectors when the number of the input variables are limited" and "implementation to the neuron MOS inverter".

[Condition in Which a Limit is Added to the Method of Deciding the Weight Vector According to the Embodiment 4-1]

Assuming that k elements of the weight vector W is represented by $\{w_1, w_2, \ldots, w_i, \ldots, w_k\}$ in ascending order, ith element $w_i$ is set such that the following formula 44 is satisfied.

$$w_i > \sum_{j=1}^{i-1} x_j (1 < i < k) \quad \text{(formula 44)}$$

This formula 44 indicates tighter condition than that of the embodiment 4-1. Accordingly, it is ensured that the input vector having any number of elements can be identified.

[A Set of the Weight Vectors Which Satisfy the Condition to Which the Limit is Added]

Next, the elements $w_i$ of the weight vector W which satisfies the formula 44 will be shown concretely.

First, the formula 44 is deformed into the following formula 45.

$$f(i) = w_{i+1} - \sum_{j=1}^{i} w_j > 0 \quad \text{(formula 45)}$$

$$(1 \leq i \leq k-1)$$

When one of solutions of satisfy the formula 45 is $w_i=\alpha^{i-1}(\alpha>1)$, the formula 45 can be represented by following formulas 46 and 47.

$$f(\alpha,i)=g(\alpha,i)/(\alpha-1) \quad (1 \leq i \leq k-1) \quad \text{(formula 46)}$$

$$g(\alpha,i)=\alpha^i \cdot (\alpha-2)+1 \quad \text{(formula 47)}$$

The sign of the function $f(\alpha,i)$ in the formula 46 is the same as the sign of the function $g(\alpha,i)$ since $\alpha>1$. Therefore, judgment of the sign of the function $f(\alpha,i)$ can be performed by using the function $g(\alpha,i)$. Thus, when the following formula 48 is satisfied, the input vector can be identified.

$$g(\alpha,i)=\alpha^i \cdot (\alpha-2)+1>0 (1 \leq i \leq k-1) \quad \text{(formula 48)}$$

When first order differentiation of $g(\alpha,i)$ with respect to $\alpha$ is represented as $g'(\alpha,i)$, the following formulas 49 are satisfied.

$$\begin{cases} g'(1, i) < 0 \\ g'(2, i) > 0 \\ g(1, i) = 0 \\ g(2, i) = 1 > 0 \end{cases} \quad \text{(formula 49)}$$

Since the formulas 49 are satisfied, the function $g(\alpha,i)$ has at least one real number root in $1<\alpha<2$, and the function $g(\alpha,i)$ is positive for any i in $\alpha \geq 2$. Thus, when a weight vector which satisfies the following formula 50 is used, input vectors which have any number of elements can be identified.

$$w_i=\alpha^{i-1} \quad (\alpha \geq 2) \quad \text{(formula 50)}$$

[A Set of Weight Vectors When the Number of the Input Variables are Limited]

As mentioned above, the formula 50 represents the weight vector by which the input vector which has any number of elements can be identified. In addition, as mentioned above, $\alpha$ exists which satisfies $g(\alpha,i)>0$ even when $1<\alpha<2$. This means that the input vector can be identified by adding a limit to the number of elements of the input vector.

Figure 101:
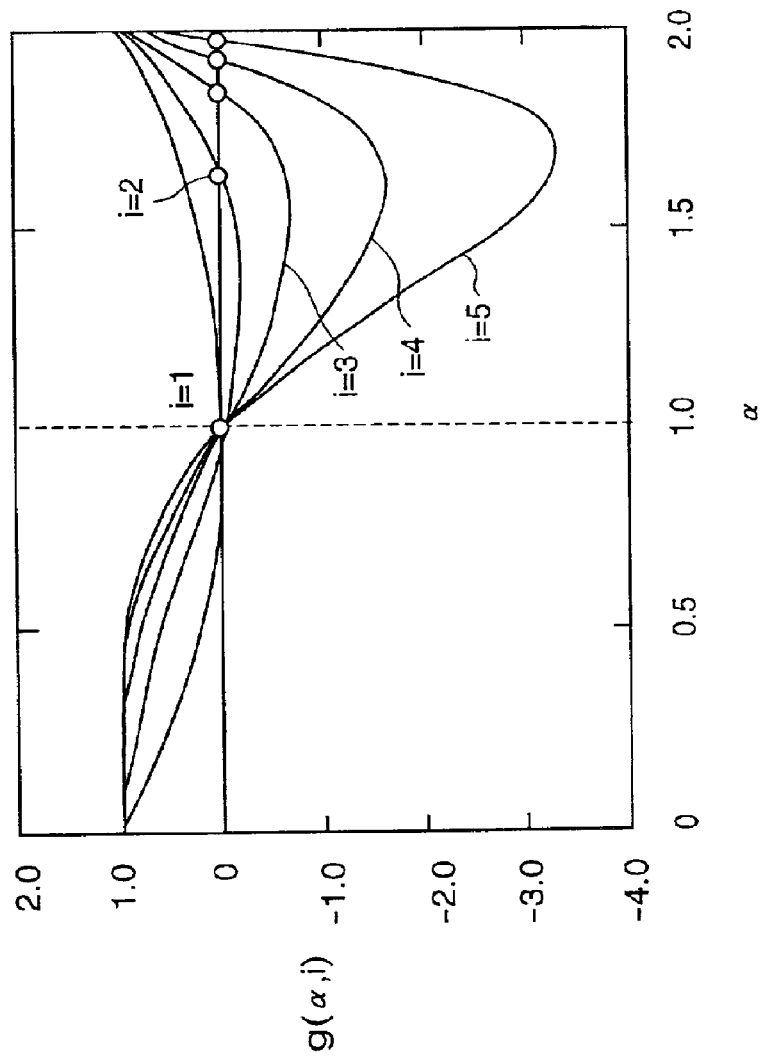
FIGS. 101A and 101B show relationships between α ($0 \leq \alpha \leq 2$) and g(a,i) when i=1, 2, 3, 4, 5. When $1<\alpha<2$.

FIGS. 101A and 101B show relationships between $\alpha$ ($0 \leq \alpha \leq 2$) and $g(\alpha,i)$ when $i=1,2,3,4,5$. When $1<\alpha<2$, the solutions of $g(\alpha,i)=0$ are 1.6180, 1.8393, 1.9276 and 1.9660 for each of $i=2,3,4,5$ respectively. As shown in FIGS. 101A and 101B, if $\alpha>1$, $\alpha>1.6180$, $\alpha>1.8393$, $\alpha>1.9276$ and $\alpha>1.9660$ are satisfied for the number of elements $k=2,3,4,5,6$ respectively, $i \leq k-1$ is satisfied so that the condition of formula 45 is satisfied. Thus, the input vector can be identified in principle.

Let us assume that $S_2$ is a scalar of a result of inner production when using $(2^0, 2^1, \ldots, 2^{i-1}, \ldots, 2^{k-1})$ as a weight vector for the input vector which can be identified. In addition, let us assume that $S_\alpha$ is a result of inner production of the weight vector and the input vector.

Figure 102:
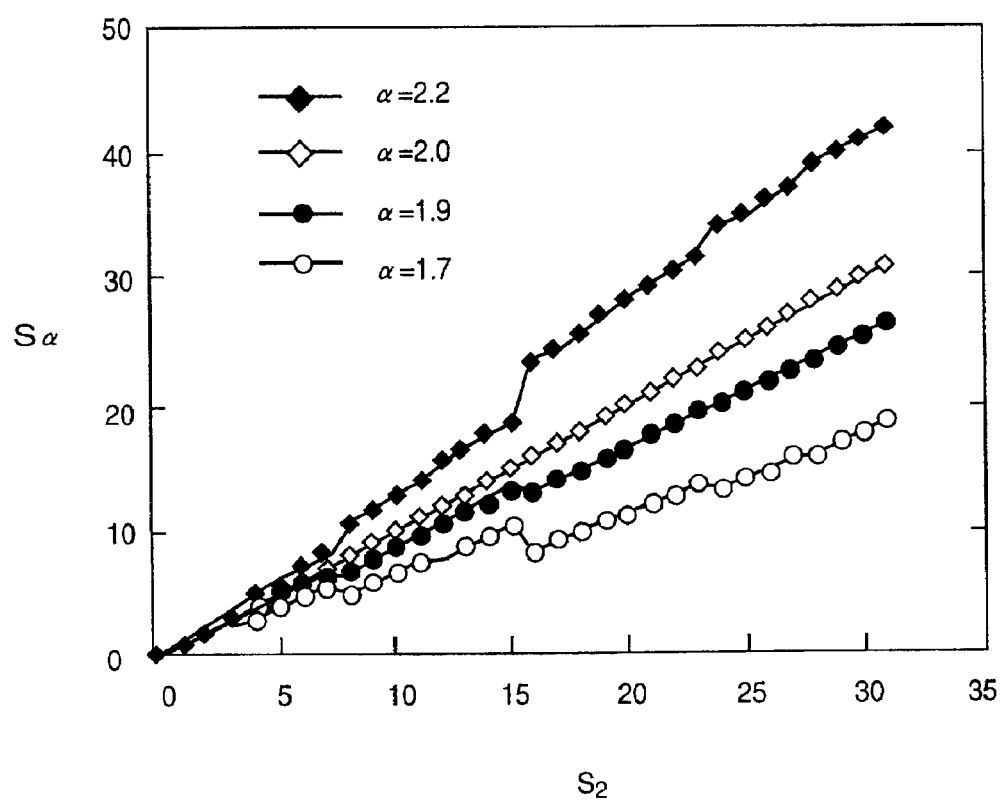
FIG. 102 shows relationships between the scalar $S_2$ and the scalar $S_\alpha$ when α=1.7, 1.9, 2.0, 2.2.

FIG. 102 shows relationships between the scalar $S_2$ and the scalar $S_\alpha$ when $\alpha=1.7$, 1.9, 2.0, 2.2. When $\alpha \geq 2$, the function $g(\alpha,i)$ becomes larger than 0 ($g(\alpha,i)>0$). Therefore, the scalar $S_\alpha$ is a monotone increasing function in which the gradient of $S_\alpha$ does not become 0 with respect to the scalar $S_2$.

Therefore, as mentioned above, the input vectors can be identified to each other since there are no same value in the scalars $S_\alpha$ for all input vectors.

Since the scalar $S_\alpha$ is a monotone increasing function in which the gradient of $S_\alpha$ does not become 0 with respect to the scalar $S_2$ if $S_2 \leq 7$, $S_2 \leq 15$ when $\alpha=1.7$, $\alpha=1.9$ respectively, the input vectors can be identified. Even when $\alpha$ is out of the bounds, if $S_2 \leq 31$ is satisfied, there are no same value in the scalars $S_\alpha$. In this case, the formula 44 is not satisfied. However, the input vectors can be identified as described in the embodiments 4-1.

[Implementation to the Neuron MOS Inverter]

When the above-mentioned method is implemented an actual circuit, the above-mentioned formulas are not always be satisfied as for actual capacitance values for the reason of variations when manufacturing the circuit. In addition, the above-mentioned formulas are not always be satisfied due to a deciding method of significant digit or a reserving method of margin when designing the circuit. However, the above-mentioned method can be applied even when there are variations of values due to manufacturing or designing.

(Embodiment 4-3)

In the embodiment 4-3, a method will be described in which a weight vector by which the input vectors can be identified is decided by decreasing the value of the formula 51 as possible when there is a lower limit in the minimum value $C w_1$ of elements of the weight vector which is shown in the related art.

$$\sum_{i=1}^{k} w_i \quad \text{(formula 51)}$$

This method corresponds to deciding the input gate capacitance ratio while decreasing the total sum of the input gate capacitance values as possible when there is a lower limit of the minimum value of the input gate capacitance values in the neuron MOS inverter. [Example and Problem When the Minimum Value is Limited]

As an example of the case that the minimum value of the input gate capacitance value is limited, a case can be considered in which variations of capacitance values are suppressed in a process of manufacturing the capacitances when the capacitances are implemented to actual circuits.

In the embodiment 4-2, the minimum value is limited to a values, the ratio of the input gate capacitances increases by power of a value. Therefore, there is a problem in that the area cost becomes large.

[A Method of Decreasing the Exponent Value of the Power]

In order to decrease the area cost, it is effective to decrease the exponent value of the power. When assuming that $\{w_1, w_2, \ldots w_i, \ldots, w_k\}$ represents the elements of the weight vector in ascending order, set ith element $w_i$ as the following formula 52 wherein $\alpha>1$.

$$\begin{cases} w_i = 1 \\ w_i = \alpha^{i-2} \cdot (1+\beta) \quad (1 < i \leq k-1) \end{cases} \quad \text{(formula 52)}$$

When the formula 52 is satisfied, the following formula 53 is satisfied.

$$f'(i) = w_{i+1} - \sum_{j=2}^{i} w_j \quad \text{(formula 53)}$$

$$f'(\alpha, \beta, i) = \left(\frac{1+\beta}{\alpha-1}\right) \cdot g'(\alpha, i) \quad (1 < i \leq k-1)$$

$$g'(\alpha, i) = \alpha^{i-1} \cdot (\alpha-2)+1$$

In the same way as the embodiment 4-2, according to the embodiment 4-3, since $f'(i)>0$ is satisfied for any i, that is, for any k when $\alpha \geq 2$, the input vectors can be identified. Even when $1<\alpha<2$, f' (i)>0 can be satisfied by limiting k so that the input vectors can be identified.

[Effect to the Area Cost]

Let us assume that $Sum_{(2)}$ is the sum of the elements of the weight vector when $w_i=\alpha^{i-1}$ in the embodiment 4-2. In addition, let us assume that $Sum_{(3)}$ is the sum of the elements of the weight vector when the minimum value of the input gate capacitance values are limited. In both of $Sum_{(2)})$ and $Sum_{(3)}$, $w_1=1$ and $\alpha=2$. $Sum_{(2)}$ is represented by the following formula 54 and $Sum_{(3)}$ is represented by the following formula 55, $$Sum_{(2)}=2^k-1 \quad \text{(formula 54)}$$

$$Sum_{(3)}=1+(2^{k-1}-1)(1+\beta) \quad \text{(formula 55)}$$

Thus, the ratio $\eta$ of the sum $Sum_{(3)}$ to the sum $Sum_{(2)}$ can be represented by the formula 56.

$$\eta=\{1+(2^{k-1}-1)(1+\beta)\}/(2^k-1) \quad \text{(formula 56)}$$

Figure 103:
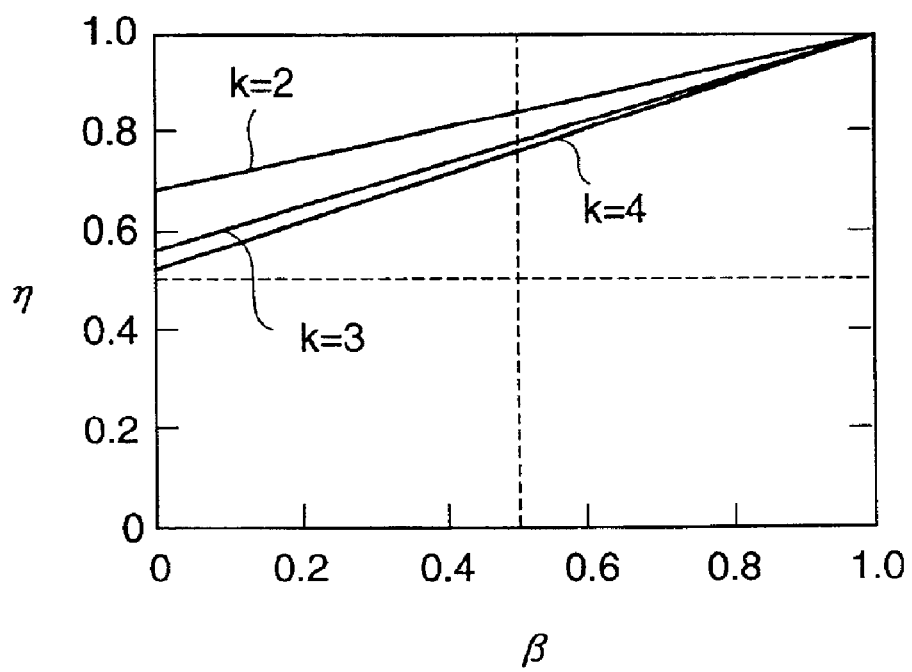
FIG. 103 shows relationships between weight modulation coefficient β and the ratio η of the sum $Sum_{(3)}$ to the sum $Sum_{(2)}$ when k=2, 3, 4.

FIG. 103 shows relationships between weight modulation coefficient $\beta$ and the ratio $\eta$ of the sum $Sum_{(3)}$ to the sum $Sum_{(2)}$ when k=2, 3, 4. That is, FIG. 103 shows reduction ratios of the area cost in the embodiment 4-3. When $\beta=0.5$, the area cost varies to an extent according to the number k of elements. However, the area cost can be decreased to about 77%~83%.

[Implementation to the Neuron MOS Inverter]

When the above-mentioned method is implemented an actual circuit, the above-mentioned formulas are not always be satisfied as for actual capacitance values for the reason of variations when manufacturing the circuit. In addition, the above-mentioned formulas are not always be satisfied due to a deciding method of significant digit or a reserving method of margin when designing the circuit. However, the above-mentioned method can be applied even when there are variations of values due to manufacturing or designing.

(Embodiment 4-4)

In the embodiment 4-4, an integrated circuit will be described. The integrated circuit can set one of two-valued values for each of $2^k$ input vectors which has k elements according to a method of deciding the weight vector, that is, the input gate capacitance ratio wherein input vectors can be identified by the weight vector which is described in embodiment 4-1~4-3.

[Definition of Terms]

First, terms which will be often used when the operation of the integrated circuit is described will be described that is, the terms used for describing the operation of the neuron MOS inverter shown in FIG. 6.

"floating gate threshold voltage" is a voltage of the floating gate of the neuron MOS inverter when the output signal of the neuron MOS inverter is logically inverted with respect to the voltage of the floating gate. "maximum floating gate voltage" is a voltage of the floating gate when all of the input signal are logical 1. "normalized floating gate voltage" $U_{fg}$" is a floating gate voltage which is normalized by the maximum floating gate voltage. "normalized floating gate threshold voltage $U_{fth}$" is a floating gate threshold voltage which is normalized by the maximum floating gate voltage. "input charge amount $Q_i$" is a charge amount accumulated in an input gate capacitance of a terminals to which an input variable is input. "input threshold charge amount $Q_{ith}$" is an input charge amount $Q_i$ when the normalized floating gate voltage $U_{fg}$ is the same as the normalized floating gate threshold voltage $U_{fth}$.

[Circuit Structure of an Integrated Circuit for Realizing Any Logic Function]

In the following, a circuit structure of an integrated circuit for realizing any logic function based on the above-mentioned concept will be described.

Figure 96:
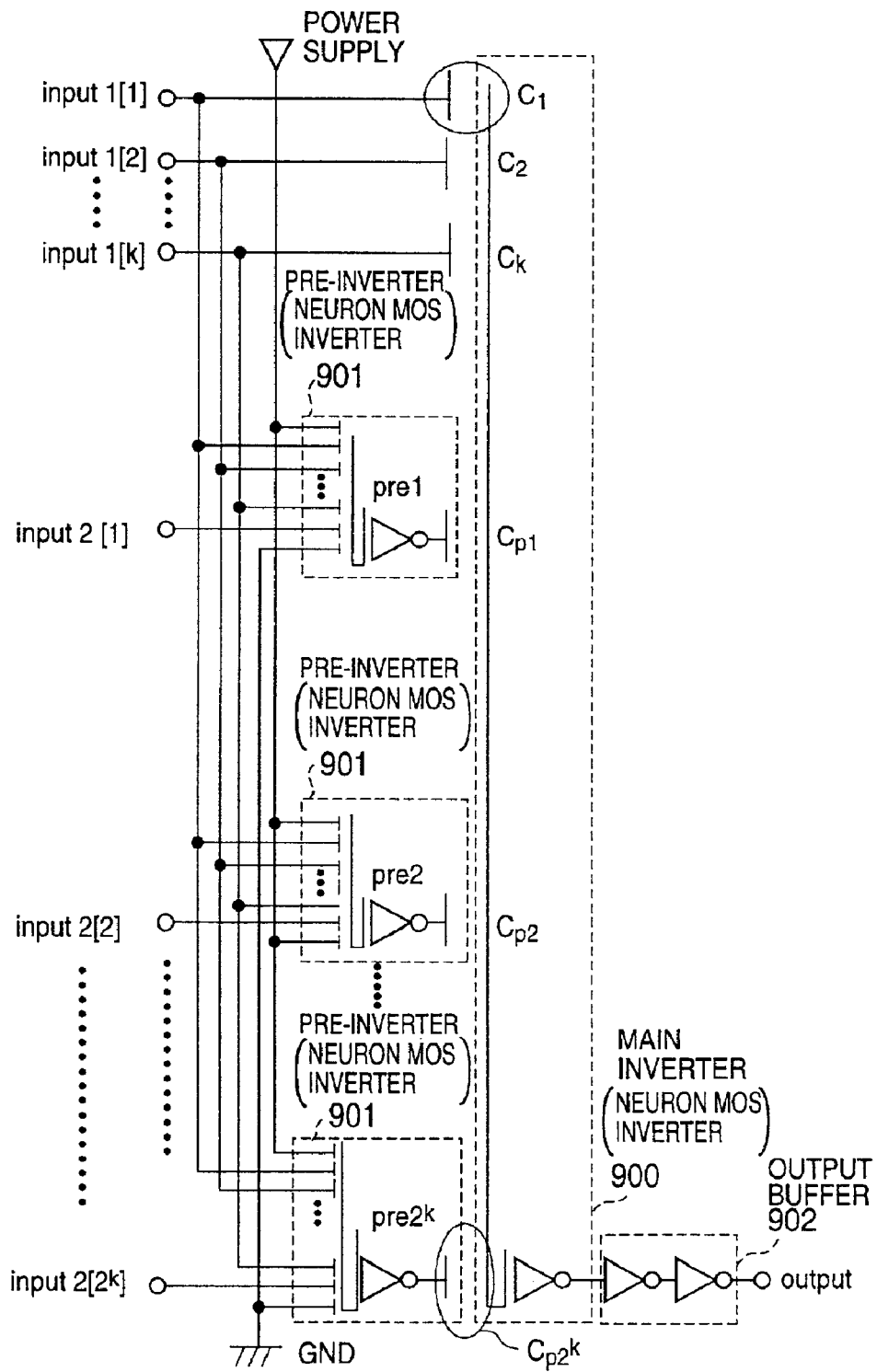
FIG. 96 shows a structure of a reconfigurable function logic integrated circuit 801 which realizes $2^k$th power of 2 logic functions of k input variables and is configured by two stages of neuron MOS inverters.

FIG. 96 shows a structure of a reconfigurable function logic integrated circuit 801 according to the embodiment of the present invention. The structure will be described first.

The integrated circuit 801, which realizes logic function of k input variables, is configured by two stages of neuron MOS inverters in the same way as integrated circuits in other embodiments that is, the integrated circuit 801 is configured by pre-inverters 901 and the main inverter 900.

The pre-inverters 901 form the first stage and the main inverter 900 forms the second stage. in this embodiment, $2^k$ pre-inverters are provided in the first stage.

Each pre-inverter 901 includes input gate electrodes which are connected to the first input signal terminals input1[1]~input1[k] to which k input variables are input, one input gate electrode in input gate electrodes which are connected to the second input signal terminals input1[2]~input2[2k] to which logic function configuration data is input, input gate electrodes which are connected to terminals which have fixed voltage such as the power supply or the ground, and an output terminal, in which the input gate electrodes which are connected to terminals which have fixed voltage control the threshold value of the pre-inverter with respect to the input signal.

The main inverter 900 includes input gate electrodes which are connected to the k first input signal terminals, input gate electrodes which are connected to the output terminals of the pre-inverters 900, and an output terminal.

[Design of the Main Inverter 900]

[A Method for Deciding Ratio of Capacitances Which are Connected to the Pre-inverters 901]

In the following, a method for setting the ratio of capacitances between the input gate electrodes which are connected to the output terminals of the pre-inverters 901 and the floating gate in the main inverter 900 of the integrated circuit 801 will be described let us assume that the number of elements k=3 and the ratio of the weight vector for identifying the input vectors, that is, the ratio of the input gate capacitances for the first input signals is (1, 3, 5).

Figure 97:
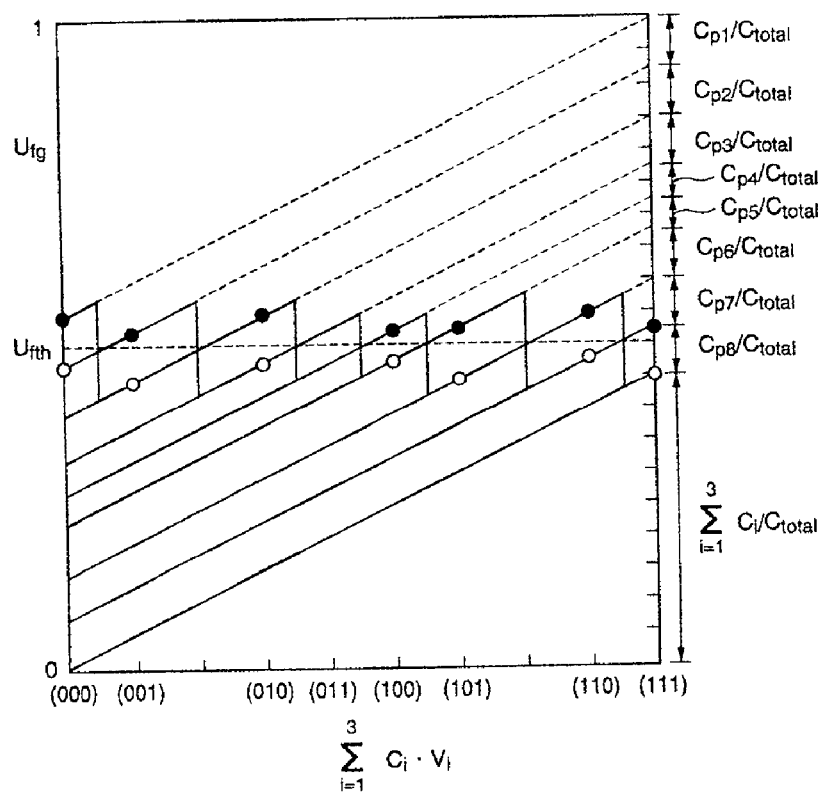
FIG. 97 shows relationships between input charge amounts $Q_i$ in the main inverter 900 and normalized floating gate voltages $U_{fg}$ when the number of elements k=3 and the weight vector is (1, 3, 5)

FIG. 97 shows relationships between the input charge amount $$Q_i = \sum_{i=1}^{3} C_i \cdot V_i \quad \text{(formula 57)}$$

in the main inverter 900 and the normalized floating gate voltage $U_{fg}$ when the number of elements k=3 and the weight vector is (1,3,5).

In FIG. 97, the lateral axis indicates the charge amount $Q_i$ and the vertical axis indicates the normalized floating gate voltage $U_{fg}$. In the lateral axis, each input vector corresponding to each $Q_i$ is denoted. In FIG. 97, $C_{total}$ is the sum of all input gate capacitance values which can be represented as follows.

$$\sum_{i=1}^{3} C_i + \sum_{i=1}^{8} C_{p[i]} \quad \text{(formula 58)}$$

First, the normalized floating gate threshold voltage $U_{fth}$ is set to ½. When all of the first input signals are logical 1, the input charge amount $Q_i$ becomes maximum. The normalized floating gate voltage $U_{fg}$ by this input charge amount $Q_i$ is set such that it does not exceed the normalized floating gate threshold voltage $U_{fth}$.

Next, when the input vector $(x_3, x_2, x_1)$ is (1,1,1) in which the input charge amount $Q_i$ is the maximum, the capacitance value of $C_{p8}$ between an input gate and the floating gate is set such that the normalized floating gate voltage $U_{fg}$ becomes larger than the normalized floating gate threshold voltage $U_{fth}$ when only the output signal of the eighth pre-inverter in the $2^3$ pre-inverters is logical 1.

When the input vector is (1,1,0) which has one smaller charge amount than that of (1,1,1), the normalized floating gate voltage $U_{fg}$ is set to be smaller than the normalized floating gate threshold voltage $U_{fth}$.

In the same way as the above case when the input vector is (1,1,1) and $C_{p8}$ is set, the input gate capacitance value $C_{p7}$ which is connected to the seventh pre-inverter is set such that the normalized floating gate voltage $U_{fg}$ becomes larger than the the normalized floating gate threshold voltage $U_{fth}$ when the input vector is (1,1,0) and if only the output signals of the seventh and eighth pre-inverters are logical 1. When the input vector is (1,0,1), $C_{p7}$ is set such that the normalized floating gate voltage $U_{fg}$ becomes smaller than the normalized floating gate threshold voltage $U_{fth}$.

In the same way, in descending order of input charge amount, input gate capacitance values $C_{p6}, C_{p5}, C_{p4}, C_{p3}, C_{p2}, C_{p1}$ corresponding to input vectors (1,0,1), (1,0,0), (0,1,1), (0,1,0), (0,0,1), (0,0,0) respectively are set.

According to the above-mentioned method, the input gate capacitance values which are connected to the output terminals of the $2^3$ pre-inverters 901 are set.

[Description of the Reason That Any Logic Function Can Be Realized]

In the following, it will be described that the main inverter having the input gate capacitance values set by the above-mentioned method can realize any logic function.

As shown in the lateral axis of the input charge amount $Q_i$, there are two input vectors next to each input vector except for (0,0,0) and (1,1,1). That is, for each input vector, there exist an input vector in which corresponding charge amount is larger than that of the each input vector and an input vector in which corresponding charge amount is smaller than that of the each input vector. Between these three input charge amount, any input charge amount of any other input vector does not exist.

As for the input vector (0,0,0), only the input vector (0,0,1) in which the charge amount is larger exists. As for the input vector (1,1,1), only the input vector (1,1,0) in which the charge amount is smaller exists.

Each pre-inverter 901 has a capability in that the pre-inverter is logically inverted so that the logic value of the output signal changes from 1 to 0 at an input charge amount between an input charge amount of an input vector and the larger charge amount $Q_i$ of the one next input vector or at an input charge amount between an input charge amount of an input vector and the smaller charge amount $Q_i$ of the another next input vector. In this case, ordering of the normalized floating gate voltage $U_{fg}$ and the normalized floating gate threshold voltage $U_{fth}$ for each input vector depends only on the value of logical 1 or 0 of the output signal of the pre-inverter which is in one-to-one correspondence with each input vector.

In FIG. 97, a black circle for each input vector indicates that the normalized floating gate voltage $U_{fg}$ is larger than the normalized floating gate threshold voltage $U_{fth}$. A white circle for each input vector indicates that the normalized floating gate voltage $U_{fg}$ is smaller than the normalized floating gate threshold voltage $U_{fth}$.

Therefore, any logic function can be realized by applying control signals as logic function configuration data to the pre-inverters 901, wherein the each of control signals selects one of two input threshold charge amounts which is included in a pre-inverter.

[Design of the Pre-inverter 901]

[A Method of Deciding Capacitance Ratio for Having Two $Q_{ith}$s]

In the following, a method will be described in which each pre-inverter 901 has two input threshold charge amounts $Q_{ith}$s.

Figure 98:
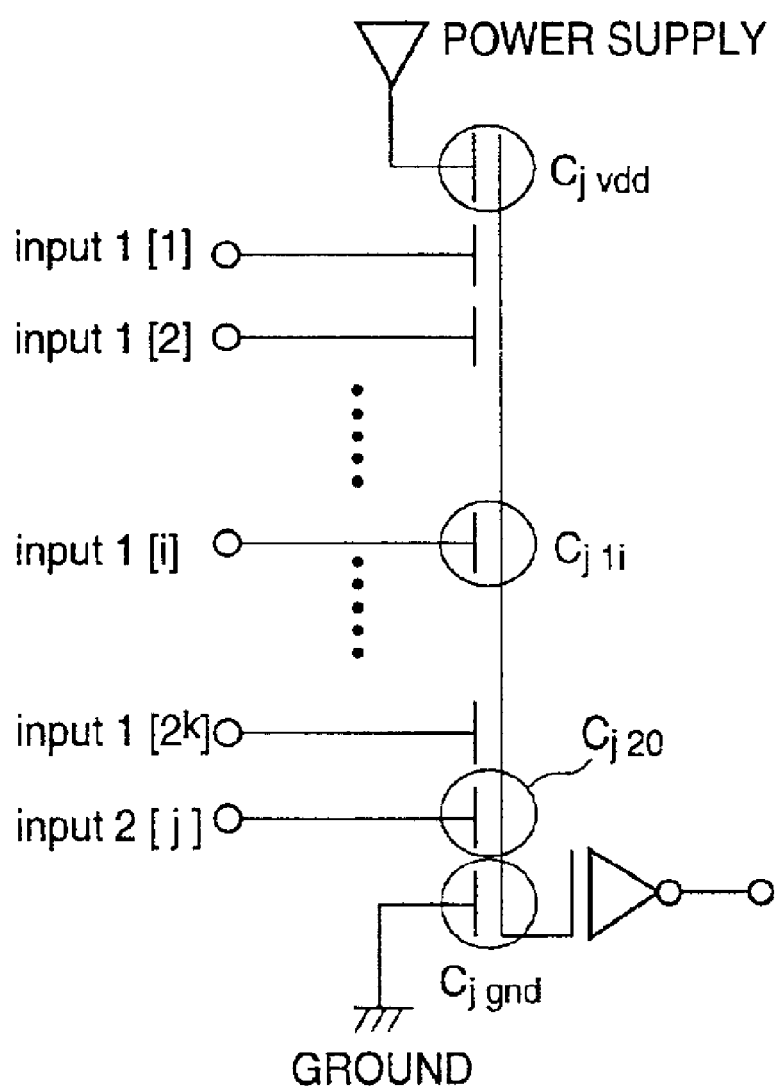
FIG. 98 shows a circuit diagram of a jth pre-inverter.

FIG. 98 shows a circuit diagram of a jth pre-inverter and relationships between input gate electrodes and the floating gate. In the following, a fifth pre-inverter corresponding to an input vector (1,0,0) will be taken as an example among the $2^3$ pre-inverters 901.

Figure 99:
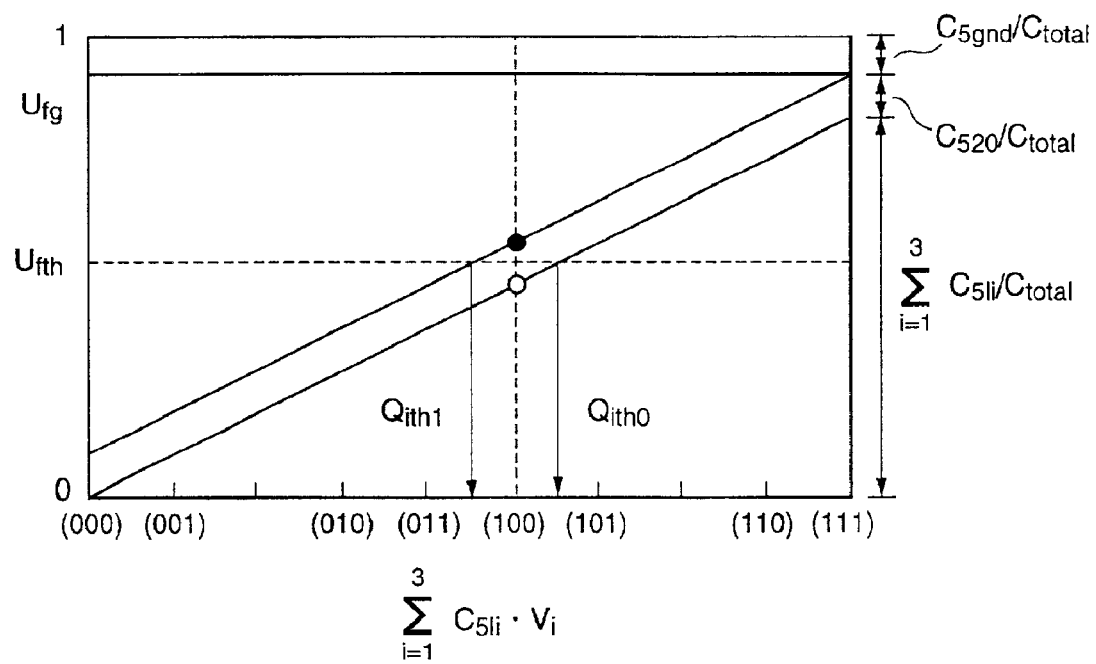
FIG. 99 shows relationships between input charge amounts $Q_i$ and normalized floating gate voltages $U_{fg}$ of the fifth pre-inverter.

FIG. 99 shows the relationship between the input charge amount $Q_1$ and the normalized floating gate voltage $U_{fg}$ of the fifth pre-inverter. In FIG. 99, $C_{total}$ is represented. as follows.

$$\sum_{i=1}^{3} C_{51i} + C_{520} + C_{5gnd} \qquad \text{(formula 59)}$$

First, the input gate capacitance values $C_{51i}$ for inputting first input signals in the fifth pre-inverter 901 is set such that the input vectors can be identified. In FIG. 99, the ratio of the input gate capacitances for the first input signals is set to be the same ratio as the main inverter 900. However, this is not necessary the same. Any value can be taken as long as the input vectors can be identified.

Next, the input gate capacitance value $C_{51i}$ for the first input signal and the input gate capacitance value $C_{520}$ for the second input signal are set such that, when the second input signal is logical 0, an input threshold charge amount $Q_{ith0}$ exists between $Q_i$ of the input vector (1,0,0) and $Q_i$ of the input vector (1,0,1), in addition, when the second input signal is logical 1, an input threshold charge amount $Q_{ith1}$ exists between $Q_i$ of the input vector (1,0,0) and $Q_i$ of the input vector (0,1,1), wherein the normalized floating gate voltage $U_{fg}$ becomes the same as the normalized floating gate threshold voltage $U_{fth}$ in each of the input threshold charge amounts $Q_{ith0}$ and $Q_{ith1}$.

At this time, when the input vector is (1,0,0), the normalized floating gate voltage $U_{fg}$ of the pre-inverter 901 may take two values which are shown by a black circle and a white circuit in FIG. 99. One value is larger than the normalized floating gate threshold voltage $U_{fth}$ when the second input signal is logical 1, another value is smaller than the normalized floating gate threshold voltage $U_{fth}$ when the second input signal is logical 0.

Figure 100:
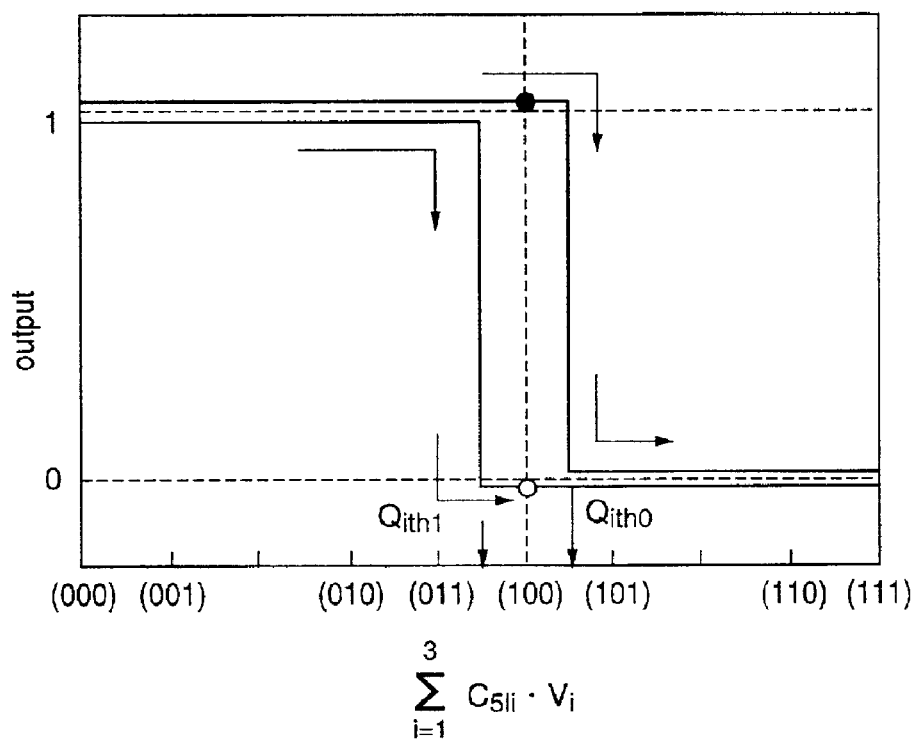
FIG. 100 shows relationships between the input vectors (or input charge amounts $Q_i$) and logical values of the output signals of the pre-inverter 901 when the relationship between the input vectors and the normalized floating gate voltage $U_{fg}$ is as shown in FIG. 99.

FIG. 100 shows a relationship between the input vectors (or input charge amounts $Q_i$) and the logical values of the output signals of the pre-inverter 901 when the relationship between the input vectors and the normalized floating gate voltage $U_{fg}$ is as shown in FIG. 99.

As shown in FIG. 100, the output is logical 1 until the input vector is (0,1,1) in which corresponding charge amount $Q_i$ is smaller than that of the input vector (1,0,0). As for input vectors such as (1,0,1) in which corresponding charge amount $Q_i$ is larger than that of the input vector (1,0,0), the output becomes logical 0. Accordingly, the above-mentioned function for a pre-inverter can be realized. The logical value of the output signal is 0 when the normalized floating gate voltage $U_{fg}$ is larger than the normalized floating gate threshold voltage $U_{fth}$, it is 1 when the normalized floating gate voltage $U_{fg}$ is smaller than the normalized floating gate threshold voltage $U_{fth}$.

The above-mentioned description is on a method of designing a circuit which realizes any logic function for k=3. When k is other than 3, any logic function can be realized in the same way mentioned above. In addition, according to the method, the integrated circuit 801 can be designed.

[Description in a Case When a Neuron MOS Inverter with a Switch Which is Different from the Neuron MOS Inverter]

Figure 115:
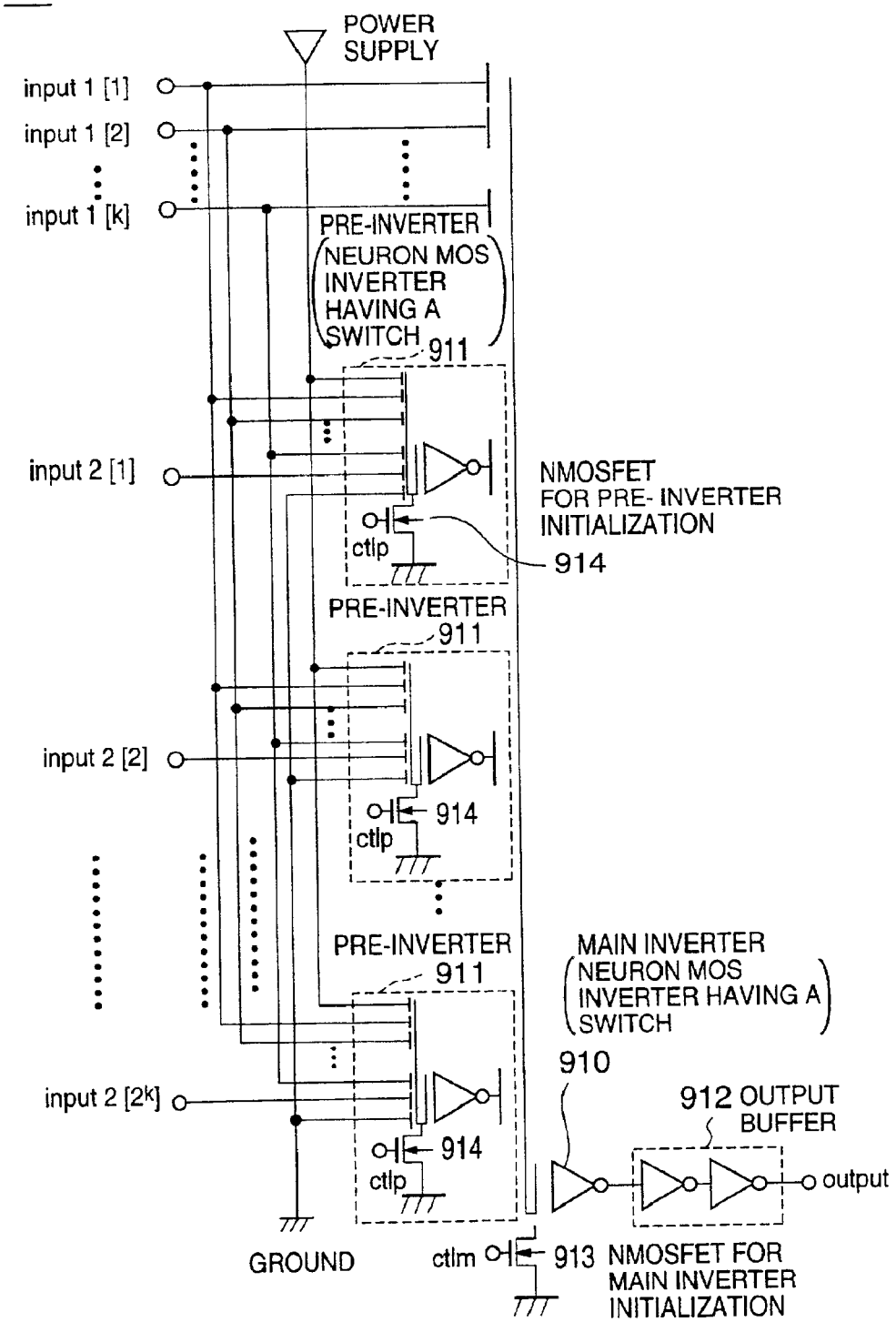
FIG. 115 shows a function reconfigurable function integrated circuit 802 which is a modified example of the integrated circuit 801.

In the following, an integrated circuit 802 which includes a neuron MOS inverter with a switch will be described. FIG. 115 shows the function reconfigurable function integrated circuit 802 which is an modified example of the integrated circuit 801.

The structure of the function reconfigurable function integrated circuit 802 is similar to the integrated circuit 801 shown in FIG. 96. The difference between the integrated circuit 802 and the integrated circuit 801 is that, in the integrated circuit 802, the main inverter 910 is substituted for the main inverter 900 of the integrated circuit 801 and the pre-inverters 911 are substituted for the pre-inverters 910.

The floating gates of the main inverter 900 and the pre-inverter 901 of the integrated circuit 801 are not connected to any terminals so that they are in completely floating state. On the other hand, each of the main inverter 910 and the pre-inverter 911 of the integrated circuit 802 is a neuron MOS inverter with a switch using a neuron MOS transistor with a switch. The neuron MOS transistor with a switch is a neuron MOS transistor in which the floating gate can connect to or disconnect from a terminal which has a voltage by conducting or interrupting a switch element such as an NMOSFET.

In the integrated circuit 802, the main inverter 910 connects to or disconnects from a terminal which has a voltage via an NMOSFET 913 for main inverter initialization which is controlled by a signal of the terminal ctlm.

Each pre-inverter 911 connects to or disconnects from a terminal which has a voltage via an NMOSFET 914 for pre-inverter initialization which is controlled by a signal of the terminal ctlp.

Except for the above-mentioned points, the structures of the integrated circuit 801 and the integrated circuit 802 are the same. Therefore, descriptions hereinafter will be given by using a circuit which includes the main inverter and the pre-inverters which are the same as those used by the integrated circuit 801 shown in FIG. 96. The same design method can be applied to the integrated circuit 802.

(Embodiment 4-5)

In the embodiment 4-5, the number of the pre-inverters is decreased in the two stage reconfigurable function logic integrated circuit by representing the function configuration data as multiple-valued values.

[Circuit Structure of an Integrated Circuit When Multiple-valued Value Representation is Used for the Configuration Data]

Figure 104:
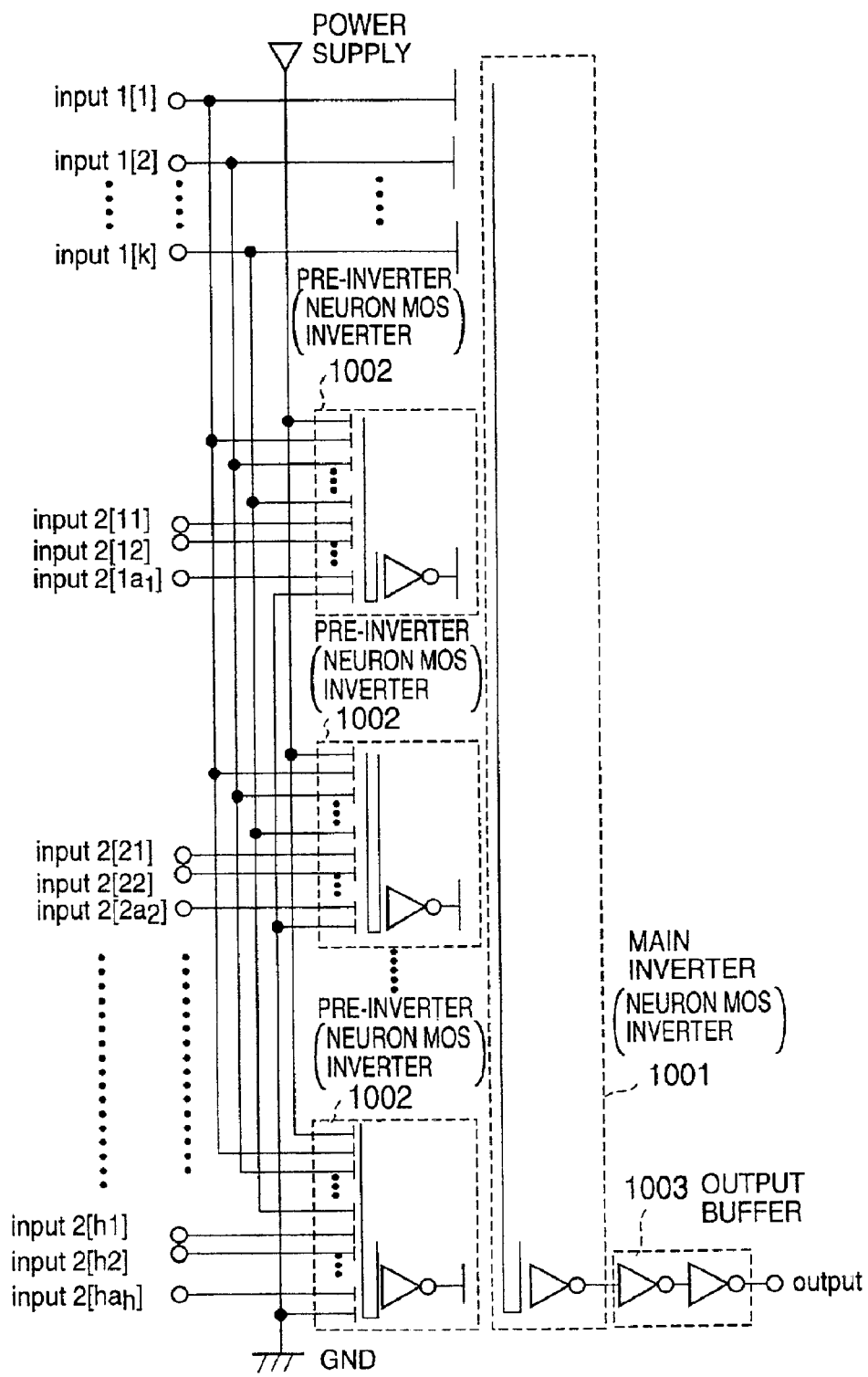
FIG. 104 shows a circuit diagram of an integrated circuit 803.

FIG. 104 shows a circuit diagram of an integrated circuit according to the embodiment of the present invention which has the above-mentioned capability.

The integrated circuit 803, which realized logic function of k input variables, is configured by two stages of neuron MOS inverters in the same way as integrated circuits in other embodiments. That is, the integrated circuit 803 is configured by pre-inverters 1002 and the main inverter 1001.

The main inverter 1001 includes input gate electrodes which are connected to the k first input signal terminals input1[1]~input1[k], input gate electrodes which are connected to the output terminals of the pre-inverters 1002.

Each pre-inverter 1002 includes input gate electrodes which are connected to the first input signal terminals input1[1]~input1[k] to which k input variables are input, input gate electrodes which are connected to the second input signal terminals input1[2]~input2 [ha$_h$] to which logic function configuration data is input, input gate electrodes which are connected to terminals which have fixed voltage such as the power supply or the ground, in which the input gate electrodes which are connected to terminals which have fixed voltage control the threshold value of the pre-inverter with respect to the input signal.

Comparing with the embodiment 4-4, the integrated circuit 801 in the embodiment 4-4 includes one second input signal terminal for each pre-inverter and $2^k$ pre-inverters. On the other hand, as for the integrated circuit 803, each pre-inverter 1002 has a plurality of second input signal terminals and the integrated circuit 803 includes pre-inverters fewer than $2^k$. That is, in FIG. 104, "h" in the second input terminal input2 [ha$_h$] indicates the number of pre-inverters which is smaller than $2^k$. "a$_h$" indicates the number of the second input signal of hth pre-inverter 1002.

To use a plurality of second input signals is equivalent to using multiple signals when one second input signal is used. For example, when using two-valued values, two values (two-valued values) (0,1) can be represented. When using two input signals, four different values {(0,0),(0,1), (1,0), (1,1)} can be represented.

[Design of the Pre-inverter 1002: A Method of Deciding the Input Gate Capacitance Ratio]

In the following, it will be described that the integrated circuit 803 can generate any input threshold charge amounts $Q_{ith}$ with respect to the input signal according to the circuit structure of the pre-inverter 1002.

Figure 105:
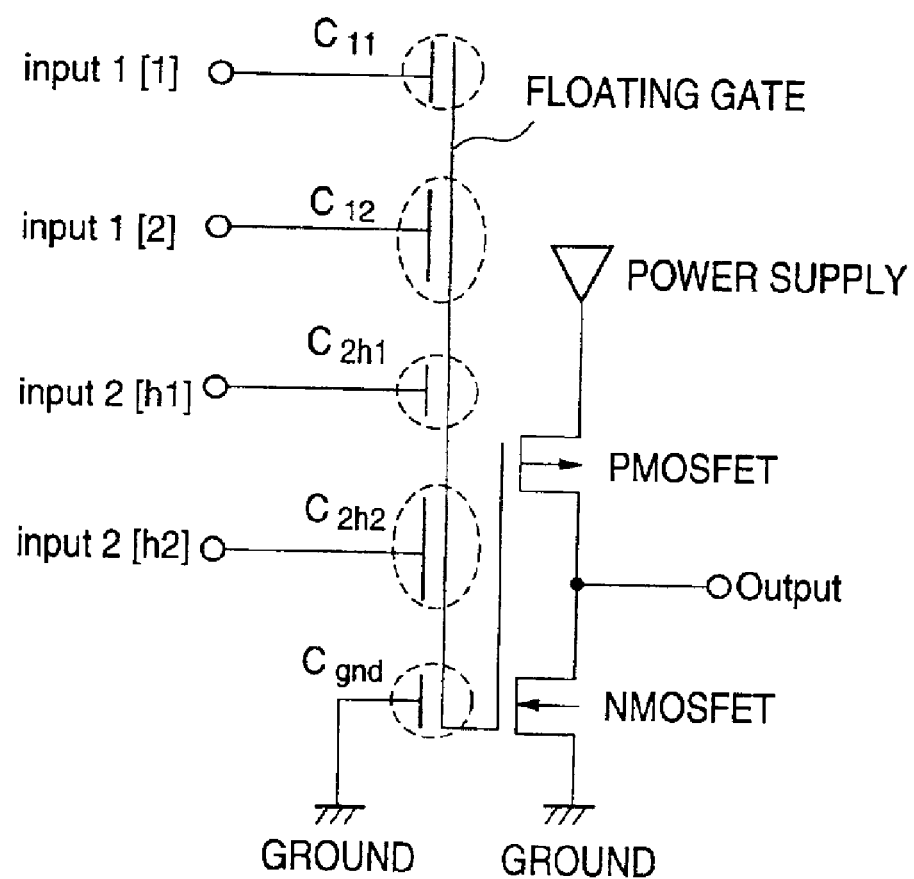
FIG. 105 is a circuit diagram of a neuron MOS inverter INV3 which has three threshold values with respect to the input signal.

As an example, a case when k=2 and two second input signals are used will be described. FIG. 105 is a circuit diagram of a neuron MOS inverter INV3 which has three threshold values with respect to the input signal.

The neuron MOS inverter INV3 includes two first input signal terminals input1[1], input1[2], two second input signal terminals input2[h1], input2[h2] and a terminal which is connected to the ground. Let us assume that the input gate capacitance values between each input gate electrodes and the floating gate are $C_{11}$, $C_{12}$, $C_{2h1}$, $C_{2h2}$, $C_{gnd}$. The input gate capacitance values $C_{11}$ and $C_{12}$ is set such that $C_{11}:C_{12}=$ 1:2 is satisfied so that the input vectors can be identified as described in the embodiment 4-4.

When assuming that the input variables corresponding to the input terminals input1[1] and input2[11] which have $C_{11}$ and $C_{12}$ respectively are $x_1$ and $x_2$, the input vector $(x_1, x_2)$ can be represented as (0,0), (1,0), (0,1), (1,1) in ascending order by the input charge amount $Q_i$.

Next, a method will be described in which the input gate capacitance values $C_{2h1}$, $C_{2h2}$, $C_{gnd}$ are decided such that one input threshold charge amount $Q_{ith}$ is set in each of three region, one region is between (0,0) and (1,0), another region is between (0,1) and (1,1), still another region is a region larger than (1,1).

Figure 106:
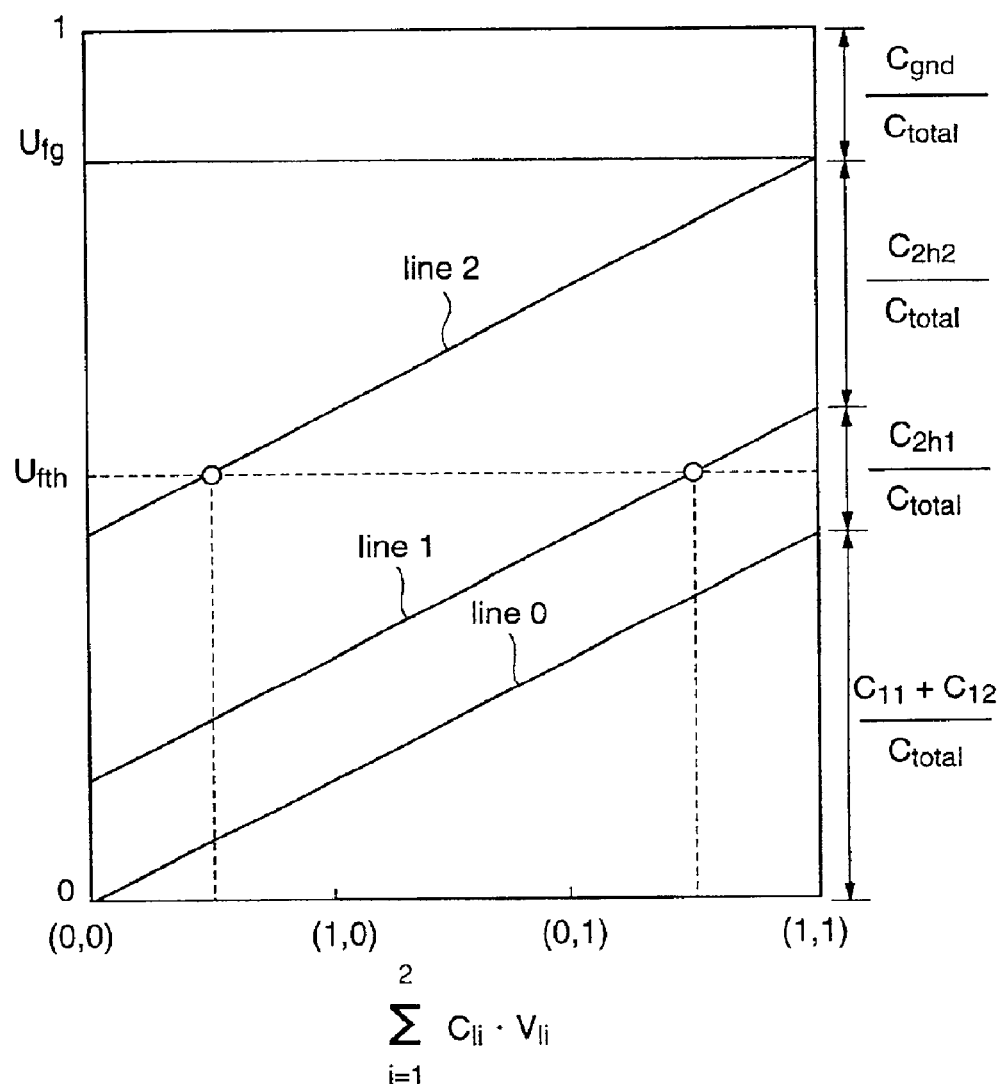
FIG. 106 shows relationships between input charge amounts of the neuron MOS inverter INV3 and the normalized floating gate voltage $U_{fg}$.

FIG. 106 shows relationships between the input charge amounts of the neuron MOS inverter INV3 which has the above-mentioned characteristics and the normalized floating gate voltage $U_{fg}$. Let us assume that the normalized floating gate threshold voltage $U_{fth}$ is set to around ½. In FIG. 106, $C_{total}$ indicates $C_{11}+C_{12}+C_{2h1}+C_{2h2}+C_{gnd}$, line0 indicates the normalized floating gate voltage $U_{fg}$ when all input signals other than the first input signals are logical 0, line1 indicates the normalized floating gate voltage $U_{fg}$ when the second input signal input from input2[h1] is always 1, and line2 indicates the normalized floating gate voltage $U_{fg}$ when both of the second input signals input from input2[h1] and input2[h2] are always logical 1.

Since a $Q_{ith}$ in a region in which $Q_i$ is larger than that of the input vector (1,1), $(C_{11}+C_{12})/C_{total}$ is set to be smaller than ½. That is, since the maximum input threshold charge amount is larger than the input charge amount at the input vector (1,1) among the three input threshold charge amounts, $(C_{11}+C_{12})/C_{total}$ which is equivalent to the normalized floating gate voltage when input vector is (1,1) should be set to be smaller than the normalized floating gate threshold voltage $U_{fth}$=½. Accordingly, line0 intersects with the normalized floating gate threshold voltage $U_{fth}$ in a region in which corresponding $Q_i$ is larger than that of the input vector (1,1).

In FIG. 106, each of $Q_{ith}$ exists at a point of intersection of line0, line1, line2 and the normalized floating gate threshold voltage $U_{fth}$. In $Q_i$ in which the normalized floating gate voltage $U_{fg}$ of line0~line2 is smaller than the normalized floating gate threshold voltage $U_{fth}$, the output signal of the neuron MOS inverter is always logical 1. On the other hand, in $Q_i$ in which the normalized floating gate voltage $U_{fg}$ of line0~line2 is larger than the normalized floating gate threshold voltage $U_{fth}$, the output signal of the neuron MOS inverter is always logical 0.

In addition, since the input threshold charge amount $Q_{ith}$ of the neuron MOS inverter INV3 is set as $Q_i$ between the input vectors (1,0) and (1,1), $C_{2h1}/C_{total}$ is set such that a point of intersection of line2 and the normalized floating gate threshold voltage $U_{fth}$ resides in between the input vectors (0,1) and (1,1).

In the same way, in order to set $Q_{ith}$ between the input vectors (0,0) and (1,0), $C_{2h2}/C_{total}$ is set such that a point of intersection of line2 and the normalized floating gate threshold voltage $U_{fth}$ resides in between the input vectors (0,0) and (1,0).

Finally, $1-(C_{11}+C_{12}+C_{2h1}+C_{2h2})/C_{total}$ is set to be $C_{gnd}/C_{total}$. By deciding the input gate capacitance value in this way, the input threshold charge amount $Q_{ith}$. [Input-output Characteristics of the Pre-inverter 1002]

Figure 107:
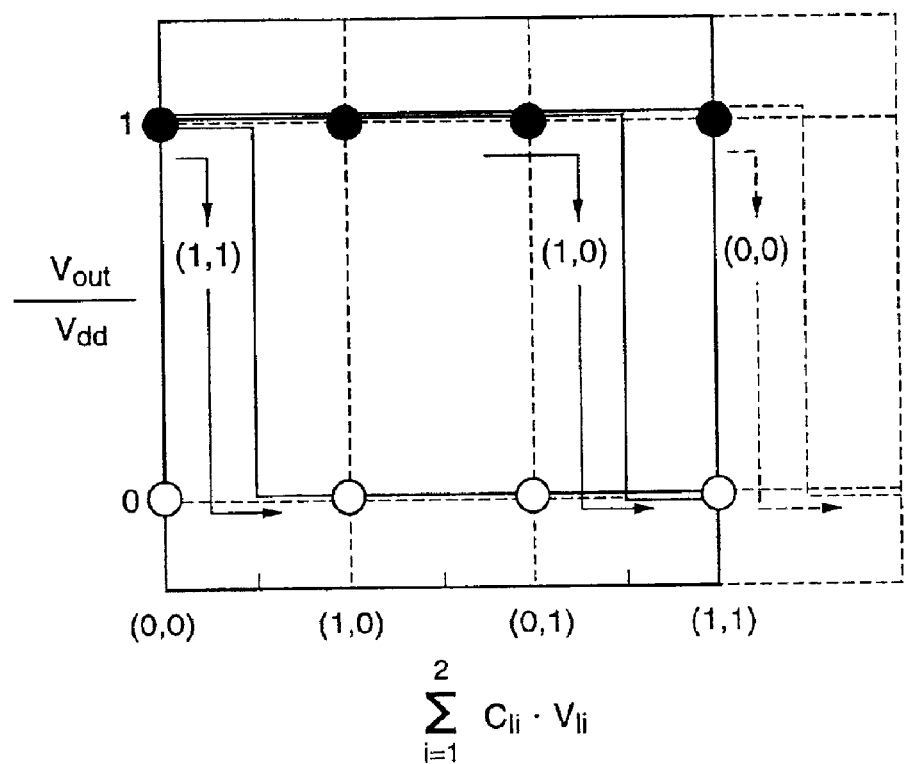
FIG. 107 shows input-output characteristics of a neuron MOS inverter in a case when input gate capacitance values are set according to the method of the present invention.

In FIG. 107, the lateral axis indicates $Q_i$ and the vertical axis indicates the output voltage $V_{out}$ which is normalized by the power supply voltage $V_{dd}$, that is, logical value. (1,1), (1,0), (0,0) in FIG. 107 show that the logical values of the second input signal terminals input2[h1] and input2[h2] are (1,1), (1,0), (0,0).

As shown in FIG. 107, by setting the input gate capacitances as mentioned above, and by using three values (1,1), (1,0), (0,0) in four values each of which is represented by the two two-valued second input signals, a neuron MOS inverter which has three different threshold values can be designed.

[Circuit Structure of the Main Inverter 1001]

By using the neuron MOS inverter designed by the above-mentioned method as the pre-inverter 1002, the integrated circuit 803 which is configured by smaller number of pre-inverters than the embodiment 4-1 can realize any logic function. In the following, an example when k=2 will be described.

Figure 108:
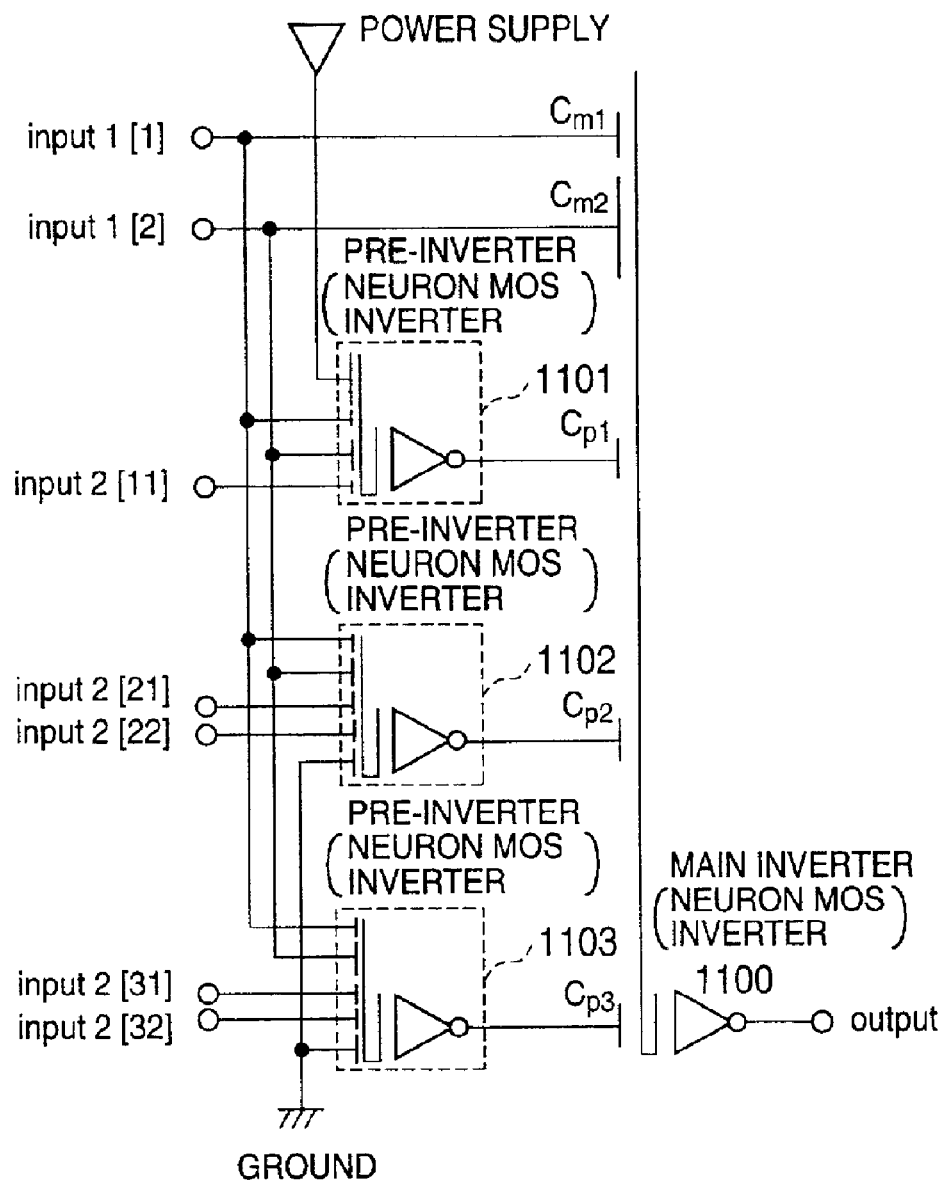
FIG. 108 shows a circuit diagram of an integrated circuit 804.

FIG. 108 shows a circuit diagram of an integrated circuit 804 according to an embodiment of the present invention. This integrated circuit 804 can reconfigure the logic function in k=2.

According to the embodiment 4-4, $2^k$=4 pre-inverters are required when k=2. On the other hand, the above-mentioned pre-inverters are used in the integrated circuit 804 so that three pre-inverters is enough for realizing the same capability.

The main inverter 1100 has input gate capacitances of $C_{m1}$, $C_{m2}$ between the first input signal terminals input1[1] input1[2] and the floating gate, wherein input variables $x_1$ and $x_2$ are input to input1[1] and input1[2] respectively. In addition, the main inverter 1100 has input gate capacitances of $C_{p1}$, $C_{p2}$, $C_{p3}$ between the terminals connected to the output terminals of the pre-inverters 1101,1102, 1103 and the floating gate. In the circuit 804, $C_{m1}:C_{m2}$=1:2 is satisfied so that the input vectors can be identified. The input gate capacitance values $C_{p1}$, $C_{p2}$, $C_{p3}$ are determined as follows.

[A Method of Deciding Input Gate Capacitance Ratio of the Main Inverter 1100]

In the embodiment 4-4, any logic function is realized by deciding a pre-inverter in a one-to-one correspondence with each input vector and by associating the logical value of the output signal with the logical value of the output signal of the main inverter.

On the other hand, according to the integrated circuit 804, a pre-inverter which is in a one-to-one correspondence with a predetermined input vector among the four input vectors is decided among the pre-inverters 1101,1102, 1103. Then, the logical value of the output signal of the decided pre-inverter is associated with the logical value of the output signal of the main inverter 1100. As for the other three input vectors, the logical value of the output signal of the main inverter 1100 is decided by a combination of the logical values of the output signals of the two pre-inverters.

Figure 109:
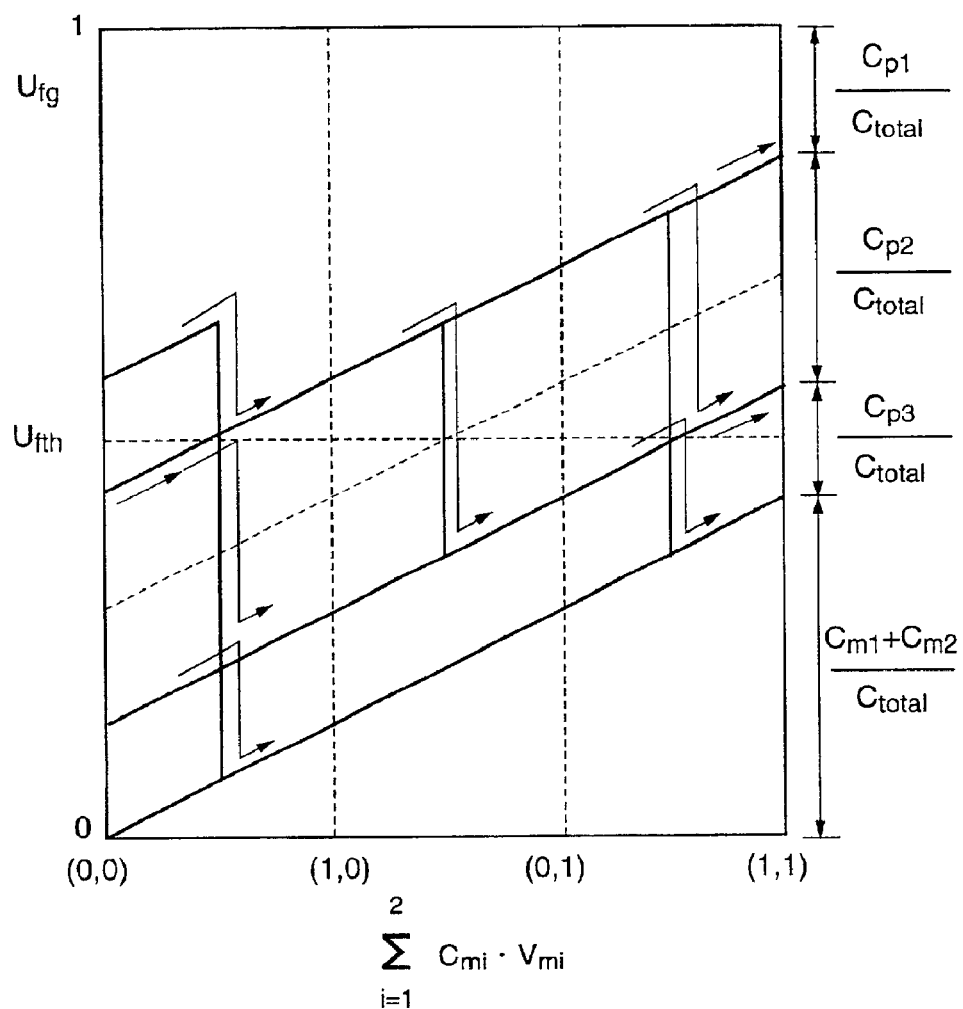
FIG. 109 shows relationships between $Q_i$ (or input vectors) in the main inverter 1100 and the normalized floating gate voltage $U_{fg}$ in the integrated circuit 804 shown in FIG. 108.

FIG. 109 shows the relationship between $Q_i$ (or input vector) in the main inverter 1100 and the normalized floating gate voltage $U_{fg}$ in the integrated circuit 804 shown in FIG. 108.

In FIG. 109, $$\sum_{i=1}^{2} C_{mi} \cdot V_{mi} \quad \text{(formula 60)}$$

in the lateral axis indicates $Q_i$ and (0,0), (1,0), (0,1), (1,1) indicate the input vectors of the input variable ($x_1$, $x_2$). The vertical axis indicates the normalized floating gate voltage $U_{fg}$.

In FIG. 109, $U_{fth}$ indicates the normalized floating gate threshold voltage and $C_{total}$ indicates the total sum of the input gate capacitance values ($C_{m1}+C_{m2}+C_{p1}+C_{p2}+C_{p3}$).

$C_{p1}+C_{p2}+C_{p3}$ is set such that, at the input vector (1,1) at which the input charge amount is maximum, the normalized floating gate voltage $U_{fg}$ at the time when the logical values of output signals of all pre-inverters are 0 does not exceed the normalized floating gate threshold voltage $U_{fth}$. Let us assume that $W_{m2}$, $W_{p1}$, $W_{p2}$, $W_{p3}$ represent the ratio of $C_{m2}$, $C_{p1}$, $C_{p2}$, $C_{p3}$ with respect to $C_{m1}$. In the example shown in FIG. 109, $w_{m2}$=2 and $(w_{p1}+w_{p2}+w_{p3})$=4.

Next, $w_{p1}$ and $(wp_2+w_{p3})$ are set such that, at the input vector (0,0) at which the input charge amount is minimum and when the output signals of the pre-inverters 1102, 1103 are logical 1, the normalized floating gate voltage $U_{fg}$ at the time when the logical values of output signals of all pre-inverters are 0 is smaller than the normalized floating gate threshold voltage $U_{fth}$, in addition, the normalized floating gate voltage $U_{fg}$ at the time when the output signal of the pre-inverter 1101 is logical 1 is larger than the normalized floating gate threshold voltage $U_{fth}$. The example shown in FIG. 109 is $w_{p1}$=1 and $(w_{p2}+w_{p3})$=3.

In addition, in the pre-inverter 1101, two input threshold charge amounts $Q_{ith}$ are set by one second input signal, one $Q_{ith}$ is smaller than $Q_i$ of the input vector (0,0) and another $Q_{ith}$ is between the input vectors (0,0) and (1,0).

Finally, $w_{p2}$ and $W_{p3}$ are set such that when the input vector is (1,1), a first normalized floating gate voltage $U_{fg}$ is larger than the normalized threshold floating gate voltage $U_{fth}$, wherein the first normalized floating gate voltage $U_{fg}$ is a value when only the output signal of the pre-inverter 1103 is logical 1 and the logical signals of the pre-inverters 1101 and 1102 are 0, in addition, when the input vector is (0,1), a second normalized floating gate voltage $U_{fg}$ is smaller than the normalized threshold floating gate voltage $U_{fth}$, wherein the second normalized threshold floating gate voltage $U_{fth}$ is a value when only the output signal of the pre-inverter 1103 is logical 1 and the logical signals of the pre-inverters 1101 and 1102 are 0.

In addition, $w_{p2}$ and $w_{p3}$ are set such that the following conditions are satisfied. First condition is that, when the input vector is (1,0), a first normalized floating gate voltage $U_{fg}$ is larger than the normalized threshold floating gate voltage $U_{fth}$, wherein the first normalized floating gate voltage $U_{fg}$ is a value when the logical values of output signals of the pre-inverters 1101,1102, 1103 is (0,1,1). Second condition is that, when the input vector is (1,0), a second normalized floating gate voltage $U_{fg}$ is smaller than the normalized floating gate voltage $U_{fth}$, wherein the second normalized threshold floating gate voltage $U_{fg}$ is a value when the combination is (0,1,0). The third condition is that, when the input vector is (0,1), a third normalized floating gate voltage $U_{fg}$ is larger than the normalized threshold floating gate voltage $U_{fth}$, wherein the third normalized floating gate voltage $U_{fg}$ is a value when the logical values of output signals of the pre-inverters 1101,1102,1103 is (0,1,0).

In an example shown in FIG. 109, $w_{p2}=2$ and $w_{p3}=1$.

In addition, in the pre-inverter 1102, four threshold values are set by applying two two-valued signals from the two second input signal terminals input2[21] and input2[22], wherein the four threshold values are in a region between the input vectors (0,0) and (1,0), a region between the input vectors (1,0) and (0,1), a region between the input vectors (0,1) and (1,1) and a region larger than the input vector (1,1).

In the pre-inverter 1103, three threshold values are set by applying two two-valued signals from the two second input signal terminals input2[31] and input2[32], wherein the three threshold values are in a region between the input vectors (0,0) and (1,0), a region between the input vectors (0,1) and (1,1) and a region larger than the input vector (1,1).

As mentioned above, by determining the input gate capacitance ratio of the main inverter 1100 and the threshold values of the pre-inverters 1101,1102, 1103, any logic function can be realized when the number k of elements is 2.

[Concrete Configuration Data]

FIG. 110 shows relationships between the normalized floating gate voltage $U_{fg}$ and logical values ($Y_{p2}$, $Y_{p3}$) of the output signals of the pre-inverters 1102, 1103, when the integrated circuit 804 realizes 8 logic functions among 16 logic functions which can be realized by input variables $x_1$ and $x_2$ when the number k of elements is 2.

The normalized floating gate voltage $U_{fg}$ is represented as 1 when it is larger than the normalized floating gate threshold voltage $U_{fth}$, and is represented as 0 when it is smaller than the normalized floating gate threshold voltage $U_{fth}$. The logical value of the output signal of the main inverter 1100 is a logically inverted value of the normalized floating gate voltage $U_{fg}$ in FIG. 110.

As for the integrated circuit 804, as shown in FIG. 109, the logical value of the output signal of the main inverter 1100 is determined only by the two-valued value of the output signal of the pre-inverter 1101. Therefore, FIG. 110 shows a case when the logical value of the output signal of the pre-inverter 1101 is 0.

When the input vector is (0,0), only if the logical value of the output signal of the pre-inverter 1101 is 1 without affecting to any other signal, the normalized floating gate voltage $U_{fg}$ becomes larger than the normalized floating gate threshold voltage $U_{fth}$. Therefore, realizing 8 logic functions means that all of the 16 logic functions can be realized.

[A Summary of the Case of k=2]

As mentioned above, the integrated circuit 804 can any of the 16 logic functions when k=2. The integrated circuit 801 of the embodiment 4-1 requires 4 pre-inverters when k=2. On the other hand, the integrated circuit 804 can realize the same capability as that of the integrated circuit 801 with three pre-inverters. In addition, by decreasing the number of the pre-inverters, the area cost of the integrated circuit can be decreased.

[Generalization]

In the following, it will be described that the above-mentioned designing method can effectively used not only for k=2 but also for any number of k using $(3/4) \cdot 2^k$ pre-inverters.

Figure 111:
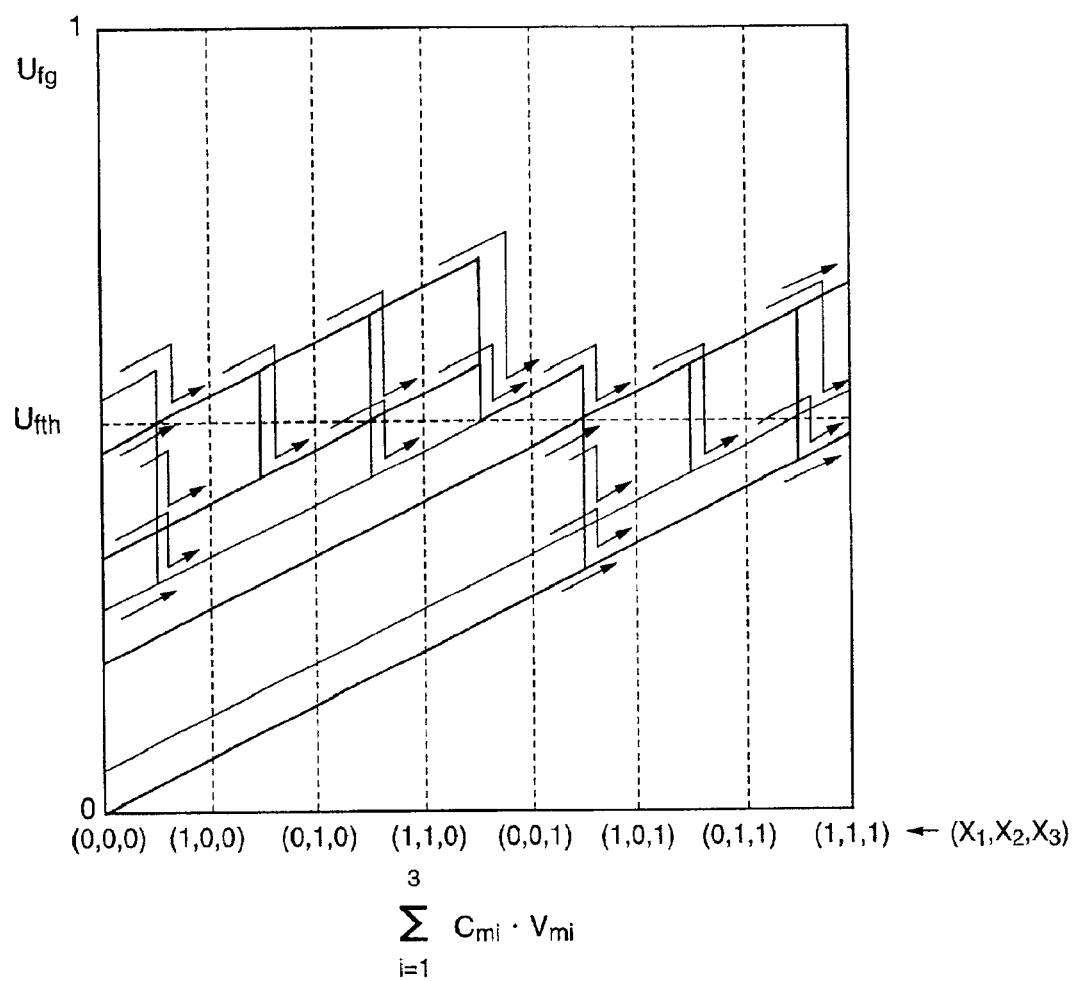
FIG. 111 shows relationships between input vectors or input charge amounts and the normalized floating gate voltage $U_{fg}$ for a main inverter of an integrated circuit which is designed by the same designing method, extended to k=3, as that of the integrated circuit 804.

FIG. 111 shows the relationship between input vectors or input charge amounts and the normalized floating gate voltage $U_{fg}$ for a main inverter of an integrated circuit which is designed by the same designing method, extended to k=3, as that of the integrated circuit 804.

There exist $2^k$ input vectors of k input variables so that there are $2^k$ logic functions which can be realized by the input vectors at the maximum let us assume that the input vectors are arranged in ascending order by corresponding input charge amount and each of four input vectors is brought together into a block.

Accordingly, $2^{k-2}$ blocks are generated. Thus, by applying the same method as that for the integrated circuit 804 to each block, any logic function for input vectors included in the block can be realized by using three pre-inverters for the block.

In FIG. 111, input vectors (0,0,0)~(1,1,0) are in a block and input vectors (0,0,1)~(1,1,1) are also in a block. Accordingly, it can be understood that the relationship between the input vectors and the normalized floating gate voltage $U_{fg}$ has a periodic structure by unit of the block.

[Summary of This Embodiment]

According to the method of the embodiment, the 2kth power of 2 logic functions which can be realized by k input variables can be realized by using $(3/4) \cdot 2^k$ pre-inverters. As mentioned above, when the function configuration data is represented by multiple-valued values, the sum of the number of the second input signals in the integrated circuit is the same as that ($2^k$) in the embodiment 4-1 or is larger than $2^k$ The number of the pre-inverters can be decreased on one hand but the number of the second input signals increases so that the number of the input gate electrodes increases on the other hand.

However, generally the effect for the area cost obtained by decreasing the number of the pre-inverters is larger than the effect obtained by increased number of the input gate electrodes for inputting the second input signals. Thus, by applying the above-mentioned embodiment, the function reconfigurable integrated circuit can be realized with lower area cost.

(Embodiment 4-6)

As mentioned in the embodiment 4-5, the threshold value with respect to the input signal can be set as the input charge amount in the pre-inverter of the integrated circuit 803 by applying a plurality of second input signals.

In the following, it will be described that the same capability can be realized by using physically multiple-valued values as input signals even when only one second input signal terminal is used.

[Structure of an Integrated Circuit When Using the Multiple Level Voltages: Comparing with the Embodiment 4-5]

Figure 112:
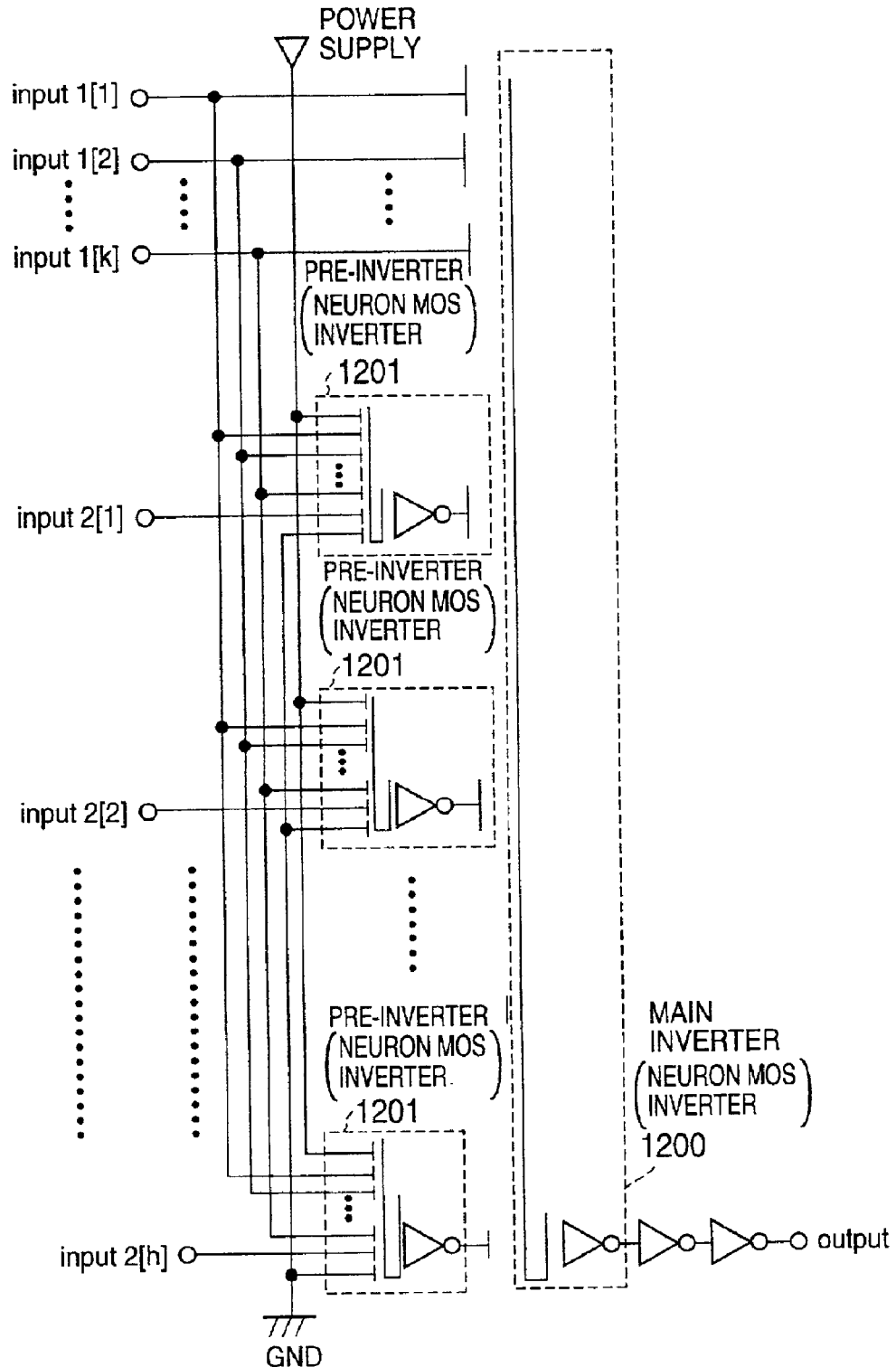
FIG. 112 shows a circuit structure of a function reconfigurable integrated circuit 805 which uses multiple level voltages as second input signals.

FIG. 112 shows the circuit structure of the function reconfigurable integrated circuit 805 which uses multiple level voltages as the second input signal. The input gate capacitance values of the main inverter 1200 and the threshold voltage of the floating gates are set in the same way as the integrated circuit 804 of the embodiment 4-5. The integrated circuit 805 is different from the integrated circuit 804 in a method for designing the number of the second input signal terminals and the threshold values of the pre-inverters 1201.

[Circuit Structure and the Operation of the Pre-inverter]

Figure 113:
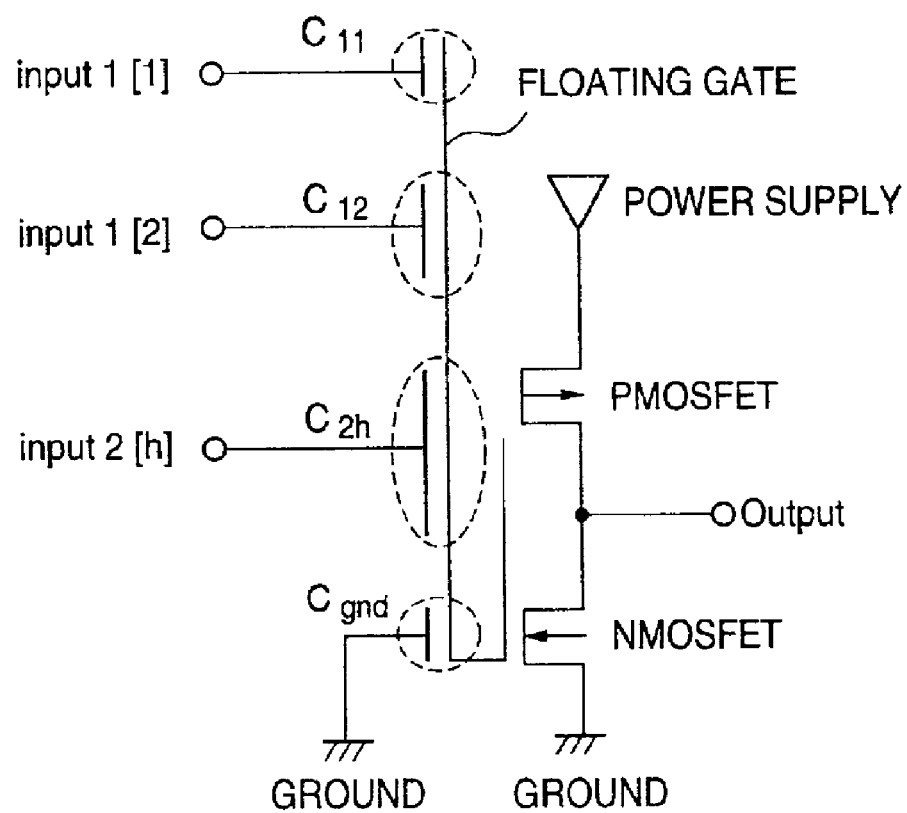
FIG. 113 shows a circuit structure of a pre-inverter 1201 of the integrated circuit 805.

FIG. 113 shows the circuit structure of the pre-inverter 1201 of the integrated circuit 805. The circuit structure and the operation of the pre-inverter 1201 will be described comparing with the neuron MOS inverter INV3. And, it will be described that applying a plurality of two-valued second input signals is equivalent to applying one second input signals of the multiple level voltage so that completely same capability can be realized.

The value $C_{2h}$ is set to the value $C_{2h1}+C_{2h2}$, wherein $C_{2h}$ indicates a value of a capacitance of an input gate which is connected to the second input signal terminal input2[h] of the pre-inverter 1201 shown in FIG. 113, $C_{2h1}$ and $C_{2h2}$ are values of capacitances of input gates to which the second input signals are input in the neuron MOS inverter INV3 shown in FIG. 105.

Figure 114:
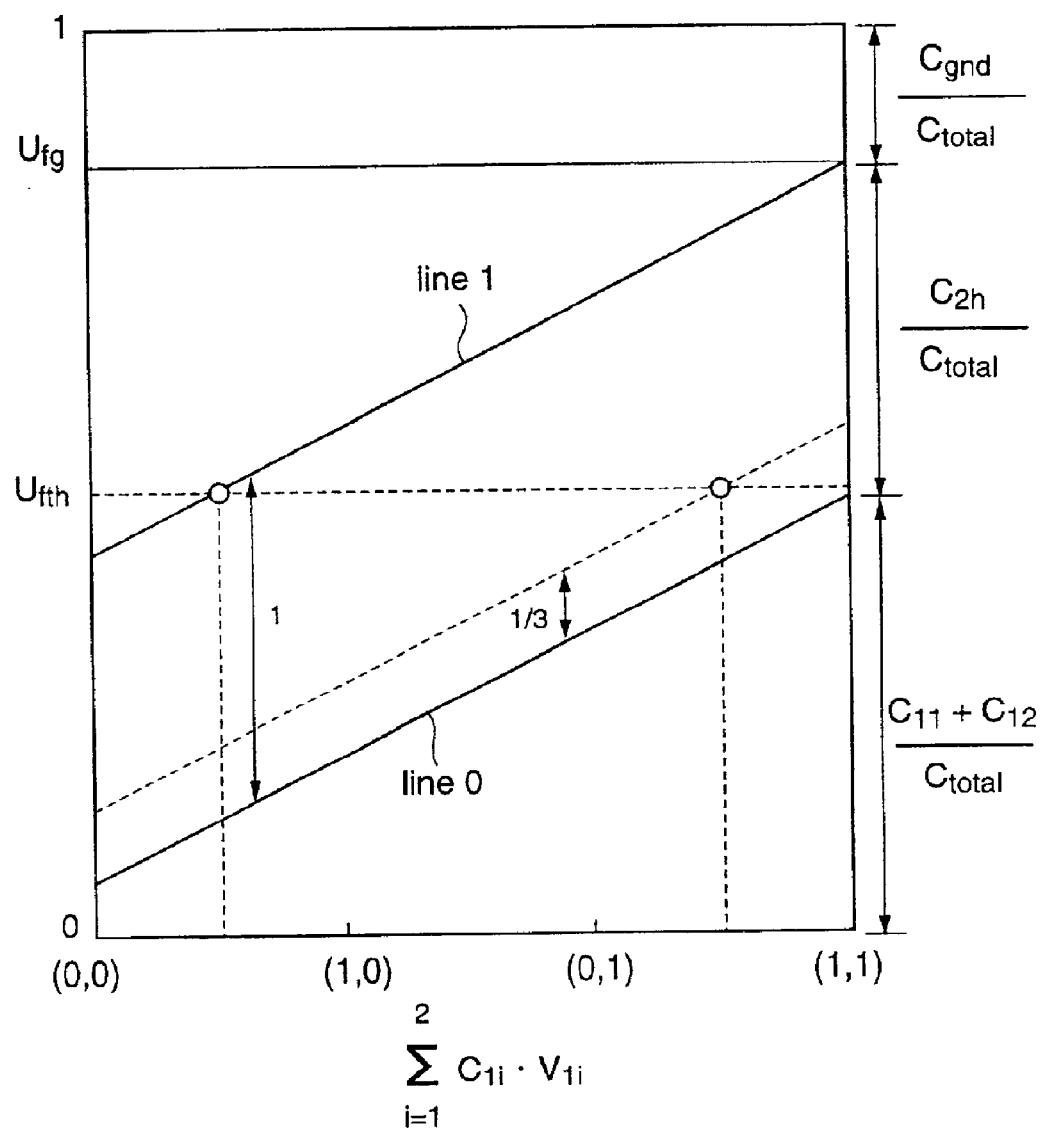
FIG. 114 shows relationships between the input vectors or the input charge amounts $Q_i$ of the pre-inverter 1201 and the normalized floating gate voltage $U_{fg}$.

FIG. 114 shows the relationship between the input vectors or the input charge amounts $Q_i$ of the pre-inverter 1201 and the normalized floating gate voltage $U_{fg}$ when the above-mentioned input gate capacitance values are used.

In FIG. 114, $C_{total}$ represents $C_{11}+C_{12}+C_{2h}+C_{gnd}$, line0 is the normalized floating gate voltage $U_{fg}$ when the signal input to the second input signal terminal input2[h] is logical 0, line1 is the normalized floating gate voltage $U_{fg}$ when the signal input to the second input signal terminal input2[h] is logical 1.

When the input signal is a two-valued value, only two states of line0 and line1 can be taken. On the other hand, when the multiple-valued value can be used, any value between line0 and line1 can be taken. As a multiple-valued value, by using logical ⅓, the input threshold charge amounts $Q_{ith}$ can be set in the same way as those shown in FIG. 106. That is, in order to set $Q_{ith}$ at the same $Q_i$ of FIG. 106, three values 1, (⅓) and 0 can be used as the second input signal of the pre-inverter 1201 of FIG. 113.

According to the above-mentioned embodiment, by using the multiple level voltage as the second input signal, the same capability as that realized when a plurality of two-valued input signals are used can be realized.

According to the designing method of the function reconfigurable integrated circuit of the present invention, any logic function capability can be implemented in the neuron MOS circuit easily and with a low cost.

In addition, according to the integrated circuit designed by the method, the logic functions can be reconfigured and the area cost can be suppressed to small.

The present invention is not limited to the specifically disclosed embodiments, and variations and modifications may be made without departing from the scope of the invention.

What is claimed is:

1. A function reconfigurable semiconductor device, comprising:
    a plurality of function cells, each of said function cells being a basic unit which realizes a function;
    of said function cells including a plurality of threshold elements;
    each of said threshold elements including means which stores a threshold value; and
    wherein a function which is realized by said function cell is determined by determining said threshold value in each of said threshold elements;
    wherein each of said function cells includes a plurality of stages, each of said stages including at least one threshold element.

2. The semiconductor device as claimed in claim 1, further comprising a nonvolatile memory which stores data for realizing said function in said function cells.

3. The semiconductor device as claimed in claim 2, wherein said function cells are connected by wiring which can change a connection status.

4. The semiconductor device as claimed in claim 3, further comprising at least two control systems,
    each of said threshold elements being connected to said control systems via said wiring; and
    at least one control system of said control systems being connected to said nonvolatile memory.

5. The semiconductor device as claimed in claim 1, each of said threshold elements comprising:
    a first input part which inputs an input signal to be processed;
    a second input part which inputs a control signal for realizing said function;
    wherein said threshold value is set by said control signal, an output value for an input signal which is input from said first input part being determined according to said threshold value.

6. The semiconductor device as claimed in claim 1, each of said threshold elements comprising:
    a plurality of input terminals;
    a first terminal which can be regarded as in an electrically insulated state transiently; and
    a nonlinear element;
    said input terminals being connected to said first terminal; and
    said nonlinear element receiving a voltage of said first terminal.

7. The semiconductor device as claimed in claim 6, each of said threshold elements further comprising:
    a first switch between said first terminal and a terminal having a first predetermined voltage;
    at least one second switch being connected to at least one input terminal of said input terminals;
    wherein said second switch switches between a connection state of inputting an input signal from said at least one input terminal and a connection state of inputting a second predetermined voltage.

8. The semiconductor device as claimed in claim 7, said nonlinear element being an inverter circuit.

9. The semiconductor device as claimed in claim 8, said inverter circuit being a CMOS inverter or a resistive load type inverter.

10. The semiconductor device as claimed in claim 6, said nonlinear element being an inverter circuit.

11. The semiconductor device as claimed in claim 10, said inverter circuit being a CMOS inverter or a resistive load type inverter.

12. The semiconductor device as claimed in claim 1, each of said threshold elements comprising:
- a semiconductor region of a first conductivity type disposed on a substrate;
- a source region and a drain region of a second conductivity type provided on said semiconductor region;
- a floating gate electrode provided on a region which separates said source region and said drain region via an insulating film, said floating gate electrode connected to a terminal having a first voltage via an element which can take a conducting state, and, an interrupted state or an electrically high impedance state;
- a plurality of input gate electrodes connected to said floating gate electrode via an insulating film, said input gate electrodes controlled by at least two input control parts provided in said semiconductor device;
- at least one element for switching which can connects at least one of said input gate electrodes to an input line which inputs function configuration data or to a terminal having a second voltage.

13. A function reconfigurable integrated circuit, comprising:
- a plurality of threshold elements;
- each of said threshold elements including means which stores a threshold value; and
- wherein a function which is realized by said integrated circuit is determined by determining said threshold value in each of said threshold elements;
- wherein said integrated circuit is configured by a plurality of stages, each of said stages including at least one threshold element.

14. The integrated circuit as claimed in claim 13, each of said threshold elements comprising:
- a first input part which inputs an input signal to be processed;
- a second input part which inputs a control signal for realizing said function;
- wherein said threshold value is set by said control signal, an output value for an input signal which is input from said first input part being determined according to said threshold value.

15. The integrated circuit as claimed in claim 13, each of said threshold elements comprising:
- a plurality of input terminals;
- a first terminal which can be regarded as an electrically insulated state transiently; and
- a nonlinear element;
- said input terminals being connected to said first terminal;
- said nonlinear element receiving a voltage of said first terminal.

16. The integrated circuit as claimed in claim 15, each of said threshold elements further comprising:
- a first switch between said first terminal and a terminal having a first predetermined voltage;
- at least one second switch being connected to at least one input terminal in said input terminals;
- wherein said second switch switches between a connection state of inputting an input signal from said at least one input terminal and a connection state of inputting a second predetermined voltage.

17. The integrated circuit as claimed in claim 16, said nonlinear element being an inverter circuit.

18. The integrated circuit as claimed in claim 17, said inverter circuit being a CMOS inverter or a resistive load type inverter.

19. The integrated circuit as claimed in claim 15, said nonlinear element being an inverter circuit.

20. The integrated circuit as claimed in claim 19, said inverter circuit being a CMOS inverter or a resistive load type inverter.

21. The integrated circuit as claimed in claim 1, each of said threshold elements comprising:
- a semiconductor region of a first conductivity type disposed on a substrate;
- a source region and a drain region of a second conductivity type provided on said semiconductor region;
- a floating gate electrode provided on a region which separates said source region and said drain region via an insulating film, said floating gate electrode connected to a terminal having a first voltage via an element which can take a conducting state, and, an interrupted state or an electrically high impedance state;
- a plurality of input gate electrodes connected to said floating gate electrode via an insulating film, said input gate electrodes controlled by at least two input control parts provided in said semiconductor device;
- at least one element for switching which can connects at least one of said input gate electrodes to an input line which inputs function configuration data or to a terminal having a second voltage.

22. A function reconfigurable integrated circuit, comprising:
- neuron MOS transistors each of which includes a switch;
- a circuit which stores function configuration data for determining a function as a vector which is a result of subtracting a third vector from the sum of a first vector and a second vector;
- said first vector including, as elements, voltages of input gate electrodes of said neuron MOS transistors at a time when floating gate electrodes of said neuron MOS transistors are in a high impedance state or are interrupted from initialization terminals used for setting an initial voltage in said floating gate electrode;
- said second vector including, as elements, voltages of said floating gate electrodes at a time when said floating gate electrodes are connected to said initialization terminals;
- said third vector including, as elements, voltages of said input gate electrodes at a time when said floating gate electrodes are interrupted from said initialization terminals or when said floating gate electrodes are in a high impedance state with respect to said initialization terminal.

23. The function reconfigurable integrated circuit as claimed in claim 22, said neuron MOS transistor comprising:
- a semiconductor region of a first conductivity type disposed on a substrate;
- a source region and a drain region of a second conductivity type provided on said semiconductor region;
- said floating gate electrode, provided on a region which separates said source region and said drain region via an insulating film, said floating gate electrode connected to said initialization terminal having a predetermined voltage via an element which can take a conducting state, and, an interrupted state or an electrically high impedance state;

a plurality of input gate electrodes capacitively coupled to said floating gate electrode via an insulating film.

24. The function reconfigurable integrated circuit as claimed in claim 22, said integrated circuit including i input terminals, i being a positive integer, wherein;

when said function reconfigurable integrated circuit stores function configuration data including n elements, n being a positive integer, a time necessary for initialization of said floating gate electrodes is divided into j intervals on a time axis, j being a positive integer, such that i+j≧n is satisfied, said time necessary for initialization being a time from a first time to a second time, at which said first time, at least one of said floating gate electrodes is connected to said initialization terminal, and at which said second time, said floating gate electrodes are interrupted from or enter in a high impedance state with respect to said initialization terminal; and function configuration data is stored such that elements of said function configuration data are disposed on predetermined regions in a two dimensional plane which is formed by said i input terminals and said j intervals so as not to overlap one another.

25. The function reconfigurable integrated circuit as claimed in claim 22, further comprising:

a circuit which provides elements of said first vector as two-valued values of logical 1 or logical 0 or continuous values;

a circuit which provides elements of said second vector as two-valued values of logical 1 or logical 0 or continuous values; and a circuit which provides elements of said third vector as two-valued values of logical 1 or logical 0 or continuous values.

26. The function reconfigurable integrated circuit as claimed in claim 22, wherein voltages which are provided from outside of said integrated circuit or voltages which are generated in said integrated circuit are used as elements of said first vector, said second vector and said third vector.

27. The function reconfigurable integrated circuit as claimed in claim 22, wherein said integrated circuit is configured by a plurality of stages, each of said stages includes at least one neuron MOS inverter having a switch which includes said neuron MOS transistor having a switch.

28. The function reconfigurable integrated circuit as claimed in claim 22, comprising:

a plurality of circuit blocks, each of said circuit blocks including at least one said integrated circuit;

wherein processing on storing function configuration data is performed in said integrated circuits simultaneously in each of said circuit blocks.

29. The function reconfigurable integrated circuit as claimed in claim 22, wherein:

multiple-valued voltages or continuous voltages are used for storing said function configuration data, said multiple-valued voltages or said continuous voltages being provided from the outside of said integrated circuit or being generated in said integrated circuit from voltages provided from the outside of said integrated circuit.

30. The function reconfigurable integrated circuit as claimed in claim 22, further comprising:

an impedance network which includes switches and impedance components; wherein, said integrated circuit stores multiple-valued voltages or continuous voltages which are generated by said impedance network from voltages provided from the outside of said integrated circuit.

31. The function reconfigurable integrated circuit as claimed in claim 30, said impedance components connected in series between a first terminal and a second terminal which have different voltages; and each of said switches being for connecting one of said impedance components to said input gate electrode of said neuron MOS transistor.

32. The function reconfigurable integrated circuit as claimed in claim 30, wherein said impedance network is configured such that capacitances are connected in parallel between a first terminal and a second terminal which have different voltages, each of said capacitances having a switch, and one of two terminals of each of said capacitances can be connected to one of said input gate electrodes of said neuron MOS transistors.

33. The function reconfigurable integrated circuit as claimed in claim 22, wherein said function configuration data is stored by storing charge amounts of multiple-valued values or charge amounts of continuous values, said multiple-valued values or said continuous values are represented by time intervals during which a predetermined voltage is provided, said predetermined voltage being provided from outside of said integrated circuit or being generated in said integrated circuit.

34. The function reconfigurable integrated circuit as claimed in claim 33, wherein said multiple-valued values or said continuous values are generated and stored by controlling said time intervals by using a network and a capacitance between said input gate electrode and said floating gate electrode, said network comprising resistance elements and capacitance elements and provided on a path over which a signal is applied to said input gate electrode.

35. A function reconfigurable integrated circuit, comprising:

neuron MOS transistors each of which includes a switch;

a circuit which stores function configuration data for determining a function, said function configuration data being a difference between the sum of charge amounts induced in input gate electrodes of said neuron MOS transistors during performing a function processing and charge amounts of floating gate electrodes of said neuron MOS transistors at a time when said floating gate electrodes are interrupted from or become in a high impedance state with respect to an initialization terminal used for setting an initial voltage to said floating gate electrode.

36. The function reconfigurable integrated circuit as claimed in claim 35, said neuron MOS transistor comprising:

a semiconductor region of a first conductivity type disposed on a substrate;

a source region and a drain region of a second conductivity type provided on said semiconductor region;

said floating gate electrode, provided on a region which separates said source region and said drain region via an insulating film, said floating gate electrode connected to said initialization terminal having a predetermined voltage via an element which can take a conducting state, and, an interrupted state or an electrically high impedance state;

a plurality of input gate electrodes capacitively coupled to said floating gate electrode via an insulating film.

37. The function reconfigurable integrated circuit as claimed in claim 35, said integrated circuit including i input terminals, i being a positive integer, wherein;

when said reconfigurable integrated circuit stores function configuration data including n elements, n being a positive integer, a time necessary for initialization of said floating gate electrodes is divided into j intervals on a time axis, j being a positive integer, such that i+j≧n is satisfied, said time necessary for initialization being a time from a first time to a second time, at which said first time, at least one of said floating gate electrodes being connected to said initialization terminal, at which said second time, said floating gate electrodes being interrupted from or becoming in a high impedance state with respect to said initialization terminal;

function configuration data is stored such that elements of said function configuration data are disposed on predetermined regions in a two dimensional plane which is formed by said i input terminals and said j intervals so as not to overlap one another.

38. The function reconfigurable integrated circuit as claimed in claim 35, wherein said integrated circuit is configured by a plurality of stages, each of said stages includes at least one neuron MOS inverter having a switch which includes said neuron MOS transistor having a switch.

39. The function reconfigurable integrated circuit as claimed in claim 22, comprising:

a plurality of circuit blocks, each of said circuit blocks including at least one said integrated circuit;

wherein processing on storing function configuration data is performed in said integrated circuits simultaneously for each of said circuit blocks.

40. The function reconfigurable integrated circuit as claimed in claim 35, wherein:

multiple-valued voltages or continuous voltages are used for storing said function configuration data, said multiple-valued voltages or said continuous voltages being provided from the outside of said integrated circuit or being generated in said integrated circuit from voltages provided from the outside of said integrated circuit.

41. The function reconfigurable integrated circuit as claimed in claim 35, further comprising:

an impedance network which includes switches and impedance components; wherein, said integrated circuit stores multiple-valued voltages or continuous voltages which are generated by said impedance network from voltages provided from the outside of said integrated circuit.

42. The function reconfigurable integrated circuit as claimed in claim 41, said impedance components connected in series between a first terminal and a second terminal which have different voltages; and each of said switches being for connecting one of said impedance components to said input gate electrode of said neuron MOS transistor.

43. The function reconfigurable integrated circuit as claimed in claim 41, wherein said impedance network is configured such that capacitances are connected in parallel between a first terminal and a second terminal which have different voltages, each of said capacitances having a switch, and one of two terminals of each of said capacitances can be connected to one of said input gate electrodes of said neuron MOS transistor.

44. The function reconfigurable integrated circuit as claimed in claim 35, wherein said function configuration data is stored by storing charge amounts of multiple-valued values or charge amounts of continuous values, said multiple-valued values or said continuous values are represented by time intervals during which a predetermined voltage is provided, said predetermined voltage being provided from outside of said integrated circuit or being generated in said integrated circuit.

45. The function reconfigurable integrated circuit as claimed in claim 44, said multiple-valued values or said continuous values are generated and stored by controlling said time intervals by using a network and a capacitance between said input gate electrode and said floating gate electrode, said network comprising resistance elements and capacitance elements and provided on a path over which a signal is applied to said input gate electrode.

46. A method of storing function configuration data in an integrated circuit including neuron MOS transistors each of which having a switch, said method comprising the steps of:

connecting each of floating gate electrodes of said neuron MOS transistors to an initialization terminal which is in a second voltage;

applying voltages in a third voltage vector to input gates of said neuron MOS transistors while each of said floating gate electrodes of said neuron MOS transistors is connected to said initialization terminal;

when a voltage of each of said floating gate electrodes can be regarded as the same as said second voltage, interrupting each of said floating gate electrodes from said initialization terminal or setting a high impedance with respect to said initialization terminal in each of said floating gate electrodes; and applying voltages of a first voltage vector to said input gate electrodes.

47. A method of storing function configuration data in an integrated circuit including neuron MOS inverters each of which having a switch, said integrated circuit configured by a plurality of stages each of which stages including at least one of said neuron MOS inverters, wherein each of floating gate electrodes of said neuron MOS inverters can be connected to a ground terminal having a ground voltage via a switch, said method comprising the steps of:

when each of said floating gate electrodes is connected to said ground terminal, applying predetermined voltages to input gate electrodes of said neuron MOS inverters;

interrupting each of said floating gate electrodes from said ground terminal or providing a high impedance to each of said floating gate electrodes while applying said predetermined voltages to said input gate electrodes;

when each of said floating gate electrodes can be regarded as in a floating state, applying a power supply voltage instead of said predetermined voltages to said input gate electrodes.

48. A method of storing function configuration data in an integrated circuit including neuron MOS inverters each of which having a switch, said integrated circuit configured by a plurality of stages each of which stages including at least one of said neuron MOS inverters, wherein each of floating gate electrodes of said neuron MOS inverters can be connected to a power supply terminal having a power supply voltage via a switch, said method comprising the steps of:

when each of said floating gate electrodes is connected to said power supply terminal, applying predetermined voltages to input gate electrodes of said neuron MOS inverters;

interrupting each of said floating gate electrodes from said power supply terminal or providing a high impedance to each of said floating gate electrodes while applying said predetermined voltages to said input gate electrodes;

when each of said floating gate electrodes can be regarded as in a floating state, applying a ground voltage instead of said predetermined voltages to said input gate electrodes.

49. A method of storing function configuration data in an integrated circuit including neuron MOS inverters each of which having a switch, said integrated circuit configured by a plurality of stages each of which stages including at least one of said neuron MOS inverters, wherein each of floating gate electrodes of said neuron MOS inverters can be connected to a second voltage terminal having a second voltage via a switch, said method comprising the steps of:

when each of said floating gate electrodes is connected to said second voltage terminal, applying third voltages to input gate electrodes of said neuron MOS inverters;

interrupting each of said floating gate electrodes from said second voltage terminal or providing a high impedance to each of said floating gate electrodes while applying said third voltages to said input gate electrodes;

when each of said floating gate electrodes can be regarded as in a floating state, applying a first voltage instead of said third voltages to said input gate electrodes.

50. An integrated circuit which realizes a function of k input variables, k being a positive integer, said integrated circuit comprising:

k first input signal terminals which input k first input signals and k+1 second input signal terminals which input k+1 second input signals, wherein input status numbers, each of which is the number of said first input signal terminals having identical values, are in one-to-one correspondence with said second input signal terminals;

said integrated circuit outputting a value which is determined according to a state of said second input signal terminal which corresponds to said input status number;

said integrated circuit including a symmetric function capability of k input variables and a selector capability, said selector capability selecting one signal among said k+1 second input signals by using said k first input signals.

51. The integrated circuit as claimed in claim 50, comprising:

two stages, a first stage in said two stages including k+1 threshold elements, a second stage in said two stages including a threshold element;

each of said k+1 threshold elements in said first stage including terminals for inputting said k first input signals and a terminal for inputting one of said second input signals;

said threshold element in said second stage including terminals for inputting said k first input signals and terminals for inputting signals based on output signals of said k+1 threshold elements of said first stage;

each of said threshold elements in said first stage having a threshold value which is different from a threshold value of any other threshold element in said first stage;

said threshold element in said second stage receiving products of a first weight and signal values output from said k+1 threshold elements of said first stage, said first weight having reversed sign of a second weight by which said first input signals are multiplied, or said threshold element in said second stage receiving products of a positive weight and reversed signals of signals output from said k+1 threshold elements of said first stage.

52. A function reconfigurable integrated circuit comprising at least one neuron MOS transistors having a switch;

said neuron MOS transistor including an element between a floating gate electrode and a terminal of a predetermined voltage, wherein said element can take either of two states of a conducting state and an interrupted state or a high impedance state; wherein, said integrated circuit has a symmetric function capability and a selector capability by controlling at least one of three voltages, a first voltage of said three voltages being a voltage of said floating gate electrode at a time when said element is in said conducting state, a second voltage of said three voltages being a voltage of an input terminal of said neuron MOS transistor at a time when said element is in said conducting state, a third voltage of said three voltages being a voltage of said input terminal of said neuron MOS transistor at a time when said element is in said interrupted state.

53. The function reconfigurable integrated circuit as claimed in claim 52, said neuron MOS transistor comprising:

a semiconductor region of a first conductivity type disposed on a substrate;

a source region and a drain region of a second conductivity type provided on said semiconductor region;

said floating gate electrode, which can be regarded as in a floating state, provided on a region which separates said source region and said drain region via an insulating film, said floating gate electrode connected to said terminal having a predetermined voltage via said element;

a plurality of input gate electrodes capacitively coupled to said floating gate electrode via an insulating film.

54. The function reconfigurable integrated circuit as claimed in claim 52, comprising:

two stages, a first stage in said two stages including k+1 threshold elements using said neuron MOS transistors, a second stage in said two stages including a threshold element using said neuron MOS transistor;

each of said k+1 threshold elements in said first stage including k first input signal terminals, a second input signal terminal which is different from other second input signal terminals of other threshold elements;

said threshold element in said second stage including terminals for inputting k first input signals and k+1 terminals for inputting signals based on output signals of said k+1 threshold elements of said first stage;

each of said threshold elements in said first stage having a threshold value which is different from a threshold value of any other threshold element in said first stage;

said threshold element in said second stage receiving products of a positive weight and reversed signals of signals output from said k+1 threshold elements of said first stage.

55. The function reconfigurable integrated circuit as claimed in claim 54, said threshold element using said neuron MOS transistor having a switch being an element which forms an inverter circuit.

56. The function reconfigurable integrated circuit as claimed in claim 54, wherein output terminals of said threshold elements of said first stage are connected to input terminals of said threshold element of said second stage via circuits including wave-shaping circuits.

57. The function reconfigurable integrated circuit as claimed in claim 54, further comprising a circuit including a delay circuit, which is provided on a path over which a signal is applied to said threshold element of said second stage.

58. The function reconfigurable integrated circuit as claimed in claim 52, further comprising a switching circuit which selects between said symmetric function capability and said selector capability.

59. The function reconfigurable integrated circuit as claimed in claim 52, further comprising a control circuit which switches between four modes;
   in a first mode, said symmetric function capability being realized only during applying function configuration data;
   in a second mode, said function configuration data being stored;
   in a third mode, said selector capability being realized only during applying an address of a signal to be selected;
   in a fourth mode, said address being stored.

60. The function reconfigurable integrated circuit as claimed in claim 52, said function reconfigurable integrated circuit comprising threshold elements using said neuron MOS transistor having a switch which forms an inverter circuit.

61. A function reconfigurable integrated circuit which includes a plurality of neuron MOS transistors or a plurality of neuron MOS transistors having a switch, wherein said integrated circuit is configured such that:
   sums of sets of an element or elements are different with respect to each other, wherein said elements in a set do not overlap each other, said elements being included in a capacitance ratio set ($W_1, W_2, \ldots, W_i, \ldots, W_k$);
   wherein each element in said capacitance ratio set ($W_1, W_2, \ldots, W_i, \ldots, W_k$) is a capacitance ratio with respect to a minimum value of capacitance values, said capacitance values being values of capacitances between input gate electrodes to which input variables are input and a floating gate electrode, wherein k is the number of said input variables.

62. The function reconfigurable integrated circuit as claimed in claim 61, each of said neuron MOS transistor and said neuron MOS transistor having a switch comprising:
   a semiconductor region of a first conductivity type disposed on a substrate;
   a source region and a drain region of a second conductivity type provided on said semiconductor region;
   said floating gate electrode, which can be regarded as in a floating state, provided on a region which separates said source region and said drain region via an insulating film;
   a plurality of input gate electrodes capacitively coupled to said floating gate electrode via an insulating film;
   wherein said floating gate electrode of said neuron MOS transistor having a switch is connected to a terminal having a predetermined voltage via an element which can take either of a conducting state and an interrupted state or a high impedance state.

63. The function reconfigurable integrated circuit as claimed in claim 61, each of said neuron MOS transistor and said neuron MOS transistor having a switch being a transistor wherein said capacitance ratio $W_i$ of an ith input gate satisfies $$w_i > \Sigma_{j=1}^{i-1} w_j, \ (2 \leq i \leq k).$$

64. The function reconfigurable integrated circuit as claimed in claim 63, each of said neuron MOS transistor and said neuron MOS transistor having a switch being a transistor wherein $w_i = z^{i-1}$, $1 \leq i \leq k$, and $z \geq 2$ are satisfied.

65. The function reconfigurable integrated circuit as claimed in claim 63, each of said neuron MOS transistor and said neuron MOS transistor having a switch being a transistor wherein $w_i = \alpha^{i-2} \cdot (1+\beta)$, $2 \leq i \leq k$, $\alpha > 1$ and $0 < \beta < 1$ are satisfied.

66. The function reconfigurable integrated circuit as claimed in claim 65, each of said neuron MOS transistor and said neuron MOS transistor having a switch being a transistor wherein $w_i = 2^{i-2} \cdot (1+\beta)$, $2 \leq i \leq k$ and $0 < \beta < 1$ are satisfied.

67. The function reconfigurable integrated circuit as claimed in claim 61, each of said neuron MOS transistor and said neuron MOS transistor having a switch being a transistor wherein $w_i = \alpha^{i-1}$, $1 \leq i \leq k$ and $1 < \alpha < 2$ are satisfied.

68. The function reconfigurable integrated circuit as claimed in claim 61, said integrated circuit including two stages, a first stage of said two stages including pre-inverters each of which is said neuron MOS transistor or said neuron MOS transistor having a switch, said pre-inverter having more than two threshold values with respect to an input signal.

69. The function reconfigurable integrated circuit as claimed in claim 68, further comprising terminals from which two-valued control signals which determine said threshold value are input.

70. The function reconfigurable integrated circuit as claimed in claim 68, further comprising a control signal terminal from which a multiple-valued signal or an analog signal is input, said multiple-valued signal or said analog signal determining said more than two threshold values.

71. A designing method of a function reconfigurable integrated circuit, said integrated circuit comprising two stages which include neuron MOS inverters using neuron MOS transistors or neuron MOS transistors having a switch, said neuron MOS inverter in a first stage of said two stages being a pre-inverter and said neuron MOS inverter in a second stage of said two stage being a main inverter, said method comprising the steps of:
   setting values of input gate capacitances, for each of said neuron MOS inverters, between input gate electrodes from which first input signals are input and a floating gate electrode such that input vectors can be identified, said input vector being a vector representation of said first input signals;
   setting, for each input gate electrode connected to an output terminal of said pre-inverter, a value of an input gate capacitance between an input gate electrode from which an output signal from a pre-inverter is input and said floating gate of said main inverter such that, of two different voltages of said floating gate which correspond to two output values of said pre-inverter, one is larger than a threshold voltage of said floating gate and another is smaller than said threshold voltage, wherein said input gate capacitance corresponds to said pre-inverter which corresponds to one of said input vectors; and
   setting, for each of said pre-inverters, a value of an input gate capacitance between an input gate electrode from which a second input signal is input and said floating gate of one of said pre-inverters, such that a voltage of said floating gate becomes equal to said threshold voltage at each of two different input charge amounts, wherein an input charge amount corresponding to said one of said pre-inverters which corresponds to a first input vector is larger than one of said two different input charge amounts and is smaller than the other of said two different input charge amounts, wherein each of said two different input charge amounts does not exceed an input charge amount of a second input vector which is nearest to said first input vector.

72. A designing method of a function reconfigurable integrated circuit, said integrated circuit comprising two stages which include neuron MOS inverters using neuron MOS transistors or neuron MOS transistors having a switch, said neuron MOS inverter in a first stage of said two stages being a pre-inverter and neuron MOS inverter in a second stage of said two stages being a main inverter, said method comprising the steps of:

setting values of input gate capacitances, for each of said neuron MOS inverters, between input gate electrodes from which first input signals are input and a floating gate electrode, such that input vectors can be identified, said input vector being a vector representation of said first input signals;

for said main inverter, dividing said input vectors which are arranged in ascending order by corresponding input charge amounts into blocks each of which blocks including four input vectors, said input charge amounts being accumulated in input gate capacitances between first input signal terminals and a floating gate;

setting values of input gate capacitances, for said main inverter, between input gate electrodes from which output signals from said pre-inverters are input and said floating gate, such that said floating gate takes two values of which one is larger than a threshold voltage of said floating gate and another is smaller than said threshold voltage of said floating gate by using combinations of logical values of output signals of three pre-inverters for four input vectors in said block; and setting, for each of said pre-inverters, a value of an input gate capacitance between an input gate electrode from which a second input signal is input and said floating gate of one of said pre-inverters, such that a voltage of said floating gate becomes equal to said threshold voltage at each of two different input charge amounts, wherein an input charge amount corresponding to said one of said pre-inverters which corresponds to a first input vector is larger than one of said two different input charge amounts and is smaller than another of said two different input charge amounts, wherein each of said two different input charge amounts does not exceed an input charge amount of a second input vector which is nearest to said first input vector.

73. The designing method of a function reconfigurable integrated circuit as claimed in claim 72, further comprising the step of utilizing a physical multiple-valued value for a multiple-valued expression.

* * * * *

UNITED STATES PATENT AND TRADEMARK OFFICE
CERTIFICATE OF CORRECTION

| | |
|---|---|
| PATENT NO. | : 7,075,827 B2 |
| APPLICATION NO. | : 09/754632 |
| DATED | : July 11, 2006 |
| INVENTOR(S) | : Kazuo Aoyama et al. |

It is certified that error appears in the above-identified patent and that said Letters Patent is hereby corrected as shown below:

Column 2, line 39, change "ofen" to --often--;

Column 8, line 6, change "comprises" to --comprise--;

Column 8, line 12, change "includes" to --include--;

Column 8, line 45, change "includes" to --include--;

Column 11, line 27, change "imprdance" to --impedance--;

Column 34, line 44, change "switche" to --switches--;

Column 83, line 1, change "$W_{p3}$" to --$w_{p3}$--;

Column 88, line 11, change "claim 1" to --claim 13--;

Column 88, line 29, change "connects" to --connect-- and

Column 91, line 27, change "claim 22" to --claim 35--.

Signed and Sealed this

Seventh Day of November, 2006

JON W. DUDAS
*Director of the United States Patent and Trademark Office*